US011114625B2

(12) United States Patent
Cho et al.

(10) Patent No.: US 11,114,625 B2
(45) Date of Patent: Sep. 7, 2021

(54) ORGANIC LIGHT-EMITTING DEVICE

(71) Applicant: SAMSUNG DISPLAY CO., LTD., Yongin (KR)

(72) Inventors: Hwan-Hee Cho, Yongin (KR); Myeong-Suk Kim, Jinju (KR); Sung-Wook Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 353 days.

(21) Appl. No.: 14/807,778

(22) Filed: Jul. 23, 2015

(65) Prior Publication Data

US 2016/0190476 A1 Jun. 30, 2016

(30) Foreign Application Priority Data

Dec. 31, 2014 (KR) ........................ 10-2014-0195398

(51) Int. Cl.

*H01L 51/54* (2006.01)
*H01L 51/00* (2006.01)
*H01L 51/50* (2006.01)

(52) U.S. Cl.

CPC ........ *H01L 51/0072* (2013.01); *H01L 51/006* (2013.01); *H01L 51/0056* (2013.01); *H01L 51/0058* (2013.01); *H01L 51/0061* (2013.01); *H01L 51/0067* (2013.01); *H01L 51/0073* (2013.01); *H01L 51/0074* (2013.01); *H01L 51/0079* (2013.01); *H01L 51/0094* (2013.01); *H01L 51/5012* (2013.01); *H01L 51/5016* (2013.01); *H01L 51/5072* (2013.01); *H01L 2251/308* (2013.01); *H01L 2251/5384* (2013.01)

(58) Field of Classification Search

CPC ............... H01L 51/0032; H01L 51/005; H01L 51/0051; H01L 51/0052; H01L 51/0054; H01L 51/0056; H01L 51/0058; H01L 51/0059; H01L 51/006; H01L 51/0061; H01L 51/0065; H01L 51/0067; H01L 51/0068; H01L 51/0069; H01L 51/0071; H01L 51/0072; H01L 51/0073; H01L 51/0074; H01L 51/0079; H01L 51/0094; H01L 51/50; H01L 51/5012; H01L 51/5016; H01L 51/5072; H01L 2251/308; H01L 2251/5384

USPC ....... 428/690, 691, 917, 411.4, 336; 427/58, 427/66; 313/500–512; 257/40, 88–104, 257/E51.001–E51.052; 252/301.16–301.35

See application file for complete search history.

(56) References Cited

U.S. PATENT DOCUMENTS

| | | | | |
|---|---|---|---|---|
| 2003/0165715 A1* | 9/2003 | Yoon | C07D 235/08 | 428/690 |
| 2008/0111473 A1* | 5/2008 | Kawamura | C07D 213/04 | 313/504 |
| 2009/0166670 A1* | 7/2009 | Park | C07D 401/04 | 257/103 |
| 2011/0037062 A1 | 2/2011 | Fukumatsu et al. | | |
| 2011/0156017 A1* | 6/2011 | Lee | C07C 15/28 | 257/40 |
| 2011/0279020 A1 | 11/2011 | Inoue et al. | | |
| 2012/0068170 A1* | 3/2012 | Pflumm | C07D 413/04 | 257/40 |
| 2012/0080670 A1* | 4/2012 | Park | C07D 209/82 | 257/40 |
| 2012/0138915 A1* | 6/2012 | Nishimura | C09K 11/06 | 257/40 |
| 2012/0181922 A1* | 7/2012 | Kawamura | H01L 51/0052 | 313/504 |
| 2012/0206037 A1* | 8/2012 | Lee | C07D 209/82 | 313/504 |
| 2013/0207082 A1* | 8/2013 | Cho | H01L 51/5016 | 257/40 |
| 2013/0248849 A1* | 9/2013 | Feldman | H05B 33/14 | 257/40 |
| 2013/0313536 A1 | 11/2013 | Nishimura et al. | | |
| 2014/0054564 A1* | 2/2014 | Kim | C07B 59/00 | 257/40 |
| 2014/0084270 A1* | 3/2014 | Kato | C09K 11/06 | 257/40 |
| 2014/0151647 A1 | 6/2014 | Mizuki et al. | | |
| 2014/0239273 A1 | 8/2014 | Mizutani et al. | | |
| 2015/0236262 A1 | 8/2015 | Cho et al. | | |

FOREIGN PATENT DOCUMENTS

| | | |
|---|---|---|
| KR | 10-2010-0105099 A | 9/2010 |
| KR | 10-2011-0007124 A | 1/2011 |
| KR | 10-2012-0042633 A | 5/2012 |
| KR | 10-2012-0057561 A | 6/2012 |
| KR | 10-2015-0096593 A | 8/2015 |
| WO | WO 2010/107244 A2 | 9/2010 |

(Continued)

*Primary Examiner* — Andrew K Bohaty

(74) *Attorney, Agent, or Firm* — Lewis Roca Rothgerber Christie LLP

(57) ABSTRACT

An organic light-emitting device includes a first electrode; a second electrode; an organic layer between the first electrode and the second electrode, the organic layer including an emission layer, and an electron transport region between the emission layer and the second electrode. The emission layer includes a first compound represented by Formula 1 and a second compound represented by any one of Formulae 2-1 to 2-5. The electron transport region includes a third compound represented by Formula 7. The organic light-emitting device may have low driving voltage, high efficiency, and a long lifespan.

18 Claims, 1 Drawing Sheet

(56) References Cited

FOREIGN PATENT DOCUMENTS

| | | | | |
|---|---|---|---|---|
| WO | WO-2010107244 A2 * | 9/2010 | ........... | C09B 5/2436 |
| WO | WO-2012015274 A2 * | 2/2012 | ............. | C07B 59/00 |
| WO | WO 2012/026780 A1 | 3/2012 | | |

* cited by examiner

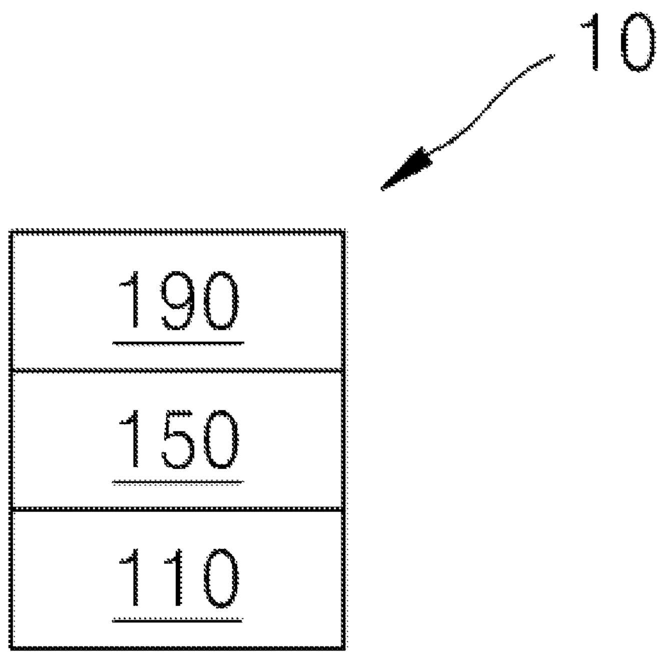
10
190
150
110

ORGANIC LIGHT-EMITTING DEVICE

CROSS-REFERENCE TO RELATED APPLICATION

This application claims priority to and the benefit of Korean Patent Application No. 10-2014-0195398, filed on Dec. 31, 2014, in the Korean Intellectual Property Office, the entire content of which is incorporated herein by reference.

BACKGROUND

1. Field

One or more aspects of embodiments of the present disclosure are directed to an organic light-emitting device.

2. Description of the Related Art

Organic light emitting devices are self-emission devices that have wide viewing angles, high contrast ratios, short response times, and excellent brightness, driving voltage, and response speed characteristics, and can produce full-color images.

An organic light-emitting device may include a first electrode positioned on a substrate, and a hole transport region, an emission layer, an electron transport region, and a second electrode, sequentially positioned on the first electrode. Holes provided from the first electrode may move toward the emission layer through the hole transport region, and electrons provided from the second electrode may move toward the emission layer through the electron transport region. Carriers (e.g., holes and electrons), are recombined in the emission layer to produce excitons. These excitons change from an excited state to a ground state, thereby generating light.

SUMMARY

One or more aspects of embodiments of the present invention are directed to an organic light-emitting device.

Additional aspects will be set forth in part in the description which follows and, in part, will be apparent from the description, or may be learned by practice of the presented embodiments.

In one or more embodiments of the present invention, an organic light-emitting device includes a first electrode, a second electrode, an organic layer between the first electrode and the second electrode, the organic layer including an emission layer; and an electron transport region between the emission layer and the second electrode;

where the emission layer includes a first compound represented by Formula 1 and a second compound represented by any one of Formulae 2-1 to 2-5; and the electron transport region includes a third compound represented by Formula 7:

Formula 1

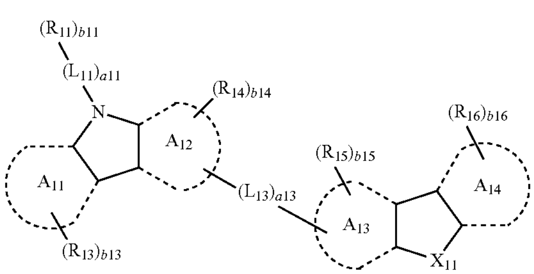

-continued

Formula 2-1

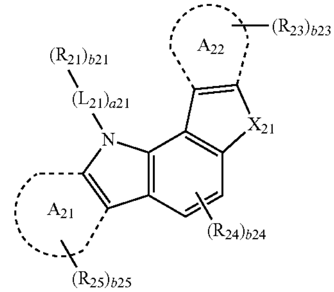

Formula 2-2

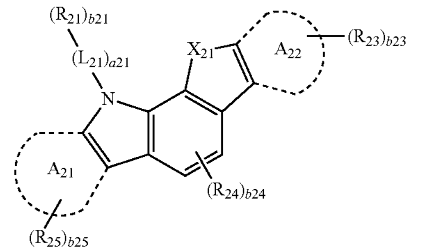

Formula 2-3

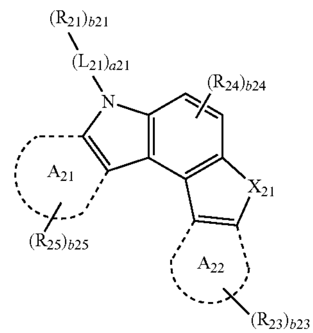

Formula 2-4

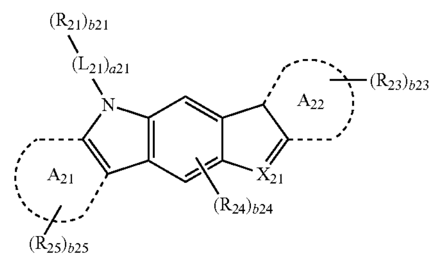

Formula 2-5

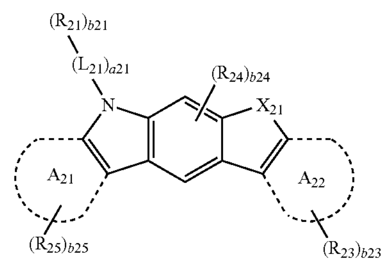

Formula 7

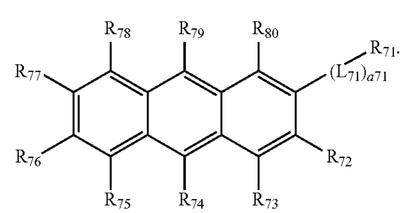

In Formulae 1, 2-1 to 2-5, and 7, $A_{11}$, $A_{12}$, $A_{13}$, $A_{14}$, $A_{21}$, and $A_{22}$ may be each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, and a cinnoline;

$X_{11}$ may be selected from O, S, $N[(L_{12})_{a12}-(R_{12})_{b12}]$, $C[(L_{12})_{a12}-(R_{12})_{b12}][R_{17}]$, $Si[(L_{12})_{a12}-(R_{12})_{b12}][R_{17}]$, $P[(L_{12})_{a12}-(R_{12})_{b12}]$, $B[(L_{12})_{a12}-(R_{12})_{b12}]$, and $P(=O)[(L_{12})_{a12}-(R_{12})_{b12}]$;

$X_{21}$ may be selected from O, S, $N[(L_{22})_{a22}-(R_{22})_{b22}]$, $C[(L_{22})_{a22}-(R_{22})_{b22}][R_{26}]$, $Si[(L_{22})_{a22}-(R_{22})_{b22}][R_{26}]$, $P[(L_{22})_{a22}-(R_{22})_{b22}]$, $B[(L_{22})_{a22}-(R_{22})_{b22}]$, and $P(=O)[(L_{22})_{a22}-(R_{22})_{b22}]$;

$L_{11}$ to $L_{13}$, $L_{21}$, $L_{22}$, and $L_{71}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a13, a21, a22, and a71 may be each independently selected from 0, 1, 2, 3, 4, and 5;

$R_{11}$ and $R_{12}$ may be each independently selected from $R_{HT}$ and $R_{ET}$, provided that at least one selected from $R_{11}$ and $R_{12}$ is $R_{ET}$;

$R_{21}$ and $R_{22}$ may be each independently $R_{HT}$;

$R_{71}$ may be $R_{ET}$;

b11, b12, b21, and b22 may be each independently selected from 1, 2, 3, and 4;

$R_{13}$ to $R_{17}$, $R_{23}$ to $R_{26}$, and $R_{72}$ to $R_{80}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid (herein, also referring to a "carboxylic acid group") or a salt thereof, a sulfonic acid (herein, also referring to a "sulfonic acid group") or a salt thereof, a phosphoric acid (herein, also referring to a "phosphoric acid group") or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, and $—B(Q_6)(Q_7)$;

b13 to b16 and b23 to b25 may be each independently selected from 1, 2, 3 and 4;

$R_{HT}$ is a hole transport group;

$R_{ET}$ is an electron transport group; and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, and $—B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, and $—B(Q_{26})(Q_{27})$; and —$N(Q_{31})(Q_{32})$, —$Si(Q_{33})(Q_{34})(Q_{35})$, and —$B(Q_{36})(Q_{37})$;

where $Q_1$ to $Q_7$, $Q_{11}$ to $Q_{17}$, $Q_{21}$ to $Q_{27}$ and $Q_{31}$ to $Q_{37}$ may be each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In one or more embodiments of the present invention, an organic light-emitting device includes a first electrode, a second electrode, and an organic layer between the first electrode and the second electrode and including an emission layer;

an electron transport region between the emission layer and the second electrode;

where the emission layer includes a first compound represented by Formula 1 and a second compound represented by any one of Formulae 2-1 to 2-5; and the electron transport region includes a third compound represented by Formula 7:

Formula 1

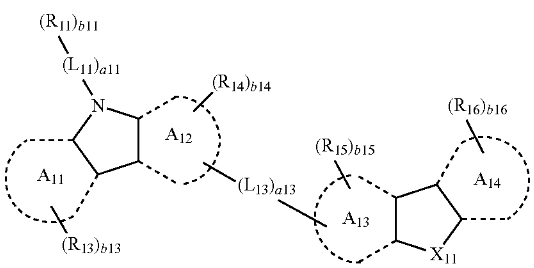

Formula 2-1

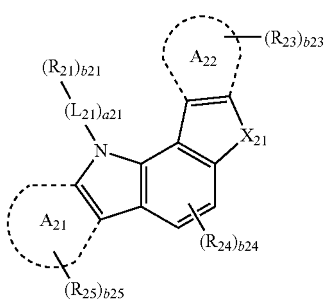

Formula 2-2

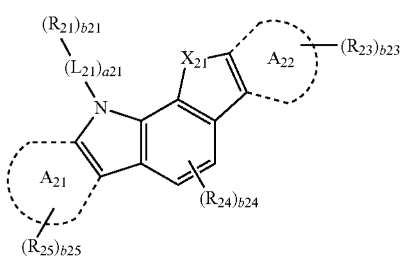

-continued

Formula 2-3

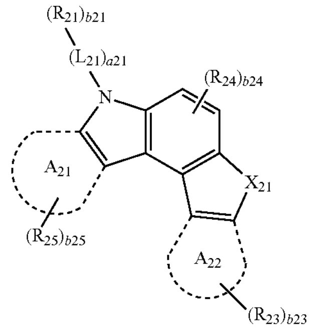

Formula 2-4

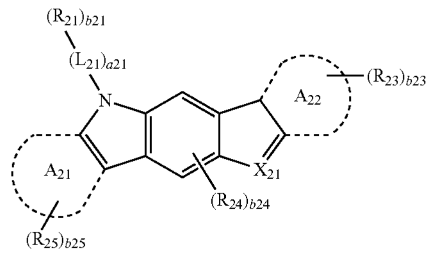

Formula 2-5

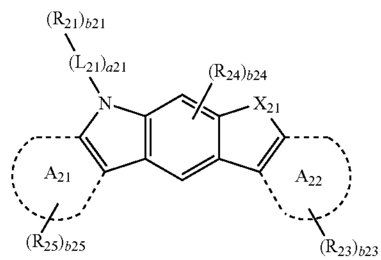

Formula 7

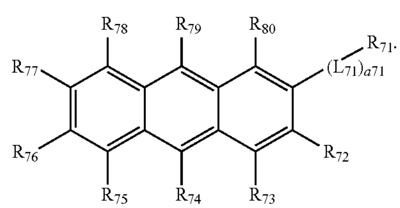

In Formulae 1, 2-1 to 2-5, and 7:

$A_{11}$, $A_{12}$, $A_{13}$, $A_{14}$, $A_{21}$, and $A_{22}$ may be each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, and a cinnoline;

$X_{11}$ may be selected from O, S, $N[(L_{12})_{a12}$-$(R_{12})_{b12}]$, $C[(L_{12})_{a12}$-$(R_{12})_{b12}][R_{17}]$, $Si[(L_{12})_{a12}$-$(R_{12})_{b12}][R_{17}]$, $P[(L_{12})_{a12}$-$(R_{12})_{b12}]$, $B[(L_{12})_{a12}$-$(R_{12})_{b12}]$, and $P({=}O)[(L_{12})_{a12}$-$(R_{12})_{b12}]$;

$X_{21}$ may be selected from O, S, $N[(L_{22})_{a22}$-$(R_{22})_{b22}]$, $C[(L_{22})_{a22}$-$(R_{22})_{b22}][R_{26}]$, $Si[(L_{22})_{a22}$-$(R_{22})_{b22}][R_{26}]$, $P[(L_{22})_{a22}$-$(R_{22})_{b22}]$, $B[(L_{22})_{a22}$-$(R_{22})_{b22}]$, and $P({=}O)[(L_{22})_{a22}$-$(R_{22})_{b22}]$;

$L_{11}$ to $L_{13}$, $L_{21}$, $L_{22}$, and $L_{71}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a13, a21, a22, and a71 may be each independently selected from 0, 1, 2, 3, 4, and 5;

$R_{11}$ and $R_{12}$ may be each independently $R_{HT}$;

$R_{21}$ and $R_{22}$ may be each independently selected from $R_{HT}$ and $R_{ET}$, provided that at least one selected from $R_{21}$ and $R_{22}$ is $R_{ET}$;

$R_{71}$ may be $R_{ET}$;

b11, b12, b21, and b22 may be each independently selected from 1, 2, 3, and 4;

$R_{13}$ to $R_{17}$, $R_{23}$ to $R_{26}$, and $R_{72}$ to $R_{80}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted a monovalent non-aromatic condensed polycyclic group, and a substituted or unsubstituted monovalent non-aromatic condensed heteropolycyclic group;

b13 to b16 and b23 to b25 may be each independently selected from 1, 2, 3 and 4;

$R_{HT}$ is a hole transport group;

$R_{ET}$ is an electron transport group; and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$);

where $Q_{11}$ to $Q_{17}$, $Q_{21}$ to $Q_{27}$, and $Q_{31}$ to $Q_{37}$ may be each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

BRIEF DESCRIPTION OF THE DRAWINGS

These and/or other aspects will become apparent and more readily appreciated from the following description of the embodiments, taken in conjunction with the drawing, which is a schematic cross-sectional view of an organic light-emitting device according to one or more embodiments of the present invention.

DETAILED DESCRIPTION

Reference will now be made in more detail to embodiments, examples of which are illustrated in the accompanying drawing, wherein like reference numerals refer to the like elements throughout. In this regard, the present embodiments may have different forms and should not be construed as being limited to the descriptions set forth herein. Accordingly, the embodiments are merely described below, by referring to the drawing, to explain aspects of the present description.

The present disclosure may be embodied in many different forms and should not be construed as being limited to the embodiments set forth herein; rather, these embodiments are provided so that this disclosure may be understood by those skilled in the art.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. That is, for example, intervening layers, regions, or components may be present.

Sizes of components in the drawing may be exaggerated for convenience of explanation. In other words, since sizes and thicknesses of components in the drawing are arbitrarily illustrated for convenience of explanation, the following embodiments are not limited thereto.

The expression "(an organic layer) includes a first compound" used herein may be interpreted as a case in which "(an organic layer) includes one or more identical first compounds represented by Formula 1 or two or more different first compounds represented by Formula 1."

The term "organic layer" used herein refers to a single layer and/or a plurality of layers between the first electrode and the second electrode of the organic light-emitting device. A material included in the "organic layer" is not limited to an organic material.

Expressions such as "at least one of" and "one of," when preceding a list of elements, modify the entire list of elements and do not modify the individual elements of the list. Further, the use of "may" when describing embodiments of the present invention refers to "one or more embodiments of the present invention."

In addition, as used herein, the terms "use," "using," and "used" may be considered synonymous with the terms "utilize," "utilizing," and "utilized," respectively. Also, the term "exemplary" is intended to refer to an example or illustration.

As used herein, the term "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 1 12, first paragraph, and 35 U.S.C. § 132(a).

The drawing is a schematic cross-sectional view of an organic light-emitting device 10 according to one or more embodiments of the present invention.

In the drawing, a substrate may be additionally positioned under the first electrode 110 or above the second electrode 190. The substrate may be a glass substrate or transparent plastic substrate, each with excellent mechanical strength, thermal stability, transparency, surface smoothness, ease of handling, and/or water-resistance.

The first electrode 110 may be formed by depositing or sputtering a material for forming the first electrode on the substrate. When the first electrode 110 is an anode, the material for the first electrode 110 may be selected from materials with a high work function so as facilitate hole injection. The first electrode 110 may be a reflective electrode or a transmissive electrode. The material for the first electrode 110 may be a transparent and highly conductive material, and non-limiting examples of such a material include indium tin oxide (ITO), indium zinc oxide (IZO), tin oxide ($SnO_2$), and zinc oxide (ZnO). When the first electrode 110 is a semi-transmissive electrode or a reflective electrode, as a material for forming the first electrode, at least one of magnesium (Mg), aluminum (Al), aluminum-lithium (Al—Li), calcium (Ca), magnesium-indium (Mg—In), and magnesium-silver (Mg—Ag) may be used.

The first electrode 110 may have a single-layer structure, or a multi-layer structure including two or more layers. For example, the first electrode 110 may have a three-layered structure of ITO/Ag/ITO, but the structure of the first electrode 110 is not limited thereto.

An organic layer 150 including an emission layer may be positioned on the first electrode 110. The organic layer 150 may include a hole transport region between the first electrode 110 and the emission layer and an electron transport region between the emission layer and the second electrode 190.

The hole transport region may include at least one selected from a hole injection layer (HIL), a hole transport layer (HTL), a buffer layer, and an electron blocking layer (EBL), and the electron transport region may include at least one selected from a hole blocking layer (HBL), an electron transport layer (ETL), and an electron injection layer (EIL), but they are not limited thereto.

The hole transport region may have a single-layered structure formed of a single material, a single-layered structure formed of a plurality of different materials, or a multi-layered structure having a plurality of layers formed of a plurality of different materials.

For example, the hole transport region may have a single-layered structure formed of a plurality of different materials, or a structure of hole injection layer/hole transport layer, a structure of hole injection layer/hole transport layer/buffer layer, a structure of hole injection layer/buffer layer, a structure of hole transport layer/buffer layer, a structure of hole injection layer/hole transport layer/electron blocking layer, or a structure of a hole transport layer/electron blocking layer, wherein the layers of each structure are sequentially stacked on the first electrode 110 in the stated order, but embodiments of the present invention are not limited thereto.

When the hole transport region includes a hole injection layer, the hole injection layer may be formed on the first electrode 110 by using (utilizing) one or more suitable methods, such as vacuum deposition, spin coating casting, a Langmuir-Blodgett (LB) method, ink-jet printing, laser-printing, and/or laser-induced thermal imaging.

When the hole injection layer is formed by vacuum deposition, for example, the vacuum deposition may be performed at a deposition temperature of about 100 to about 500° C., at a vacuum degree of about $10^{-8}$ to about $10^{-3}$ torr, and at a deposition rate of about 0.01 to about 100 Å/sec, depending on the compound for forming the hole injection layer to be deposited, and the structure of the hole injection layer to be formed.

When the hole injection layer is formed by spin coating, the spin coating may be performed at a coating rate of about 2000 rpm to about 5000 rpm, and at a temperature of about 80° C. to about 200° C., depending on the compound for forming the hole injection layer to be deposited, and the structure of the hole injection layer to be formed.

When the hole transport region includes a hole transport layer, the hole transport layer may be formed on the first electrode 110 or the hole injection layer by using one or more suitable methods, such as vacuum deposition, spin coating, casting, a LB method, ink-jet printing, laser-printing, and/or laser-induced thermal imaging. When the hole transport layer is formed by vacuum deposition and/or spin coating, deposition and coating conditions for the hole transport layer may be the same as (or similar to) the deposition and coating conditions for the hole injection layer.

The hole transport region may include at least one selected from m-MTDATA, TDATA, 2-TNATA, NPB, 3-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), (polyaniline)/poly(4-styrenesulfonate) (PANI/PSS), a compound represented by Formula 201 below, and a compound represented by Formula 202 below:

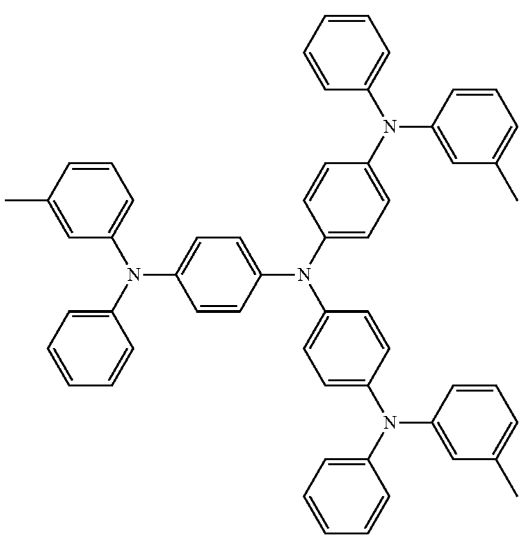

m-MTDATA

-continued

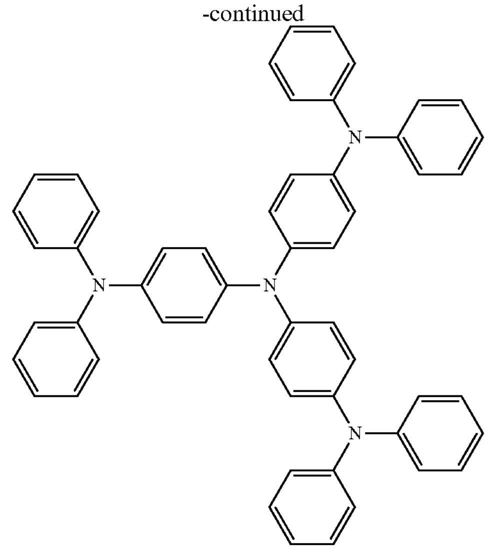

TDATA

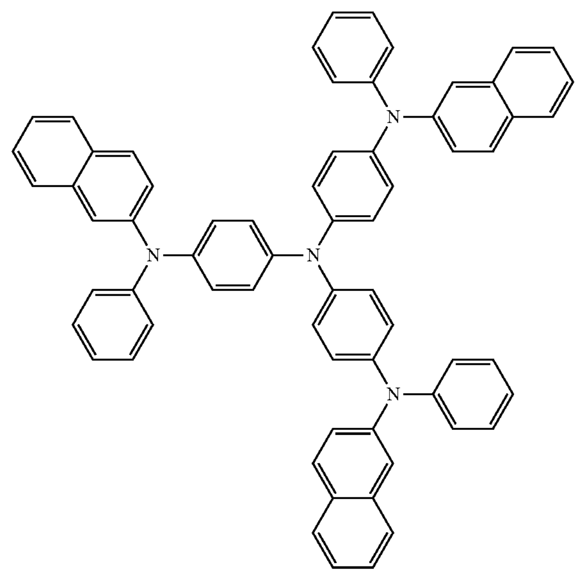

2-TNATA

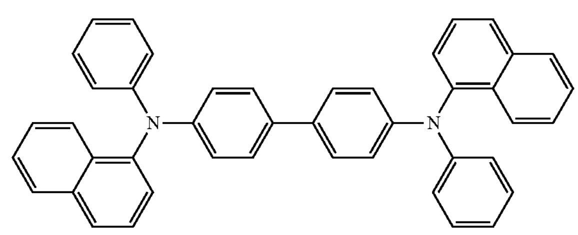

NPB

-continued

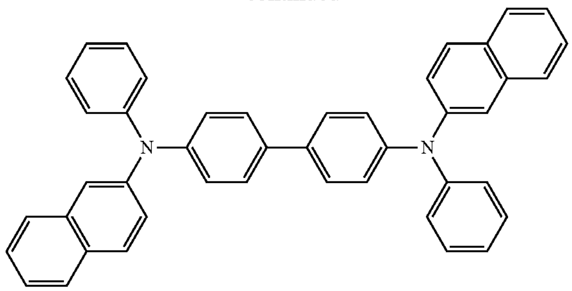

β-NPB

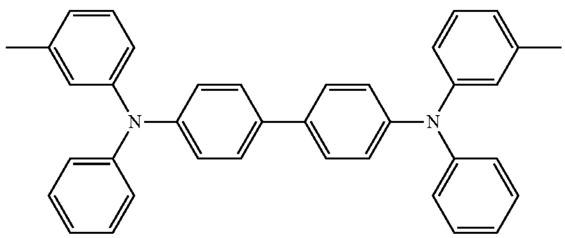

TPD

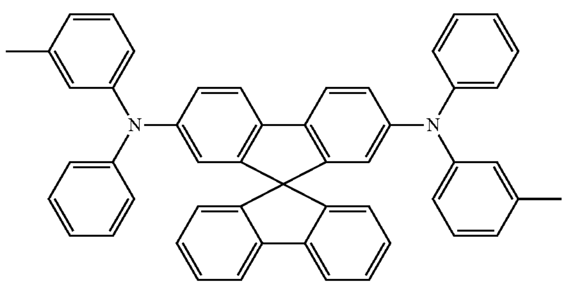

Spiro-TPD

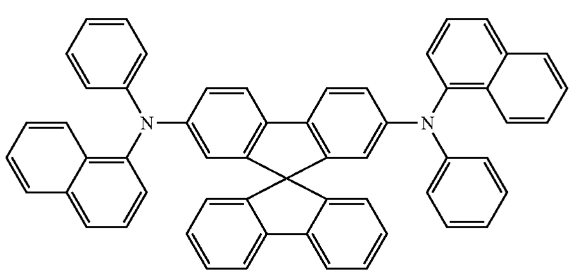

Spiro-NPB

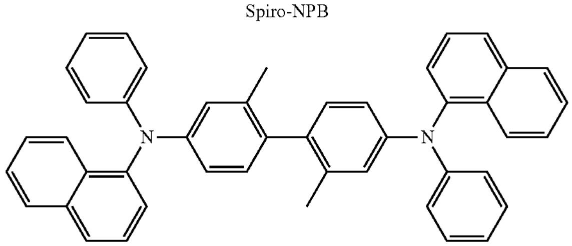

methylated NPB

-continued

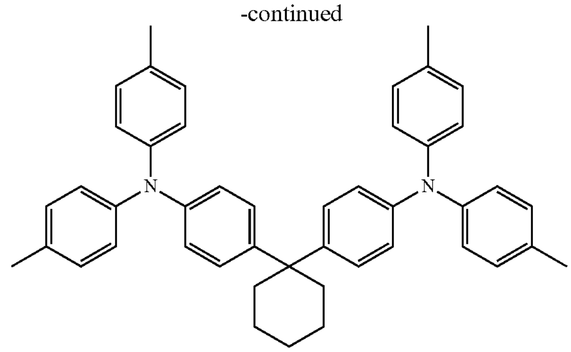

TAPC

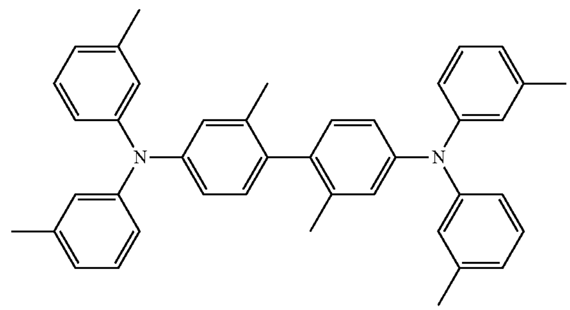

HMTPD

Formula 201

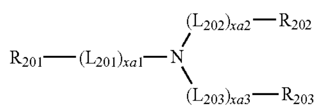

Formula 202

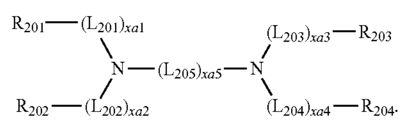

In Formulae 201 and 202, descriptions of $L_{201}$ to $L_{205}$ may be the same as those provided herein in connection with $L_{11}$;

xa1 to xa4 may be each independently selected from 0, 1, 2, and 3;

xa5 may be selected from 1, 2, 3, 4, and 5; and $R_{201}$ to $R_{204}$ may be each independently understood by referring to the description provided herein in connection with $R_{11}$.

In some embodiments, in Formulae 201 and 202, $L_{201}$ to $L_{205}$ may be each independently selected from a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may be each independently 0, 1, or 2;

xa5 may be 1, 2, or 3;

$R_{201}$ to $R_{204}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but they are not limited thereto.

The compound represented by Formula 201 may be represented by Formula 201A:

Formula 201A

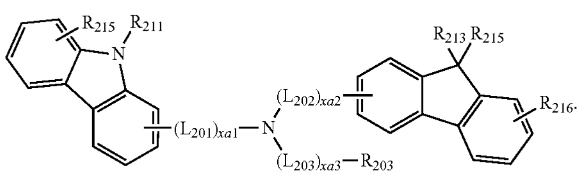

For example, the compound represented by Formula 201 may be represented by Formula 201A-1 below, but is not limited thereto:

Formula 201A-1

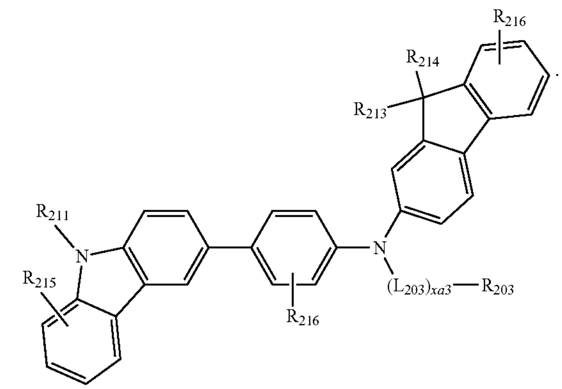

For example, the compound represented by Formula 202 may be represented by Formula 202A below, but is not limited thereto:

Formula 202A

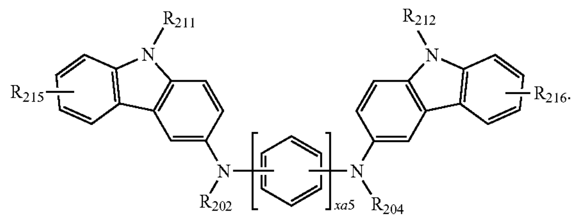

$L_{201}$ to $L_{203}$, xa1 to xa3, xa5, and $R_{202}$ to $R_{204}$ in Formulae 201A, 201A-1 and 202A are as described above, and $R_{211}$ and $R_{212}$ may be each independently understood by referring to the description provided herein in connection with $R_{203}$, and $R_{213}$ to $R_{216}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

For example, in Formulae 201A, 201A-1, and 202A, $L_{201}$ to $L_{203}$ may be each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may be each independently 0 or 1;

$R_{202}$ to $R_{204}$, $R_{211}$, and $R_{212}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may be each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and $R_{215}$ and $R_{216}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 may be 1 or 2.

$R_{213}$ and $R_{214}$ in Formulae 201A, and 201A-1 may bind to each other to form a saturated or unsaturated ring.

The compound represented by Formula 201, and the compound represented by Formula 202 may each independently include compounds HT1 to HT20 illustrated below, but are not limited thereto.

HT1

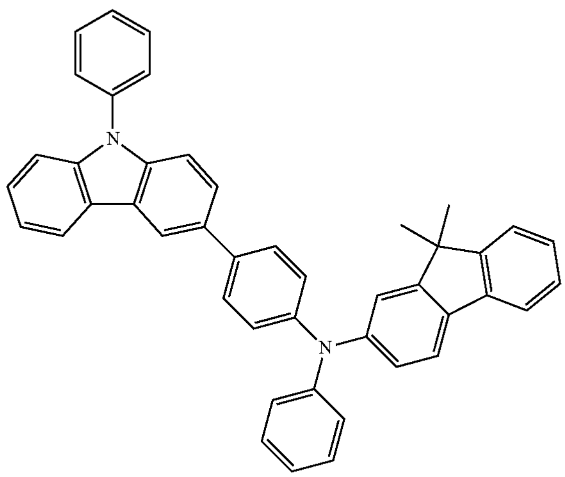

HT2

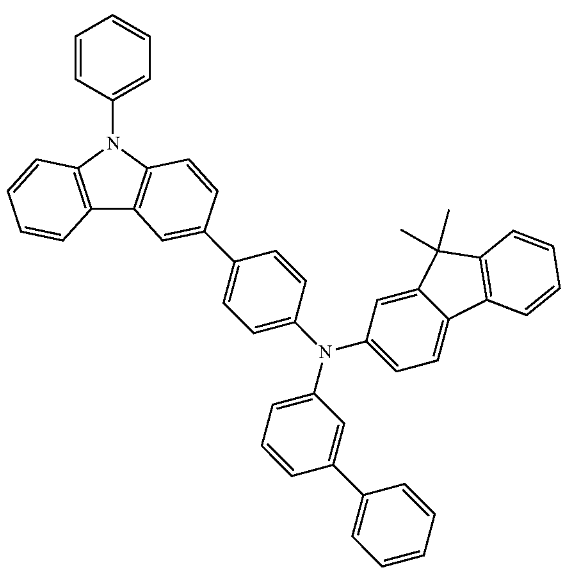

-continued

HT3

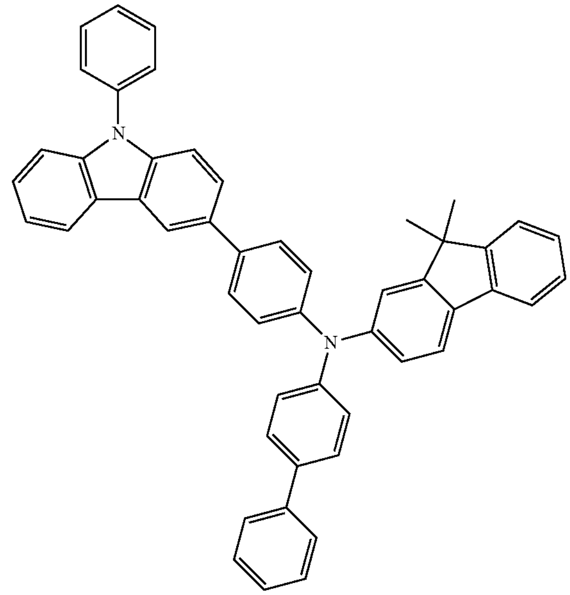

HT4

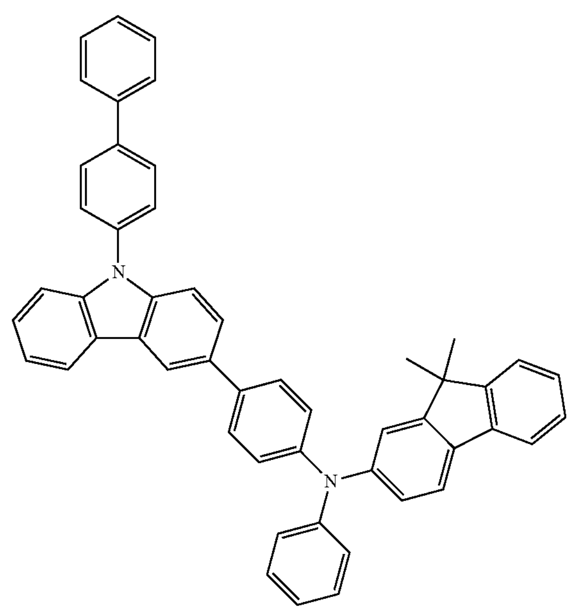

-continued
HT5
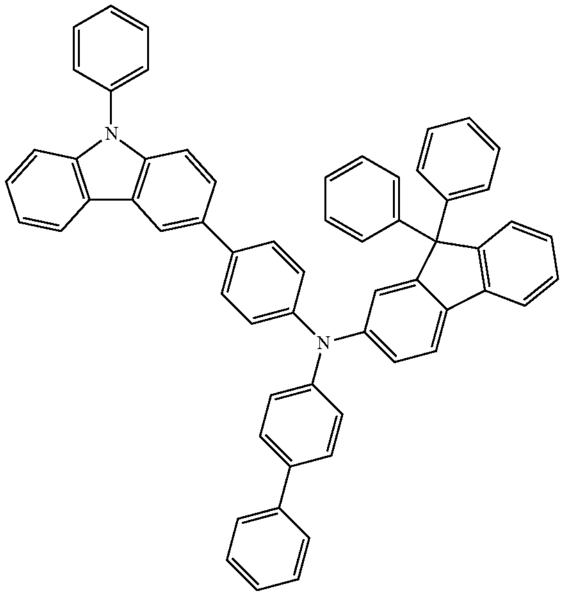
HT6
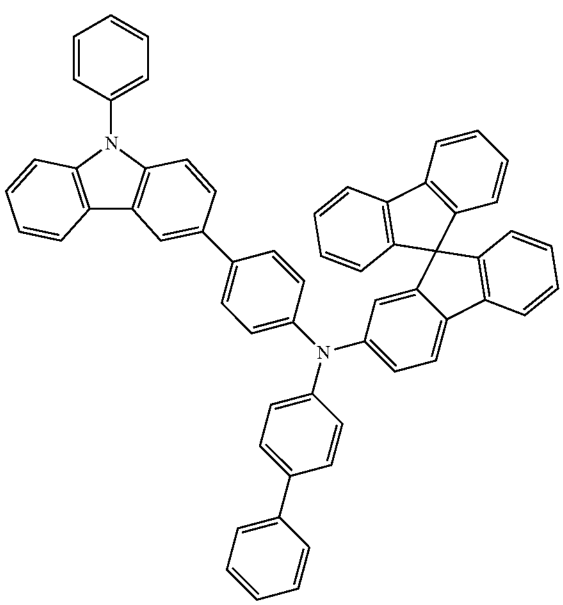
-continued
HT7
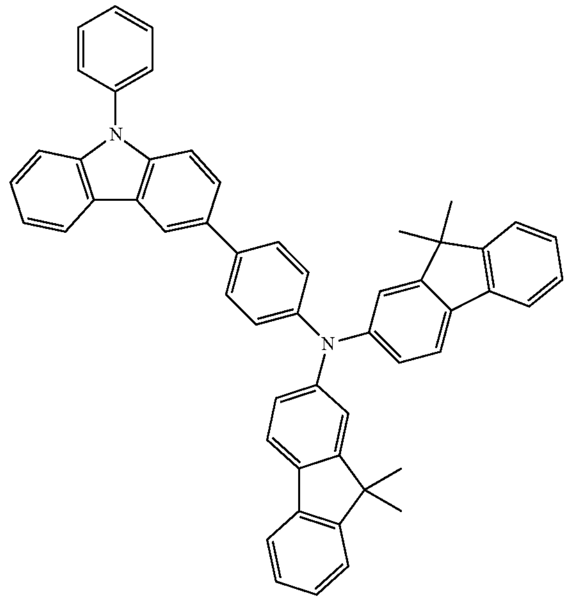
HT8
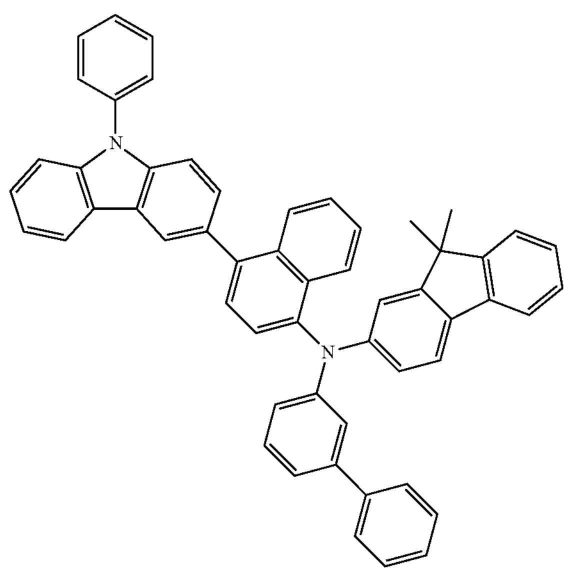

HT9
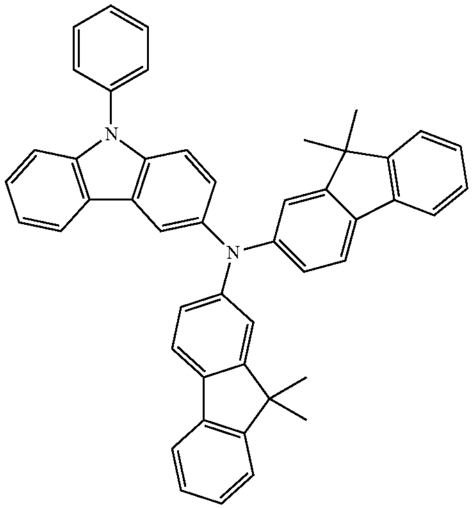
HT10
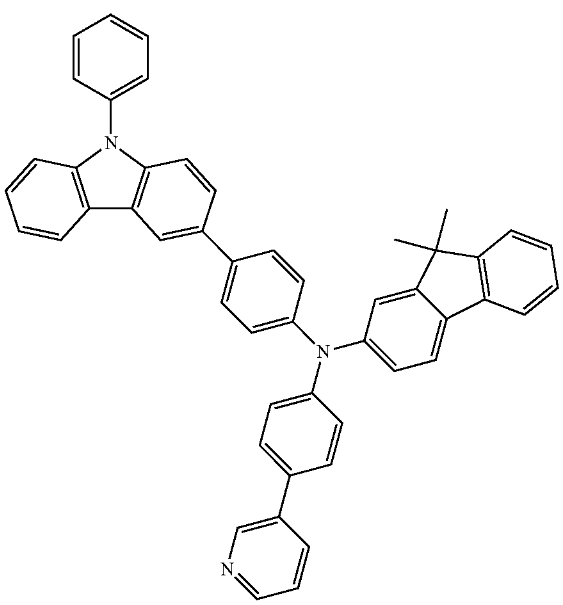
HT11
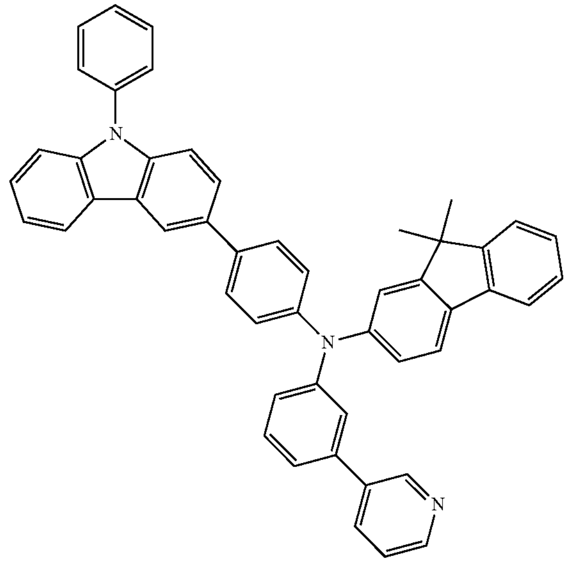
HT12
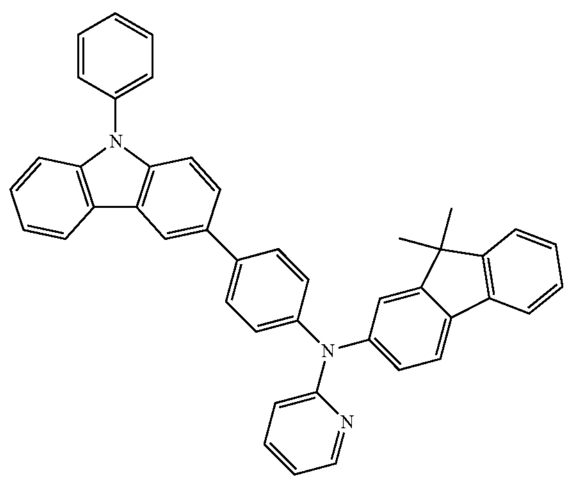
HT13
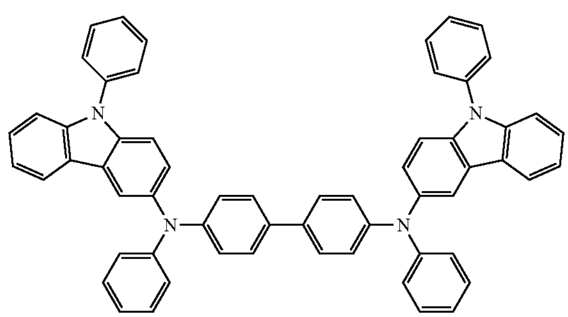

-continued

HT14

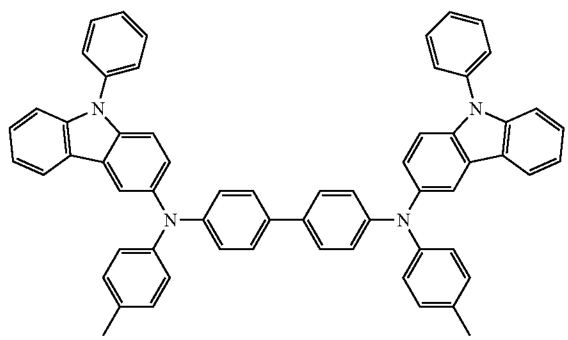

HT15

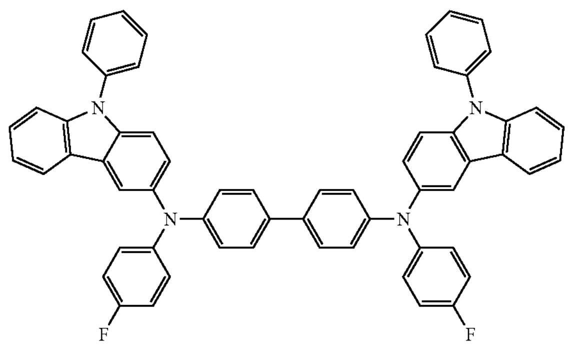

HT16

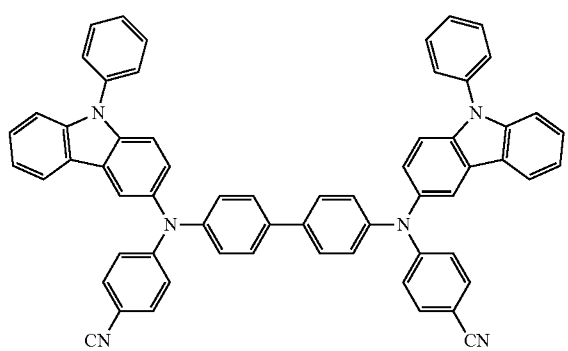

HT17

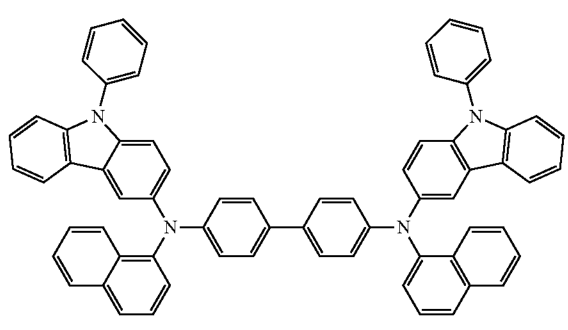

-continued

HT18

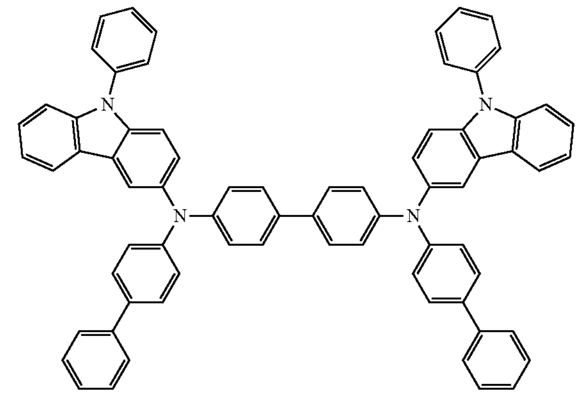

HT19

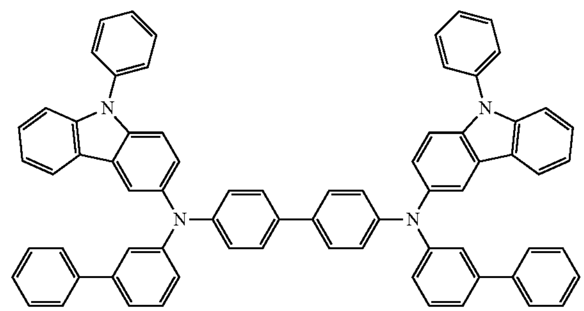

HT20

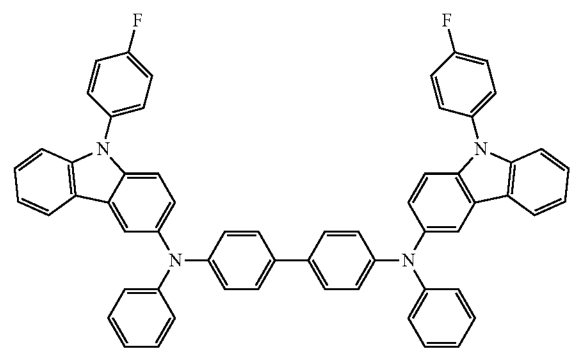

A thickness of the hole transport region may be in a range of about 100 Å to about 10,000 Å, for example, about 100 Å to about 1,000 Å. When the hole transport region includes both a hole injection layer and a hole transport layer, a thickness of the hole injection layer may be in a range of about 100 Å to about 10,000 Å, for example, about 100 Å to about 9,950 Å, or about 100 Å to about 1,000 Å, and a thickness of the hole transport layer may be in a range of about 50A to about 2,000 Å, for example about 100 Å to about 1,500 Å. When the thicknesses of the hole transport region, the hole injection layer, and the hole transport layer are within any of these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or unhomogeneously dispersed in the hole transport region.

The charge-generation material may be, for example, a p-dopant. The p-dopant may be selected from a quinone derivative, a metal oxide, and a cyano group-containing compound, but embodiments of the present invention are not limited thereto. Non-limiting examples of the p-dopant include quinone derivatives, such as tetracyanoquinonedimethane (TCNQ) and/or 2,3,5,6-tetrafluoro-tetracyano-1,4-benzoquinonedimethane (F4-TCNQ); metal oxides, such as tungsten oxide and/or molybdenum oxide, and Compound HT-D1 illustrated below.

Compound HT-D1

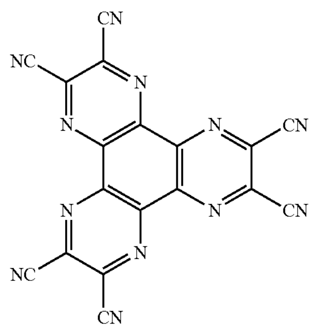

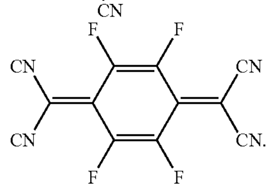

F4-TCNQ

The hole transport region may further include, in addition to the hole injection layer and the hole transport layer, at least one of a buffer layer and an electron blocking layer. Since the buffer layer may compensate for an optical resonance distance according to a wavelength of light emitted from the emission layer, light-emission efficiency of the formed organic light-emitting device may be improved. For use as a material included in the buffer layer, materials that are included in the hole transport region may be used. The electron blocking layer prevents or substantially blocks the injection of electrons from the electron transport region.

In some embodiments, an emission layer is formed on the first electrode 110 or the hole transport region by using (utilizing) one or more suitable methods, such as vacuum deposition, spin coating, casting, a LB method, ink-jet printing, laser-printing, and/or laser-induced thermal imaging. When the emission layer is formed by vacuum deposition and/or spin coating, deposition and coating conditions for the emission may be the same as (or similar to) those for the hole injection layer.

When the organic light-emitting device 10 is a full color organic light-emitting device, the emission layer may be patterned into a red emission layer, a green emission layer, and/or a blue emission layer, according to a sub pixel. In some embodiments, the emission layer may have a stacked structure of a red emission layer, a green emission layer, and a blue emission layer, or may include a red-light emission material, a green-light emission material, and a blue-light emission material, which are mixed with each other in a single layer, to emit white light. In some embodiments, the emission layer may be a white emission layer, and may further include a color converting layer or a color filter to turn white light into light of a desired color.

The emission layer may include a host and a dopant.

In some embodiments, the host may include a first compound represented by Formula 1 and a second compound represented by one of Formulae 2-1 to 2-5;

Formula 1

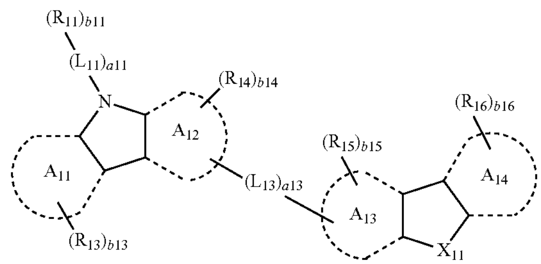

Formula 2-1

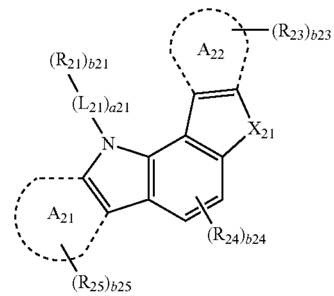

Formula 2-2

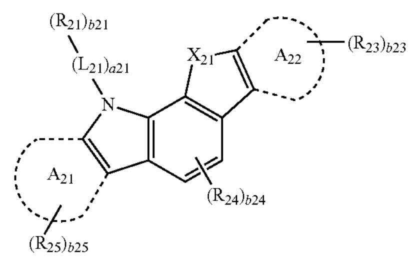

Formula 2-3

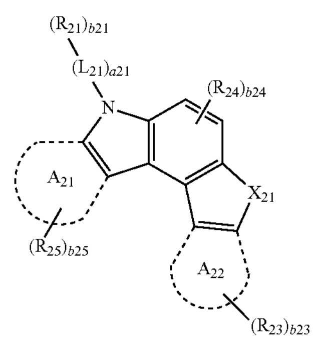

Formula 2-4

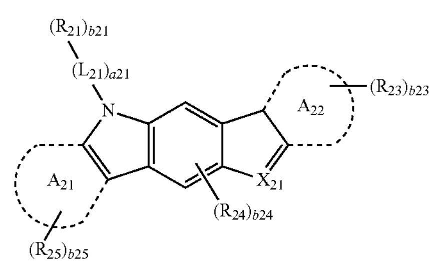

-continued

Formula 2-5

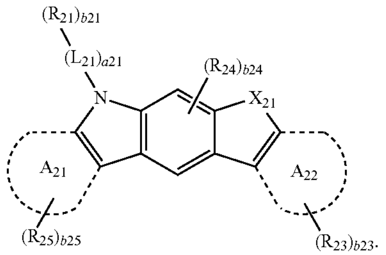

$A_{11}$, $A_{12}$, $A_{13}$, $A_{14}$, $A_{21}$, and $A_{22}$ in Formulae 1, and 2-1 to 2-5 may be each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, and a cinnoline.

For example, $A_{11}$, $A_{12}$, $A_{13}$, $A_{14}$, $A_{21}$, and $A_{22}$ in Formulae 1, and 2-1 to 2-5 may be each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, and a quinazoline.

In some embodiments, in Formula 1, $A_{11}$ and $A_{14}$ may be each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, and a quinazoline, and $A_{12}$ and $A_{13}$ may each independently be a benzene, but they are not limited thereto.

In some embodiments, in Formula 1, $A_{11}$ and $A_{14}$ may be each independently selected from a benzene and a naphthalene, and $A_{12}$ and $A_{13}$ may be each independently a benzene, but they are not limited thereto.

In some embodiments, $A_{11}$ to $A_{14}$ in Formula 1 may be each independently a benzene, but they are not limited thereto.

In some embodiments, $A_{21}$ and $A_{22}$ in Formulae 2-1 to 2-5 may be each independently a benzene, but they are not limited thereto.

$X_{11}$ in Formula 1 may be selected from O, S, $N[(L_{12})_{a12}\text{-}(R_{12})_{b12}]$, $C[(L_{12})_{a12}\text{-}(R_{12})_{b12}][R_{17}]$, $Si[(L_{12})_{a12}\text{-}(R_{12})_{b12}][R_{17}]$, $P[(L_{12})_{a12}\text{-}(R_{12})_{b12}]$, $B[(L_{12})_{a12}\text{-}(R_{12})_{b12}]$, and $P(=O)[(L_{12})_{a12}\text{-}(R_{12})_{b12}]$.

For example, $X_{11}$ in Formula 1 may be selected from O, S, $N[(L_{12})_{a12}\text{-}(R_{12})_{b12}]$, $C[(L_{12})_{a12}\text{-}(R_{12})_{b12}][R_{17}]$, $Si[(L_{12})_{a2}\text{-}(R_{12})_{b2}][R_{17}]$, $P[(L_{12})_{a12}\text{-}(R_{12})_{b12}]$, $B[(L_{12})_{a12}\text{-}(R_{12})_{b12}]$, and $P(=O)[(L_{12})_{a12}\text{-}(R_{12})_{b12}]$; and $R_{12}$ and $R_{17}$ may be optionally connected to each other to form a saturated or unsaturated ring, but they are not limited thereto.

In some embodiments, $X_{11}$ in Formula 1 may be selected from O, S, $N[(L_{12})_{a12}\text{-}(R_{12})_{b12}]$, and $C[(L_{12})_{a12}\text{-}(R_{12})_{b12}][R_{17}]$, but is not limited thereto.

$X_{21}$ in Formulae 2-1 to 2-5 may be selected from O, S, $N[(L_{22})_{a22}\text{-}(R_{22})_{b22}]$, $C[(L_{22})_{a22}\text{-}(R_{22})_{b22}][R_{26}]$, $Si[(L_{22})_{a22}\text{-}(R_{22})_{b22}][R_{26}]$, $P[(L_{22})_{a22}\text{-}(R_{22})_{b22}]$, $B[(L_{22})_{a22}\text{-}(R_{22})_{b22}]$, and $P(=O)[(L_{22})_{a22}\text{-}(R_{22})_{b22}]$.

For example, $X_{21}$ in Formulae 2-1 to 2-5 may be selected from O, S, $N[(L_{22})_{a22}\text{-}(R_{22})_{b22}]$ and $C[(L_{22})_{a22}\text{-}(R_{22})_{b22}][R_{26}]$, but is not limited thereto.

$L_{11}$ to $L_{13}$, $L_{21}$, and $L_{22}$ in Formulae 1 and 2-1 to 2-5 may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group; and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, and the substituted divalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $-N(Q_{11})(Q_{12})$, $-Si(Q_{13})(Q_{14})(Q_{15})$, and $-B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$;

where $Q_{11}$ to $Q_{17}$, $Q_{21}$ to $Q_{27}$, and $Q_{31}$ to $Q_{37}$ may be each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, $L_{11}$ to $L_{13}$, $L_{21}$, and $L_{22}$ in Formulae 1 and 2-1 to 2-5 may be each independently selected from a phenylene group, a naphthylene group, a fluorenylene group, a phenanthrenylene group, a anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group; and a phenylene group, a naphthylene group, a fluorenylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an indazolyl group, a quinolinyl group, an isoquinolinyl group, a carbazolyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, an oxadiazolyl group, a triazinyl group, a dibenzofuranyl group, a dibenzothiophenyl group, a benzocarbazolyl group and a dibenzocarbazolyl group, but they are not limited thereto.

In some embodiments, $L_{11}$ to $L_{13}$, $L_{21}$, and $L_{22}$ in Formulae 1 and 2-1 to 2-5 may be each independently selected from a phenylene group, a naphthylene group, a fluorenylene group, a dibenzofuranylene group, and a dibenzothiophenylene group; and a phenylene group, a naphthylene group, a fluorenylene group, a dibenzofuranylene group, and a dibenzothiophenylene group, each substituted with at least one selected from deuterium, —F, —Cl, —Br, —I, a cyano group, a nitro group, a $C_1$-$C_{20}$ alkyl group, a phenyl group, and a naphthyl group, but they are not limited thereto.

In some embodiments, $L_{11}$ to $L_{13}$, $L_{21}$, and $L_{22}$ in Formulae 1 and 2-1 to 2-5 may be each independently selected from groups represented by Formulae 3-1 to 3-19, but they are not limited thereto:

3-1

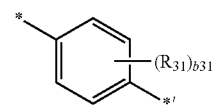

3-2

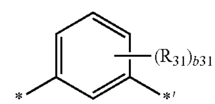

3-3

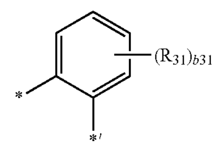

3-4

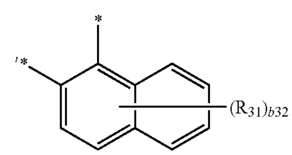

3-5

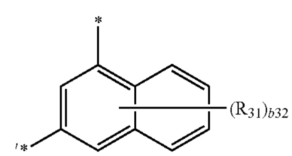

3-6

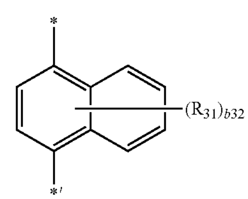

3-7

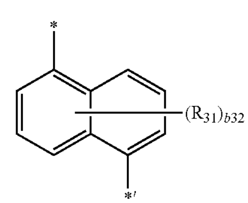

3-8

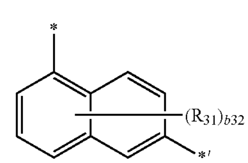

-continued 3-9

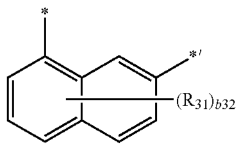

3-10

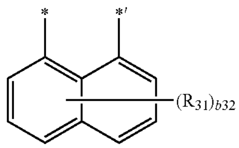

3-11

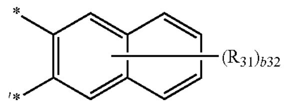

3-12

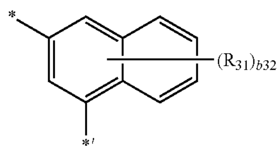

3-13

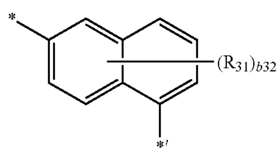

3-14

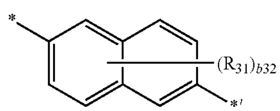

3-15

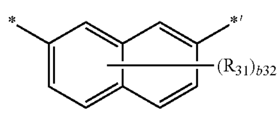

3-16

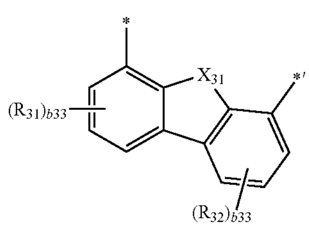

3-17

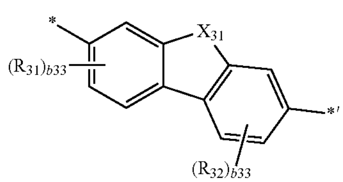

3-18

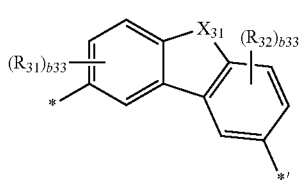

-continued 3-19

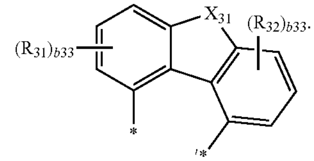

In Formulae 3-1 to 3-19, $X_{31}$ may be selected from O, S, and $C(R_{33})(R_{34})$;

$R_{31}$ to $R_{34}$ may be each independently selected from hydrogen, deuterium, —F, —Cl, —Br, —I, a cyano group, a nitro group, a methyl group, an ethyl group, an n-propyl group, an iso-propyl group, an n-butyl group, iso-butyl group, a sec-butyl group, a tert-butyl group, a phenyl group, and a naphthyl group;

b31 may be selected from 1, 2, 3, and 4;

b32 may be selected from 1, 2, 3, 4, 5, and 6;

b33 may be selected from 1, 2, and 3; and

* and *' each indicate a binding site to a neighboring atom.

In some embodiments, $L_{11}$ to $L_{13}$, $L_{21}$, and $L_{22}$ in Formulae 1 and 2-1 to 2-5 may be each independently selected from groups represented by Formulae 4-1 to 4-13, but they are not limited thereto:

4-1

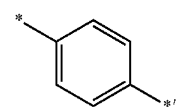

4-2

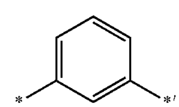

4-3

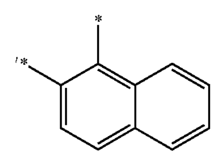

4-4

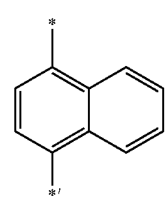

4-5

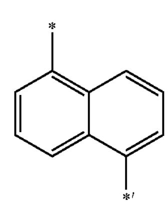

4-6

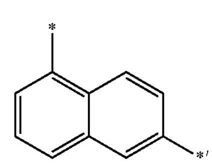

-continued 4-7

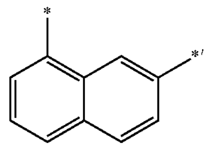

4-8

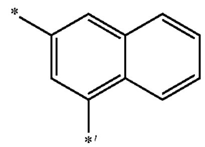

4-9

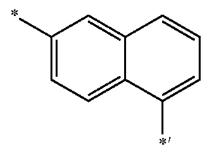

4-10

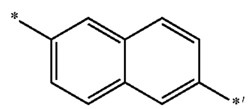

4-11

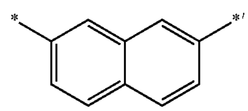

4-12

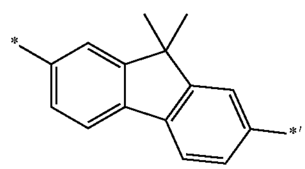

4-13

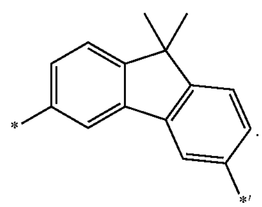

In Formulae 4-1 to 4-13,

* and *' each indicate a binding site to a neighboring atom.

a11 in Formula 1 indicates the number of $L_{11}$, and a11 may be selected from 0, 1, 2, 3, 4, and 5. When a11 is 0, $-(L_{11})_{a11}-$ indicates a single bond. When a11 is 2 or more, a plurality of $L_{11}$ may be identical to or different from each other. For example, a11 in Formula 1 may be selected from 0 and 1, but is not limited thereto.

a12 in Formula 1 indicates the number of $L_{12}$, and a12 may be selected from 0, 1, 2, 3, 4, and 5. When a12 is 0, $-(L_{12})_{a12}-$ is a single bond. When a12 is 2 or more, a plurality of $L_{12}$ may be identical to or different from each other. For example, a12 in Formula 1 may be selected from 0 and 1, but is not limited thereto.

a13 in Formula 1 indicates the number of $L_{13}$, and a13 may be selected from 0, 1, 2, 3, 4, and 5. When a13 is 0, $-(L_{13})_{a13}-$ indicates a single bond. When a13 is 2 or more, a plurality of $L_{13}$ may be identical to or different from each other. For example, a13 in Formula 1 may be selected from 0 and 1, but is not limited thereto. In some embodiments, a13 in Formula 1 may be 0, but is not limited thereto.

a21 in Formulae 2-1 to 2-5 indicates the number of $L_{21}$, and a21 may be selected from 0, 1, 2, 3, 4, and 5. When a21 is 0, $-(L_{21})_{a21}-$ indicates a single bond. When a21 is 2 or more, a plurality of $L_{21}$ may be identical to or different from each other. For example, a21 in Formula 1 may be selected from 0 and 1, but is not limited thereto.

a22 in Formulae 2-1 to 2-5 indicates the number of $L_{22}$, and a22 may be selected from 0, 1, 2, 3, 4, and 5. When a22 is 0, $-(L_{22})_{a22}-$ is a single bond. When a22 is 2 or more, a plurality of $L_{22}$ may be identical to or different from each other. For example, a22 in Formula 1 may be selected from 0 and 1, but is not limited thereto.

In Formulae 1 and 2-1 to 2-5, $R_{11}$ and $R_{12}$ may be each independently selected from $R_{HT}$ and $R_{ET}$, provided that at least one selected from $R_{11}$ and $R_{12}$ is $R_{ET}$; and $R_{21}$ and $R_{22}$ may be each independently $R_{HT}$; where $R_{HT}$ is a hole transport group and $R_{ET}$ is an electron transport group. $R_{HT}$ and $R_{ET}$ will be described in detail later.

b11 in Formula 1 indicates the number of $R_{11}$, and b11 may be selected from 1, 2, 3, and 4. When b11 is 2 or more, a plurality of $R_{11}$ may be identical to or different from each other.

b12 in Formula 1 indicates the number of $R_{12}$, and b12 may be selected from 0, 1, 2, 3, and 4. When b12 is 2 or more, a plurality of $R_{12}$ may be identical to or different from each other.

b21 in Formulae 2-1 to 2-5 indicates the number of $R_{21}$, and may be selected from 1, 2, 3, and 4. When b21 is 2 or more, a plurality of $R_{21}$ may be identical to or different from each other.

b22 in Formulae 2-1 to 2-5 indicates the number of $R_{22}$, and may be selected from 1, 2, 3, and 4. When b22 is 2 or more, a plurality of $R_{22}$ may be identical to or different from each other.

$R_{13}$ to $R_{17}$ and $R_{23}$ to $R_{26}$ in Formulae 1 and 2-1 to 2-5 may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), and —B($Q_6$)($Q_7$);

at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted a monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$);

where $Q_1$ to $Q_7$, $Q_{11}$ to $Q_{17}$, $Q_{21}$ to $Q_{27}$ and $Q_{31}$ to $Q_{37}$ may be each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, $R_{13}$ to $R_{17}$ and $R_{23}$ to $R_{26}$ in Formulae 1 and 2-1 to 2-5 may be each independently selected from hydrogen, a methyl group, an ethyl group, an n-propyl group, an n-butyl group, a phenyl group, a naphthyl group, an anthryl group, a pyrenyl group, a phenanthrenyl group, a fluorenyl group, a carbazolyl group, —N($Q_1$)($Q_2$), and —Si($Q_3$)($Q_4$)($Q_5$); and a phenyl group, a naphthyl group, an anthryl group, a pyrenyl group, a phenanthrenyl group, a fluorenyl group, and a carbazolyl group, each substituted with at least one selected from deuterium, —F, —Cl, —Br, —I, a cyano group, a nitro group, a methyl group, a phenyl group, and a naphthyl group, where $Q_1$ to $Q_5$ may be each independently selected from a $C_1$-$C_{60}$ alkyl group, a $C_6$-$C_{60}$ aryl group, a monovalent non-aromatic condensed polycyclic group, and a monovalent non-aromatic condensed heteropolycyclic group, but they are not limited thereto.

In some embodiments, $R_{13}$ to $R_{17}$ and $R_{23}$ to $R_{26}$ in Formulae 1 and 2-1 to 2-5 may be each independently selected from hydrogen, a methyl group, a phenyl group, a naphthyl group, a carbazolyl group, —N($Q_1$)($Q_2$), and —Si($Q_3$)($Q_4$)($Q_5$), where $Q_1$ to $Q_5$ may be each independently selected from a methyl group, an ethyl group, a phenyl group, and a naphthyl group, but they are not limited thereto.

In some embodiments, $R_{13}$ to $R_{17}$ and $R_{23}$ to $R_{26}$ in Formulae 1 and 2-1 to 2-5 may be each independently hydrogen, but they are not limited thereto.

b13 to b16 and b23 to b25 in Formulae 1 and 2-1 to 2-5 may be each independently selected from 1, 2, 3, and 4.

For example, $R_{HT}$ in Formulae 1 and 2-1 to 2-5 may be selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a thianthrenyl group, a phenoxathinyl group, and a dibenzodioxinyl group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a thianthrenyl group, a phenoxathinyl group, and a dibenzodioxinyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, —N($Q_{41}$)($Q_{42}$), —Si($Q_{43}$)($Q_{44}$)($Q_{45}$), and —B($Q_{46}$)($Q_{47}$); and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a thianthrenyl group, a phenoxathinyl group, and a dibenzodioxinyl group, each substituted with at least one selected from a phenyl group, a naphthyl group, a fluorenyl group, and a carbazolyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a benzofluorenyl group, a dibenzofluorenyl group, a carbazolyl group, —N($Q_{51}$)($Q_{52}$), —Si($Q_{53}$)($Q_{54}$)($Q_{55}$), and —B($Q_{56}$)($Q_{57}$);

where $Q_{41}$ to $Q_{47}$ and $Q_{51}$ to $Q_{57}$ may be each independently selected from a $C_1$-$C_{60}$ alkyl group, a $C_6$-$C_{60}$ aryl group, a monovalent non-aromatic condensed polycyclic group, and a monovalent non-aromatic condensed heteropolycyclic group, but embodiments of the present invention are not limited thereto.

In some embodiments, $R_{HT}$ in Formulae 1 and 2-1 to 2-5 may be selected from a phenyl group, a naphthyl group, a fluorenyl group, a phenanthrenyl group, an anthracenyl group, a triphenylenyl group, a carbazolyl group, a benzofuranyl group, a benzothiophenyl group, a dibenzofuranyl group, a dibenzothiophenyl group, a thianthrenyl group, a phenoxathinyl group and a dibenzodioxinyl group;

a phenyl group, a naphthyl group, a fluorenyl group, a phenanthrenyl group, an anthracenyl group, a triphenylenyl group, a carbazolyl group, a benzofuranyl group, a benzothiophenyl group, a dibenzofuranyl group, a dibenzothiophenyl group, a thianthrenyl group, a phenoxathinyl group, and a dibenzodioxinyl group, each substituted with at least one selected from deuterium, a $C_1$-$C_{20}$ alkyl group, a $C_1$-$C_{20}$ alkoxy group, a phenyl group, a naphthyl group, a fluorenyl group, a carbazolyl group, —N($Q_{41}$)($Q_{42}$), and —Si($Q_{43}$)($Q_{44}$)($Q_{45}$); and a phenyl group, a naphthyl group, a fluorenyl group, a phenanthrenyl group, an anthracenyl group, a triphenylenyl group, a carbazolyl group, a benzofuranyl group, a benzothiophenyl group, a dibenzofuranyl group, a dibenzothiophenyl group, a thianthrenyl group, a phenoxathinyl group, and a dibenzodioxinyl group, each substituted with at least one selected from a phenyl group, a naphthyl group, a fluorenyl group and a carbazolyl group, each substituted with at least one selected from deuterium, a $C_1$-$C_{20}$ alkyl group, a $C_1$-$C_{20}$ alkoxy group, a phenyl group, a naphthyl group, —N($Q_{51}$)($Q_{52}$), and —Si($Q_{53}$)($Q_{54}$)($Q_{55}$);

where $Q_{41}$ to $Q_{45}$ and $Q_{51}$ to $Q_{55}$ may be each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group, but embodiments of the present invention are not limited thereto.

In some embodiments, $R_{HT}$ in Formulae 1 and 2-1 to 2-5 may be selected from groups represented by Formulae 5-1 to 5-12, but embodiments are not limited thereto:

5-1

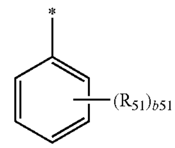

5-2

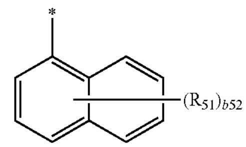

5-3

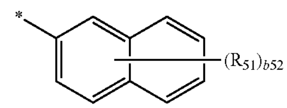

5-4

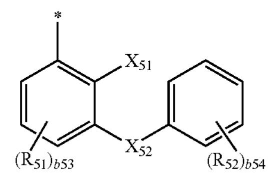

5-5

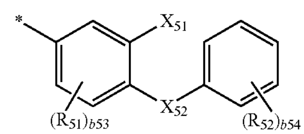

5-6

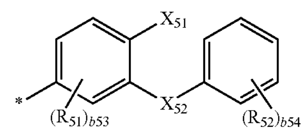

5-7

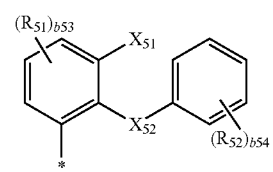

5-8

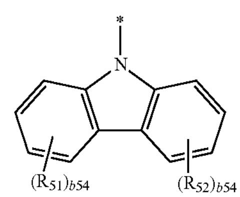

5-9

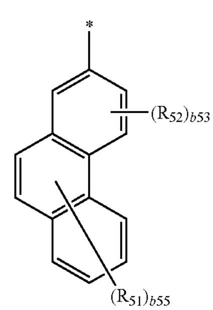

-continued

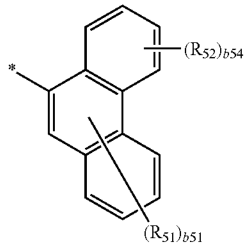

5-10

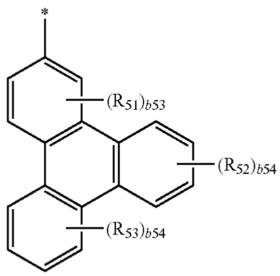

5-11

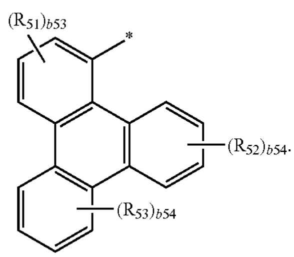

5-12

In Formulae 5-1 to 5-12, $X_{51}$ is selected from a single bond, $N(R_{54})$, $C(R_{54})(R_{55})$, O, and S;

$X_{52}$ is selected from $N(R_{56})$, $C(R_{56})(R_{57})$, O, and S;

$R_{51}$ to $R_{57}$ may be each independently selected from:

deuterium, a $C_1$-$C_{20}$ alkyl group, a phenyl group, a naphthyl group, a fluorenyl group, a carbazolyl group, —$N(Q_{41})(Q_{42})$, and —$Si(Q_{43})(Q_{44})(Q_{45})$; and a phenyl group, a naphthyl group, a fluorenyl group, and a carbazolyl group, each substituted with at least one selected from deuterium, a $C_1$-$C_{20}$ alkyl group, a phenyl group, a naphthyl group, —$N(Q_{51})(Q_{52})$, and —$Si(Q_{53})(Q_{54})(Q_{55})$;

where $Q_{41}$ to $Q_{45}$ and $Q_{51}$ to $Q_{55}$ are each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group;

b51 may be selected from 1, 2, 3, 4, and 5;

b52 may be selected from 1, 2, 3, 4, 5, 6, and 7;

b53 may be selected from 1, 2, and 3;

b54 may be selected from 1, 2, 3, and 4;

b55 may be selected from 1, 2, 3, 4, 5, and 6; and

* indicates a binding site to a neighboring atom.

For example, $R_{ET}$ in Formulae 1 and 2-1 to 2-5 may be selected from a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a benzophenanthrolinyl group, a phenazinyl group, a benzimidazolyl group, a naphthoimidazolyl group, a benzothiazolyl group, an isobenzothiazolyl group, a benzoxazolyl group, an isobenzoxazolyl group, a triazolyl group, a tetrazolyl group, an oxadiazolyl group, a triazinyl group, an imidazopyridinyl group, an imidazopyrimidinyl group, an imidazoquinolinyl group, an imidazoisoquinolinyl group, a pyridobenzofuranyl group, a pyrimidobenzofuranyl group, a pyridobenzothiophenyl group, and a pyrimidobenzothiophenyl group;

a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a benzophenanthrolinyl group, a phenazinyl group, a benzimidazolyl group, a naphthoimidazolyl group, a benzothiazolyl group, an isobenzothiazolyl group, a benzoxazolyl group, an isobenzoxazolyl group, a triazolyl group, a tetrazolyl group, an oxadiazolyl group, a triazinyl group, an imidazopyridinyl group, an imidazopyrimidinyl group, an imidazoquinolinyl group, an imidazoisoquinolinyl group, a pyridobenzofuranyl group, a pyrimidobenzofuranyl group, a pyridobenzothiophenyl group, and a pyrimidobenzothiophenyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, a pyridinyl group, a pyrimidinyl group, a triazinyl group, —$N(Q_{41})(Q_{42})$, —$Si(Q_{43})(Q_{44})(Q_{45})$, and —$B(Q_{46})(Q_{47})$; and a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a benzophenanthrolinyl group, a phenazinyl group, a benzimidazolyl group, a naphthoimidazolyl group, a benzothiazolyl group, an isobenzothiazolyl group, a benzoxazolyl group, an isobenzoxazolyl group, a triazolyl group, a tetrazolyl group, an oxadiazolyl group, a triazinyl group, an imidazopyridinyl group, an imidazopyrimidinyl group, an imidazoquinolinyl group, an imidazoisoquinolinyl group, a pyridobenzofuranyl group, a pyrimidobenzofuranyl group, a pyridobenzothiophenyl group, and a pyrimidobenzothiophenyl group, each substituted with at least one selected from a phenyl group, a naphthyl group, a fluorenyl group, a carbazolyl group, a pyridinyl group, a pyrimidinyl group, and a triazinyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a benzofluorenyl group, a dibenzofluorenyl group, a carbazolyl group, a pyridinyl group, a pyrimidinyl group, a triazinyl group, —N($Q_{51}$)($Q_{52}$), —Si($Q_{53}$)($Q_{54}$)($Q_{55}$), and —B($Q_{56}$)($Q_{57}$);

where $Q_{41}$ to $Q_{47}$ and $Q_{51}$ to $Q_{57}$ may be each independently selected from a $C_1$-$C_{60}$ alkyl group, a $C_6$-$C_{60}$ aryl group, a monovalent non-aromatic condensed polycyclic group, and a monovalent non-aromatic condensed heteropolycyclic group, but embodiments of the present invention are not limited thereto.

In some embodiments, $R_{ET}$ in Formulae 1 and 2-1 to 2-5 may be selected from a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a phenanthridinyl group, a phenanthrolinyl group, a benzophenanthrolinyl group, a benzimidazolyl group, a naphthoimidazolyl group, a triazinyl group, an imidazopyridinyl group, an imidazopyrimidinyl group, an imidazoquinolinyl group, and an imidazoisoquinolinyl group;

a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a phenanthridinyl group, a phenanthrolinyl group, a benzophenanthrolinyl group, a benzimidazolyl group, a naphthoimidazolyl group, a triazinyl group, an imidazopyridinyl group, an imidazopyrimidinyl group, an imidazoquinolinyl group, and imidazoisoquinolinyl group, each substituted with at least one selected from deuterium, a $C_1$-$C_{20}$ alkyl group, a phenyl group, a naphthyl group, a fluorenyl group, a carbazolyl group, a pyridinyl group, —N($Q_{41}$)($Q_{42}$), and —Si($Q_{43}$)($Q_{44}$)($Q_{45}$); and a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a phenanthridinyl group, a phenanthrolinyl group, a benzophenanthrolinyl group, a benzimidazolyl group, a naphthoimidazolyl group, a triazinyl group, an imidazopyridinyl group, an imidazopyrimidinyl group, an imidazoquinolinyl group, and an imidazoisoquinolinyl group, each substituted with at least one selected from a phenyl group, a naphthyl group, a fluorenyl group, a carbazolyl group and a pyridinyl group, each substituted with at least one selected from deuterium, a $C_1$-$C_{20}$ alkyl group, a phenyl group, a naphthyl group, a pyridinyl group, —N($Q_{51}$)($Q_{52}$), and —Si($Q_{53}$)($Q_{54}$)($Q_{55}$);

where $Q_{41}$ to $Q_{45}$ and $Q_{51}$ to $Q_{55}$ may be each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group, but embodiments of the present invention are not limited thereto.

In some embodiments, $R_{ET}$ in Formulae 1 and 2-1 to 2-5 may be selected from groups represented by Formulae 6-1 to 6-63, but is not limited thereto:

6-1

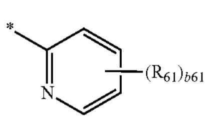

-continued 6-2

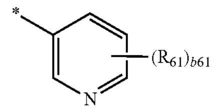

6-3

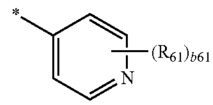

6-4

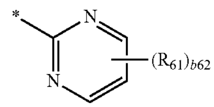

6-5

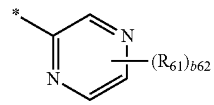

6-6

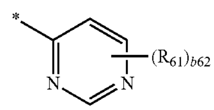

6-7

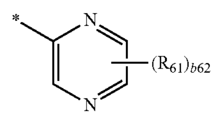

6-8

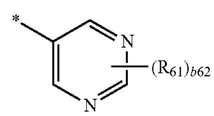

6-9

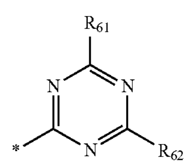

6-10

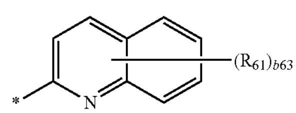

6-11

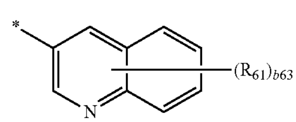

6-12

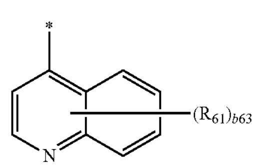

6-13

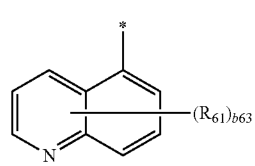

-continued
6-14
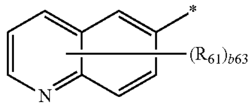
6-15
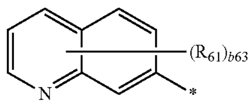
6-16
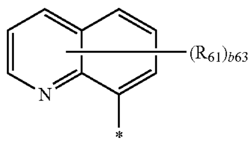
6-17
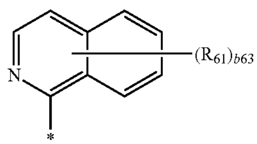
6-18
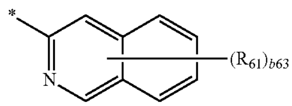
6-19
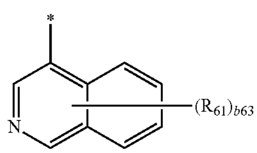
6-20
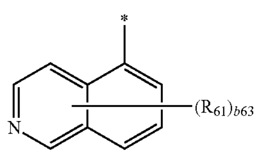
6-21
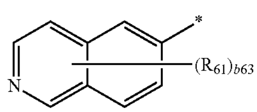
6-22
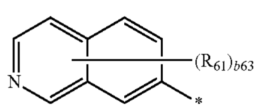
6-23
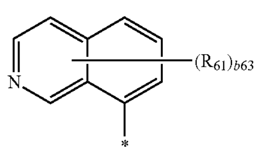
6-24
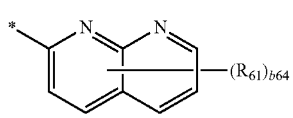
6-25
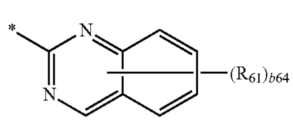
-continued
6-26
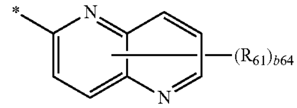
6-27
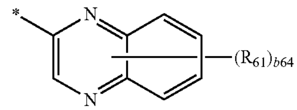
6-28
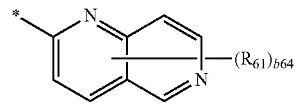
6-29
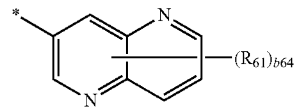
6-30
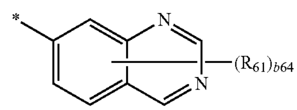
6-31
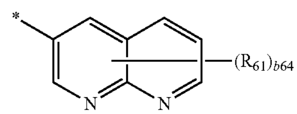
6-32
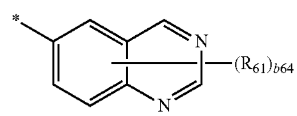
6-33
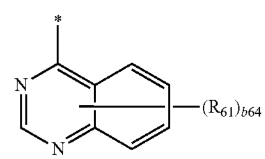
6-34
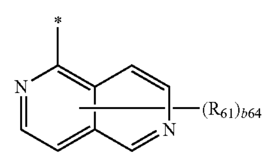
6-35
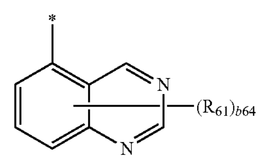
6-36
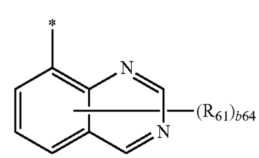
6-37
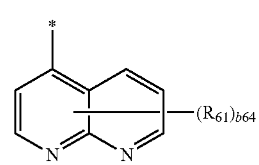

-continued
6-38
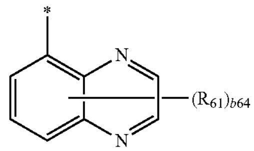
6-39
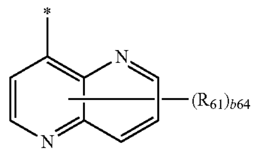
6-40
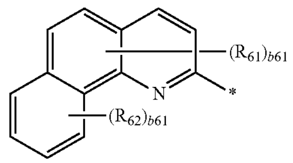
6-41
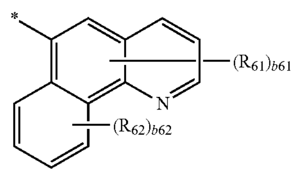
6-42
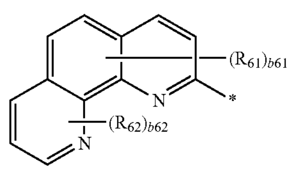
6-43
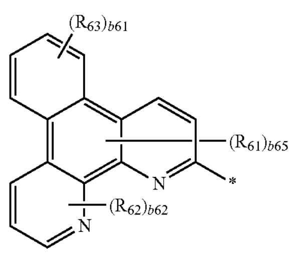
6-44
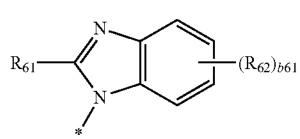
6-45
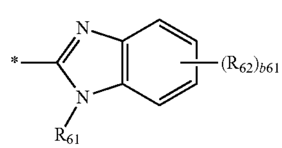
6-46
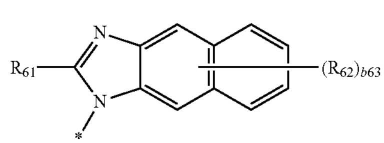
-continued
6-47
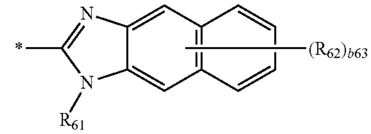
6-48
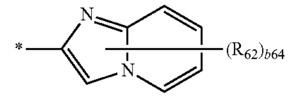
6-49
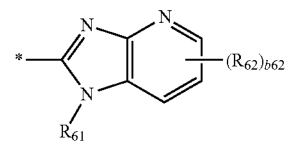
6-50
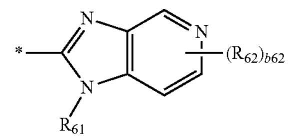
6-51
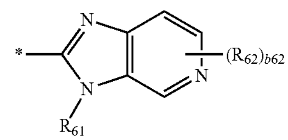
6-52
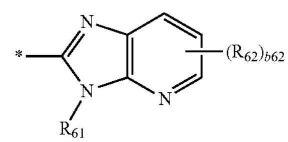
6-53
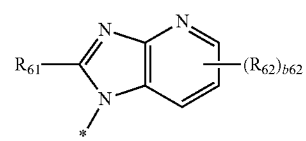
6-54
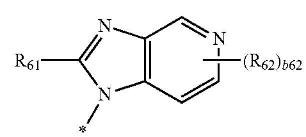
6-55
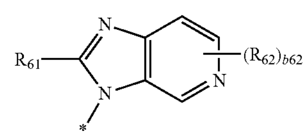
6-56
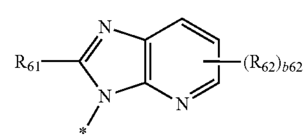
6-57
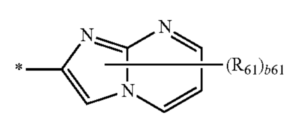
6-58
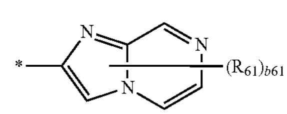

-continued 6-59

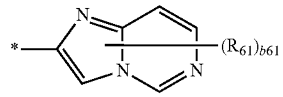

6-60

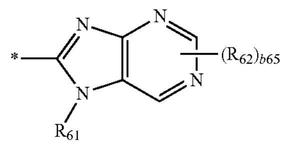

6-61

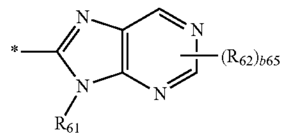

6-62

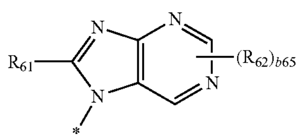

6-63

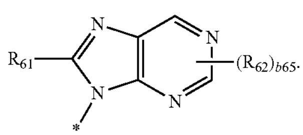

In Formulae 6-1 to 6-63, $R_{61}$ to $R_{63}$ may be each independently selected from:

deuterium, a $C_1$-$C_{20}$ alkyl group, a phenyl group, a naphthyl group, a fluorenyl group, a carbazolyl group, a pyridinyl group, —N($Q_{41}$)($Q_{42}$), and —Si($Q_{43}$)($Q_{44}$)($Q_{45}$); and a phenyl group, a naphthyl group, a fluorenyl group, a carbazolyl group, a pyridinyl group, each substituted with at least one selected from deuterium, a $C_1$-$C_{20}$ alkyl group, a phenyl group, a naphthyl group, a pyridinyl group, —N($Q_{51}$)($Q_{52}$), and —Si($Q_{53}$)($Q_{54}$)($Q_{55}$);

where $Q_{41}$ to $Q_{45}$ and $Q_{51}$ to $Q_{55}$ may be each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group;

b61 may be selected from 1, 2, 3, and 4; and b62 may be selected from 1, 2, and 3;

b63 may be selected from 1, 2, 3, 4, 5, and 6;

b64 may be selected from 1, 2, 3, 4, and 5;

b65 may be selected from 1 and 2; and

* indicates a binding site to a neighboring atom.

For example, the first compound may be represented by Formula 1-1 below, but is not limited thereto:

Formula 1-1

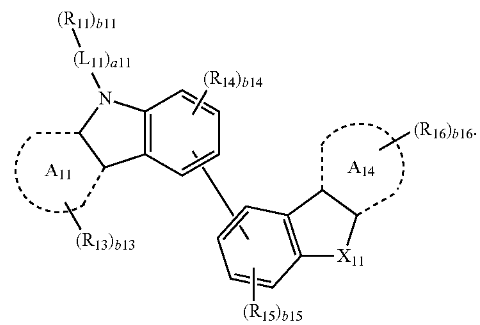

In Formula 1-1, descriptions of $A_{11}$, $A_{14}$, $X_{11}$, $L_{11}$, a11, $R_{11}$, $R_{13}$ to $R_{16}$, b11, and b13 to b16 are the same as described above.

In some embodiments, the second compound may be represented by any one of Formulae 2-11 to 2-15 below, but embodiments of the present invention are not limited thereto:

Formula 2-11

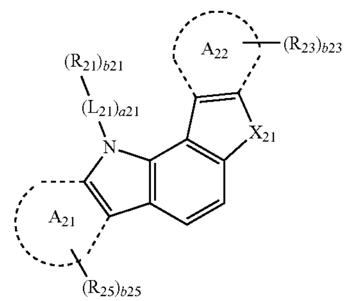

Formula 2-12

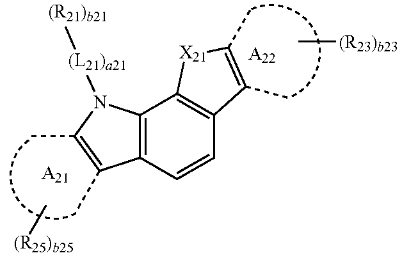

-continued
Formula 2-13
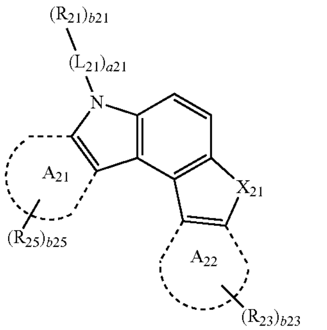
Formula 2-14
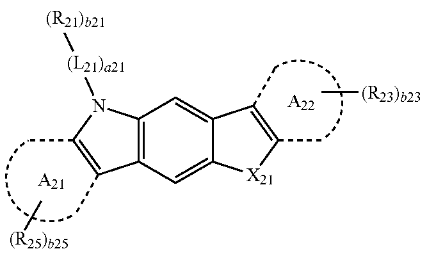
-continued
Formula 2-15
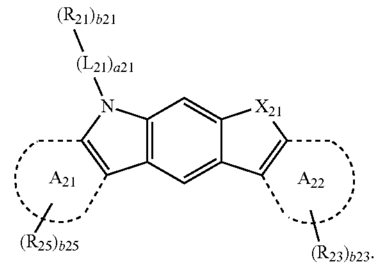
In Formulae 2-11 to 2-15,
descriptions of $A_{21}$, $A_{22}$, $L_{21}$, a21, $X_{21}$, $R_{21}$, $R_{23}$, $R_{25}$, b21, b23, and b25 are the same as described above.
In some embodiments, the first compound may be selected from Compounds 101A to 206A below, but is not limited thereto:
101A
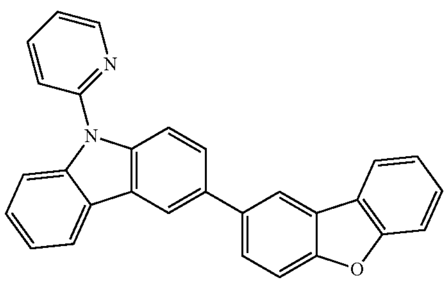
102A
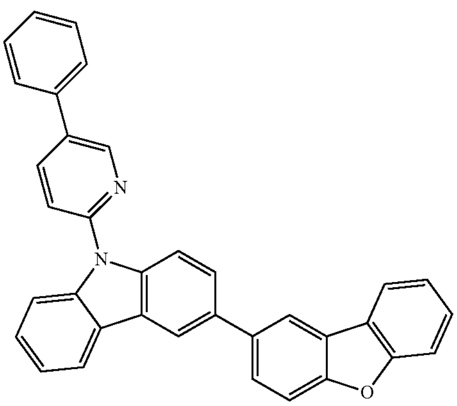
103A
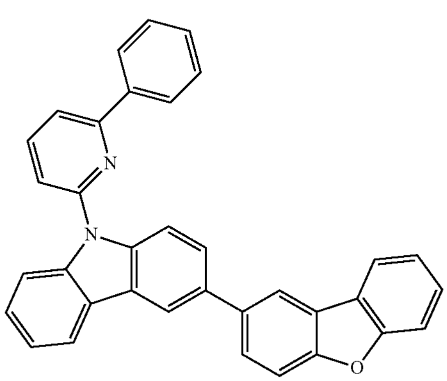
104A
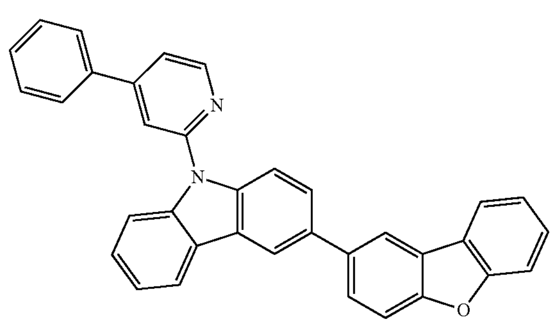

-continued
105A
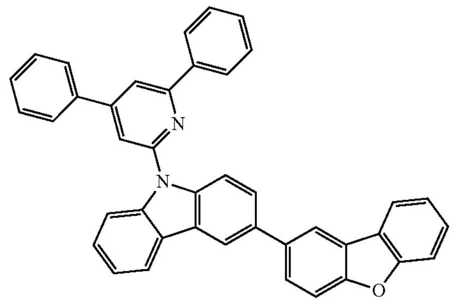
106A
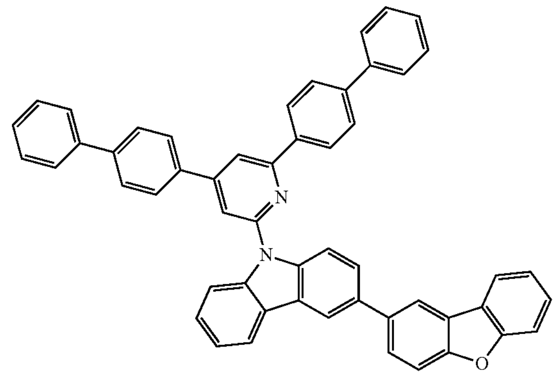
107A
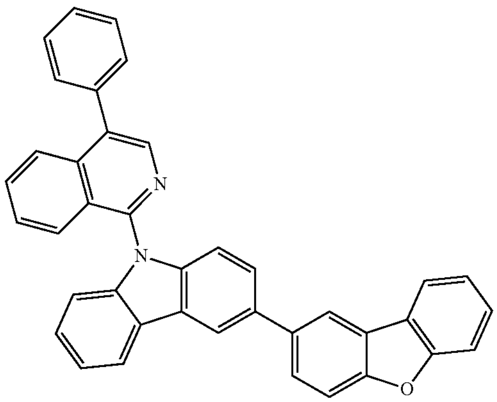
108A
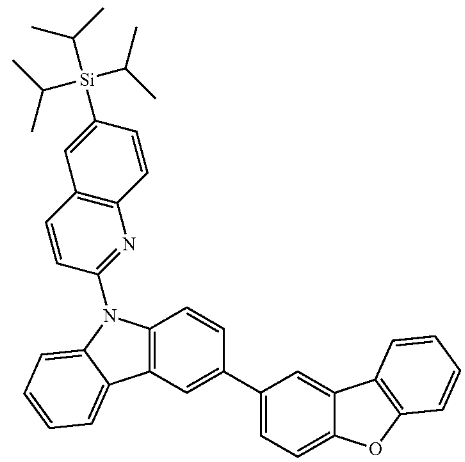
109A
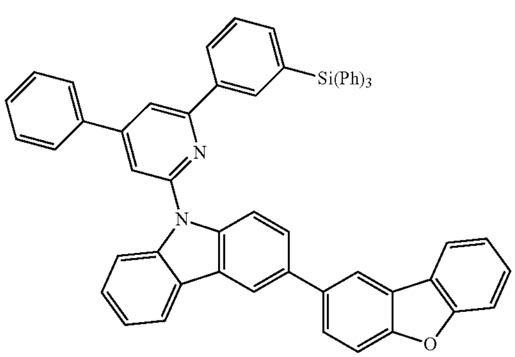
110A
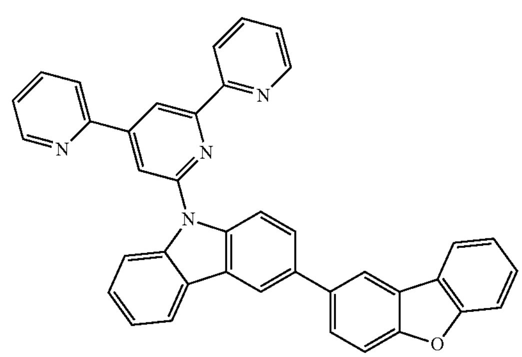
111A
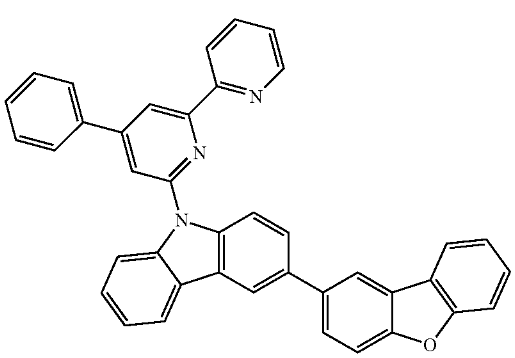
112A
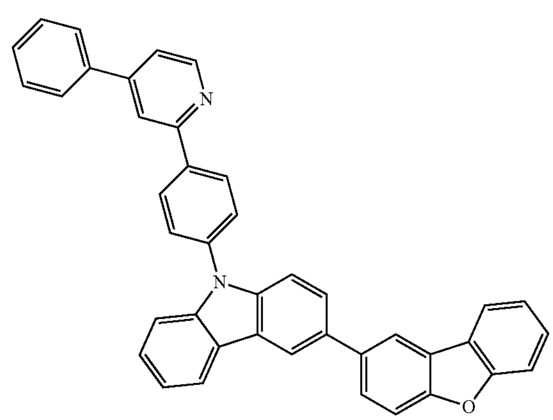

-continued
113A
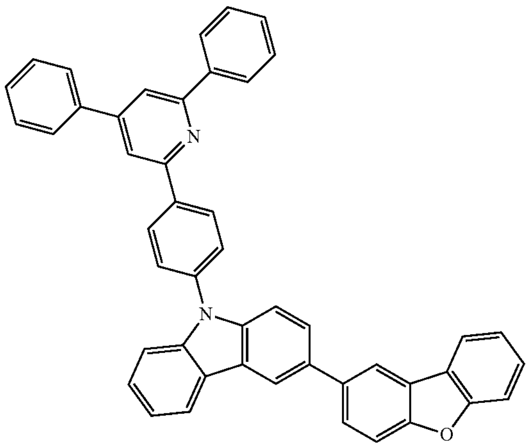
114A
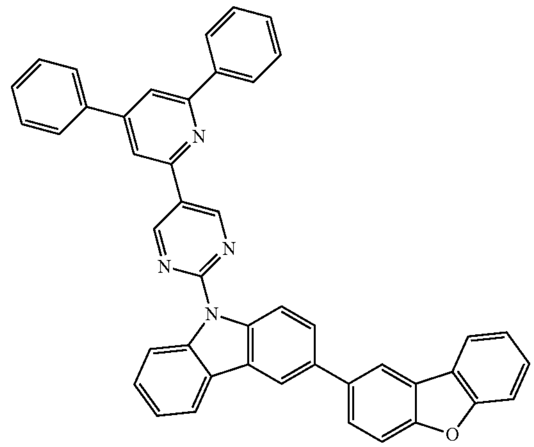
115A
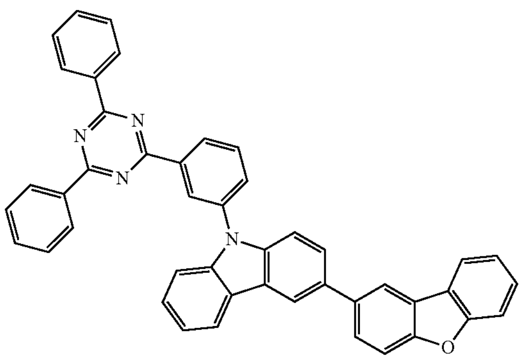
116A
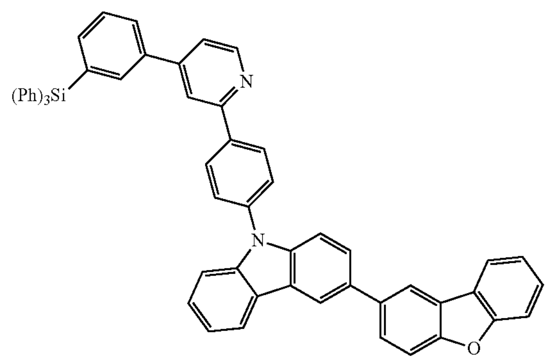
117A
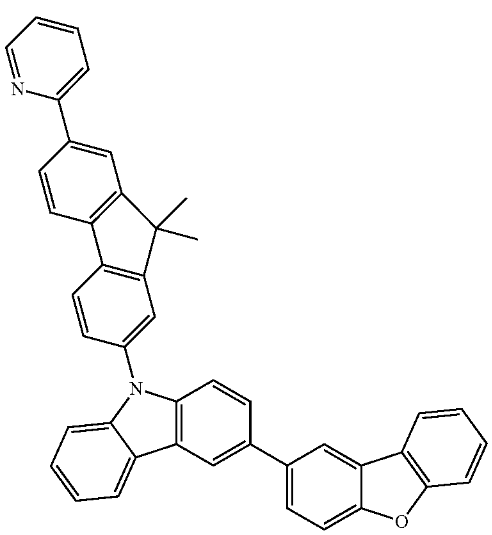
118A
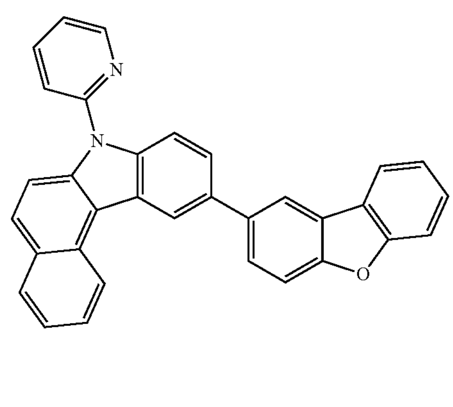

-continued
119A
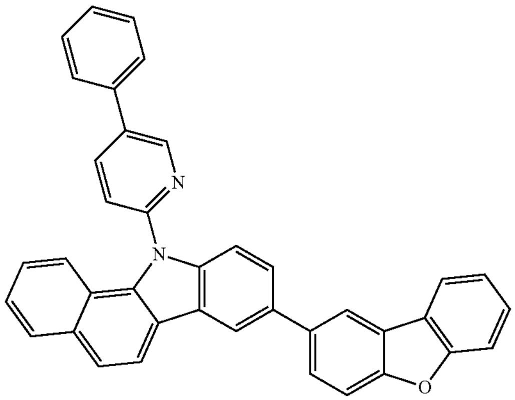
120A
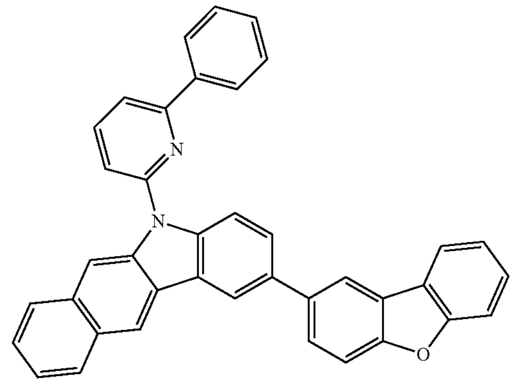
121A
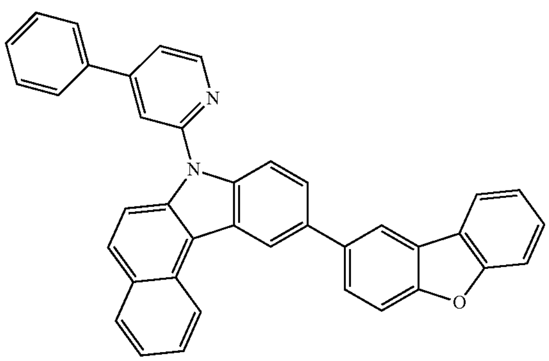
122A
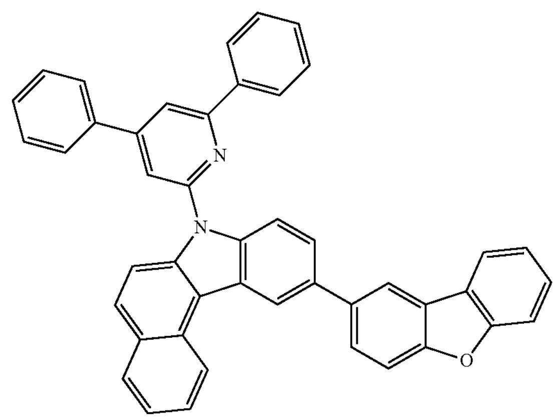
123A
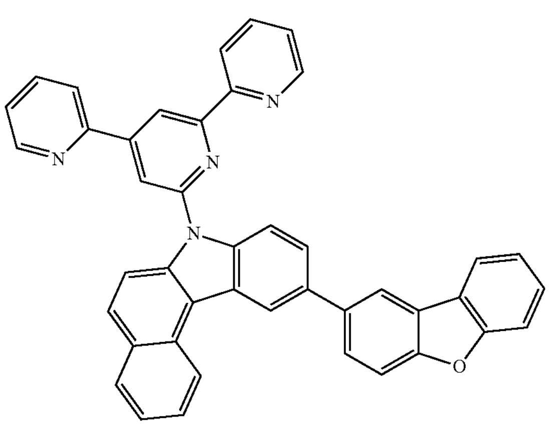
124A
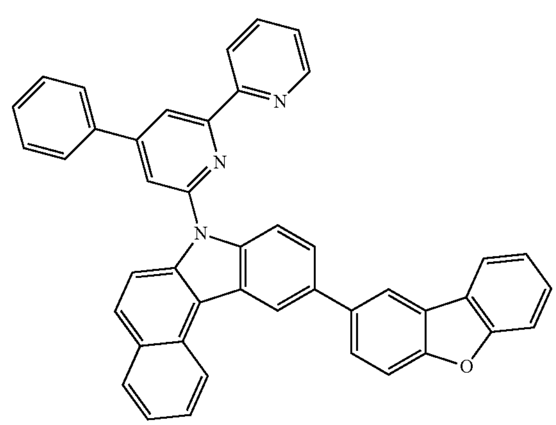

-continued
125A
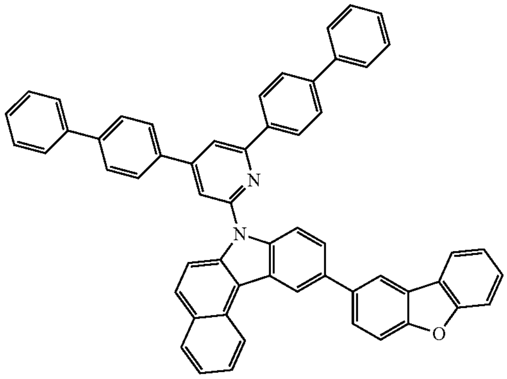
126A
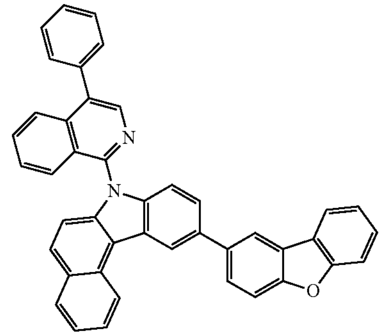
127A
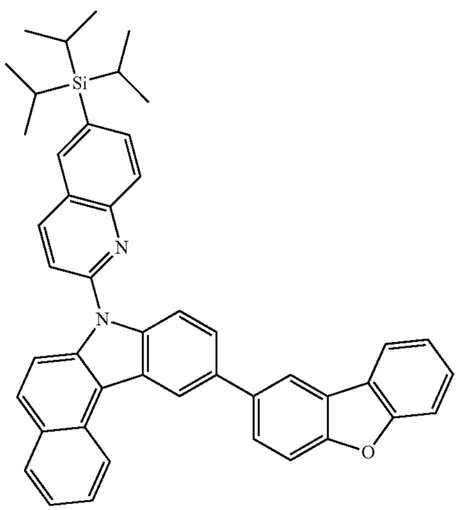
128A
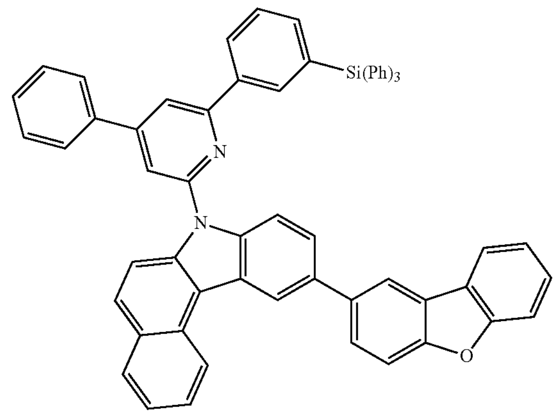
129A
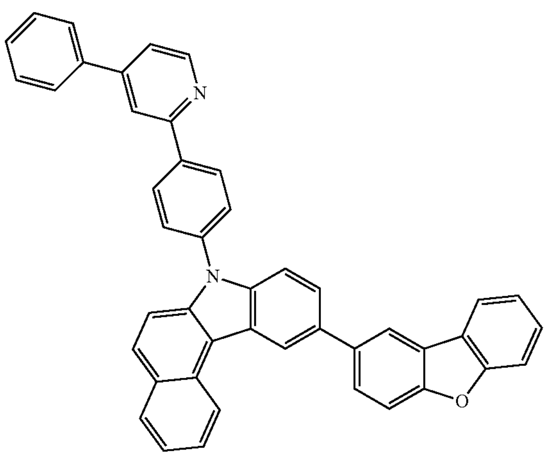
130A
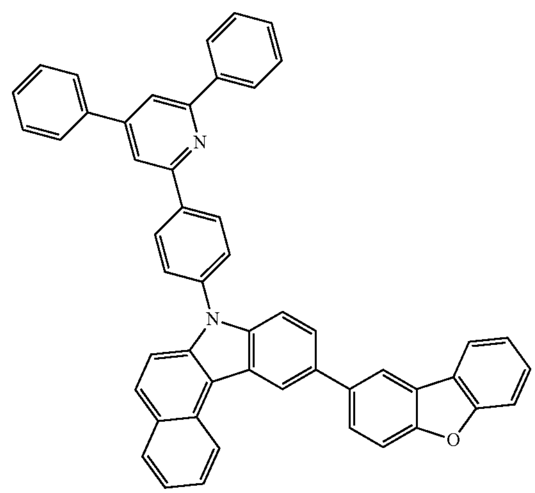

-continued
131A
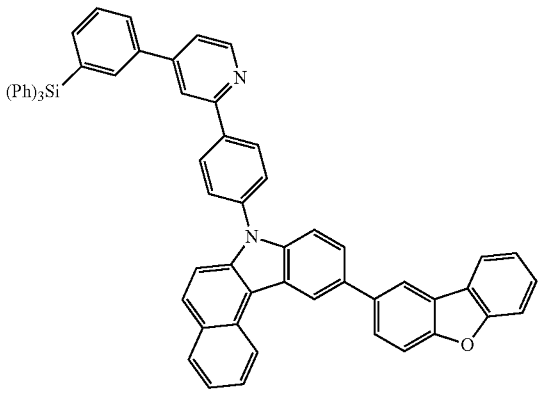
132A
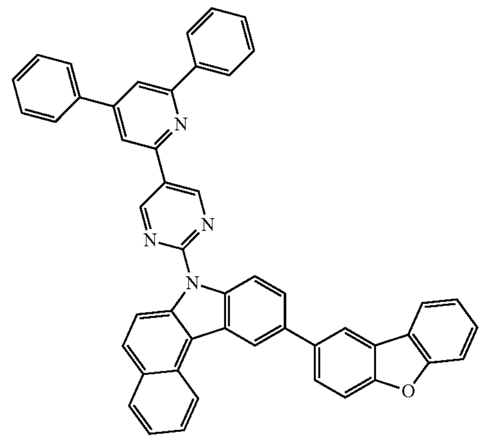
133A
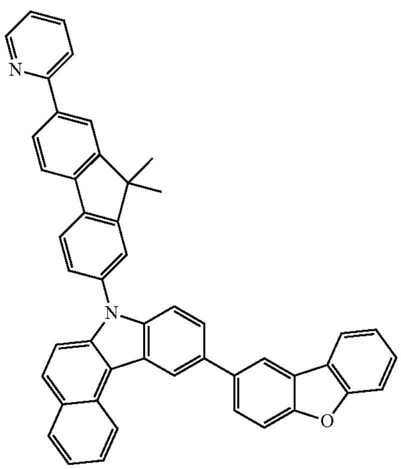
134A
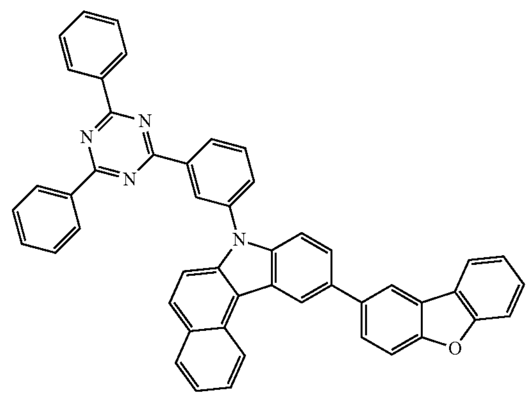
135A
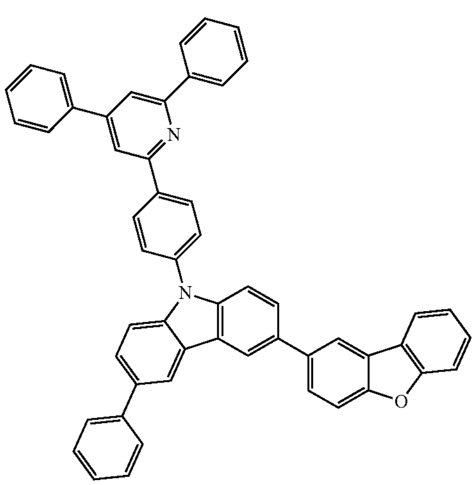
136A
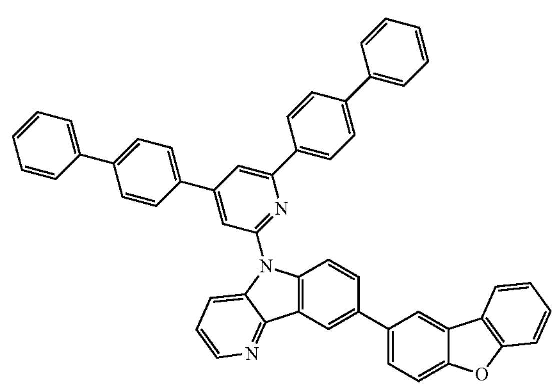

-continued
137A
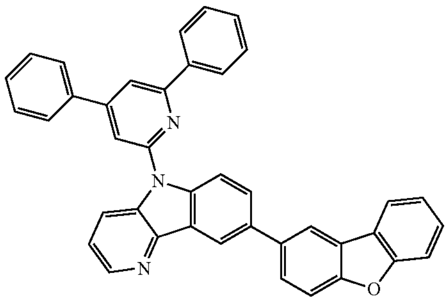
138A
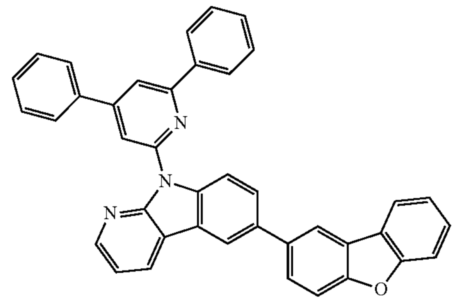
139A
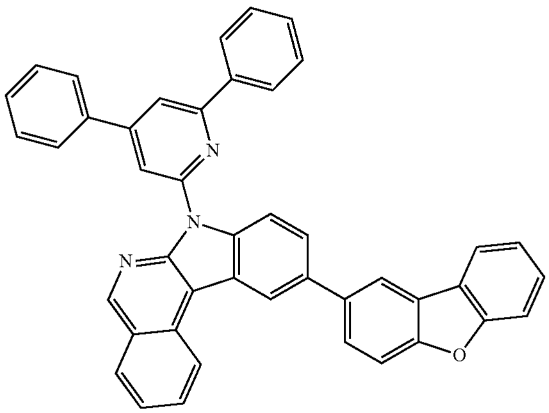
140A
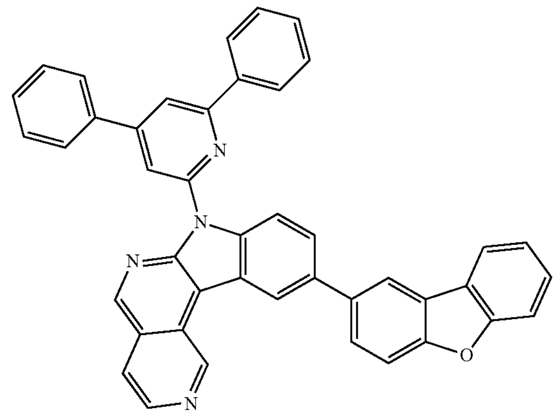
141A
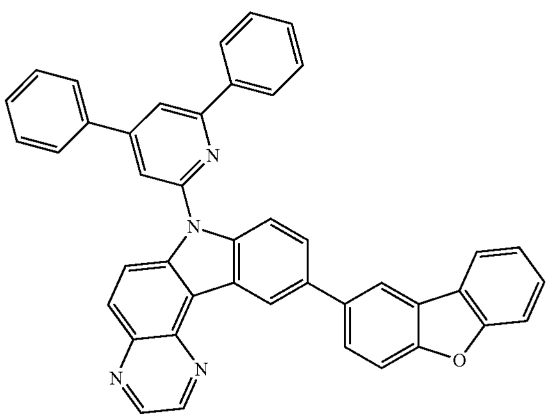
142A
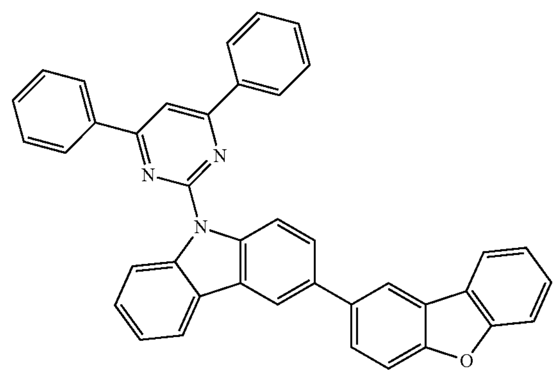
143A
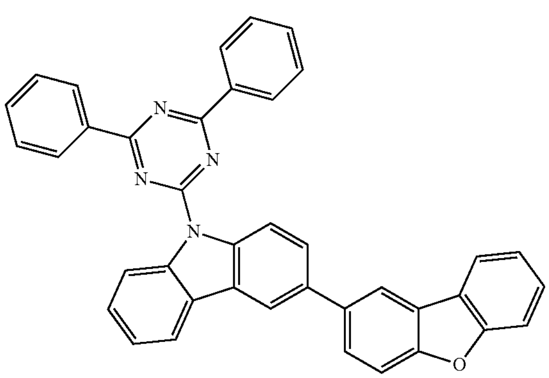
144A
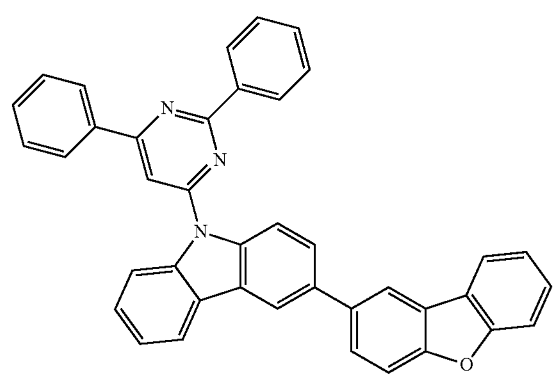

-continued
145A
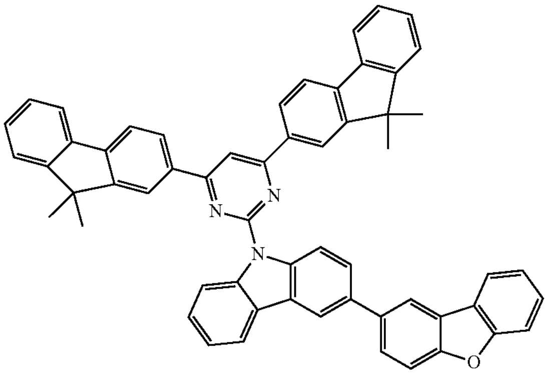
146A
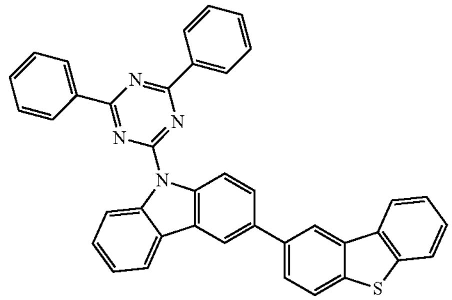
147A
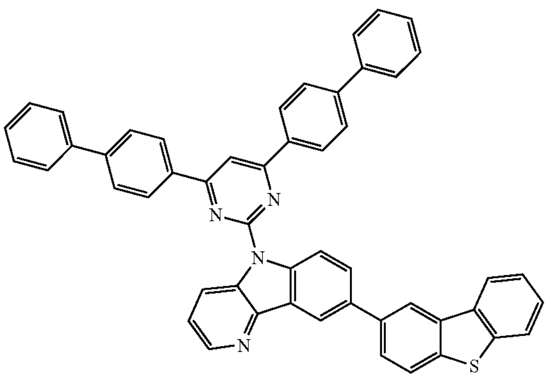
148A
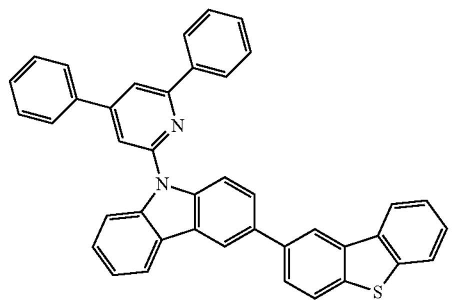
149A
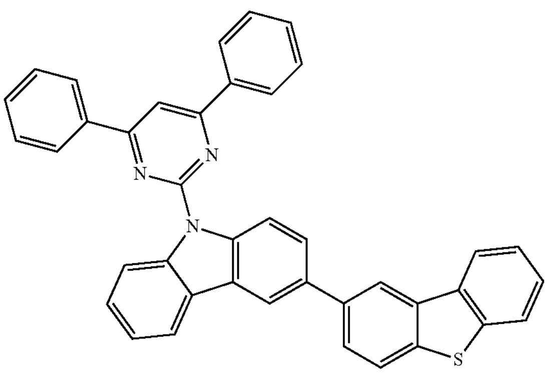
150A
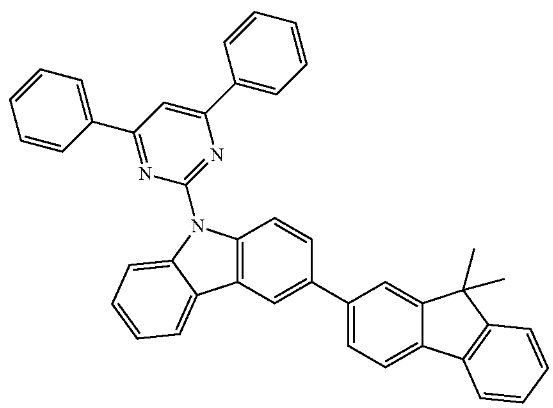
151A
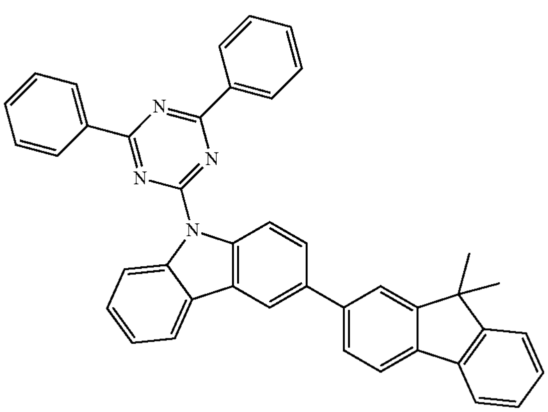
152A
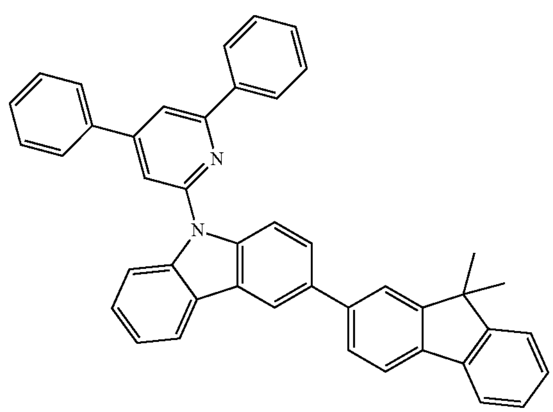

-continued
153A
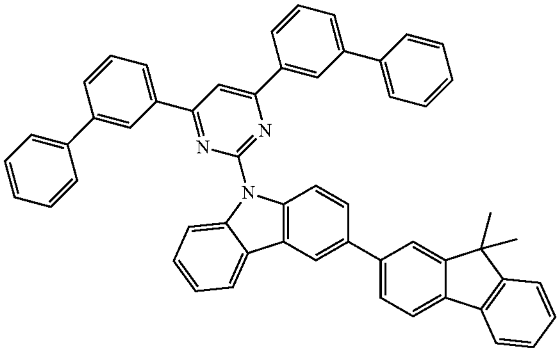
154A
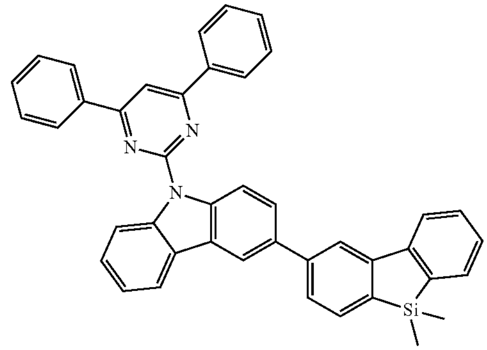
155A
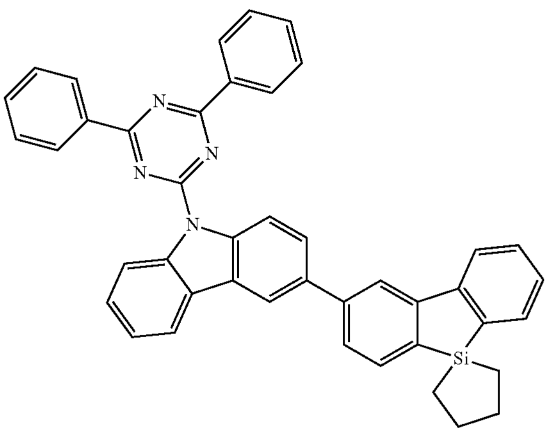
156A
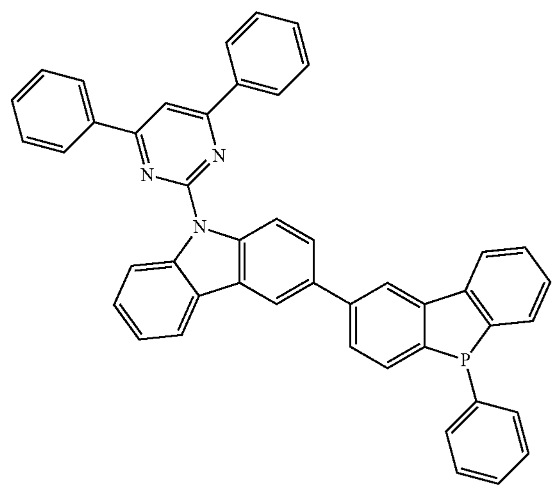
157A
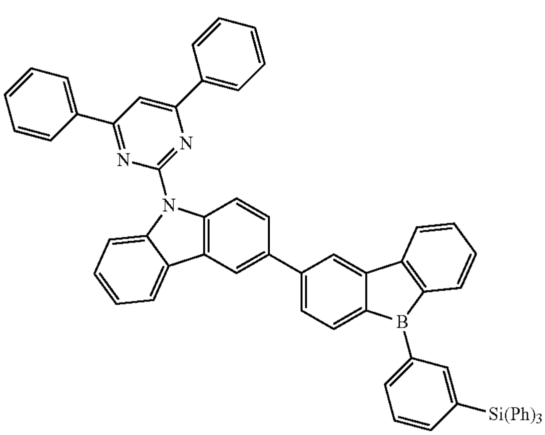
158A
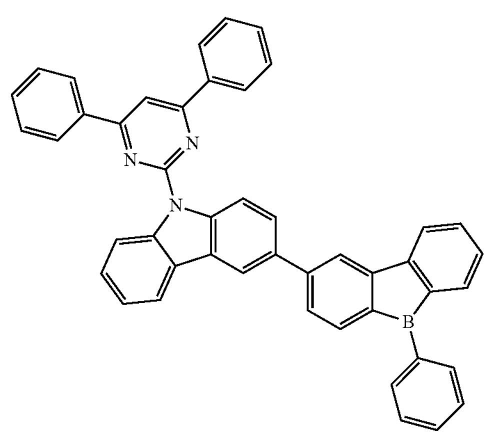

-continued
159A
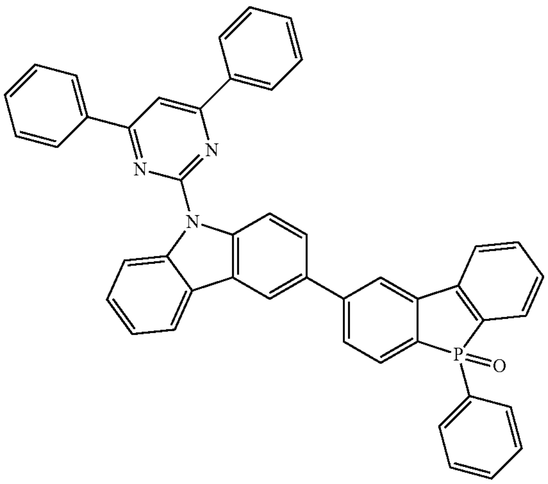
160A
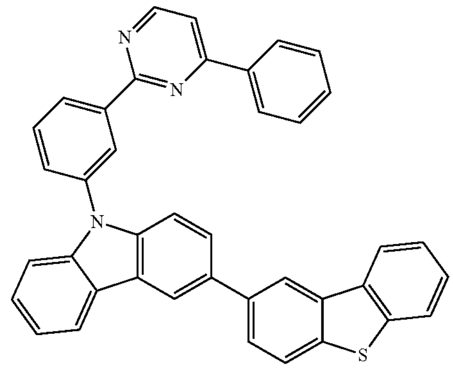
161A
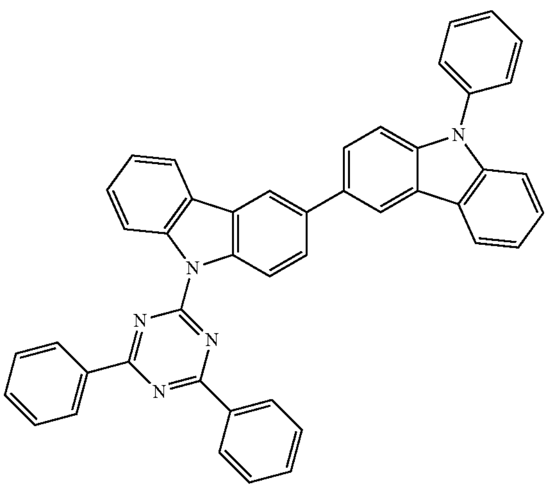
162A
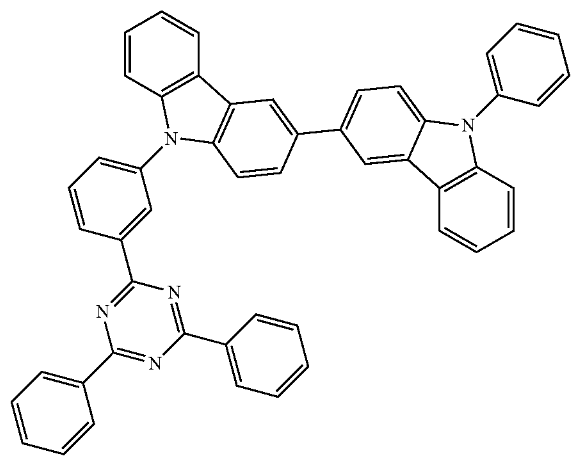
163A
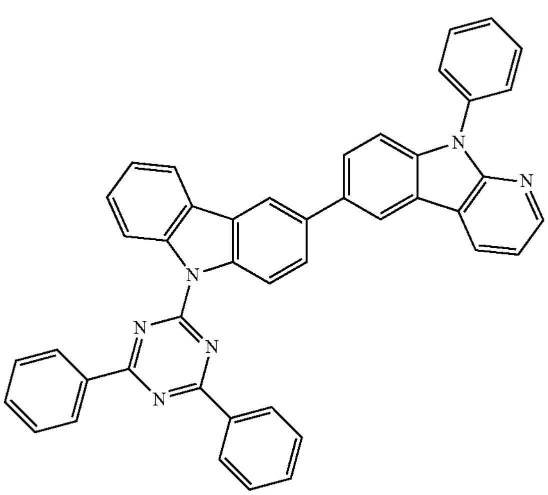
164A
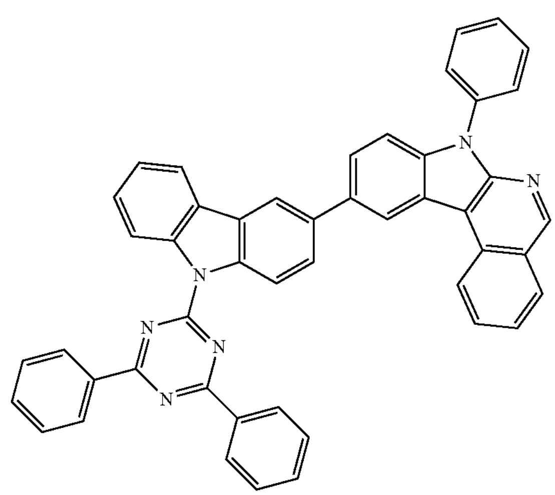

-continued
165A
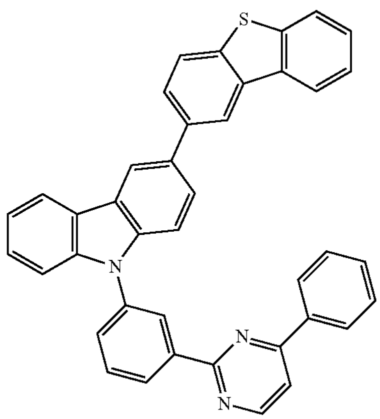
166A
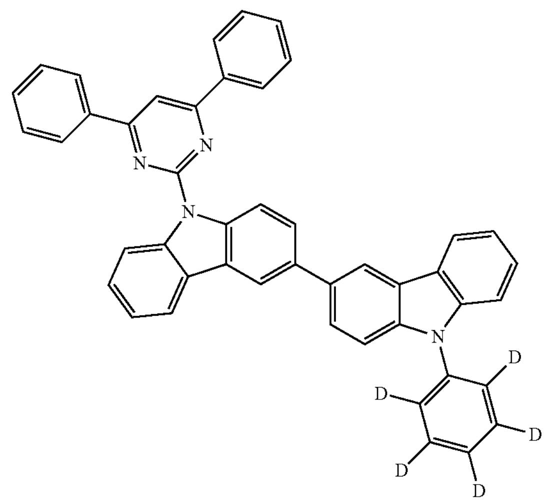
167A
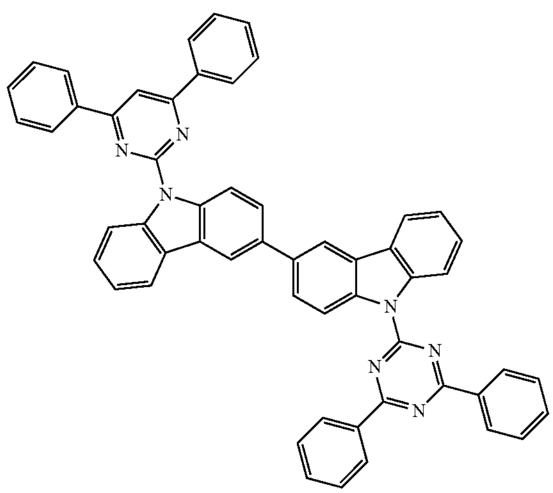
168A
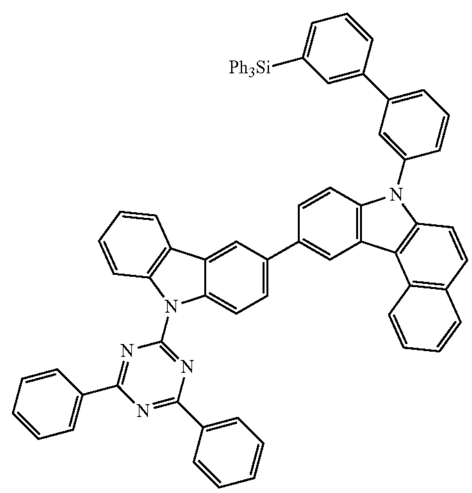
169A
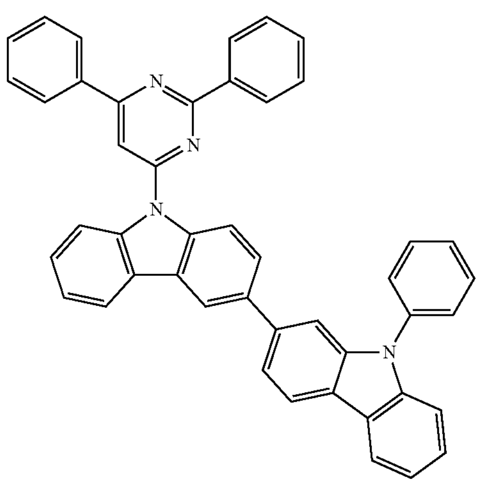
170A
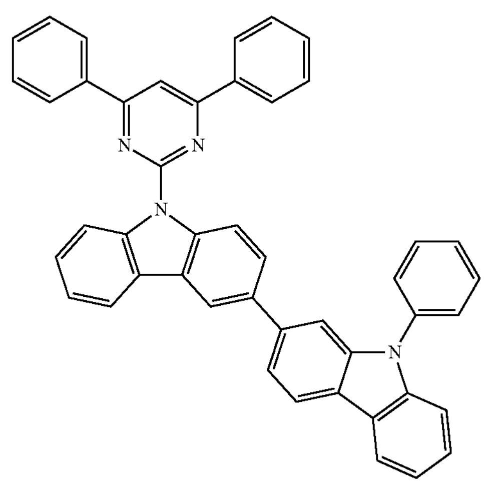

-continued
171A
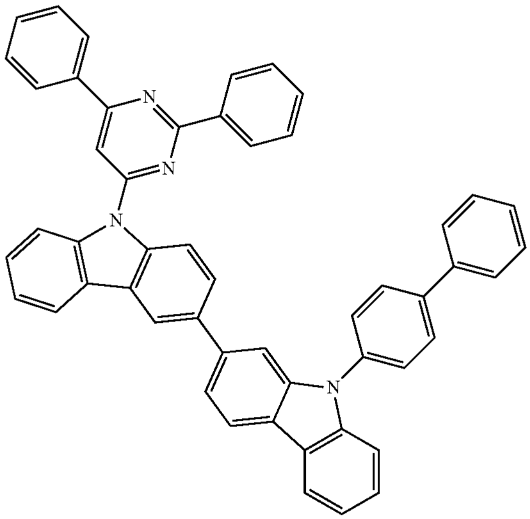
172A
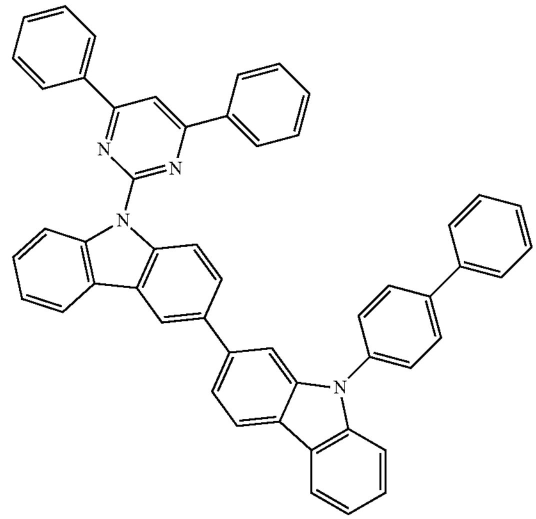
173A
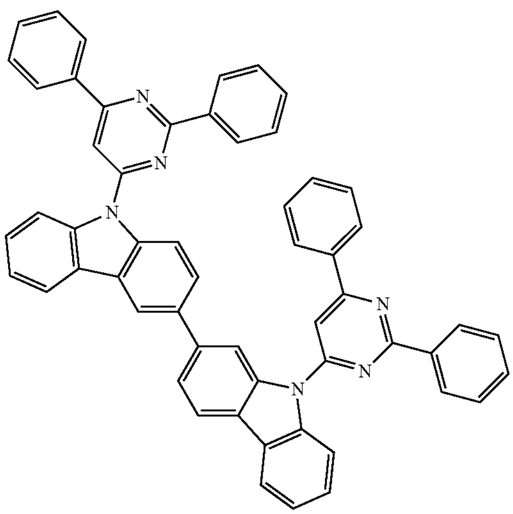
174A
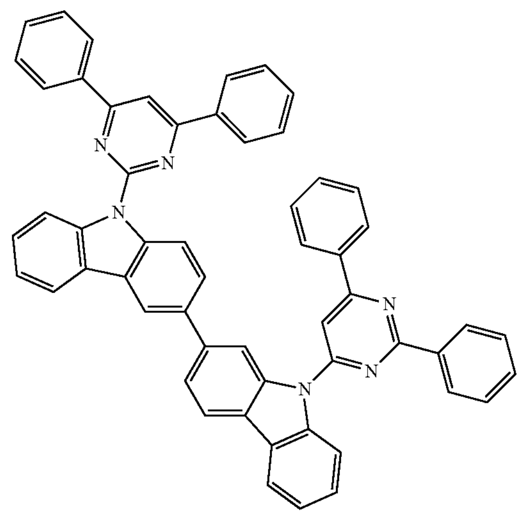
175A
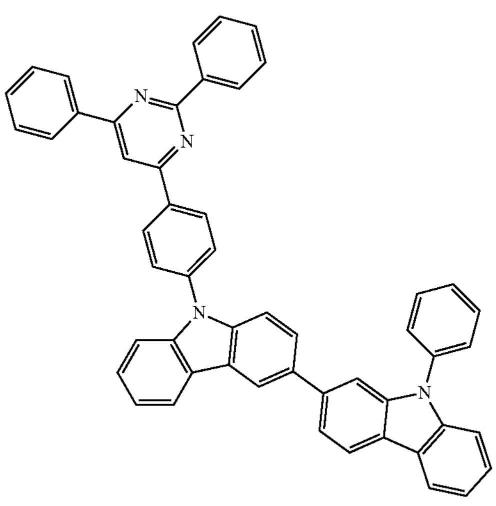
176A
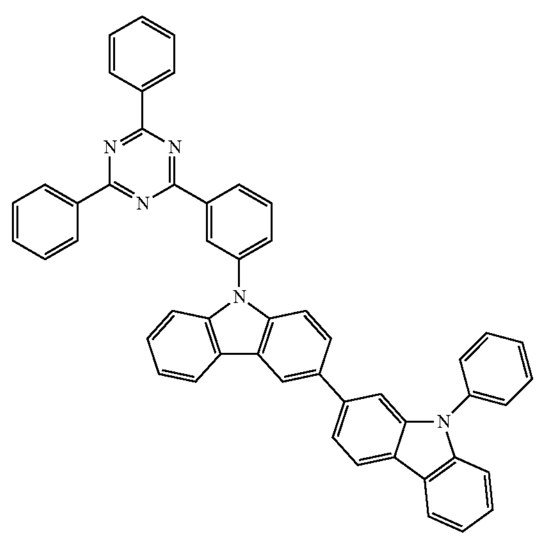

-continued
177A
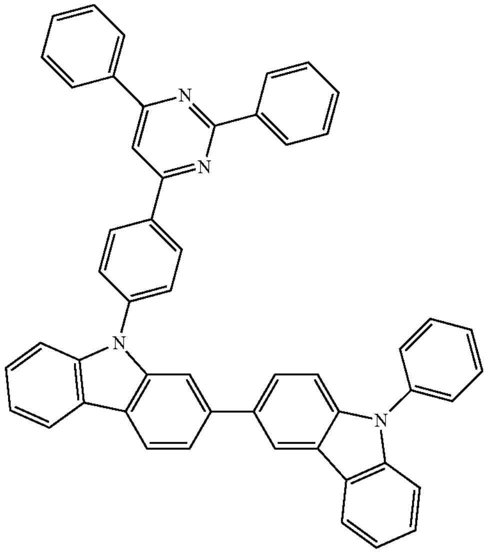
178A
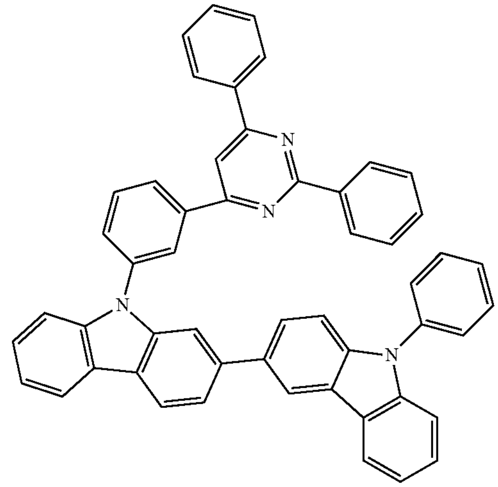
179A
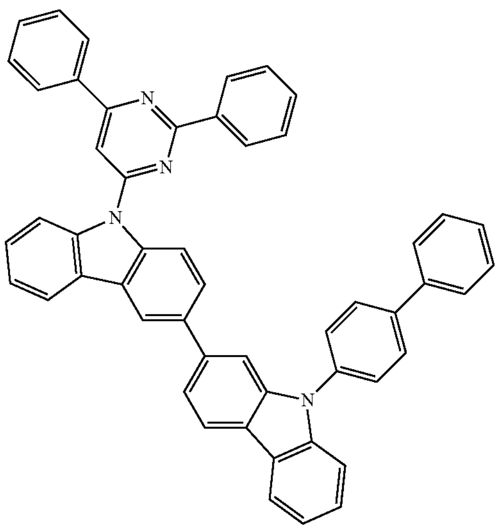
180A
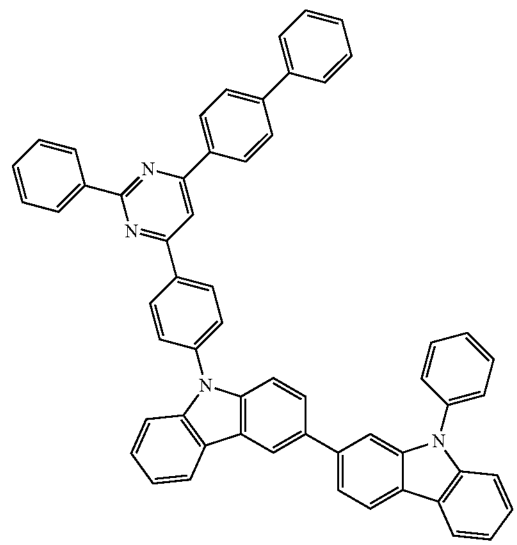
181A
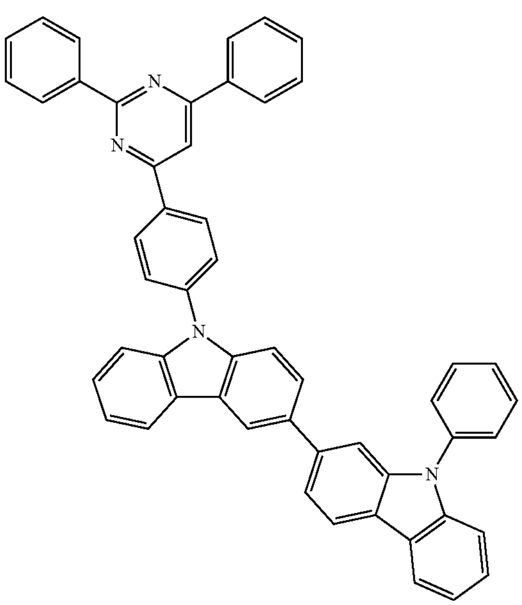
182A
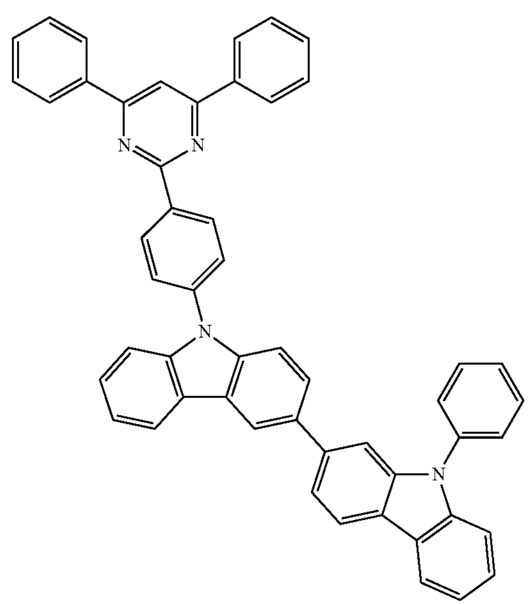

-continued
183A
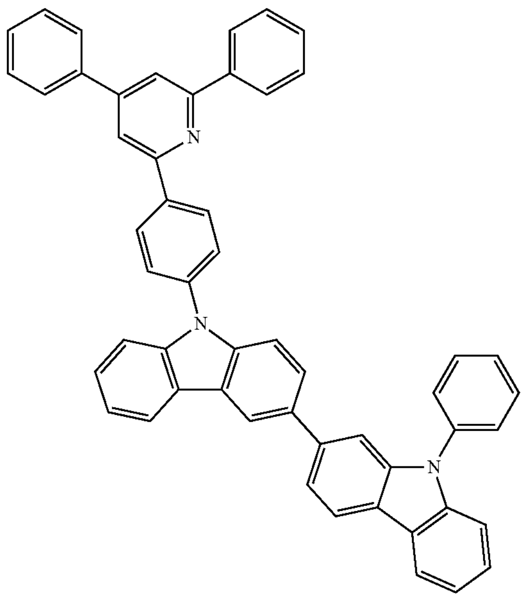
184A
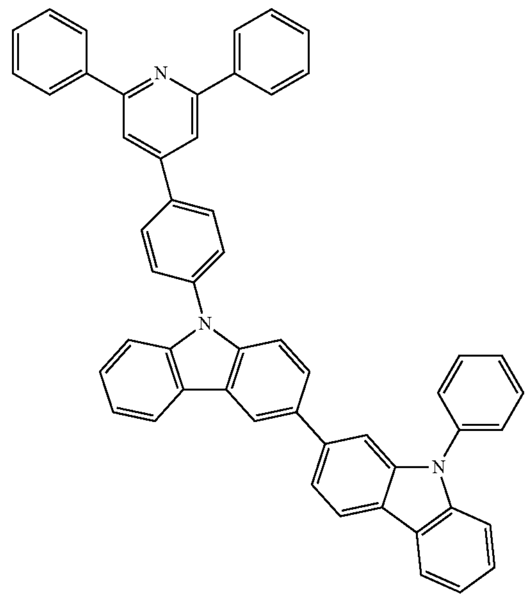
185A
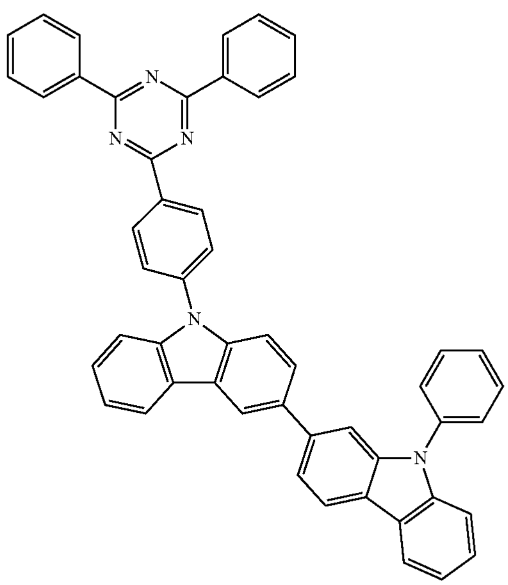
186A
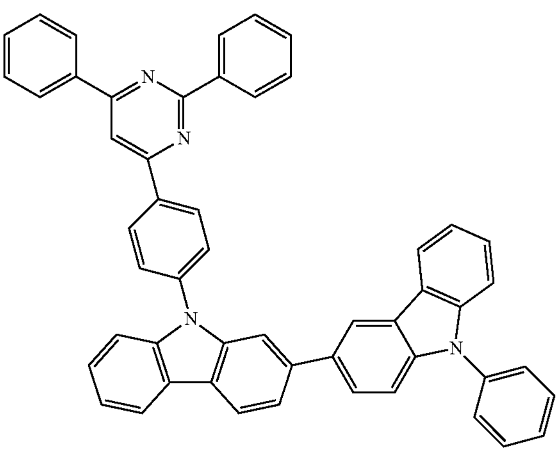
187A
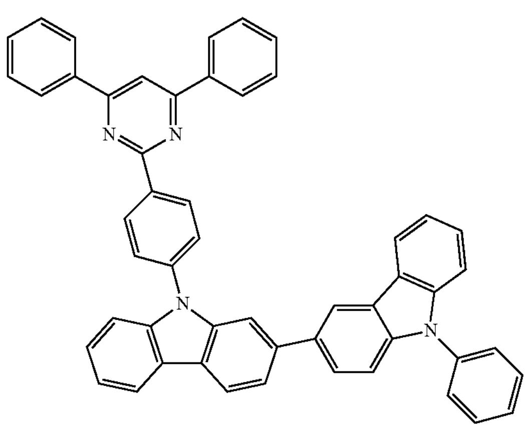
188A
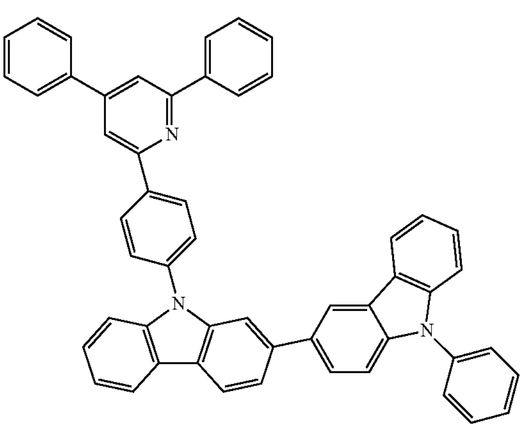

-continued
189A
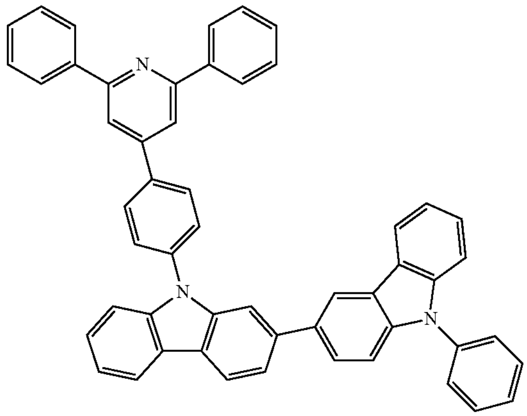
190A
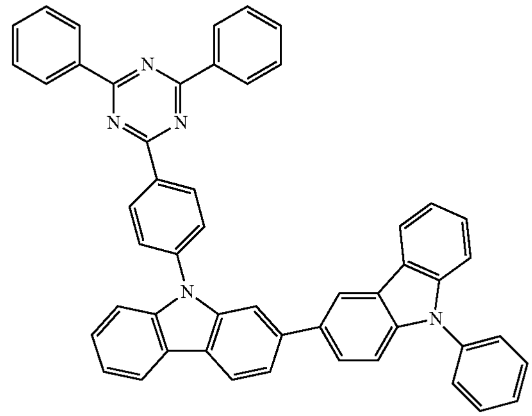
191A
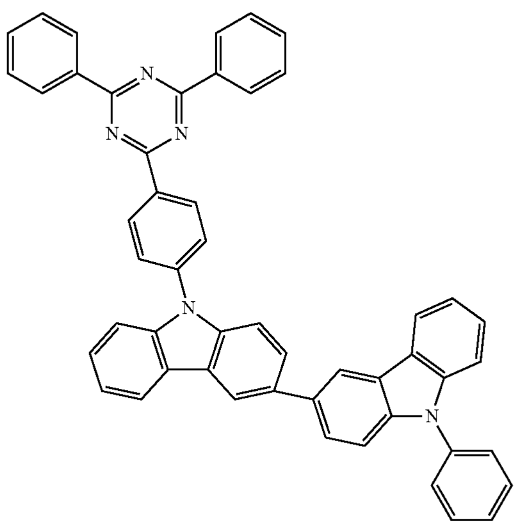
192A
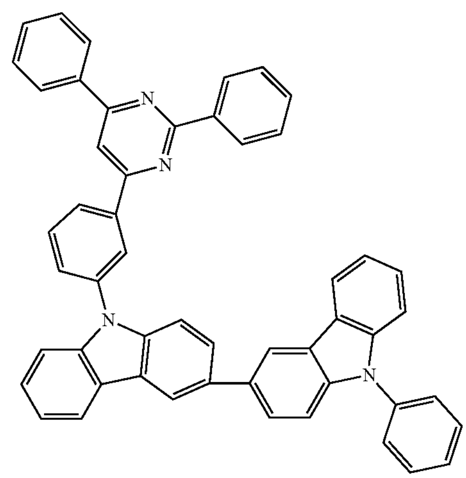
193A
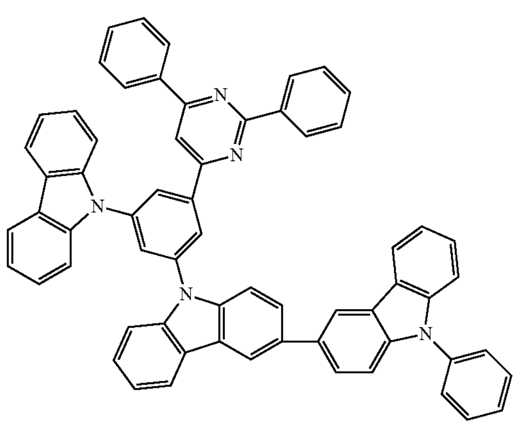
194A
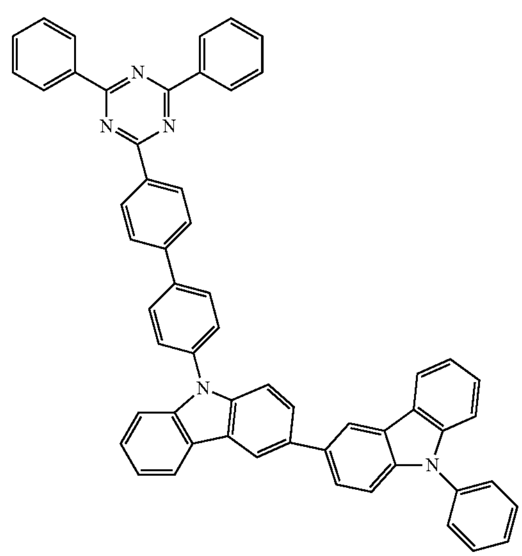

-continued
195A
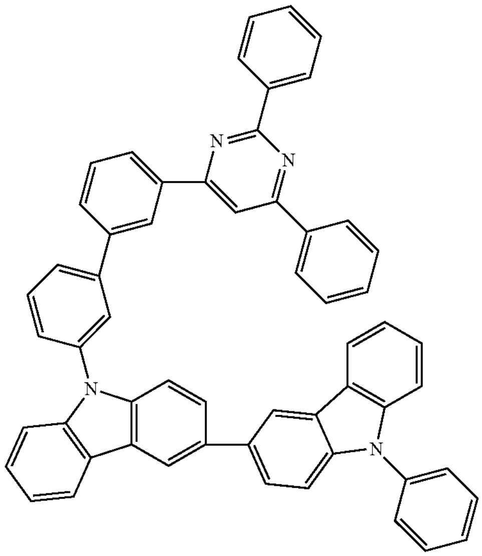
196A
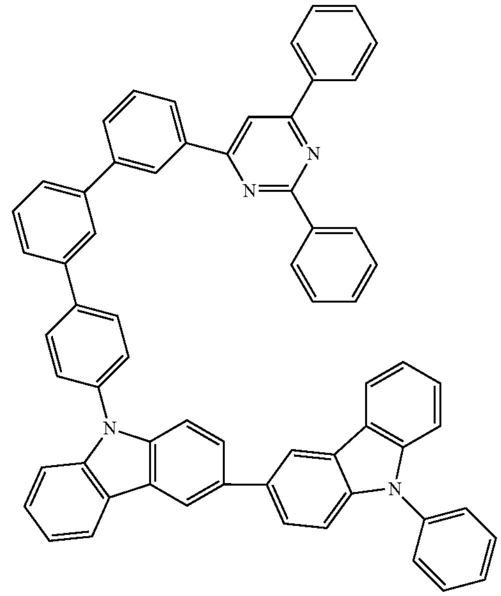
197A
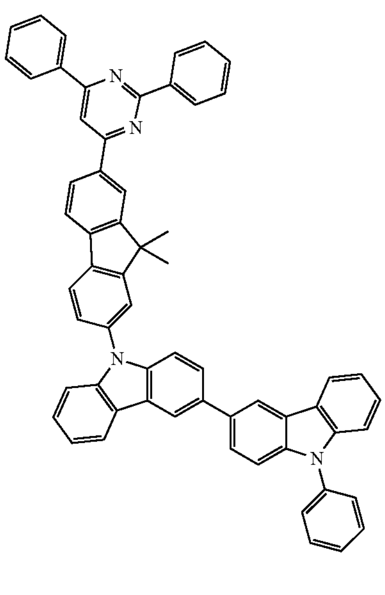
198A
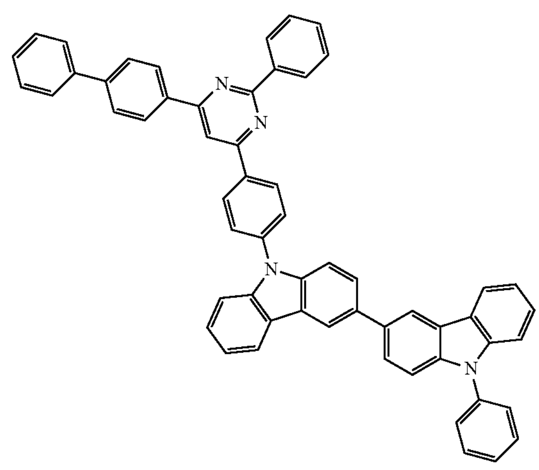

-continued
199A
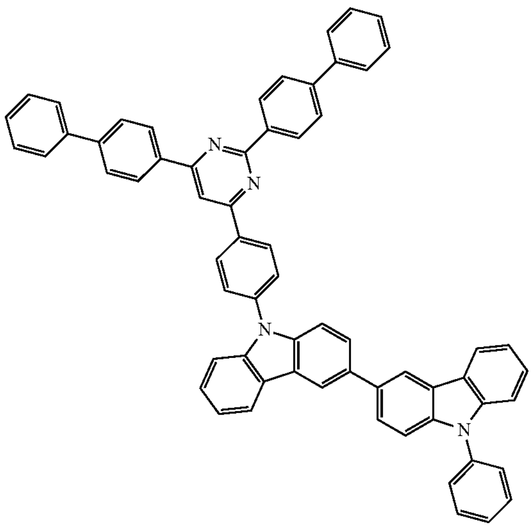
200A
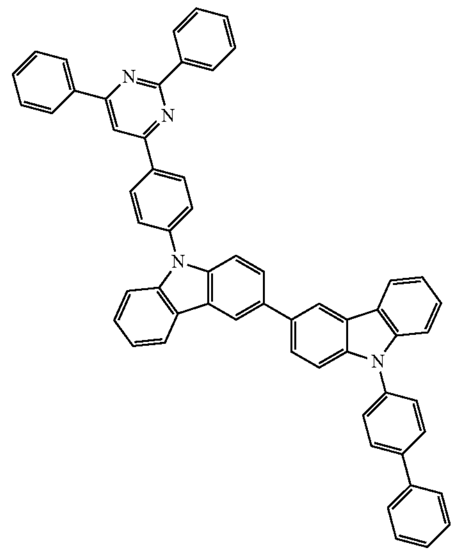
201A
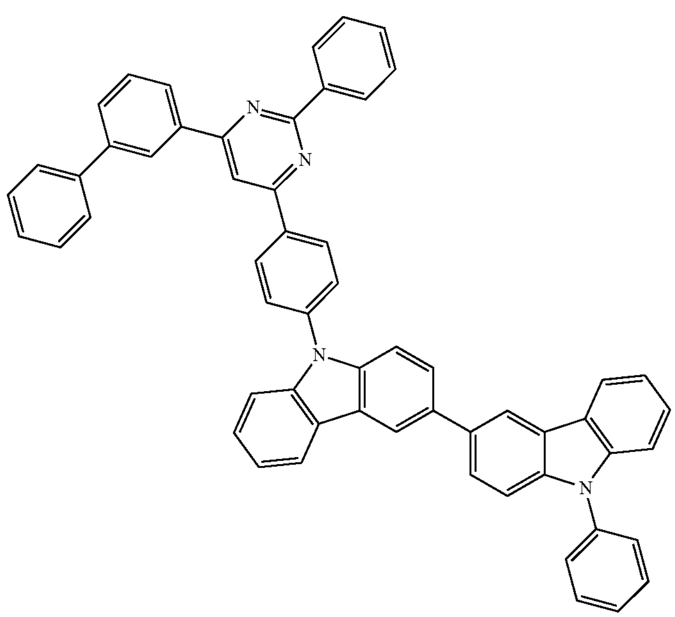
.

-continued
202A
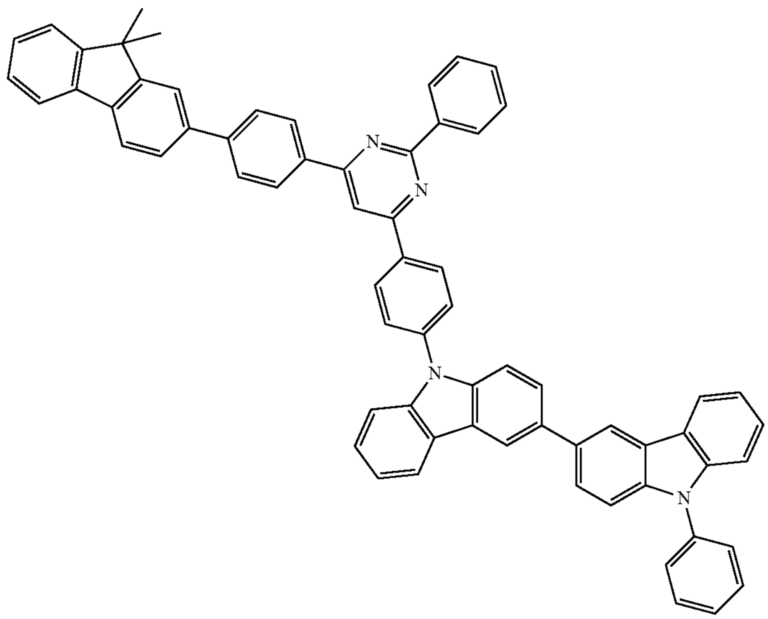
203A
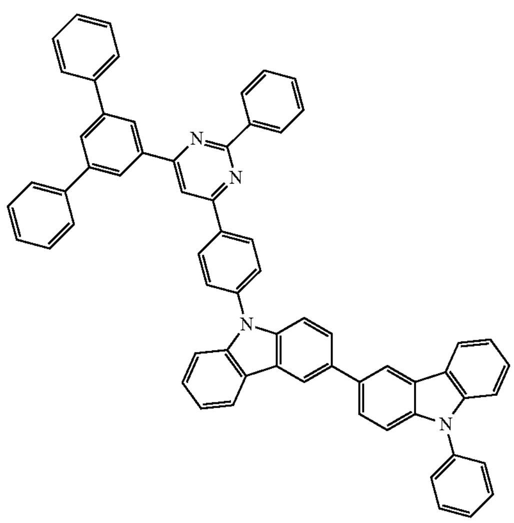
204A
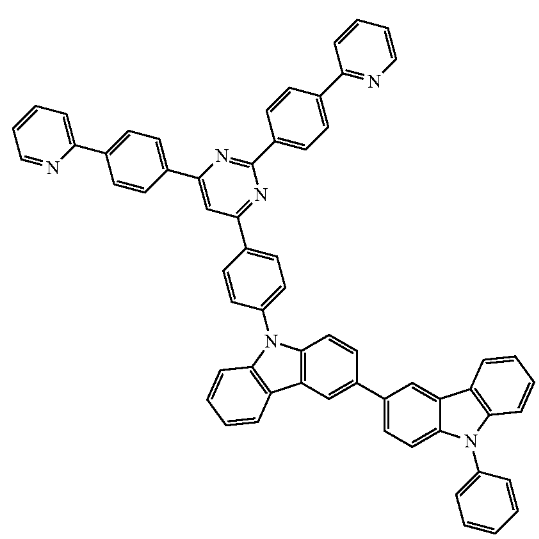

-continued
205A
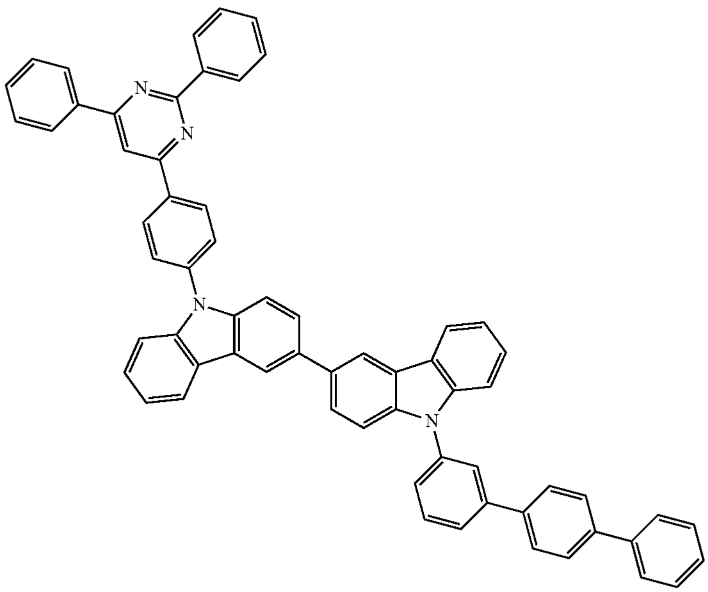
206A
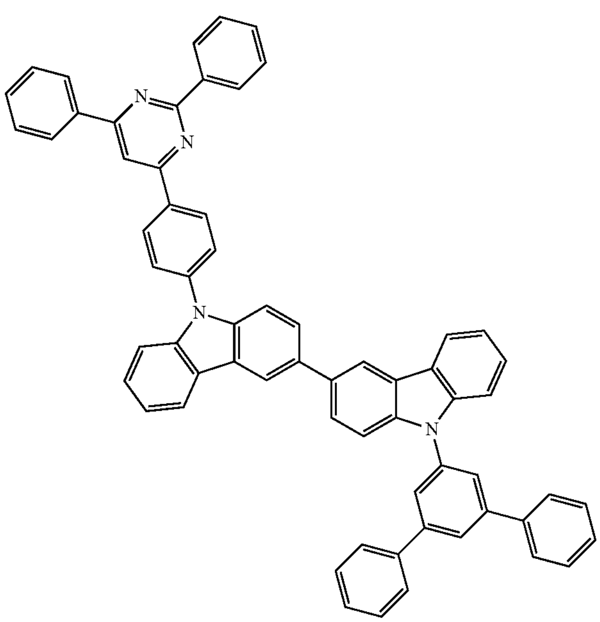

In some embodiments, the second compound may be selected from Compounds 301A to 369A below, but is not limited thereto:
301A
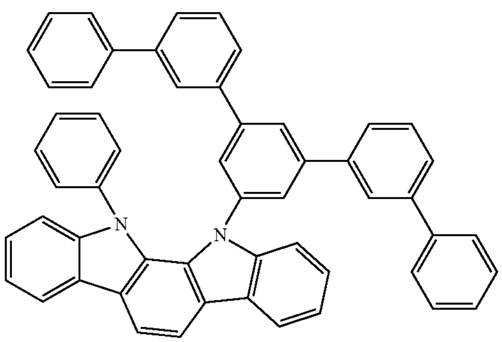
302A
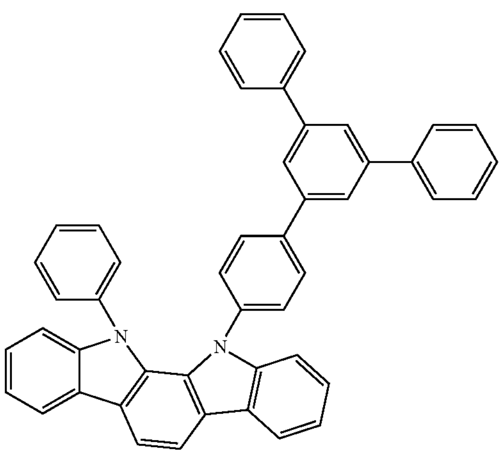
303A
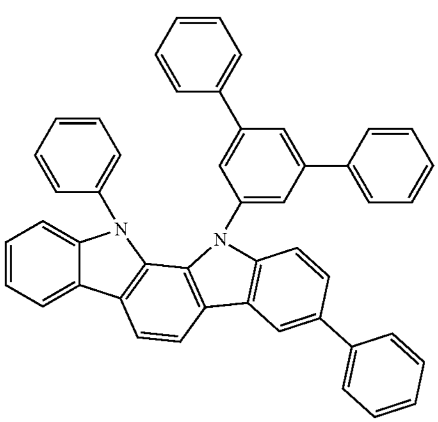
-continued
304A
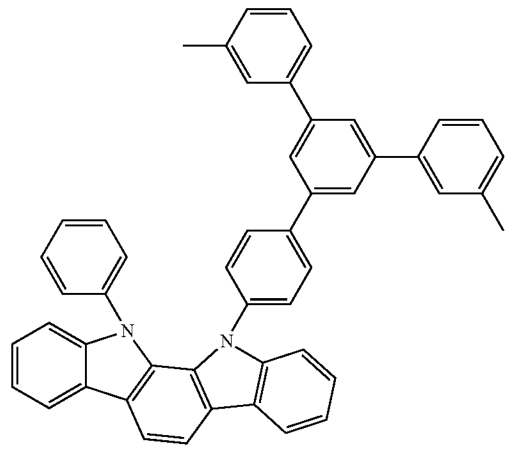
305A
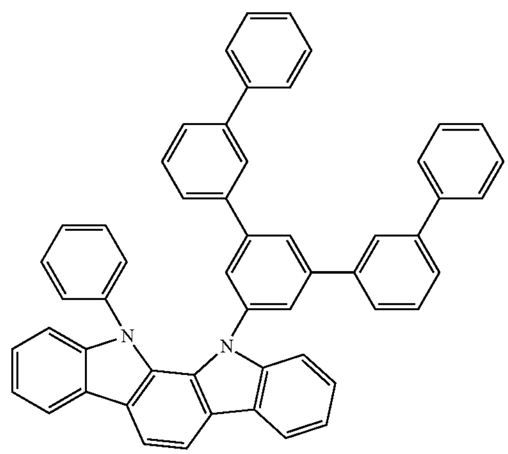
306A
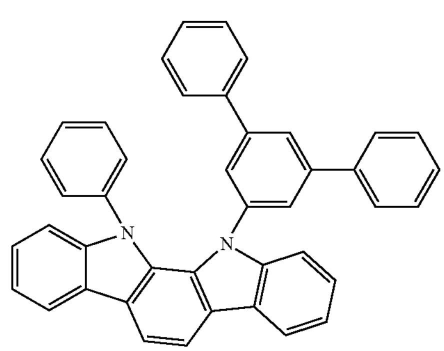

-continued
307A
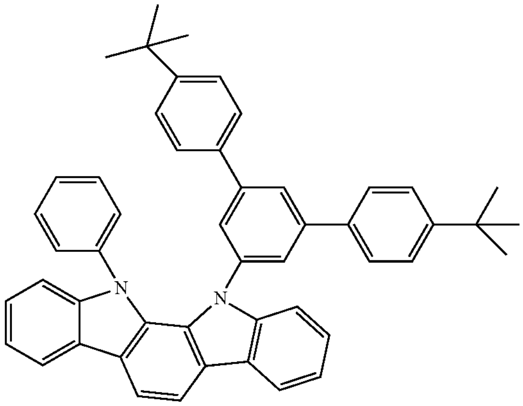
308A
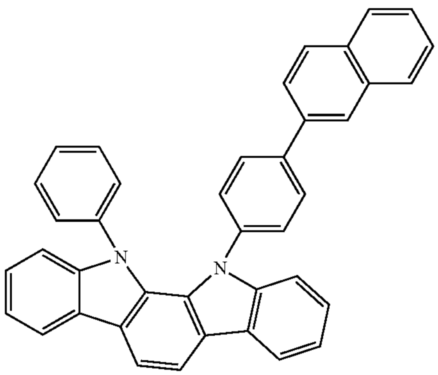
309A
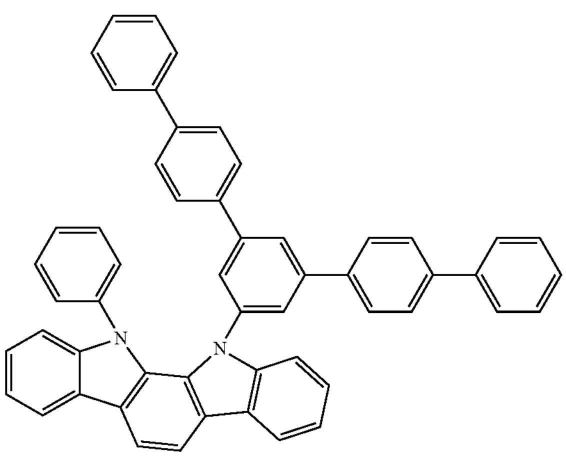
310A
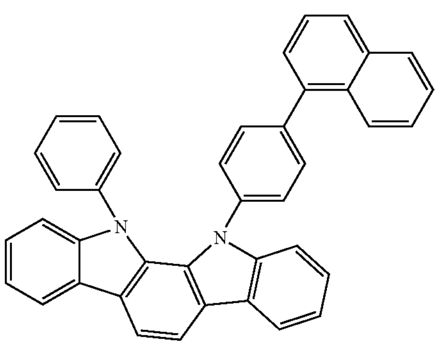
-continued
311A
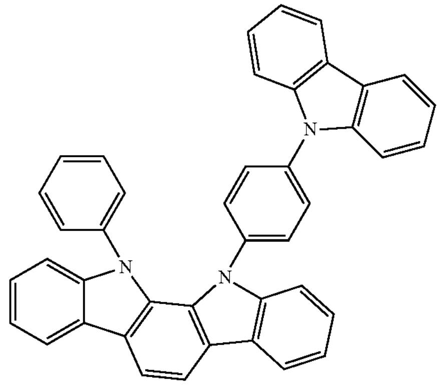
312A
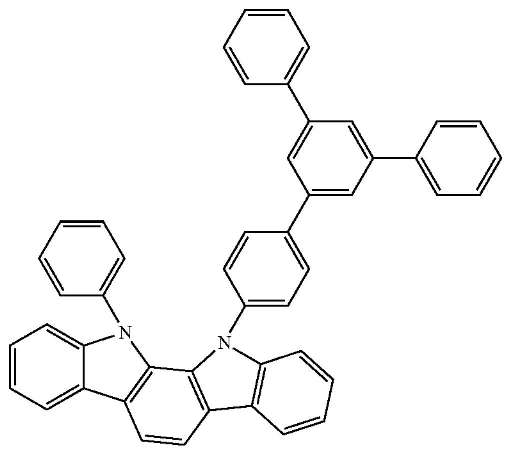
313A
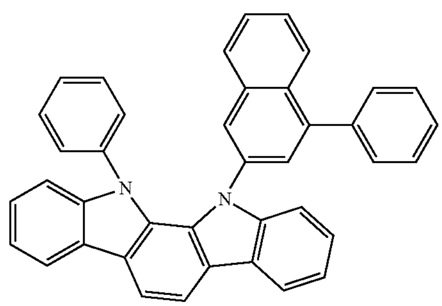
314A
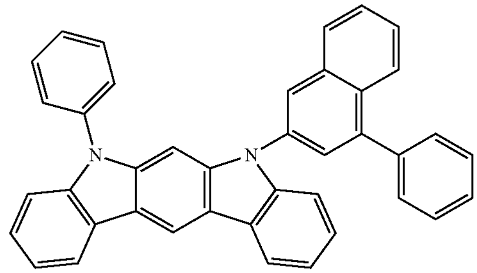

-continued
315A
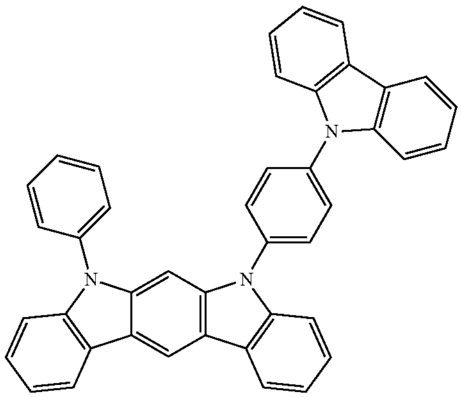
316A
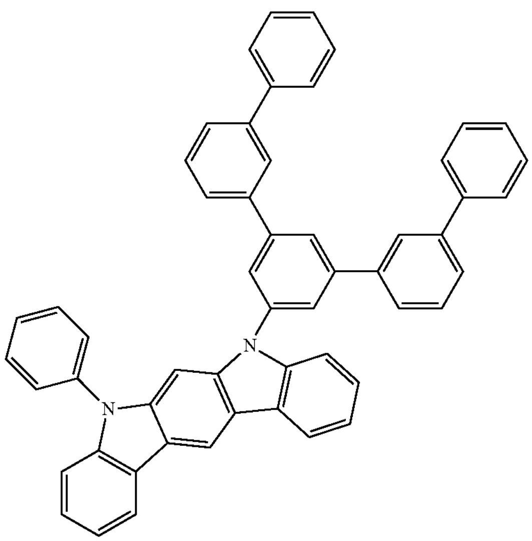
317A
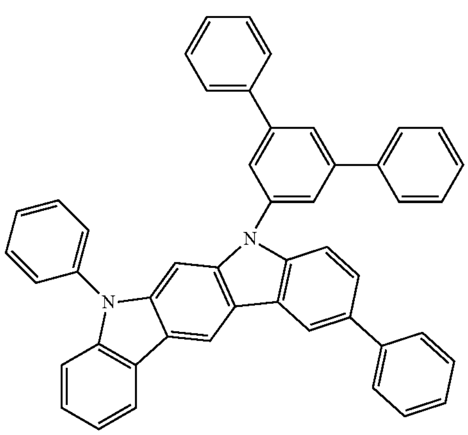
-continued
318A
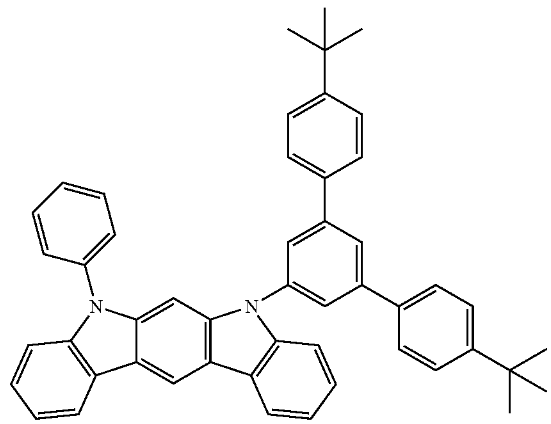
319A
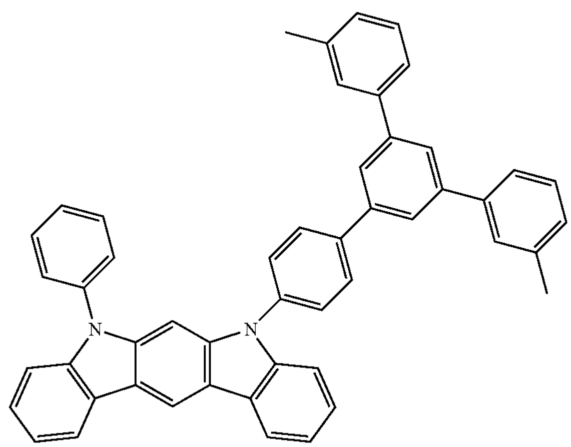
320A
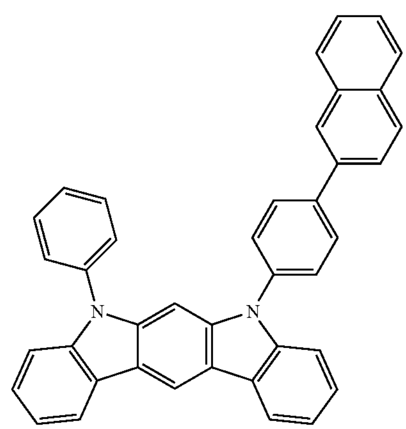

-continued
321A
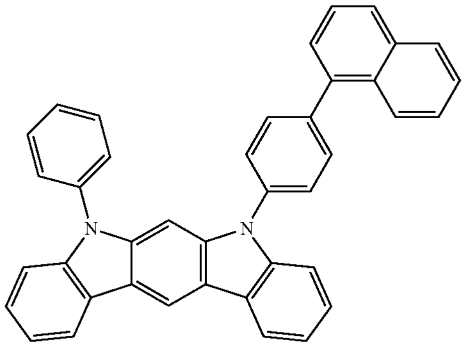
322A
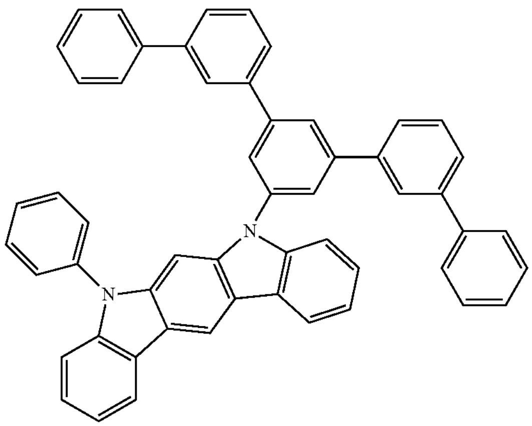
323A
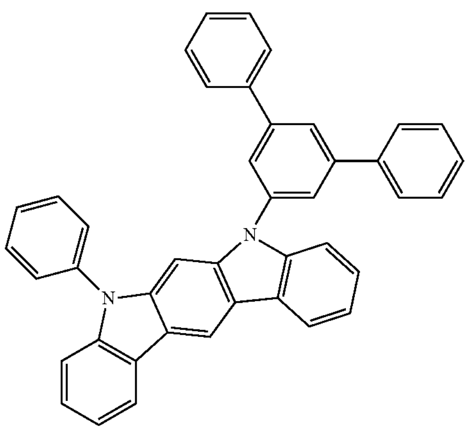
324A
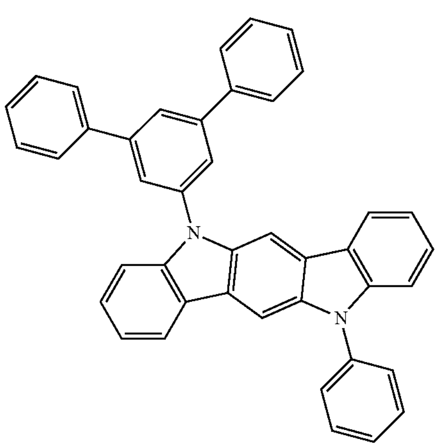
-continued
325A
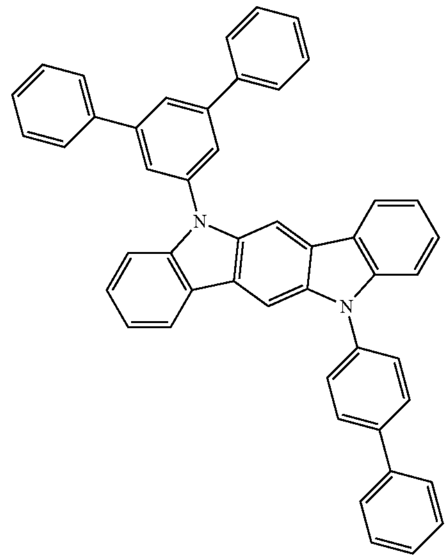
326A
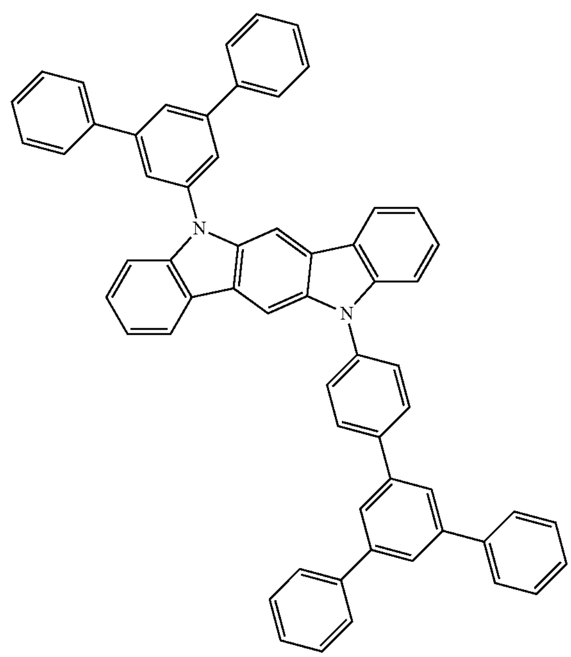

-continued
327A
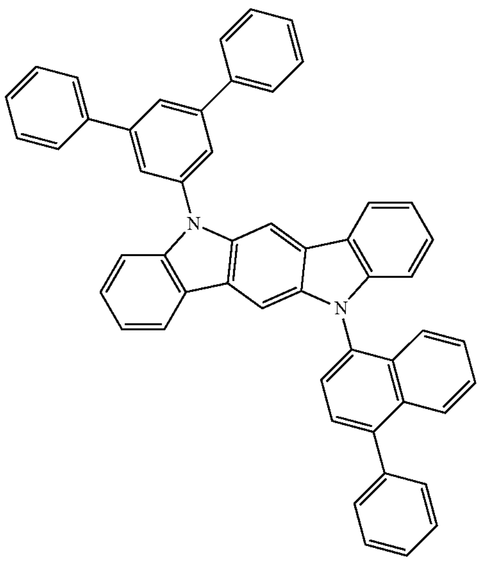
328A
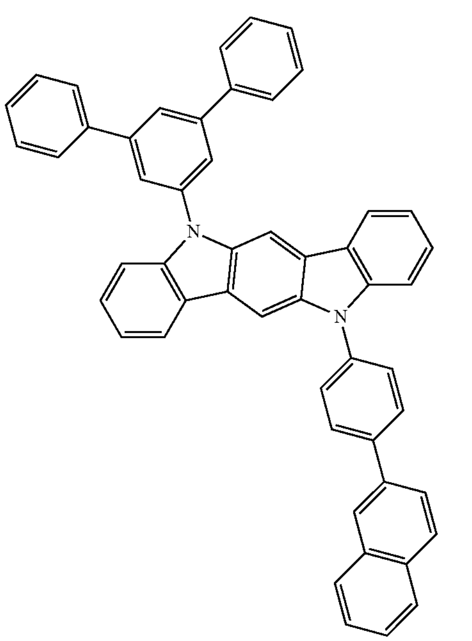
-continued
329A
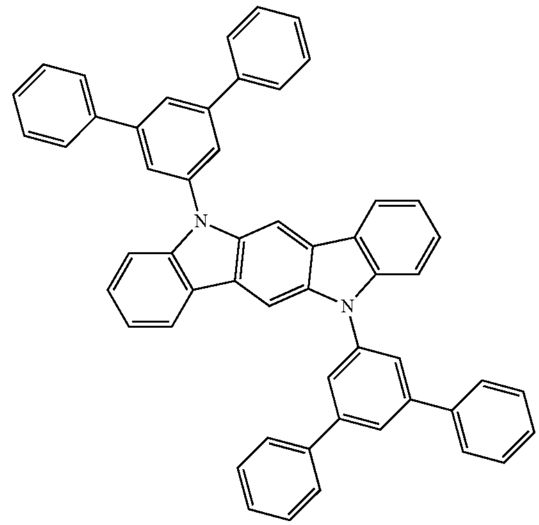
330A
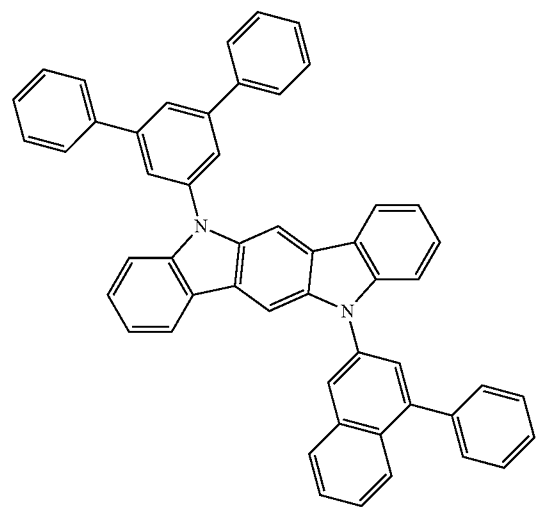
331A
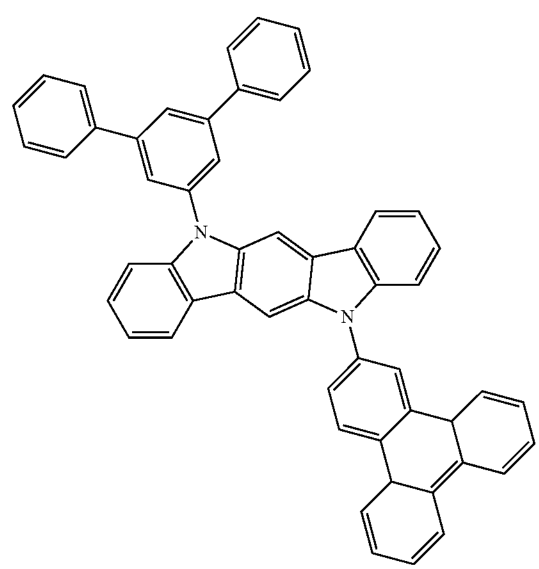

-continued
340A
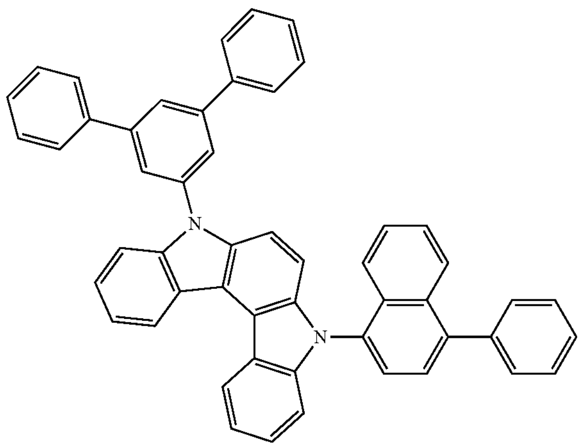
341A
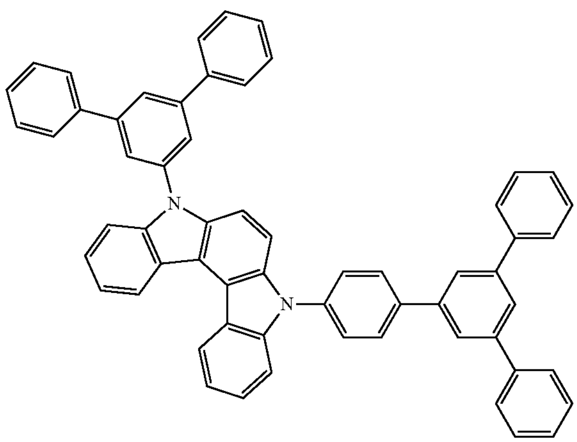
342A
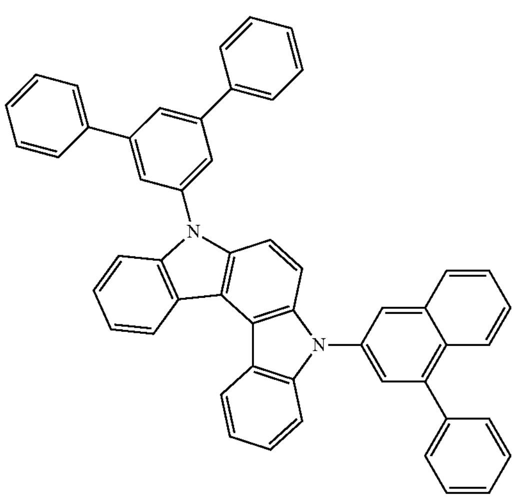
-continued
343A
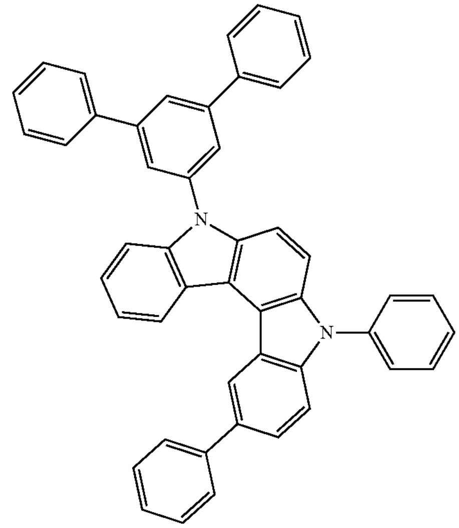
344A
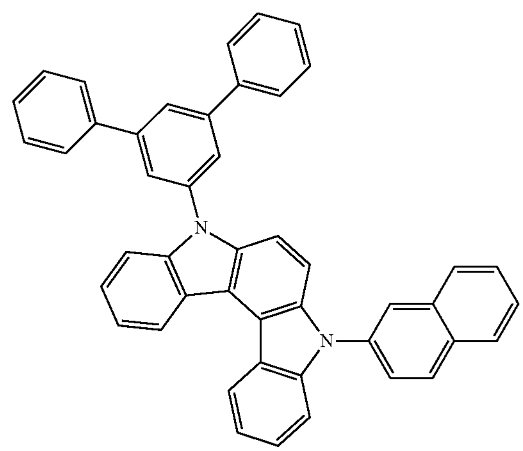
345A
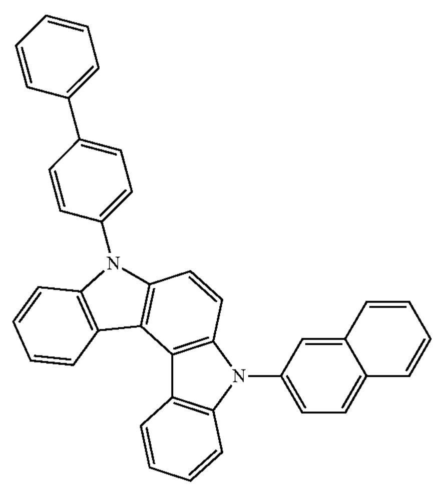

-continued
346A
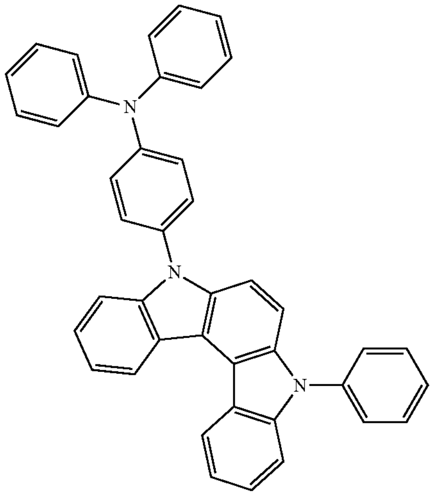
347A
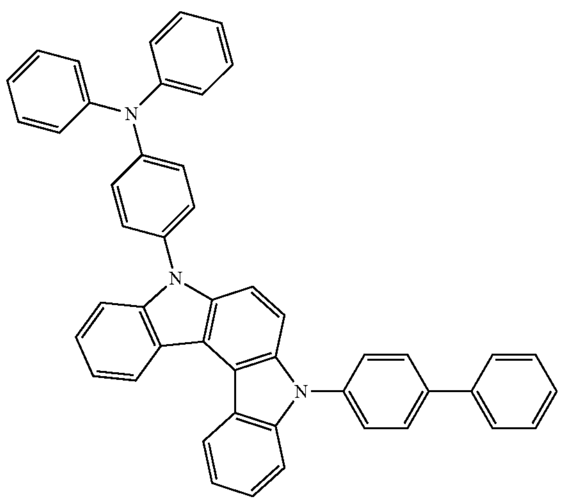
348A
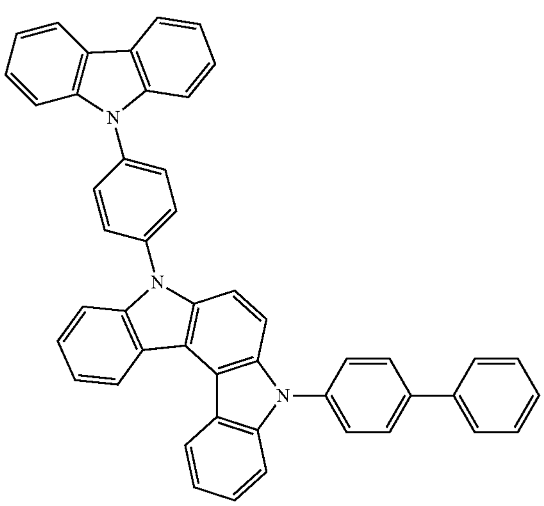
-continued
349A
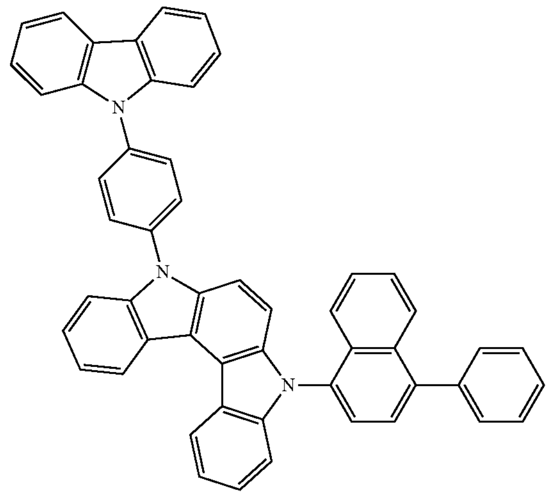
350A
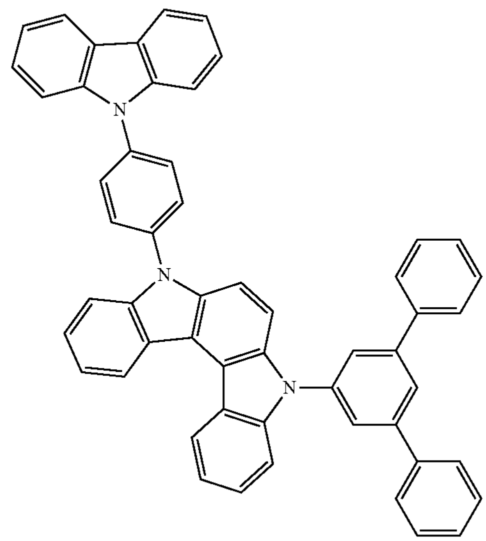
351A
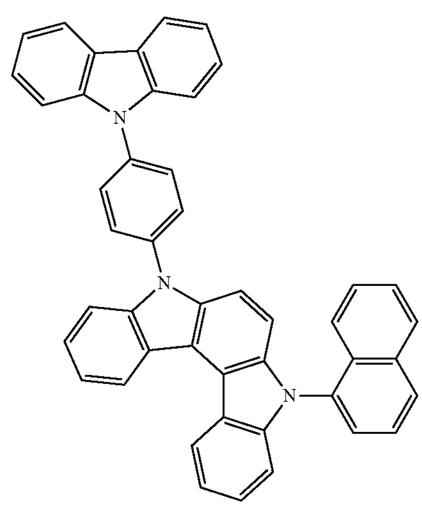

352A
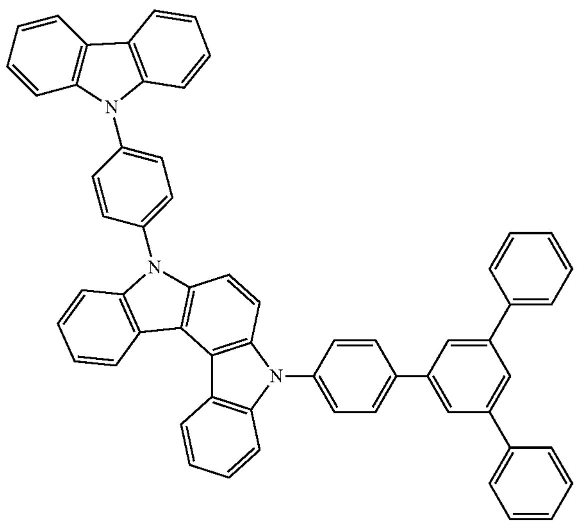
353A
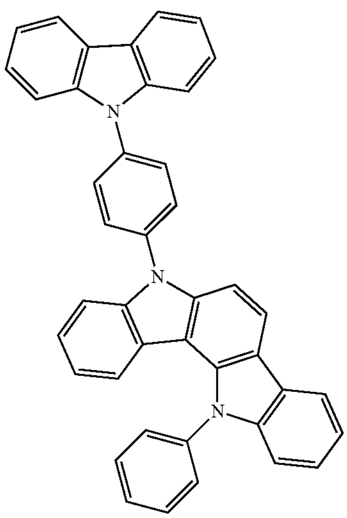
354A
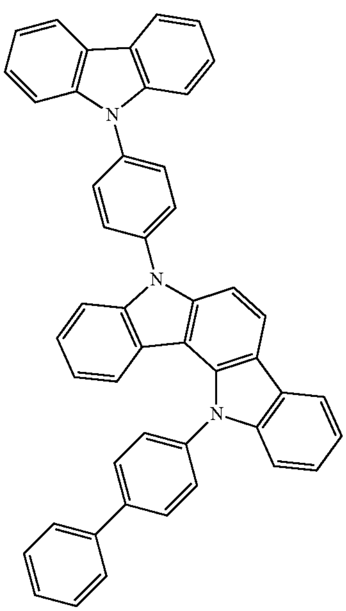
355A
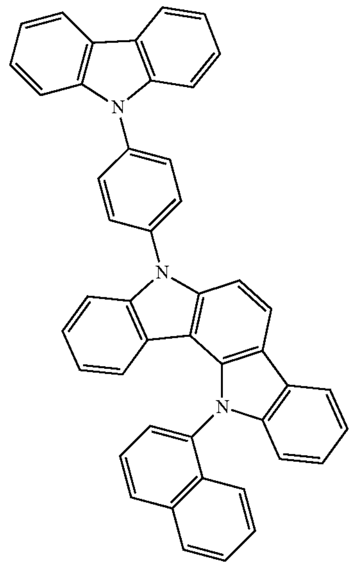
356A
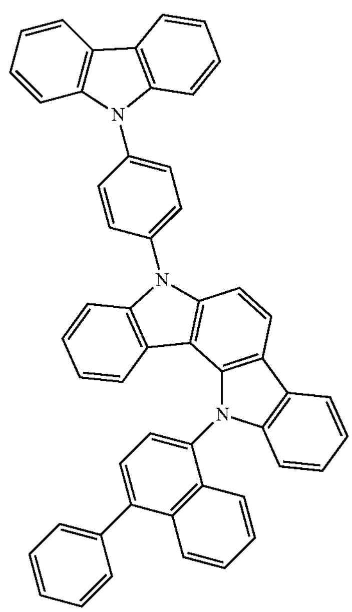

357A
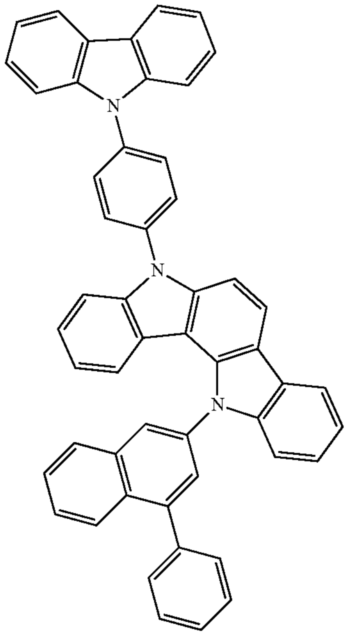
358A
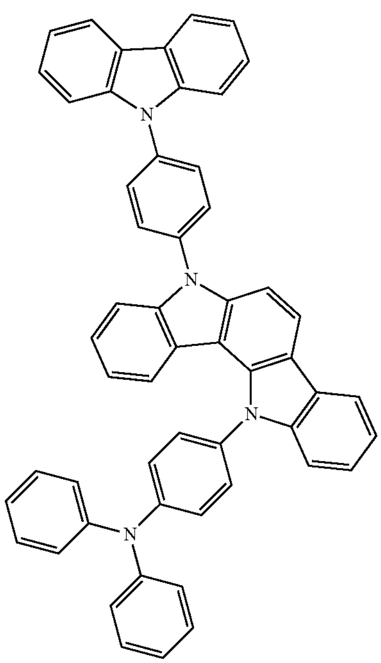
359A
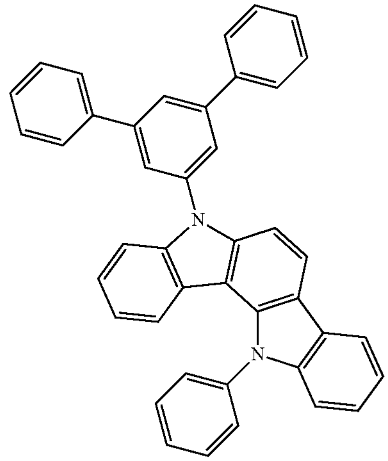
360A
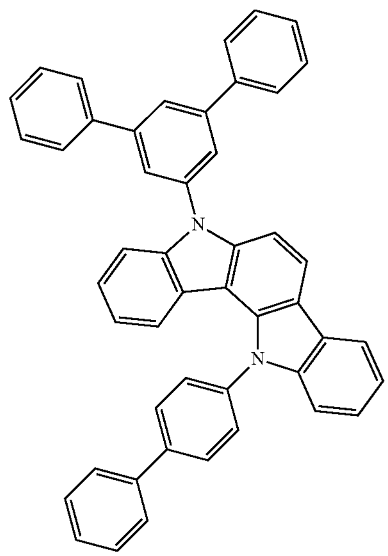
361A
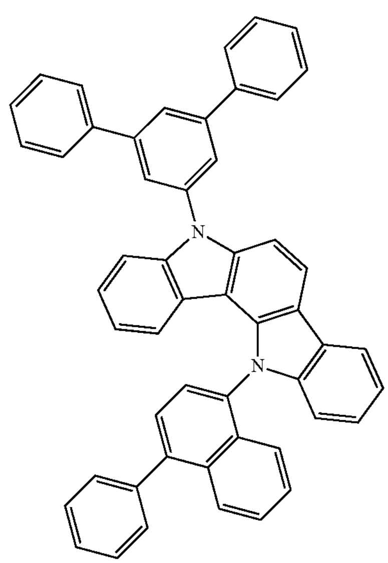

-continued
362A
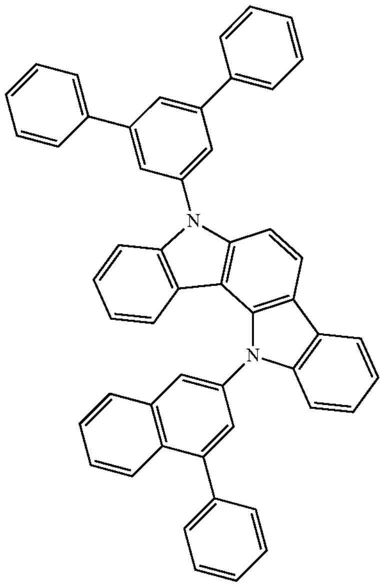
363A
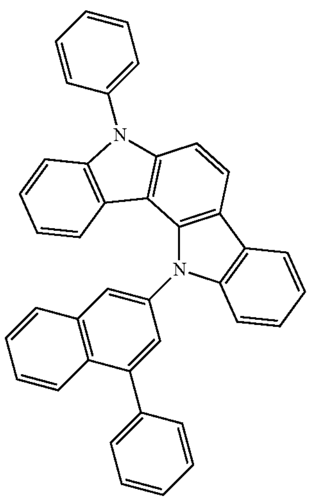
364A
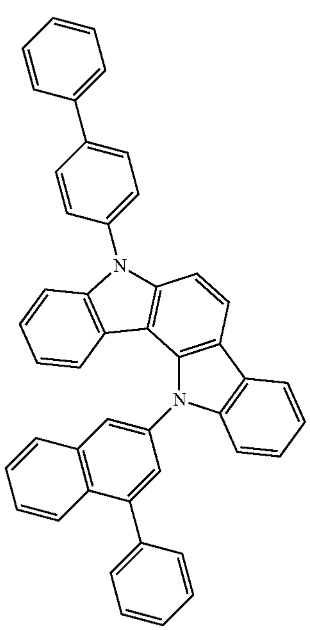
-continued
365A
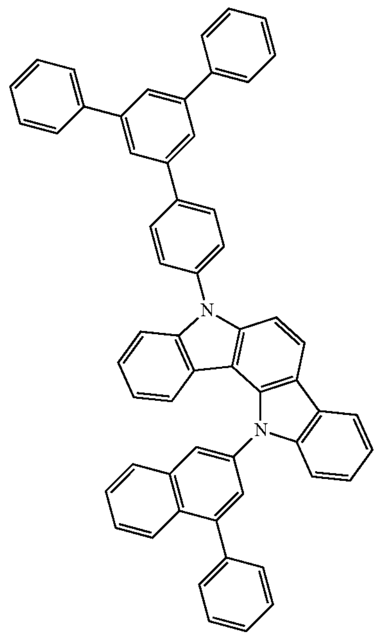
366A
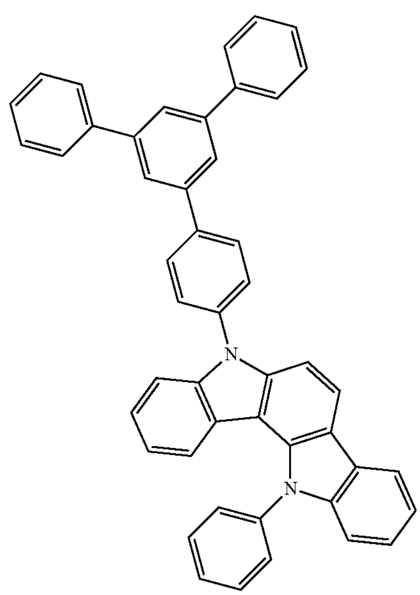

-continued
367A
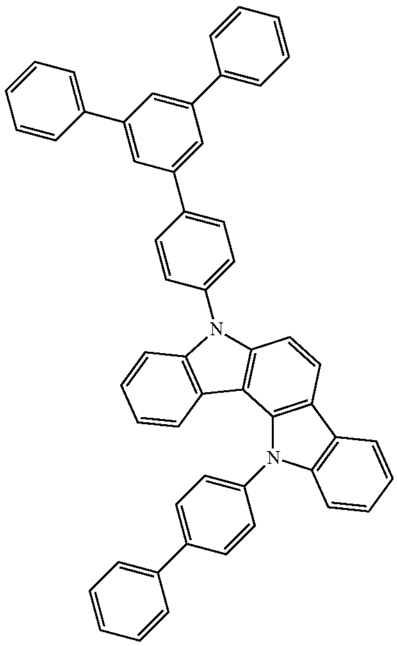
368A
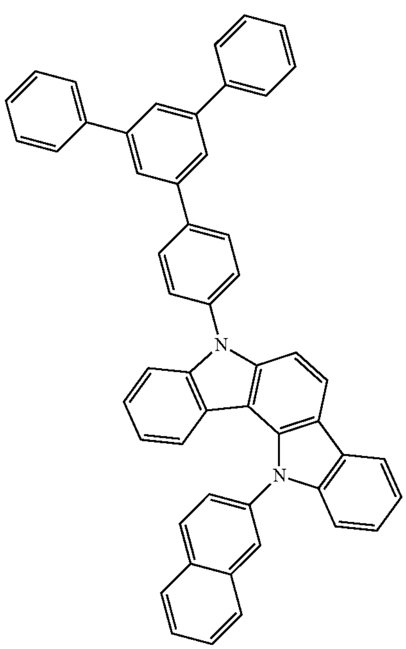
-continued
369A
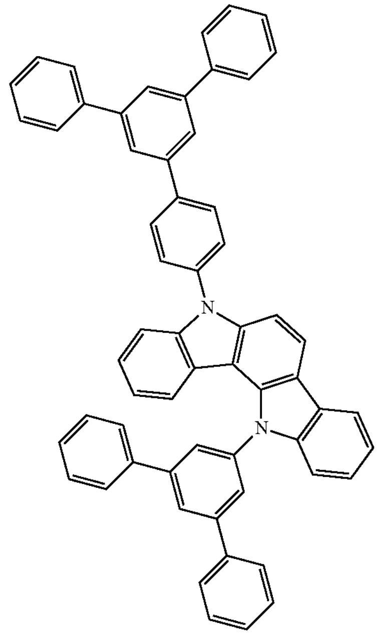
370A
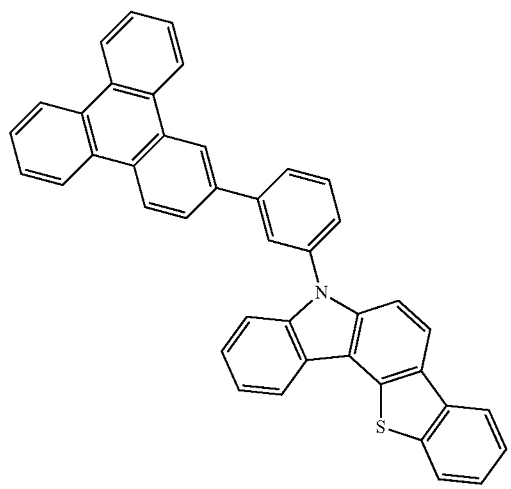
372A
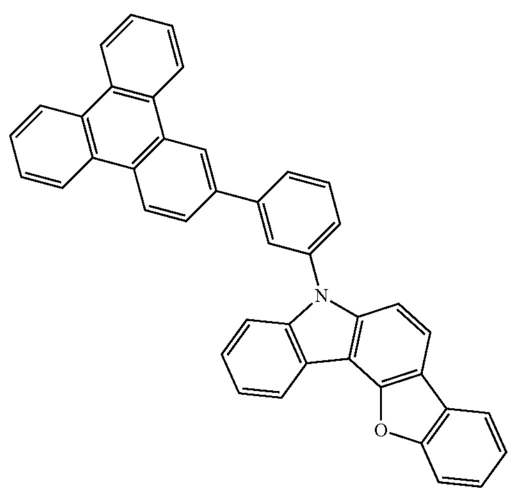

-continued

373A

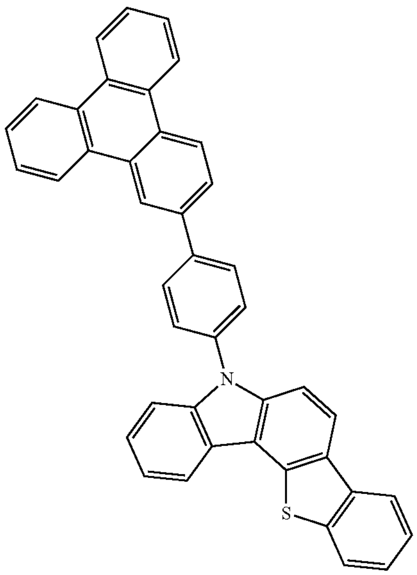

374A

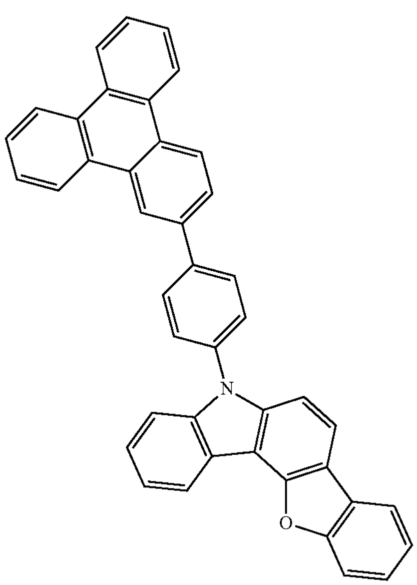

-continued

375A

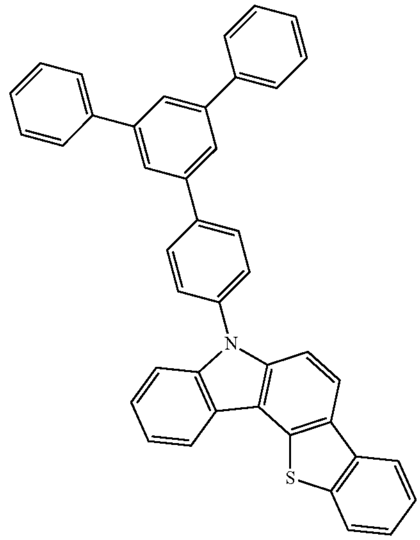

376A

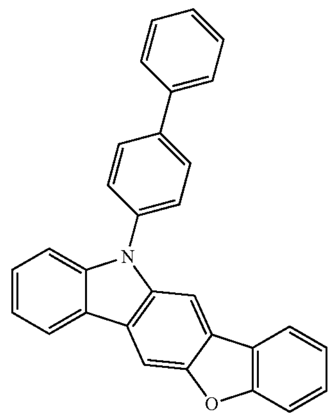

In some embodiments, neither the first compound nor the second compound may include a cyano group.

When the first compound and the second compound include a cyano group, due to very strong electron affinity of the cyano group, lowest unoccupied molecular orbital (LUMO) levels of the compounds may be decreased to below 3.0 eV, which may not be appropriate for a LUMO level of a phosphorescent dopant. Accordingly, an organic light-emitting device including a compound having a cyano group as a host may have a relatively low efficiency.

Also, when the first compound and the second compound include a cyano group, due to the very strong electron affinity of the cyano group, the polarity of the compounds may be too high, and thus electric stability may be decreased. Accordingly, an organic light-emitting device including a compound having a cyano group as a host may have a decreased lifespan.

On the other hand, when neither the first compound nor the second compound includes a cyano group, their LUMO levels may be in a range of about 2.6 eV to about 3.0 eV, which may be appropriate for a LUMO level for a phosphorescent dopant.

When neither the first compound nor the second compound includes a cyano group, their electric stability may be increased.

Accordingly, since neither the first compound nor the second compound includes a cyano group, an organic light-emitting device including the first compound and the second compound may have high efficiency and a longer lifespan.

In some embodiments, the host may include a first compound represented by Formula 1 and a second compound represented by any one of Formulae 2-1 to 2-5;

Formula 1

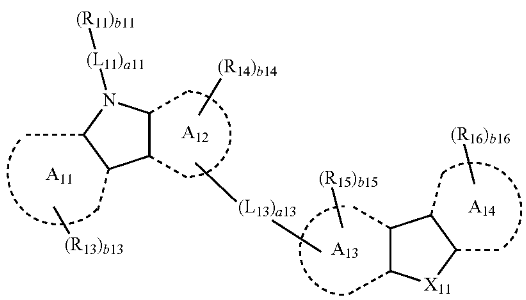

Formula 2-1

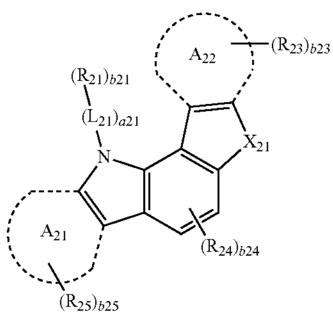

Formula 2-2

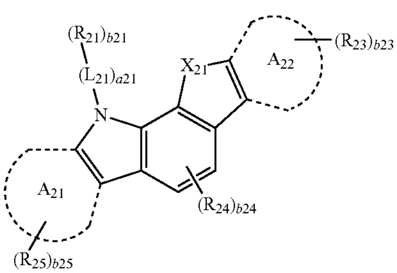

Formula 2-3

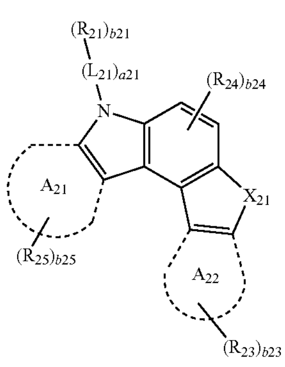

-continued

Formula 2-4

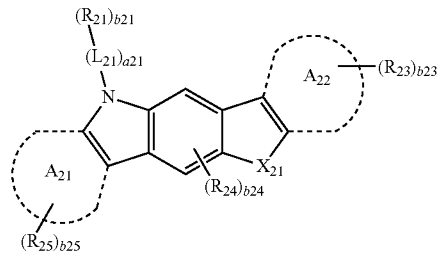

Formula 2-5

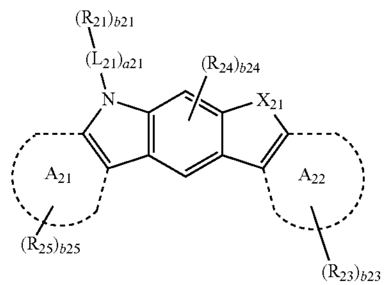

$A_{11}$, $A_{12}$, $A_{13}$, $A_{14}$, $A_{21}$, and $A_{22}$ in Formulae 1, and 2-1 to 2-5 may be each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, and a cinnoline.

For example, $A_{11}$, $A_{12}$, $A_{13}$, $A_{14}$, $A_{21}$, and $A_{22}$ in Formulae 1, and 2-1 to 2-5 may be each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, and a quinazoline.

In some embodiments, in Formula 1, $A_{11}$ and $A_{14}$ may be each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, and a quinazoline, and $A_{12}$ and $A_{13}$ may be each independently a benzene, but they are not limited thereto.

In some embodiments, in Formula 1, $A_{11}$ and $A_{14}$ may be each independently selected from a benzene and a naphthalene, and $A_{12}$ and $A_{13}$ may be each independently a benzene, but they are not limited thereto.

In some embodiments, $A_{11}$ to $A_{14}$ in Formula 1 may be each independently a benzene, but they are not limited thereto.

In some embodiments, $A_{21}$ and $A_{22}$ in Formulae 2-1 to 2-5 may be each independently a benzene, but they are not limited thereto.

$X_{11}$ in Formula 1 may be selected from O, S, $N[(L_{12})_{a12}\text{-}(R_{12})_{b12}]$, $C[(L_{12})_{a12}\text{-}(R_{12})_{b12}][R_{17}]$, $Si[(L_{12})_{a12}\text{-}(R_{12})_{b12}][R_{17}]$, $P[(L_{12})_{a12}\text{-}(R_{12})_{b12}]$, $B[(L_{12})_{a12}\text{-}(R_{12})_{b12}]$, and $P({=}O)[(L_{12})_{a12}\text{-}(R_{12})_{b12}]$.

For example, $X_{11}$ in Formula 1 may be selected from O, S, $N[(L_{12})_{a12}\text{-}(R_{12})_{b12}]$, $C[(L_{12})_{a12}\text{-}(R_{12})_{b12}][R_{17}]$, $Si[(L_{12})_{a2}\text{-}(R_{12})_{b2}][R_{17}]$, $P[(L_{12})_{a12}\text{-}(R_{12})_{b12}]$, $B[(L_{12})_{a12}\text{-}(R_{12})_{b12}]$, and $P({=}O)[(L_{12})_{a12}\text{-}(R_{12})_{b12}]$; and $R_{12}$ and $R_{17}$ may be optionally connected to each other to form a saturated or unsaturated ring, but they are not limited thereto.

In some embodiments, $X_{11}$ in Formula 1 may be selected from O, S, $N[(L_{12})_{a12}-(R_{12})_{b12}]$, and $C[(L_{12})_{a12}-(R_{12})_{b12}][R_{17}]$, but is not limited thereto.

$X_{21}$ in Formulae 2-1 to 2-5 may be selected from O, S, $N[(L_{22})_{a22}-(R_{22})_{b22}]$, $C[(L_{22})_{a22}-(R_{22})_{b22}][R_{26}]$, $Si[(L_{22})_{a22}-(R_{22})_{b22}][R_{26}]$, $P[(L_{22})_{a22}-(R_{22})_{b22}]$, $B[(L_{22})_{a22}-(R_{22})_{b22}]$, and $P(=O)[(L_{22})_{a22}-(R_{22})_{b22}]$.

For example, $X_{21}$ in Formulae 2-1 to 2-5 may be selected from O, S, $N[(L_{22})_{a22}-(R_{22})_{b22}]$ and $C[(L_{22})_{a22}-(R_{22})_{b22}][R_{26}]$, but is not limited thereto.

$L_{11}$ to $L_{13}$, $L_{21}$, and $L_{22}$ in Formulae 1 and 2-1 to 2-5 may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group; and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, and the substituted divalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $-N(Q_{11})(Q_{12})$, $-Si(Q_{13})(Q_{14})(Q_{15})$, and $-B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $-N(Q_{21})(Q_{22})$, $-Si(Q_{23})(Q_{24})(Q_{25})$, and $-B(Q_{26})(Q_{27})$; and $-N(Q_{31})(Q_{32})$, $-Si(Q_{33})(Q_{34})(Q_{35})$, and $-B(Q_{36})(Q_{37})$;

where $Q_{11}$ to $Q_{17}$, $Q_{21}$ to $Q_{27}$, and $Q_{31}$ to $Q_{37}$ may be each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, $L_{11}$ to $L_{13}$, $L_{21}$, and $L_{22}$ in Formulae 1 and 2-1 to 2-5 may be each independently selected from a phenylene group, a naphthylene group, a fluorenylene group, a phenanthrenylene group, a anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group; and a phenylene group, a naphthylene group, a fluorenylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an indazolyl group, a quinolinyl group, an isoquinolinyl group, a carbazolyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, an oxadiazolyl group, a triazinyl group, a dibenzofuranyl group, a dibenzothiophenyl group, a benzocarbazolyl group and a dibenzocarbazolyl group, but they are not limited thereto.

In some embodiments, $L_{11}$ to $L_{13}$, $L_{21}$, and $L_{22}$ in Formulae 1 and 2-1 to 2-5 may be each independently selected from a phenylene group, a naphthylene group, a fluorenylene group, a dibenzofuranylene group, and a dibenzothiophenylene group; and a phenylene group, a naphthylene group, a fluorenylene group, a dibenzofuranylene group, and a dibenzothiophenylene group, each substituted with at least one selected from deuterium, —F, —Cl, —Br, —I, a cyano group, a nitro group, a $C_1$-$C_{20}$ alkyl group, a phenyl group, and a naphthyl group, but they are not limited thereto.

In some embodiments, $L_{11}$ to $L_{13}$, $L_{21}$, and $L_{22}$ in Formulae 1 and 2-1 to 2-5 may be each independently selected from groups represented by Formulae 3-1 to 3-19, but they are not limited thereto:

3-1

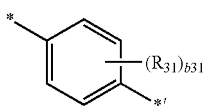

3-2

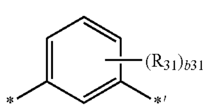

3-3

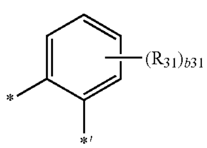

3-4

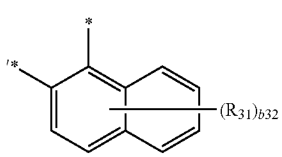

3-5

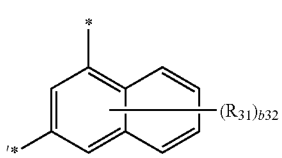

3-6

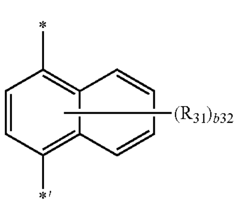

-continued 3-7

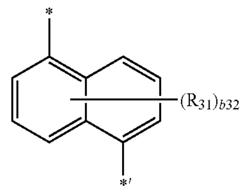

3-8

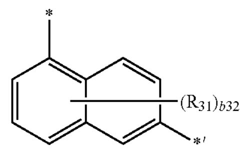

3-9

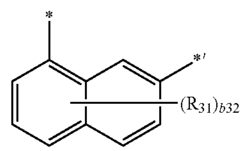

3-10

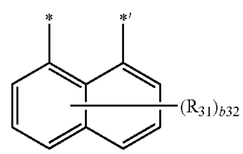

3-11

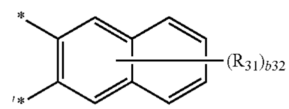

3-12

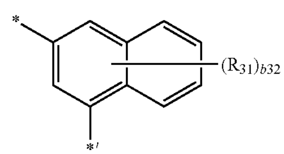

3-13

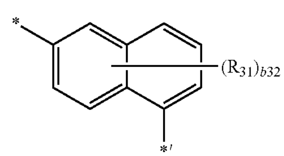

3-14

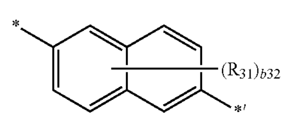

3-15

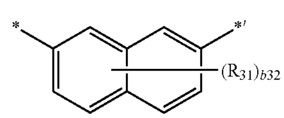

3-16

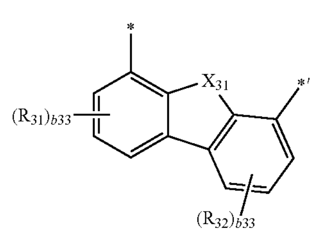

-continued 3-17

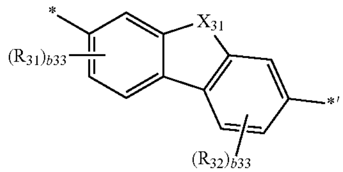

3-18

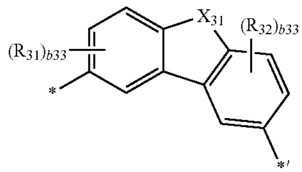

3-19

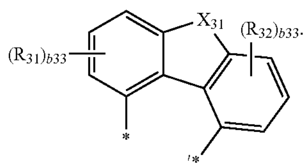

In Formulae 3-1 to 3-19, $X_{31}$ may be selected from O, S, and $C(R_{33})(R_{34})$;

$R_{31}$ to $R_{34}$ may be each independently selected from hydrogen, deuterium, —F, —Cl, —Br, —I, a cyano group, a nitro group, a methyl group, an ethyl group, an n-propyl group, an iso-propyl group, an n-butyl group, iso-butyl group, a sec-butyl group, a tert-butyl group, a phenyl group, and a naphthyl group;

b31 may be selected from 1, 2, 3, and 4;

b32 may be selected from 1, 2, 3, 4, 5, and 6;

b33 may be selected from 1, 2, and 3; and

* and *' each indicate a binding site to a neighboring atom.

In some embodiments, $L_{11}$ to $L_{13}$, $L_{21}$, and $L_{22}$ in Formulae 1 and 2-1 to 2-5 may be each independently selected from groups represented by Formulae 4-1 to 4-13, but they are not limited thereto:

4-1

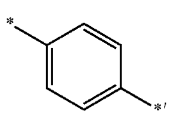

4-2

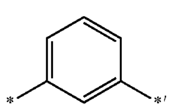

4-3

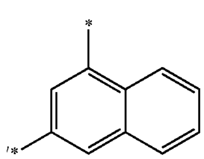

4-4

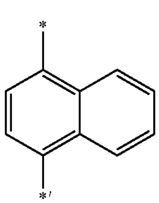

-continued 4-5

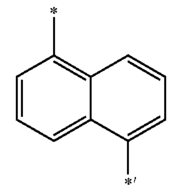

4-6

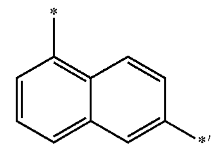

4-7

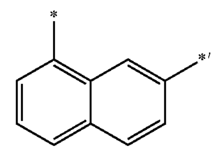

4-8

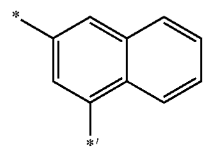

4-9

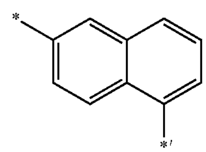

4-10

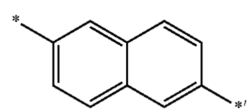

4-11

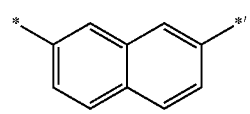

4-12

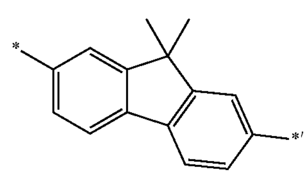

4-13

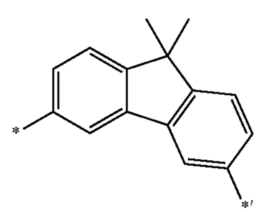

In Formulae 4-1 to 4-13,

* and *' each indicate a binding site to a neighboring atom.

a11 in Formula 1 indicates the number of $L_{11}$, and a11 may be selected from 0, 1, 2, 3, 4, and 5. When a11 is 0, $-(L_{11})_{a11}-$ indicates a single bond. When a11 is 2 or more, a plurality of $L_{11}$ may be identical to or different from each other. For example, a11 in Formula 1 may be selected from 0 and 1, but is not limited thereto.

a12 in Formula 1 indicates the number of $L_{12}$, and a12 may be selected from 0, 1, 2, 3, 4, and 5. When a12 is 0, $-(L_{12})_{a12}-$ is a single bond. When a12 is 2 or more, a plurality of $L_{12}$ may be identical to or different from each other. For example, a12 in Formula 1 may be selected from 0 and 1, but is not limited thereto.

a13 in Formula 1 indicates the number of $L_{13}$, and a13 may be selected from 0, 1, 2, 3, 4, and 5. When a13 is 0, $-(L_{13})_{a13}-$ indicates a single bond. When a13 is 2 or more, a plurality of $L_{13}$ may be identical to or different from each other. For example, a13 in Formula 1 may be selected from 0 and 1, but is not limited thereto. In some embodiments, a13 in Formula 1 may be 0, but is not limited thereto.

a21 in Formulae 2-1 to 2-5 indicates the number of $L_{21}$, and a21 may be selected from 0, 1, 2, 3, 4, and 5. When a21 is 0, $-(L_{21})_{a21}-$ indicates a single bond. When a21 is 2 or more, a plurality of $L_{21}$ may be identical to or different from each other. For example, a21 in Formula 1 may be selected from 0 and 1, but is not limited thereto.

a22 in Formulae 2-1 to 2-5 indicates the number of $L_{22}$, and a22 may be selected from 0, 1, 2, 3, 4, and 5. When a22 is 0, $-(L_{22})_{a22}-$ is a single bond. When a22 is 2 or more, a plurality of $L_{22}$ may be identical to or different from each other. For example, a22 in Formula 1 may be selected from 0 and 1, but is not limited thereto.

In Formulae 1 and 2-1 to 2-5, $R_{11}$ and $R_{12}$ may be each independently $R_{HT}$; $R_{21}$ and $R_{22}$ may be each independently selected from $R_{HT}$ and $R_{ET}$, provided that at least one selected from $R_{21}$ and $R_{22}$ is $R_{ET}$; where $R_{HT}$ is a hole transport group; and $R_{ET}$ is an electron transport group.

b11 in Formula 1 indicates the number of $R_{11}$, and b11 may be selected from 1, 2, 3, and 4. When b11 is 2 or more, a plurality of $R_{11}$ may be identical to or different from each other.

b12 in Formula 1 indicates the number of $R_{12}$, and b12 may be selected from 0, 1, 2, 3, and 4. When b12 is 2 or more, a plurality of $R_{12}$ may be identical to or different from each other.

b21 in Formulae 2-1 to 2-5 indicates the number of $R_{21}$, and may be selected from 1, 2, 3, and 4. When b21 is 2 or more, a plurality of $R_{21}$ may be identical to or different from each other.

b22 in Formulae 2-1 to 2-5 indicates the number of $R_{22}$, and may be selected from 1, 2, 3, and 4. When b22 is 2 or more, a plurality of $R_{22}$ may be identical to or different from each other.

$R_{13}$ to $R_{17}$ and $R_{23}$ to $R_{26}$ in Formulae 1 and 2-1 to 2-5 may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), and —B($Q_6$)($Q_7$);

at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted a monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$);

where $Q_1$ to $Q_7$, $Q_{11}$ to $Q_{17}$, $Q_{21}$ to $Q_{27}$ and $Q_{31}$ to $Q_{37}$ may be each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, $R_{13}$ to $R_{17}$ and $R_{23}$ to $R_{26}$ in Formulae 1 and 2-1 to 2-5 may be each independently selected from hydrogen, a methyl group, an ethyl group, an n-propyl group, an n-butyl group, a phenyl group, a naphthyl group, an anthryl group, a pyrenyl group, a phenanthrenyl group, a fluorenyl group, a carbazolyl group, —N($Q_1$)($Q_2$), and —Si($Q_3$)($Q_4$)($Q_5$); and a phenyl group, a naphthyl group, an anthryl group, a pyrenyl group, a phenanthrenyl group, a fluorenyl group, and a carbazolyl group, each substituted with at least one selected from deuterium, —F, —Cl, —Br, —I, a cyano group, a nitro group, a methyl group, a phenyl group, and a naphthyl group, where $Q_1$ to $Q_5$ may be each independently selected from a $C_1$-$C_{60}$ alkyl group, a $C_6$-$C_{60}$ aryl group, a monovalent non-aromatic condensed polycyclic group, and a monovalent non-aromatic condensed heteropolycyclic group, but they are not limited thereto.

In some embodiments, $R_{13}$ to $R_{17}$ and $R_{23}$ to $R_{26}$ in Formulae 1 and 2-1 to 2-5 may be each independently selected from hydrogen, a methyl group, a phenyl group, a naphthyl group, a carbazolyl group, —N($Q_1$)($Q_2$), and —Si($Q_3$)($Q_4$)($Q_5$), where $Q_1$ to $Q_5$ may be each independently selected from a methyl group, an ethyl group, a phenyl group, and a naphthyl group, but they are not limited thereto.

In some embodiments, $R_{13}$ to $R_{17}$ and $R_{23}$ to $R_{26}$ in Formulae 1 and 2-1 to 2-5 may be each independently hydrogen, but they are not limited thereto.

b13 to b16 and b23 to b25 in Formulae 1 and 2-1 to 2-5 may be each independently selected from 1, 2, 3, and 4.

For example, $R_{HT}$ in Formulae 1 and 2-1 to 2-5 may be selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a thianthrenyl group, a phenoxathinyl group, and a dibenzodioxinyl group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a thianthrenyl group, a phenoxathinyl group, and a dibenzodioxinyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, —N($Q_{41}$)($Q_{42}$), —Si($Q_{43}$)($Q_{44}$)($Q_{45}$), and —B($Q_{46}$)($Q_{47}$); and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a thianthrenyl group, a phenoxathinyl group, and a dibenzodioxinyl group, each substituted with at least one selected from a phenyl group, a naphthyl group, a fluorenyl group, and a carbazolyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a benzofluorenyl group, a dibenzofluorenyl group, a carbazolyl group, —N($Q_{51}$)($Q_{52}$), —Si($Q_{53}$)($Q_{54}$)($Q_{55}$), and —B($Q_{56}$)($Q_{57}$);

where $Q_{41}$ to $Q_{47}$ and $Q_{51}$ to $Q_{57}$ may be each independently selected from a $C_1$-$C_{60}$ alkyl group, a $C_6$-$C_{60}$ aryl group, a monovalent non-aromatic condensed polycyclic group, and a monovalent non-aromatic condensed heteropolycyclic group, but embodiments of the present invention are not limited thereto.

In some embodiments, $R_{HT}$ in Formulae 1 and 2-1 to 2-5 may be each independently selected from a phenyl group, a naphthyl group, a fluorenyl group, a phenanthrenyl group, an anthracenyl group, a triphenylenyl group, a carbazolyl group, a benzofuranyl group, a benzothiophenyl group, a dibenzofuranyl group, a dibenzothiophenyl group, a thianthrenyl group, a phenoxathinyl group and a dibenzodioxinyl group;

a phenyl group, a naphthyl group, a fluorenyl group, a phenanthrenyl group, an anthracenyl group, a triphenylenyl group, a carbazolyl group, a benzofuranyl group, a benzothiophenyl group, a dibenzofuranyl group, a dibenzothiophenyl group, a thianthrenyl group, a phenoxathinyl group, and a dibenzodioxinyl group, each substituted with at least one selected from deuterium, a $C_1$-$C_{20}$ alkyl group, a $C_1$-$C_{20}$ alkoxy group, a phenyl group, a naphthyl group, a fluorenyl group, a carbazolyl group, —N($Q_{41}$)($Q_{42}$), and —Si($Q_{43}$)($Q_{44}$)($Q_{45}$); and a phenyl group, a naphthyl group, a fluorenyl group, a phenanthrenyl group, an anthracenyl group, a triphenylenyl group, a carbazolyl group, a benzofuranyl group, a benzothiophenyl group, a dibenzofuranyl group, a dibenzothiophenyl group, a thianthrenyl group, a phenoxathinyl group, and a dibenzodioxinyl group, each substituted with at least one selected from a phenyl group, a naphthyl group, a fluorenyl group and a carbazolyl group, each substituted with at least one selected from deuterium, a $C_1$-$C_{20}$ alkyl group, a $C_1$-$C_{20}$ alkoxy group, a phenyl group, a naphthyl group, —N($Q_{51}$)($Q_{52}$), and —Si($Q_{53}$)($Q_{54}$)($Q_{55}$);

where $Q_{41}$ to $Q_{45}$ and $Q_{51}$ to $Q_{55}$ may be each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group, but embodiments of the present invention are not limited thereto.

In some embodiments, $R_{HT}$ in Formulae 1 and 2-1 to 2-5 may be selected from groups represented by Formulae 5-1 to 5-12, but embodiments of the present invention are not limited thereto:

5-1

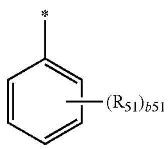

5-2

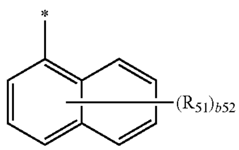

5-3

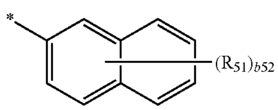

5-4

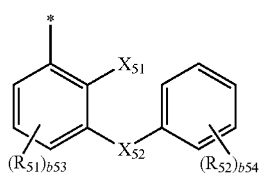

5-5

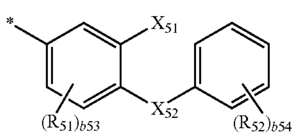

5-6

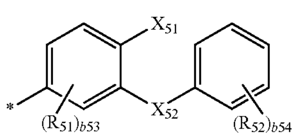

5-7

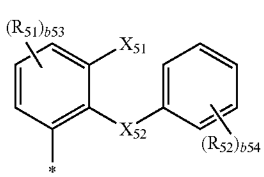

5-8

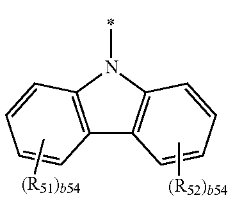

-continued 5-9

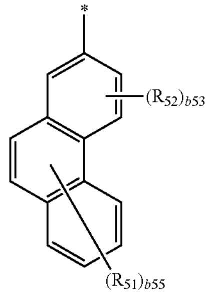

5-10

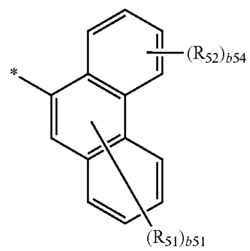

5-11

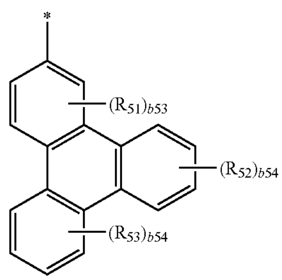

5-12

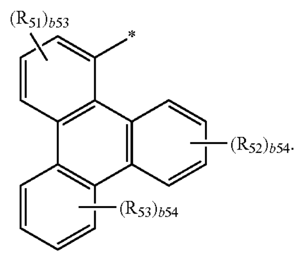

In Formulae 5-1 to 5-12, $X_{51}$ is selected from a single bond, N($R_{54}$), C($R_{54}$)($R_{55}$), O, and S;

$X_{52}$ is selected from N($R_{56}$), C($R_{56}$)($R_{57}$), O, and S;

$R_{51}$ to $R_{57}$ may be each independently selected from:

deuterium, a $C_1$-$C_{20}$ alkyl group, a phenyl group, a naphthyl group, a fluorenyl group, a carbazolyl group, —N($Q_{41}$)($Q_{42}$), and —Si($Q_{43}$)($Q_{44}$)($Q_{45}$); and a phenyl group, a naphthyl group, a fluorenyl group, and a carbazolyl group, each substituted with at least one selected from deuterium, a $C_1$-$C_{20}$ alkyl group, a phenyl group, a naphthyl group, —N($Q_{51}$)($Q_{52}$), and —Si($Q_{53}$)($Q_{54}$)($Q_{55}$);

where $Q_{41}$ to $Q_{45}$ and $Q_{51}$ to $Q_{55}$ are each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group;

b51 may be selected from 1, 2, 3, 4, and 5;

b52 may be selected from 1, 2, 3, 4, 5, 6, and 7;

b53 may be selected from 1, 2, and 3;

b54 may be selected from 1, 2, 3, and 4;

b55 may be selected from 1, 2, 3, 4, 5, and 6; and

* indicates a binding site to a neighboring atom.

For example, $R_{ET}$ in Formulae 1 and 2-1 to 2-5 may be selected from a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a benzophenanthrolinyl group, a phenazinyl group, a benzimidazolyl group, a naphthoimidazolyl group, a benzothiazolyl group, an isobenzothiazolyl group, a benzoxazolyl group, an isobenzoxazolyl group, a triazolyl group, a tetrazolyl group, an oxadiazolyl group, a triazinyl group, an imidazopyridinyl group, an imidazopyrimidinyl group, an imidazoquinolinyl group, an imidazoisoquinolinyl group, a pyridobenzofuranyl group, a pyrimidobenzofuranyl group, a pyridobenzothiophenyl group, and a pyrimidobenzothiophenyl group;

a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a benzophenanthrolinyl group, a phenazinyl group, a benzimidazolyl group, a naphthoimidazolyl group, a benzothiazolyl group, an isobenzothiazolyl group, a benzoxazolyl group, an isobenzoxazolyl group, a triazolyl group, a tetrazolyl group, an oxadiazolyl group, a triazinyl group, an imidazopyridinyl group, an imidazopyrimidinyl group, an imidazoquinolinyl group, an imidazoisoquinolinyl group, a pyridobenzofuranyl group, a pyrimidobenzofuranyl group, a pyridobenzothiophenyl group, and a pyrimidobenzothiophenyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, a pyridinyl group, a pyrimidinyl group, a triazinyl group, —N($Q_{41}$)($Q_{42}$), —Si($Q_{43}$)($Q_{44}$)($Q_{45}$), and —B($Q_{46}$)($Q_{47}$); and a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a benzophenanthrolinyl group, a phenazinyl group, a benzimidazolyl group, a naphthoimidazolyl group, a benzothiazolyl group, an isobenzothiazolyl group, a benzoxazolyl group, an isobenzoxazolyl group, a triazolyl group, a tetrazolyl group, an oxadiazolyl group, a triazinyl group, an imidazopyridinyl group, an imidazopyrimidinyl group, an imidazoquinolinyl group, an imidazoisoquinolinyl group, a pyridobenzofuranyl group, a pyrimidobenzofuranyl group, a pyridobenzothiophenyl group, and a pyrimidobenzothiophenyl group, each substituted with at least one selected from a phenyl group, a naphthyl group, a fluorenyl group, a carbazolyl group, a pyridinyl group, a pyrimidinyl group, and a triazinyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a benzofluorenyl group, a dibenzofluorenyl group, a carbazolyl group, a pyridinyl group, a pyrimidinyl group, a triazinyl group, —N($Q_{51}$)($Q_{52}$), —Si($Q_{53}$)($Q_{54}$)($Q_{55}$), and —B($Q_{56}$)($Q_{57}$);

where $Q_{41}$ to $Q_{47}$ and $Q_{51}$ to $Q_{57}$ may be each independently selected from a $C_1$-$C_{60}$ alkyl group, a $C_6$-$C_{60}$ aryl group, a monovalent non-aromatic condensed polycyclic group, and a monovalent non-aromatic condensed heteropolycyclic group, but embodiments of the present invention are not limited thereto.

In some embodiments, $R_{ET}$ in Formulae 1 and 2-1 to 2-5 may be selected from a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a phenanthridinyl group, a phenanthrolinyl group, a benzophenanthrolinyl group, a benzimidazolyl group, a naphthoimidazolyl group, a triazinyl group, an imidazopyridinyl group, an imidazopyrimidinyl group, an imidazoquinolinyl group, and an imidazoisoquinolinyl group;

a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a phenanthridinyl group, a phenanthrolinyl group, a benzophenanthrolinyl group, a benzimidazolyl group, a naphthoimidazolyl group, a triazinyl group, an imidazopyridinyl group, an imidazopyrimidinyl group, an imidazoquinolinyl group, and imidazoisoquinolinyl group, each substituted with at least one selected from deuterium, a $C_1$-$C_{20}$ alkyl group, a phenyl group, a naphthyl group, a fluorenyl group, a carbazolyl group, a pyridinyl group, —N($Q_{41}$)($Q_{42}$), and —Si($Q_{43}$)($Q_{44}$)($Q_{45}$); and a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a phenanthridinyl group, a phenanthrolinyl group, a benzophenanthrolinyl group, a benzimidazolyl group, a naphthoimidazolyl group, a triazinyl group, an imidazopyridinyl group, an imidazopyrimidinyl group, an imidazoquinolinyl group, and an imidazoisoquinolinyl group, each substituted with at least one selected from a phenyl group, a naphthyl group, a fluorenyl group, a carbazolyl group and a pyridinyl group, each substituted with at least one selected from deuterium, a $C_1$-$C_{20}$ alkyl group, a phenyl group, a naphthyl group, a pyridinyl group, —N($Q_{51}$)($Q_{52}$), and —Si($Q_{53}$)($Q_{54}$)($Q_{55}$);

where $Q_{41}$ to $Q_{45}$ and $Q_{51}$ to $Q_{55}$ may be each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group, but embodiments of the present invention are not limited thereto.

In some embodiments, $R_{ET}$ in Formulae 1 and 2-1 to 2-5 may be selected from groups represented by Formulae 6-1 to 6-63, but is not limited thereto:
6-1
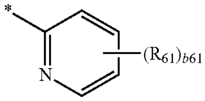
6-2
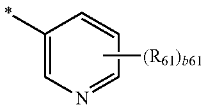
6-3
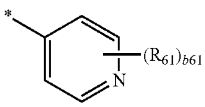
6-4
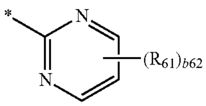
6-5
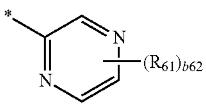
6-6
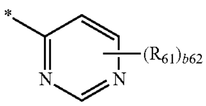
6-7
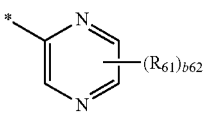
6-8
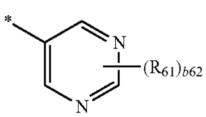
6-9
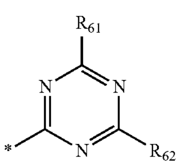
6-10
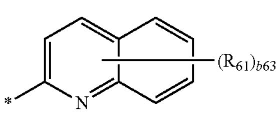
6-11
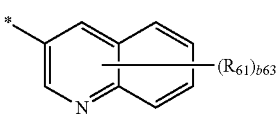
6-12
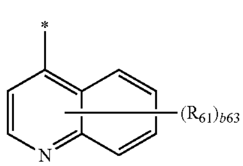
-continued
6-13
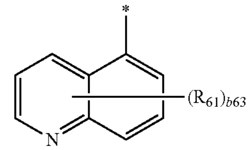
6-14
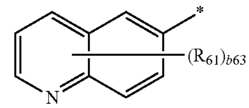
6-15
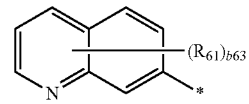
6-16
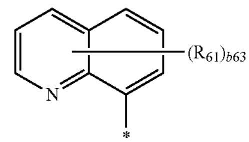
6-17
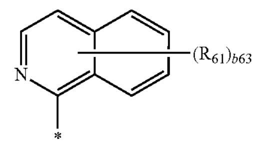
6-18
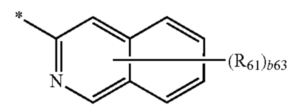
6-19
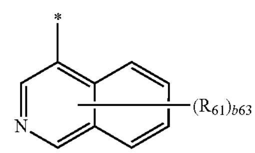
6-20
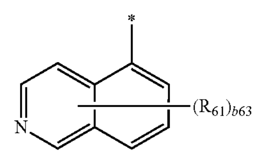
6-21
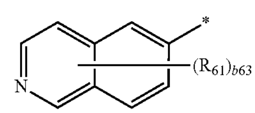
6-22
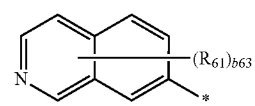
6-23
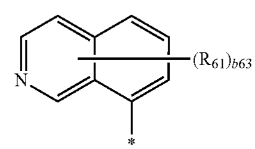
6-24
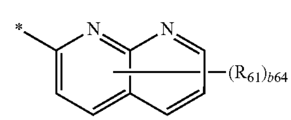

-continued
6-25
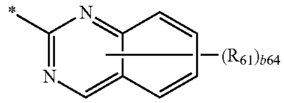
6-26
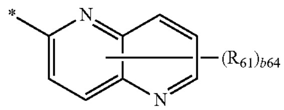
6-27
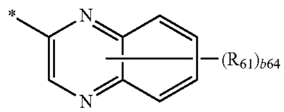
6-28
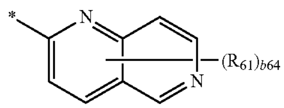
6-29
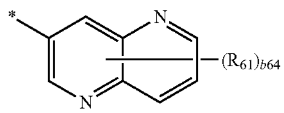
6-30
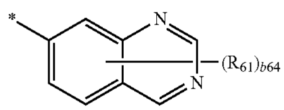
6-31
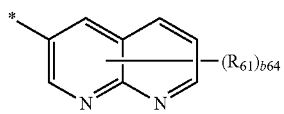
6-32
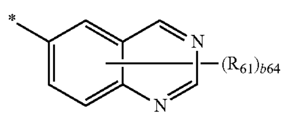
6-33
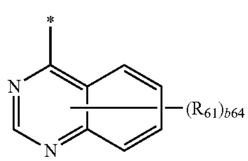
6-34
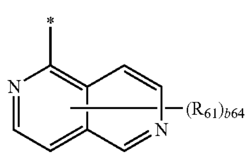
6-35
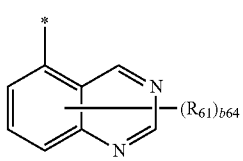
6-36
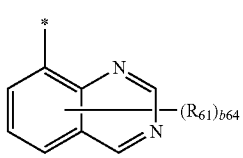
-continued
6-37
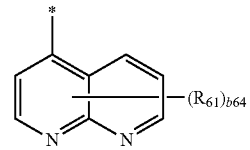
6-38
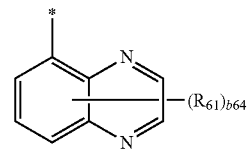
6-39
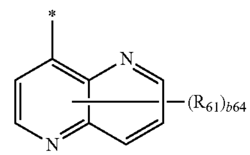
6-40
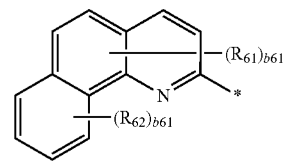
6-41
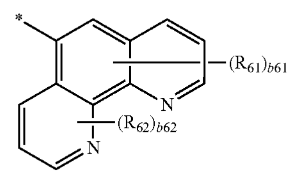
6-42
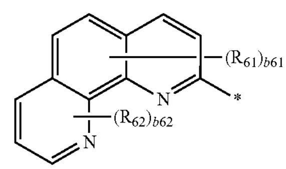
6-43
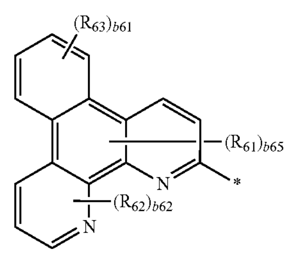
6-44
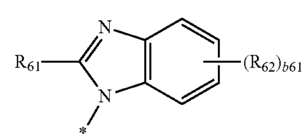
6-45
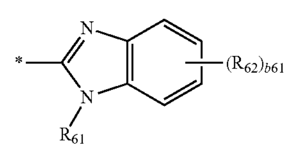

-continued 6-46

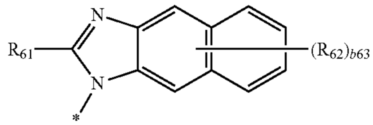

6-47

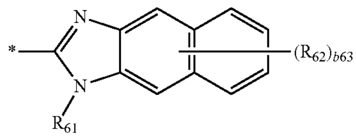

6-48

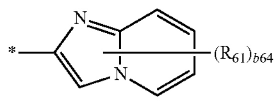

6-49

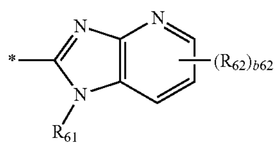

6-50

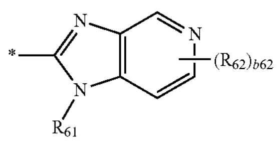

6-51

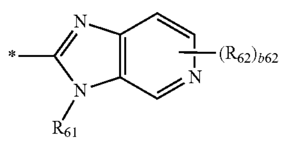

6-52

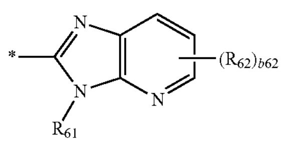

6-53

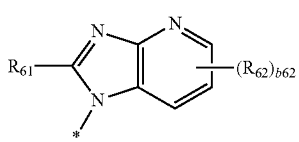

6-54

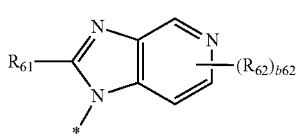

6-55

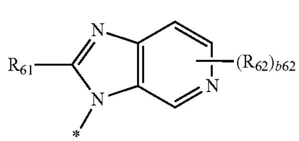

6-56

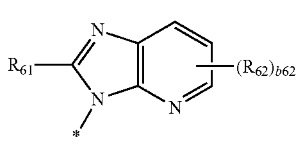

-continued 6-57

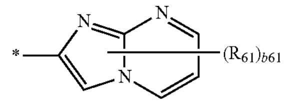

6-58

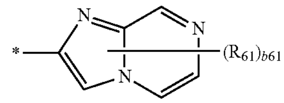

6-59

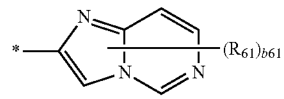

6-60

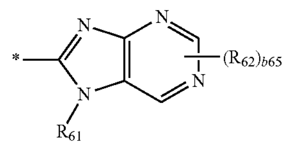

6-61

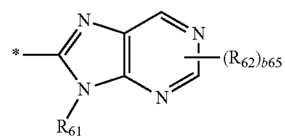

6-62

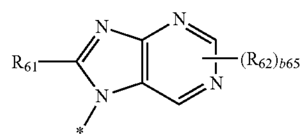

6-63

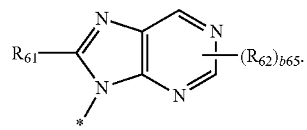

In Formulae 6-1 to 6-63, $R_{61}$ to $R_{63}$ may be each independently selected from:

deuterium, a $C_1$-$C_{20}$ alkyl group, a phenyl group, a naphthyl group, a fluorenyl group, a carbazolyl group, a pyridinyl group, —N($Q_{41}$)($Q_{42}$), and —Si($Q_{43}$)($Q_{44}$)($Q_{45}$); and a phenyl group, a naphthyl group, a fluorenyl group, a carbazolyl group, a pyridinyl group, each substituted with at least one selected from deuterium, a $C_1$-$C_{20}$ alkyl group, a phenyl group, a naphthyl group, a pyridinyl group, —N($Q_{51}$)($Q_{52}$), and —Si($Q_{53}$)($Q_{54}$)($Q_{55}$);

where $Q_{41}$ to $Q_{45}$ and $Q_{51}$ to $Q_{55}$ may be each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group;

b61 may be selected from 1, 2, 3, and 4; and b62 may be selected from 1, 2, and 3;

b63 may be selected from 1, 2, 3, 4, 5, and 6;

b64 may be selected from 1, 2, 3, 4, and 5;

b65 may be selected from 1 and 2; and

* indicates a binding site to a neighboring atom.

For example, the first compound may be represented by Formula 1-1 below, but is not limited thereto:

Formula 1-1

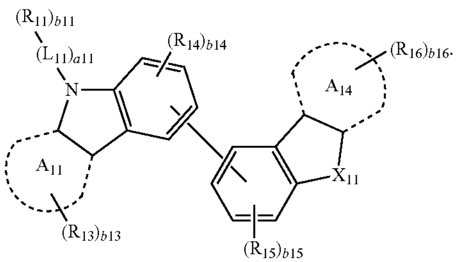

In Formula 1-1, descriptions of $A_{11}$, $A_{14}$, $X_{11}$, $L_{11}$, a11, $R_{11}$, $R_{13}$ to $R_{16}$, b11, and b13 to b16 are the same as described above.

In some embodiments, the second compound may be represented by any one of Formulae 2-11 to 2-15 below, but embodiments of the present invention are not limited thereto:

Formula 2-11

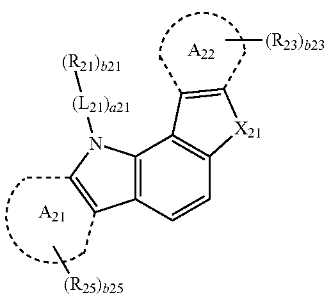

Formula 2-12

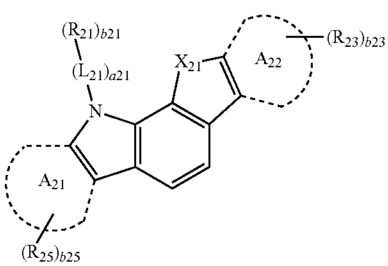

Formula 2-13

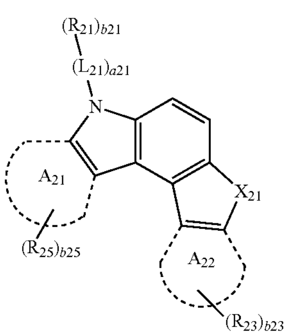

-continued

Formula 2-14

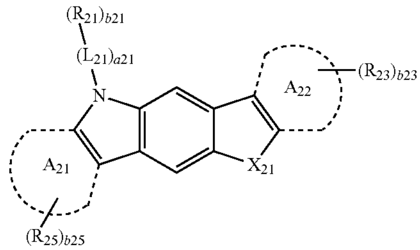

Formula 2-15

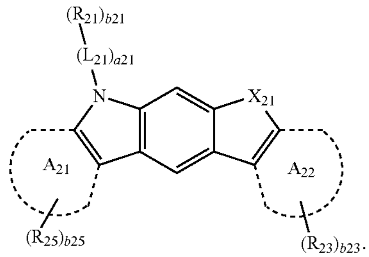

In Formulae 2-11 to 2-15, descriptions of $A_{21}$, $A_{22}$, $L_{21}$, a21, $X_{21}$, $R_{21}$, $R_{23}$, $R_{25}$, b21, b23, and b25 are the same as described above.

In some embodiments, the first compound may be selected from Compounds 101B to 230B below, but is not limited thereto:

101B

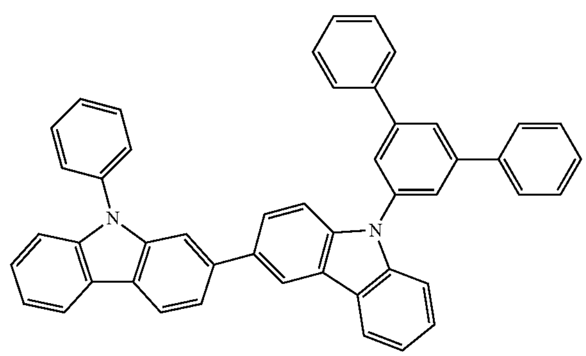

102B

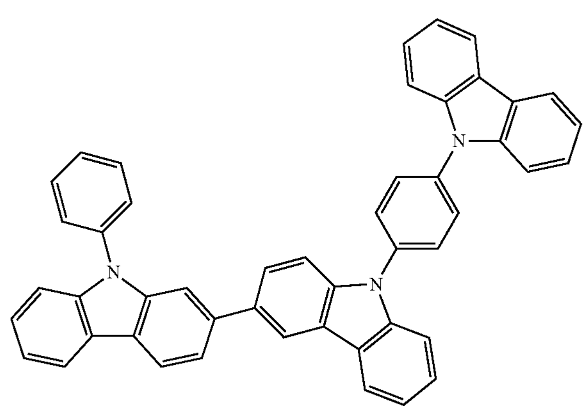

-continued
103B
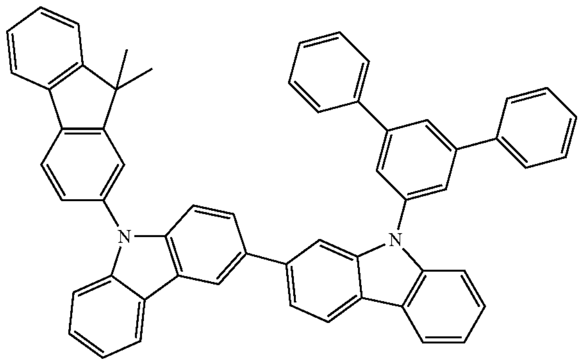
104B
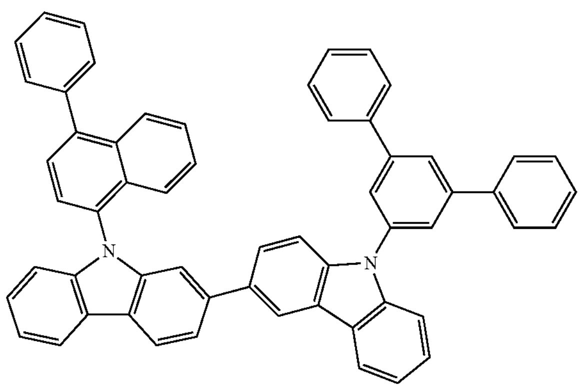
105B
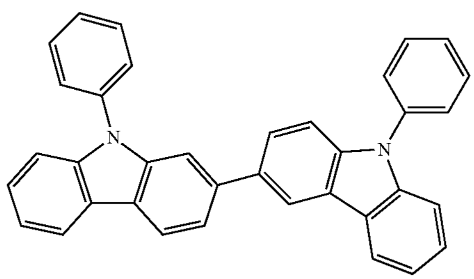
106B
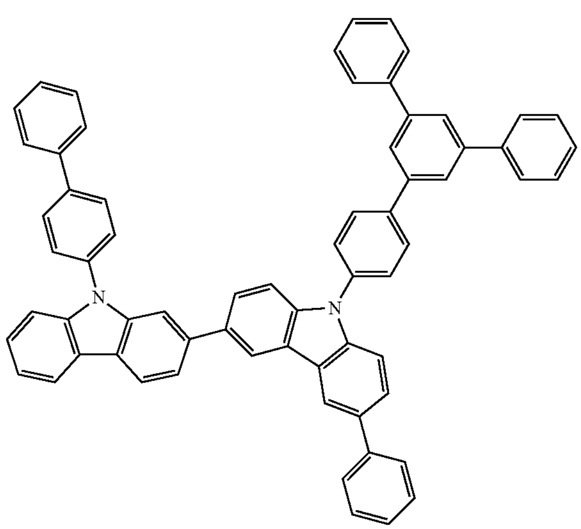
-continued
107B
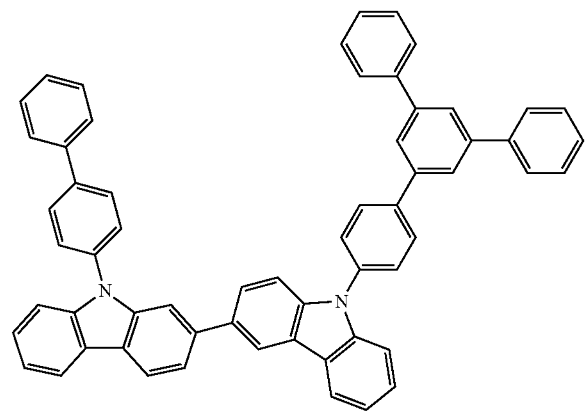
108B
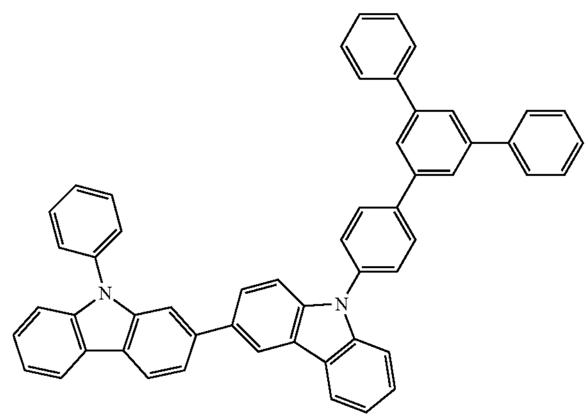
109B
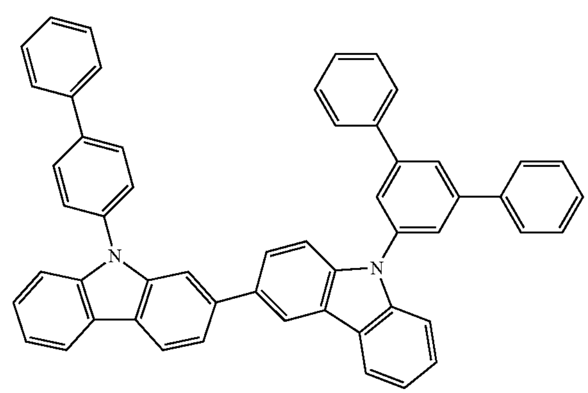

-continued
110B
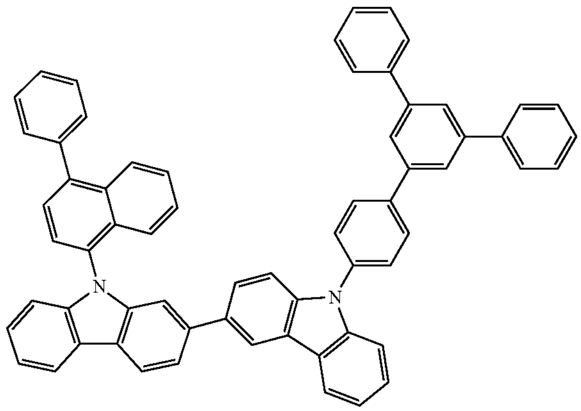
111B
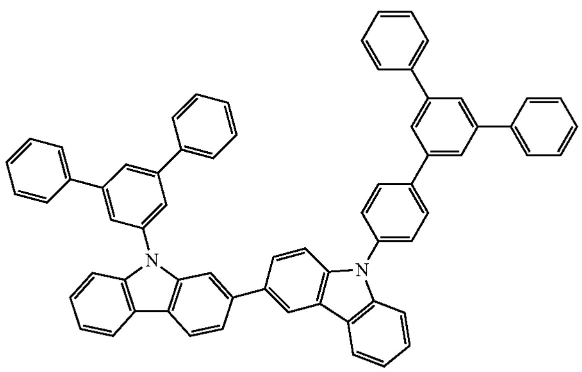
112B
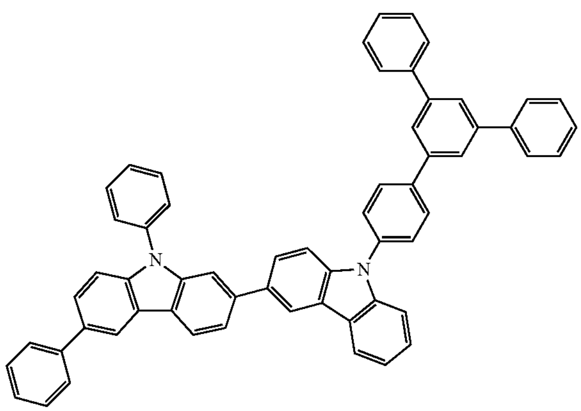
113B
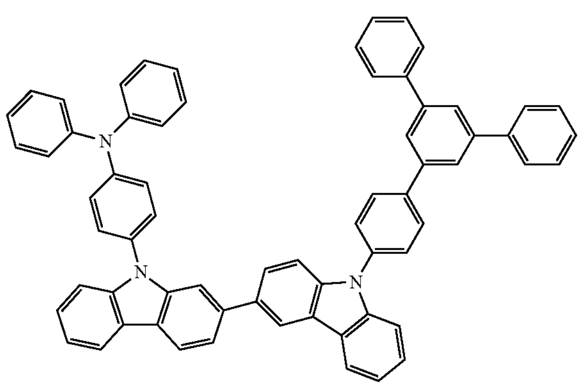
-continued
114B
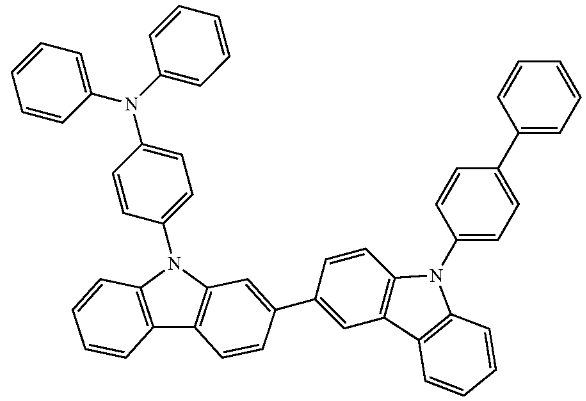
115B
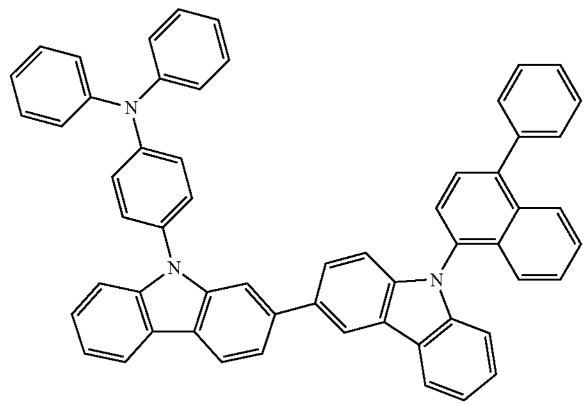
116B
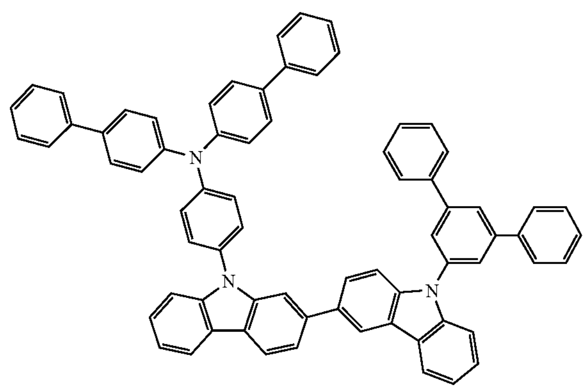
117B
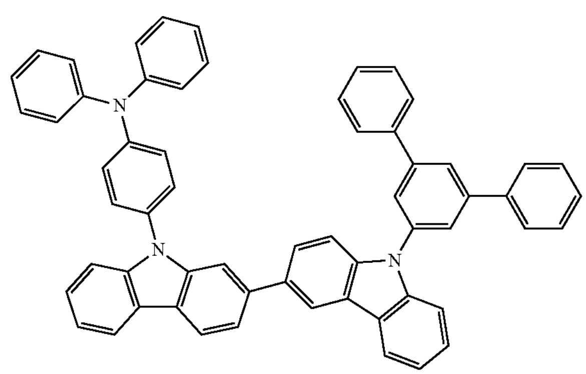

-continued
118B
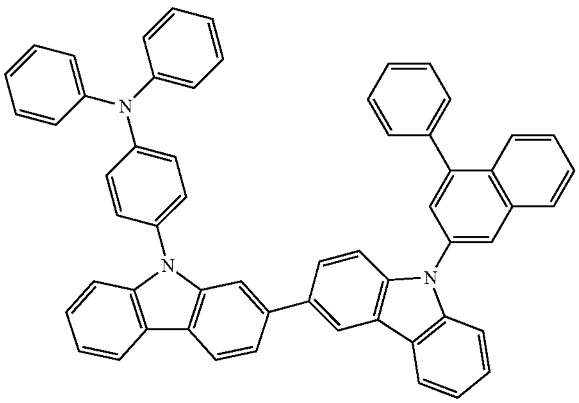
119B
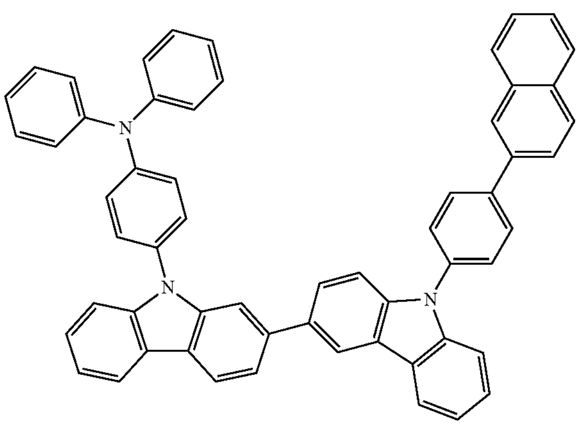
120B
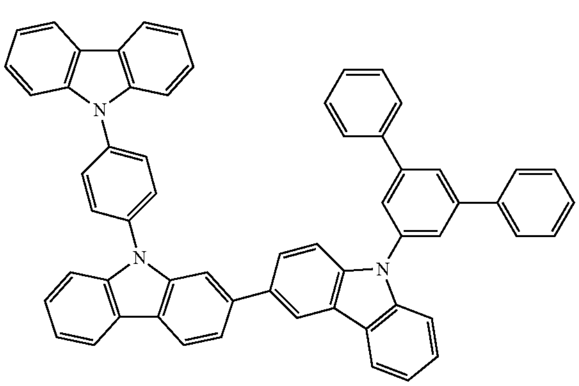
-continued
121B
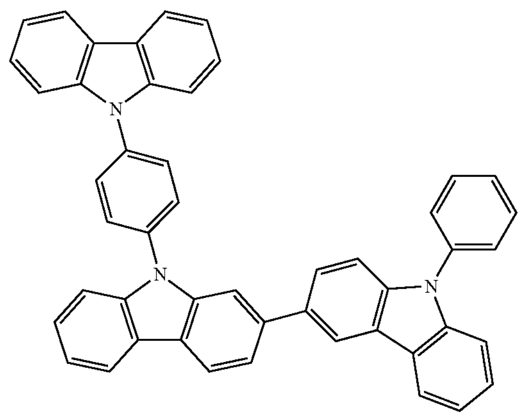
122B
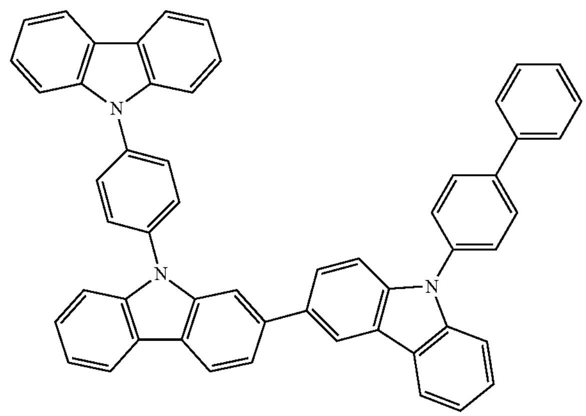
123B
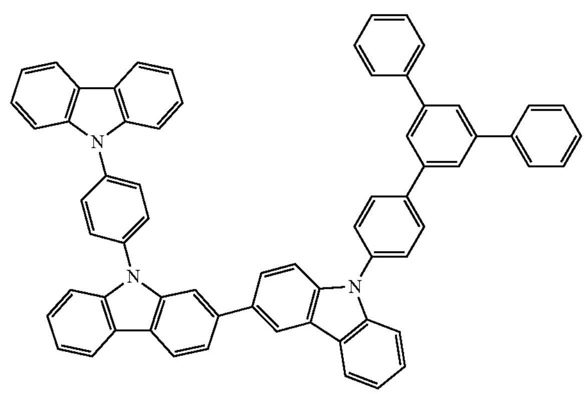
124B
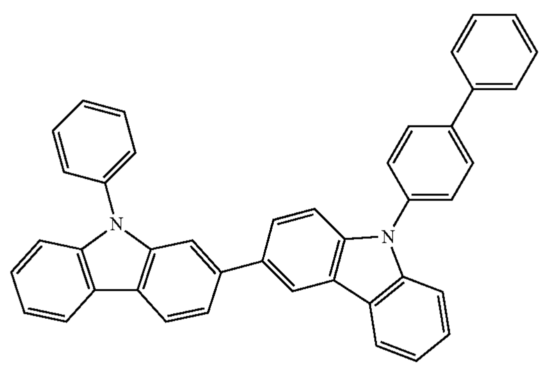

-continued
125B
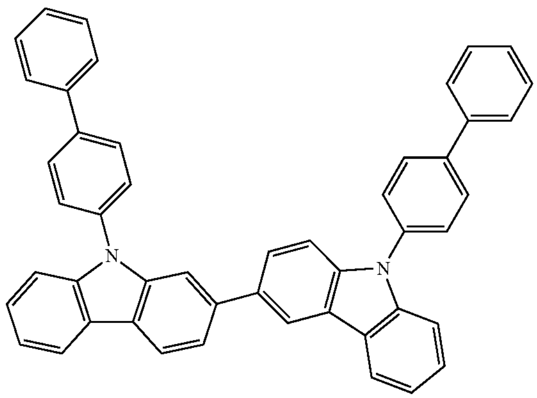
126B
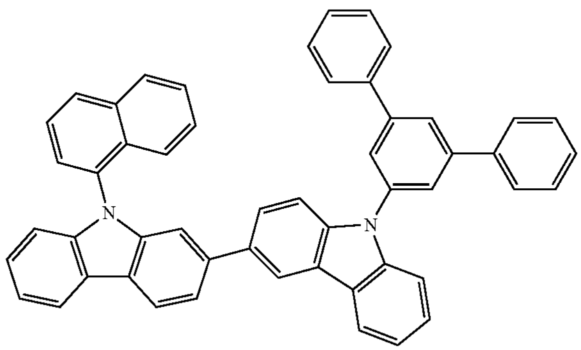
127B
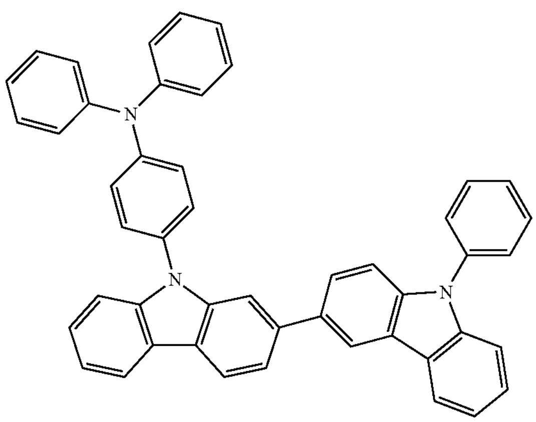
128B
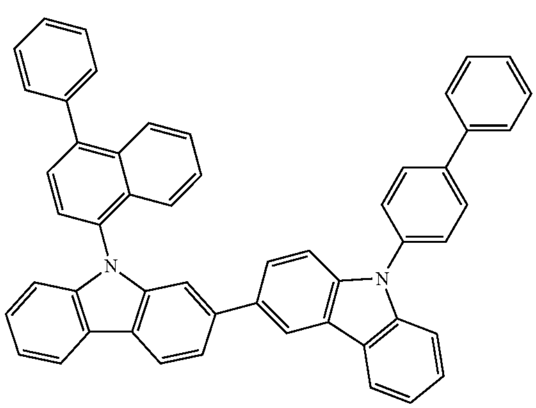
-continued
129B
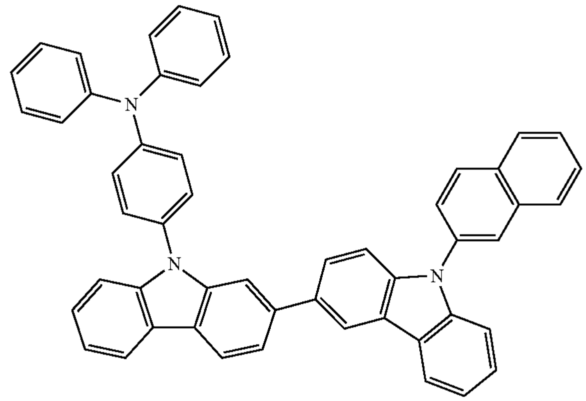
130B
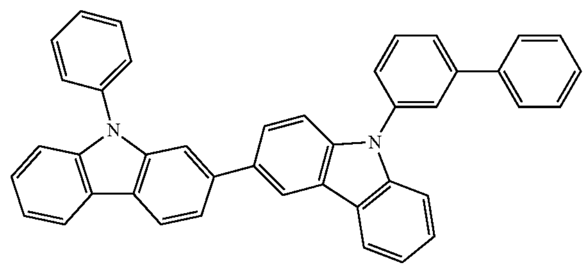
131B
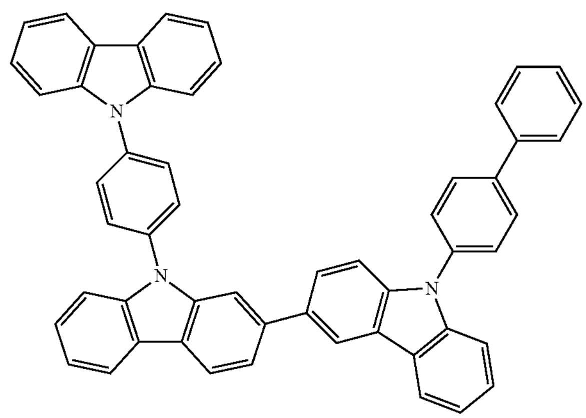
132B
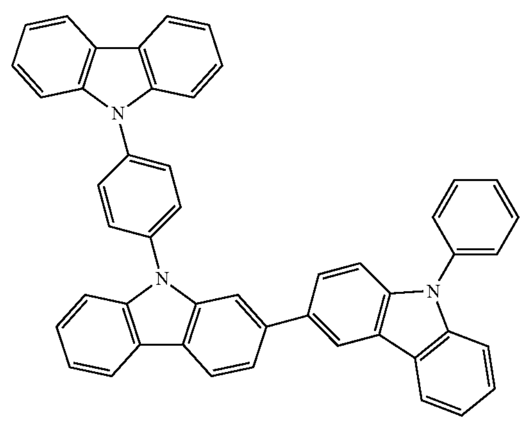

-continued
133B
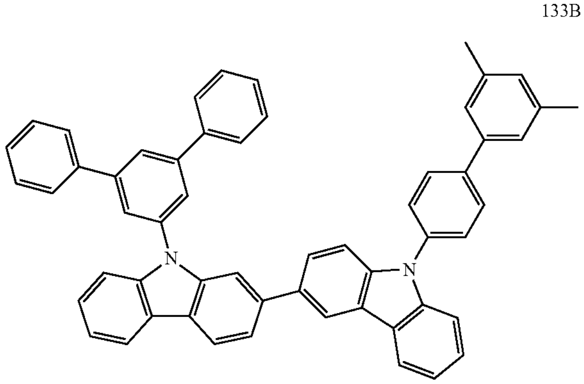
134B
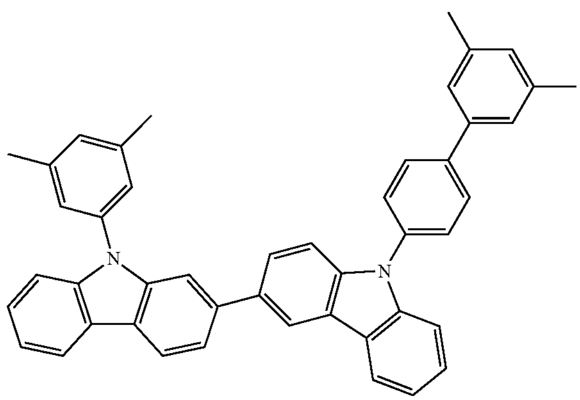
135B
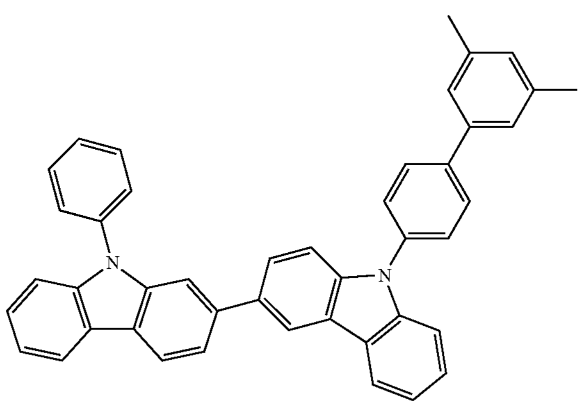
136B
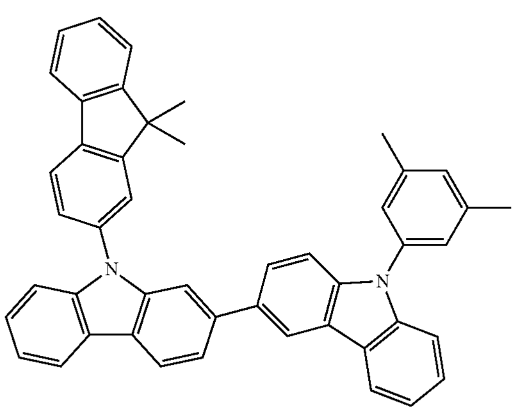
-continued
137B
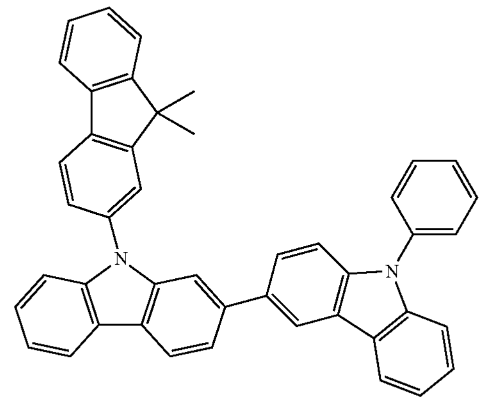
138B
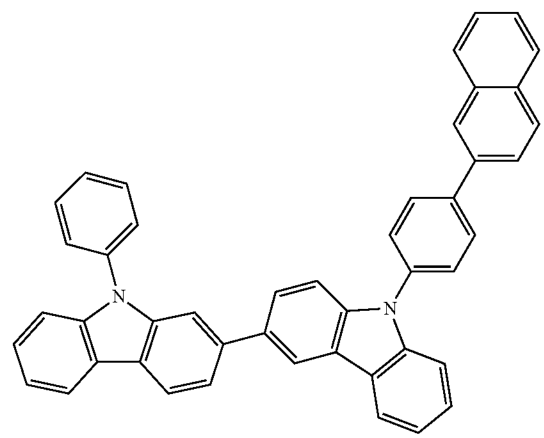
139B
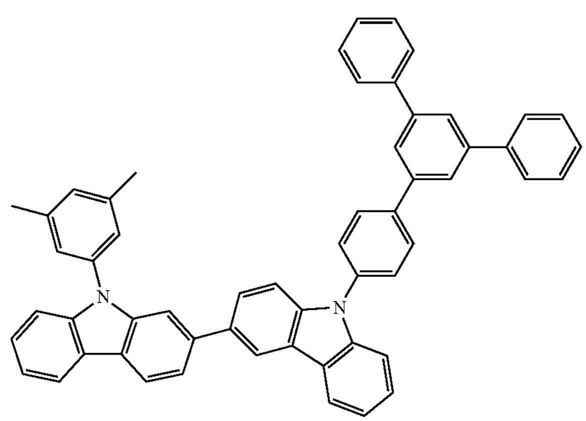

-continued
140B
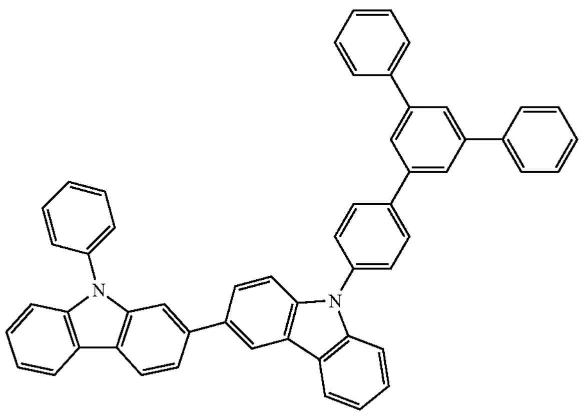
141B
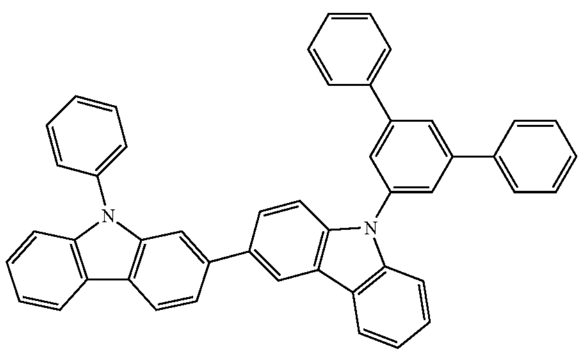
142B
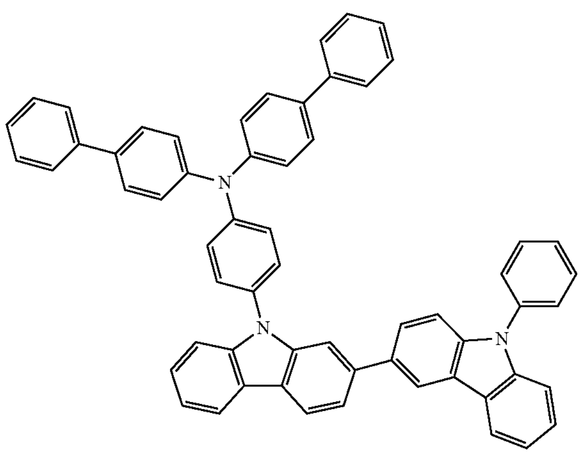
143B
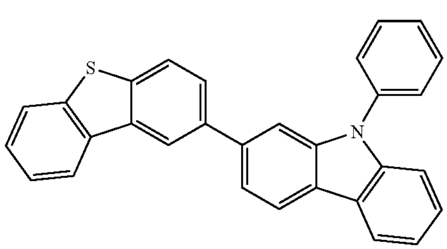
-continued
144B
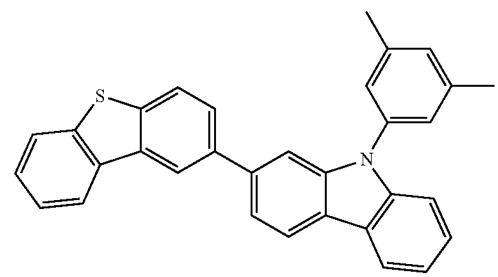
145B
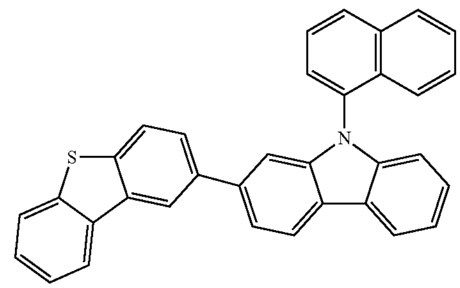
146B
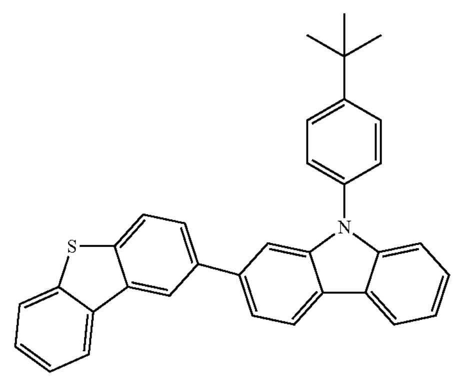
147B
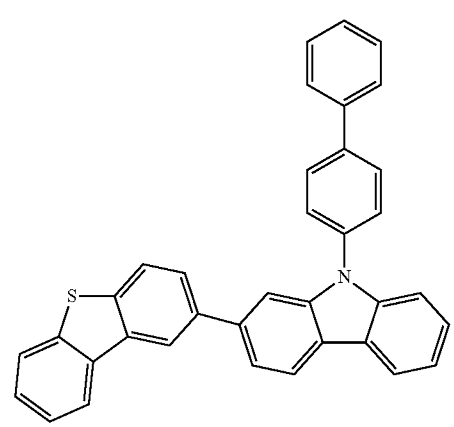

-continued
148B
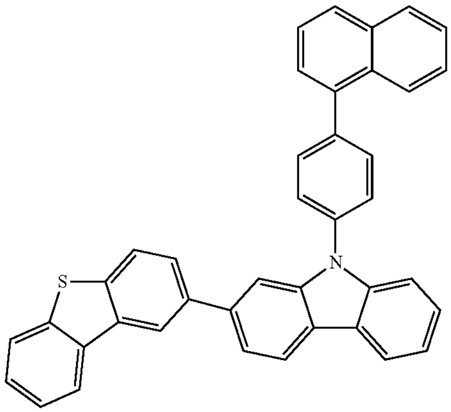
149B
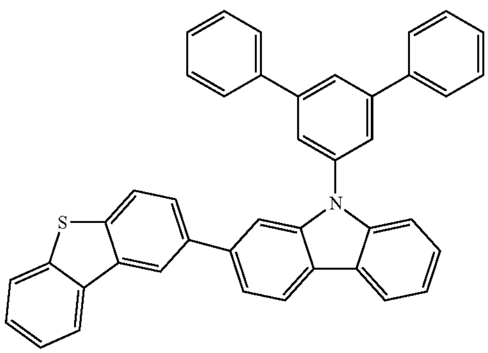
150B
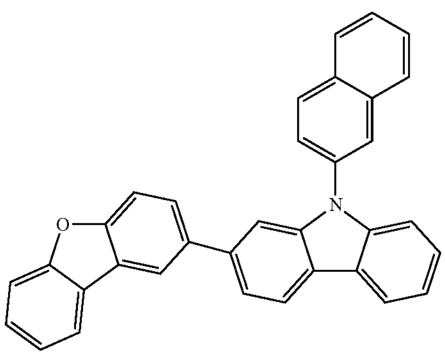
151B
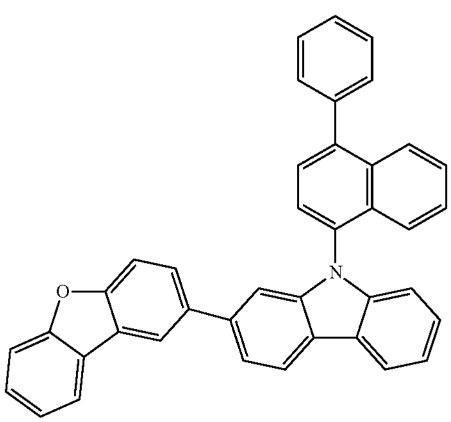
-continued
152B
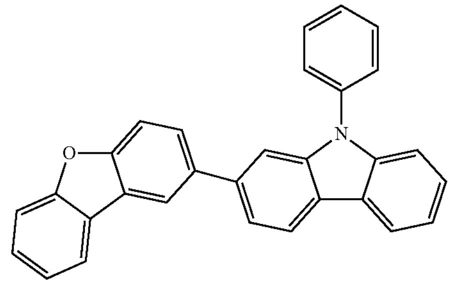
153B
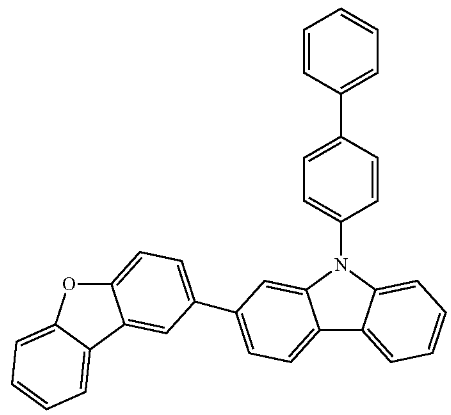
154B
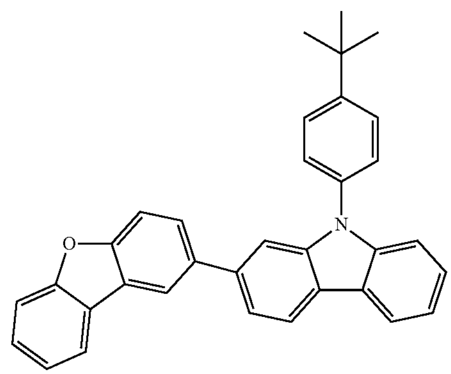
155B
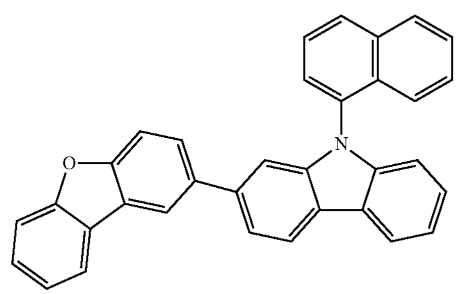
156B
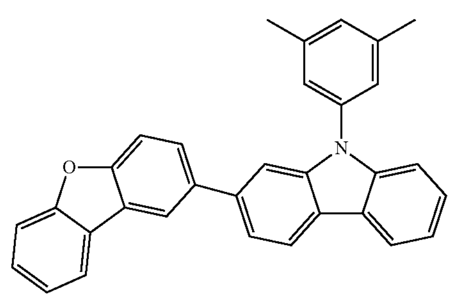

-continued
157B
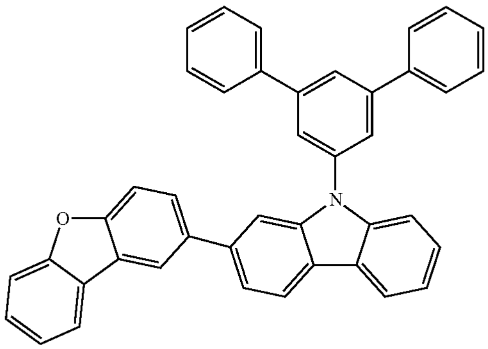
158B
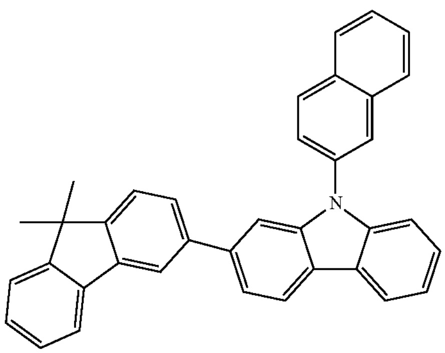
159B
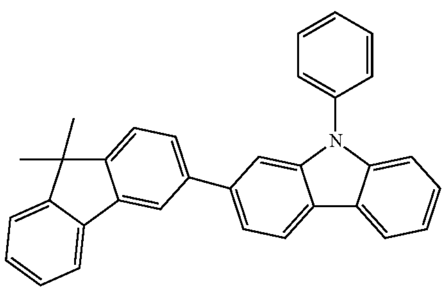
160B
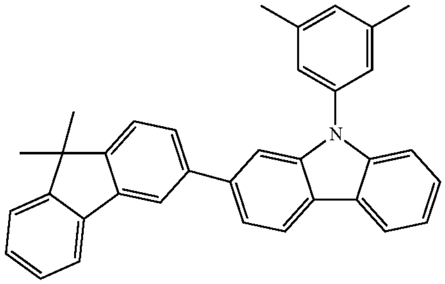
-continued
161B
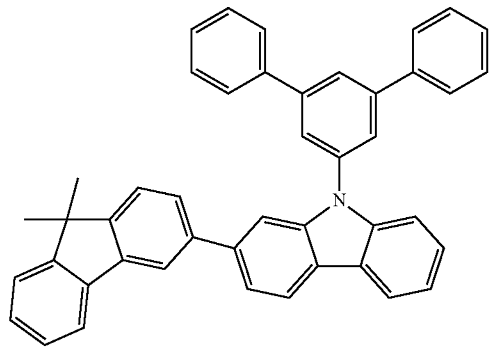
162B
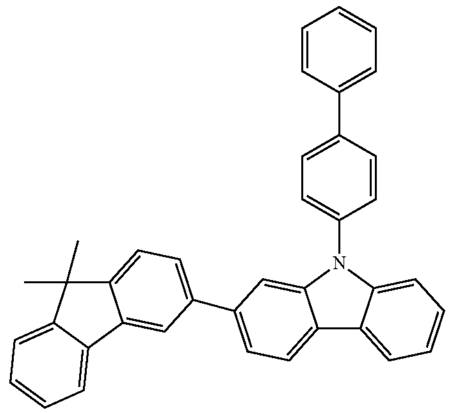
163B
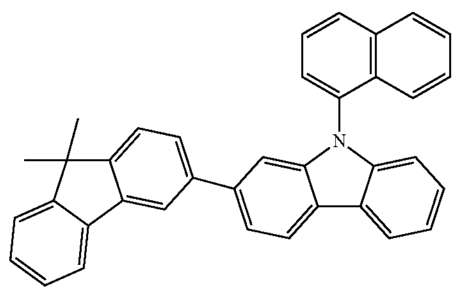
164B
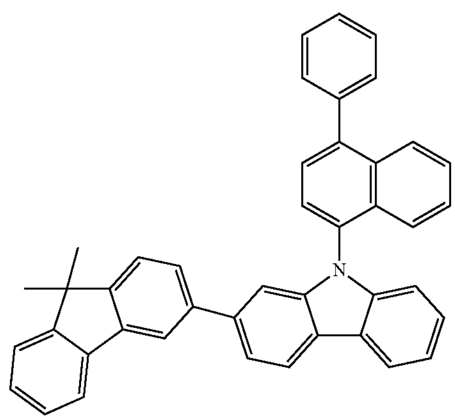

165B
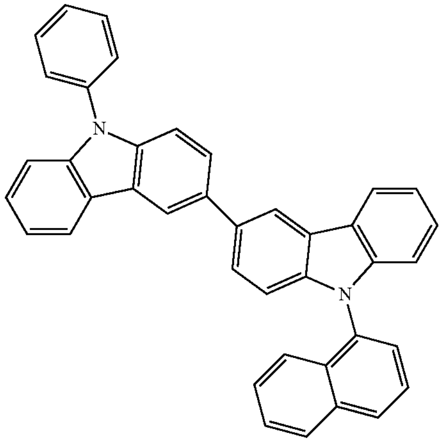
166B
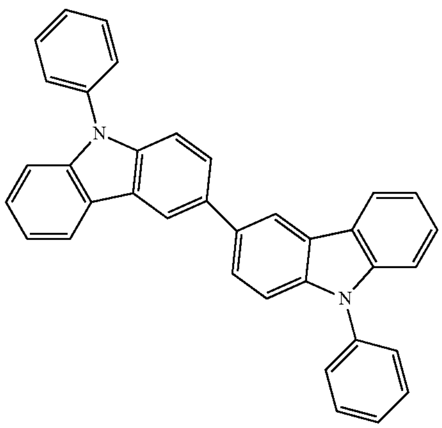
167B
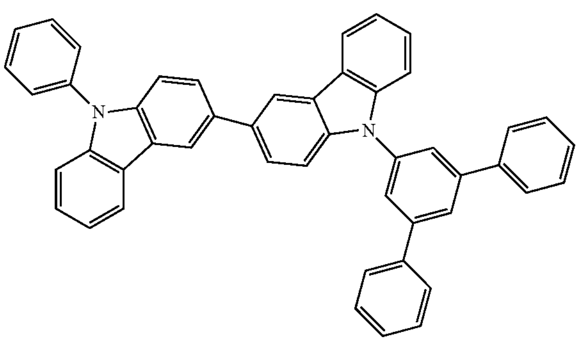
168B
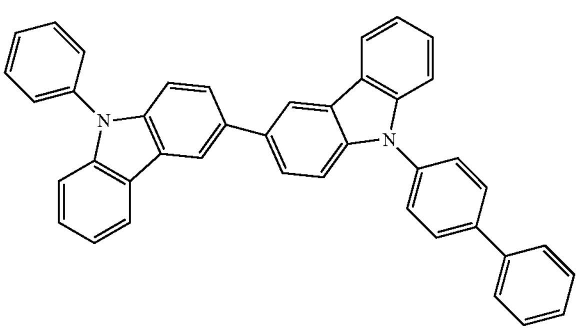
169B
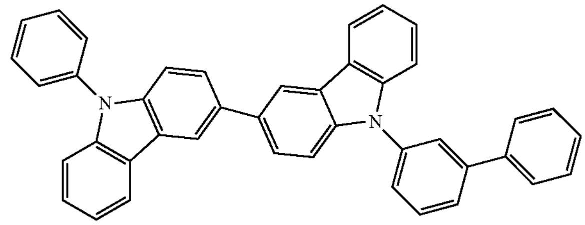
170B
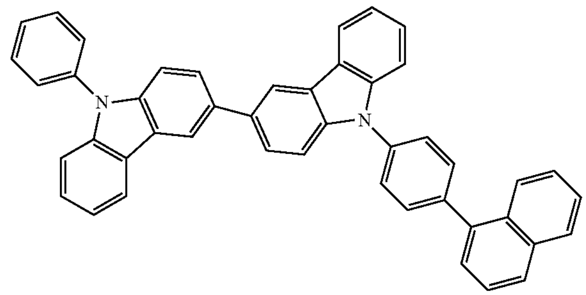
171B
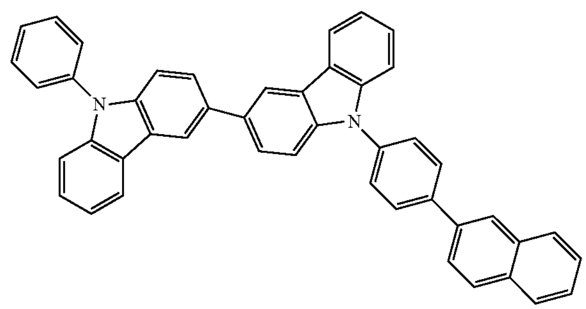
172B
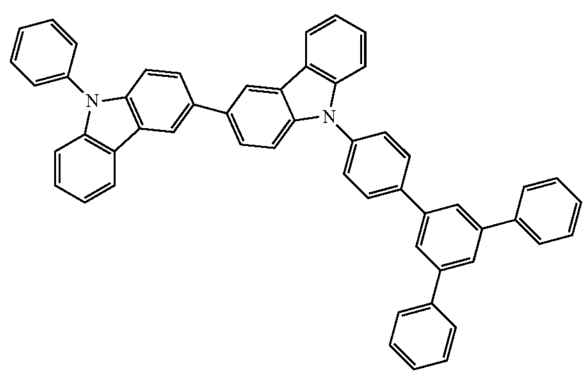

-continued
173B
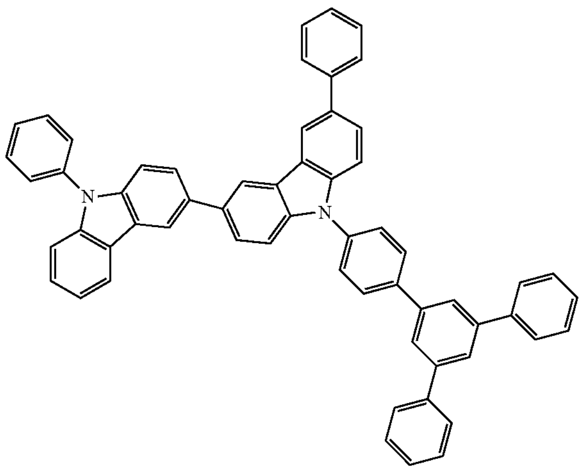
174B
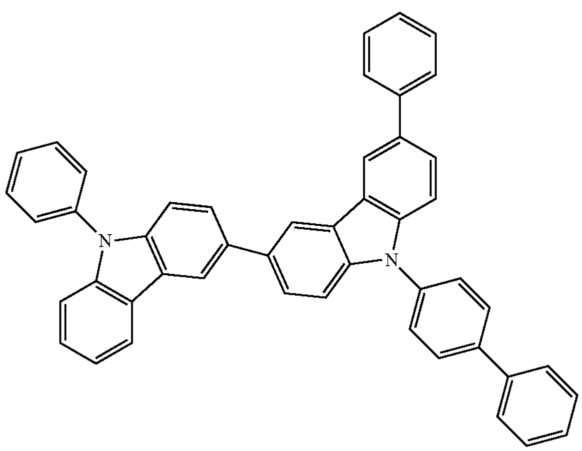
175B
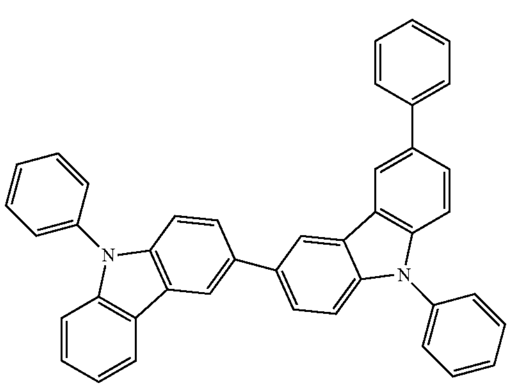
-continued
176B
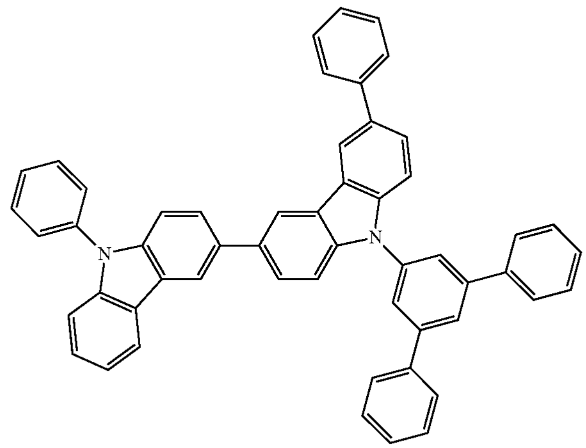
177B
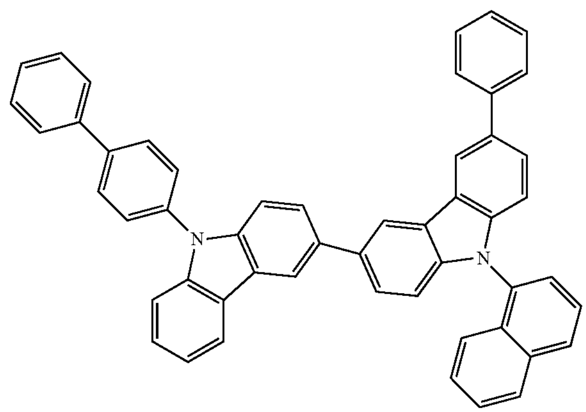
178B
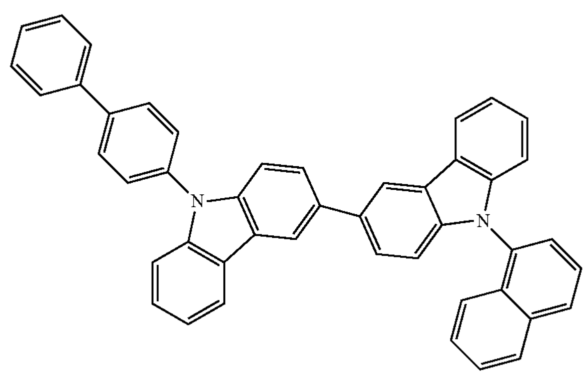
179B
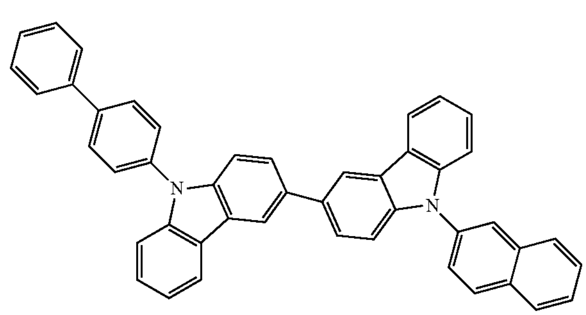

-continued
180B
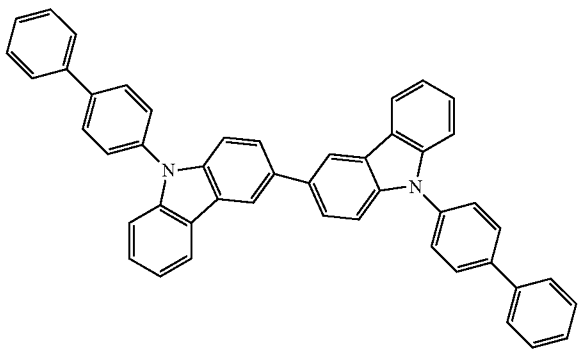
181B
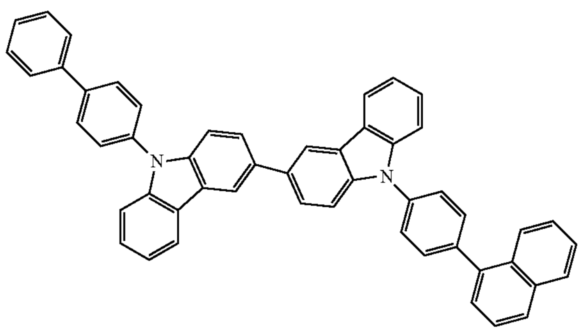
182B
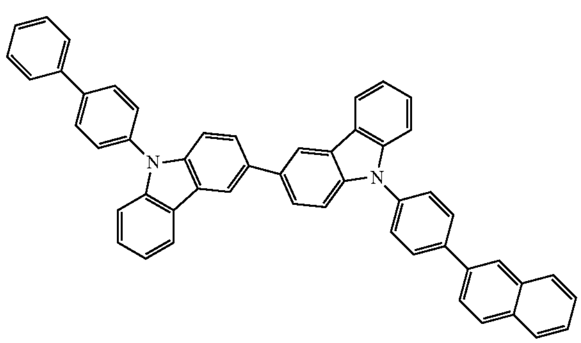
183B
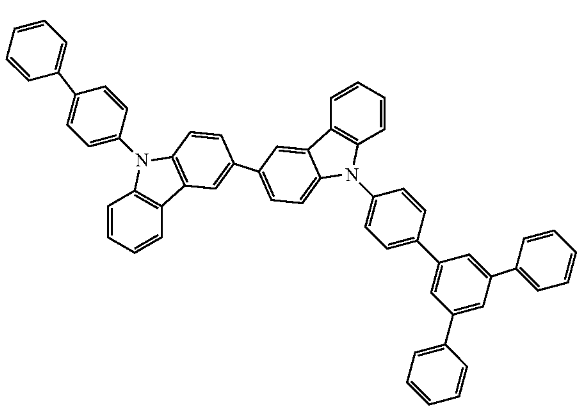
-continued
184B
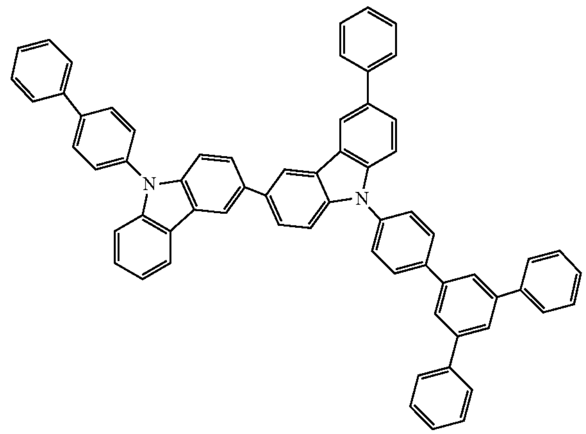
185B
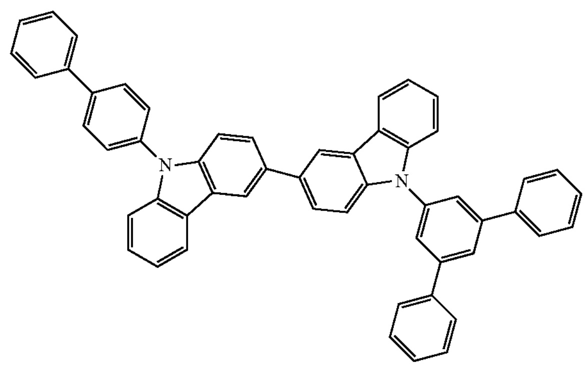
186B
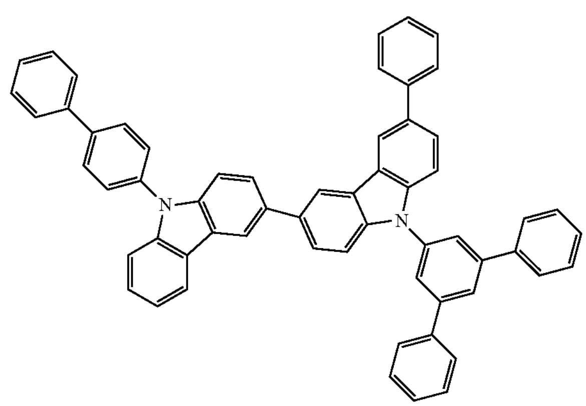

-continued
187B
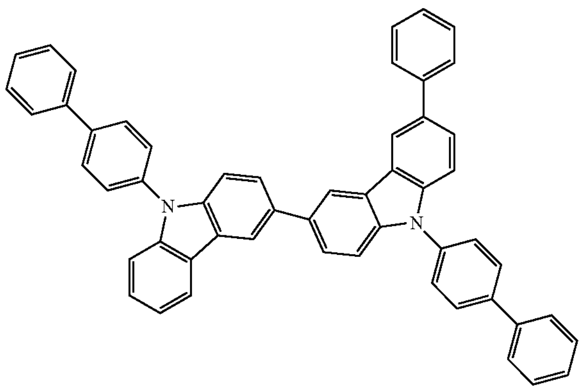
188B
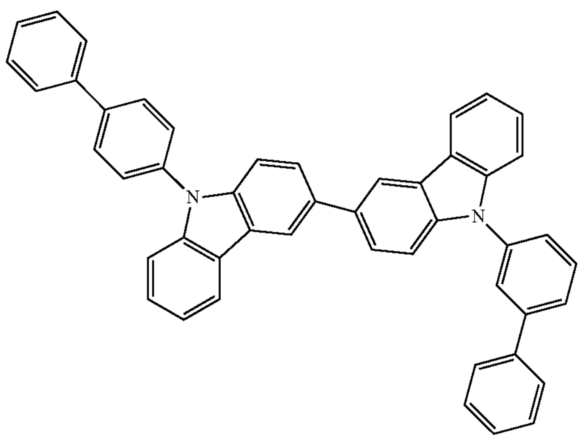
189B
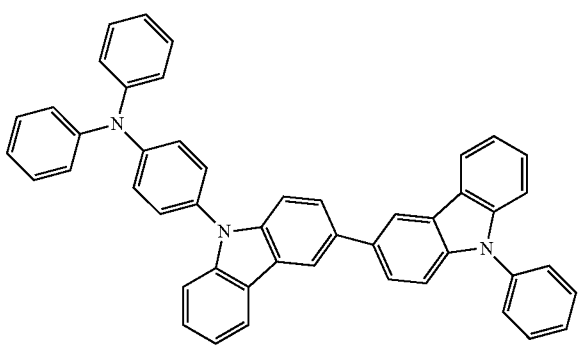
190B
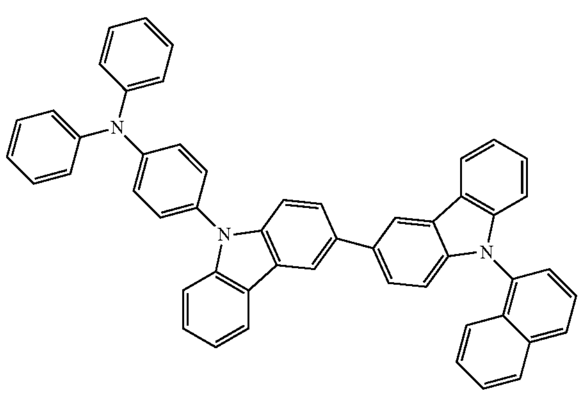
-continued
191B
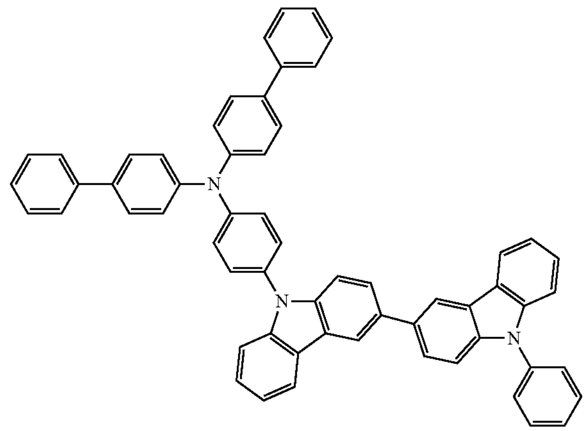
192B
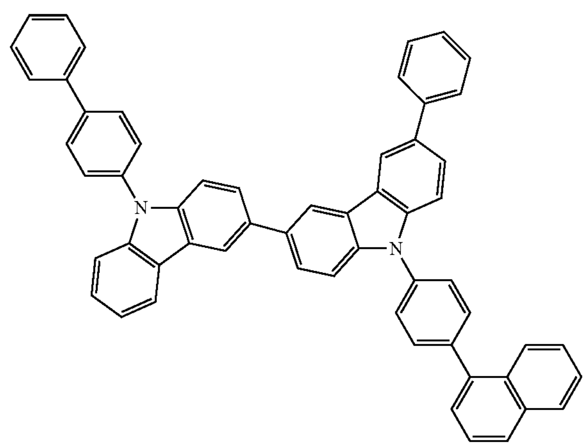
193B
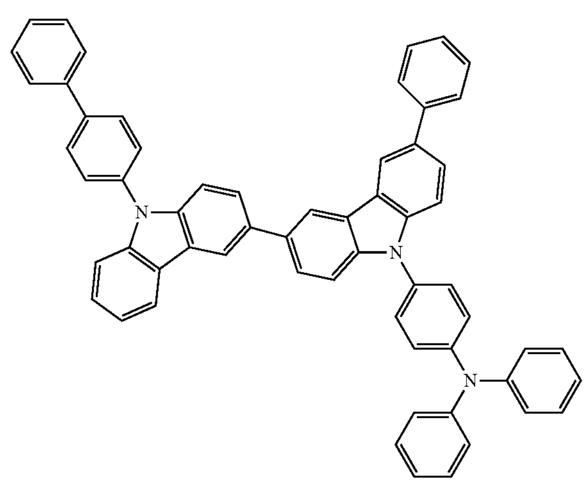

-continued
194B
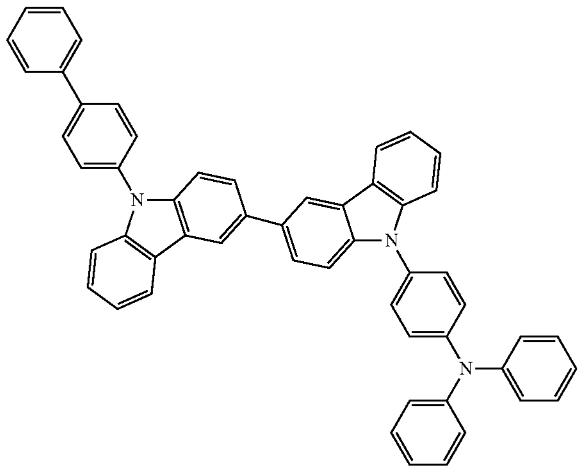
195B
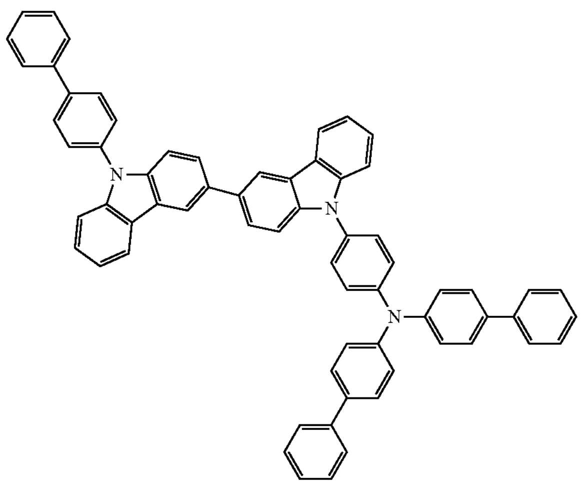
196B
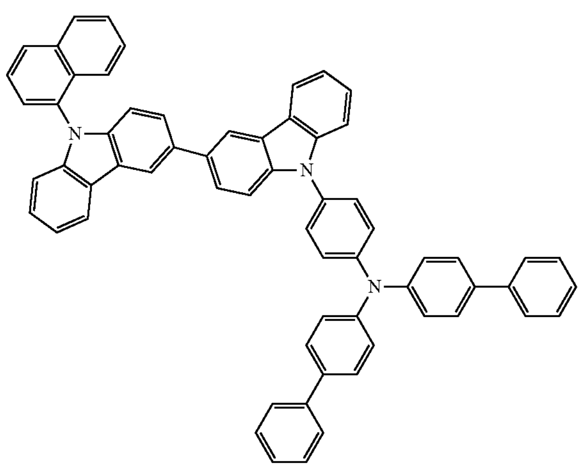
-continued
197B
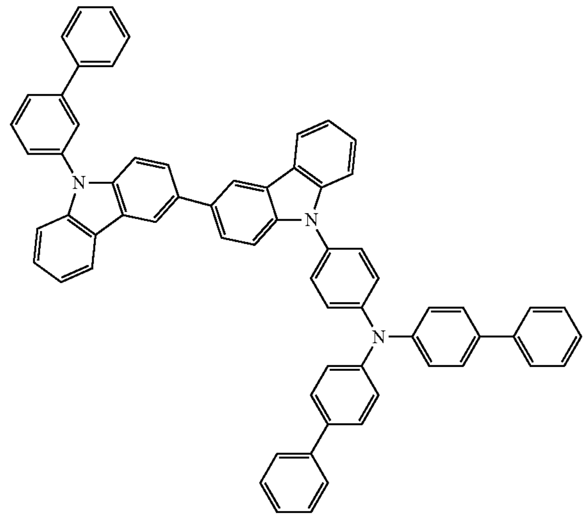
198B
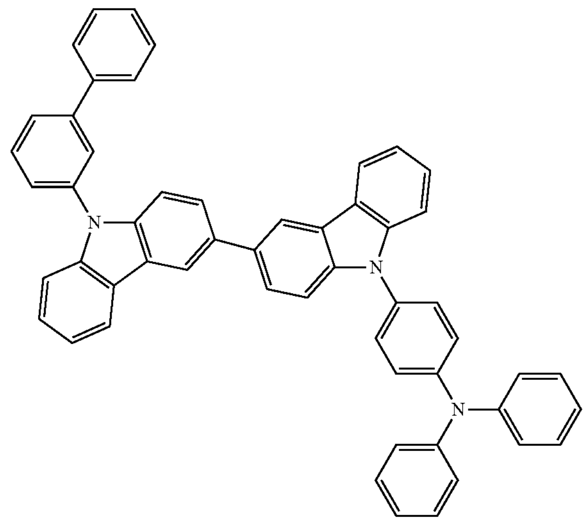
199B
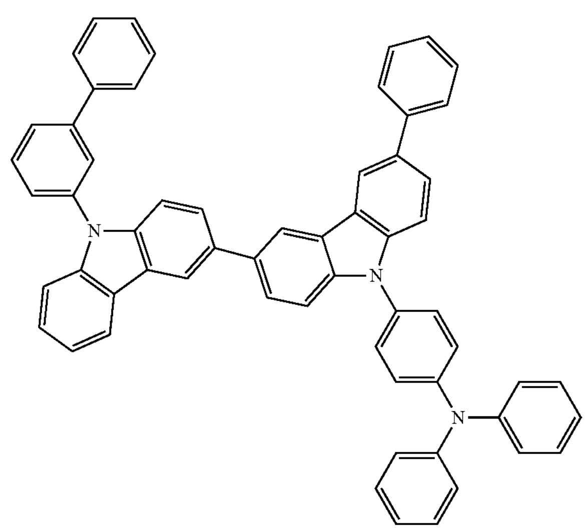

-continued
200B
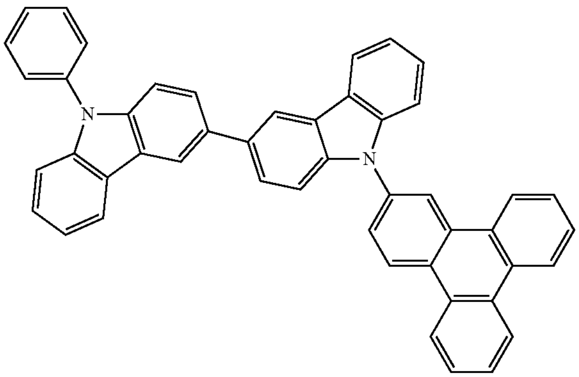
201B
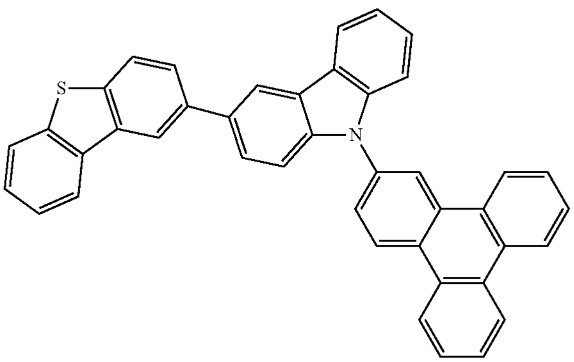
202B
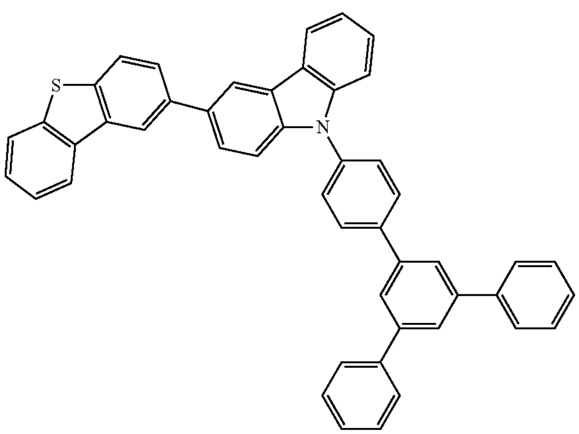
203B
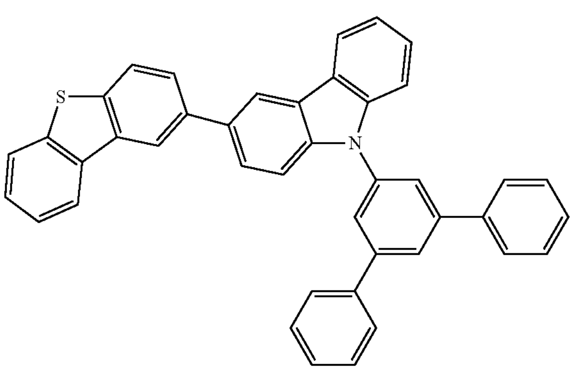
-continued
204B
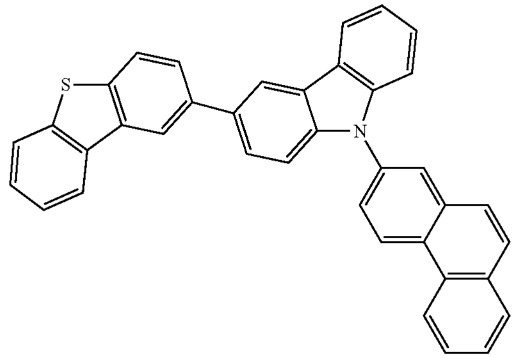
205B
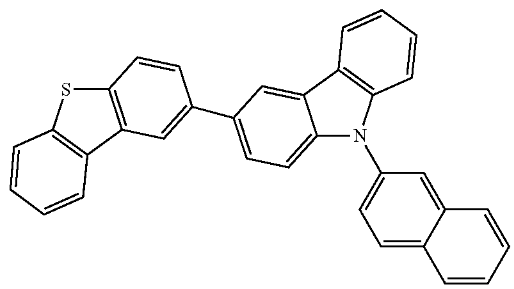
206B
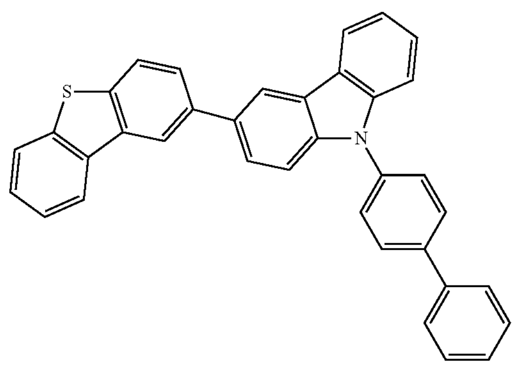
207B
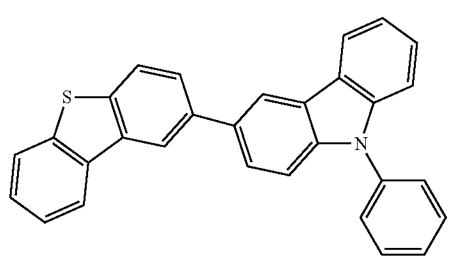
208B
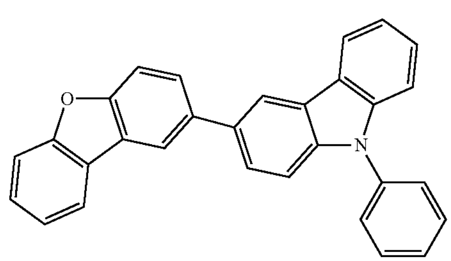

-continued
209B
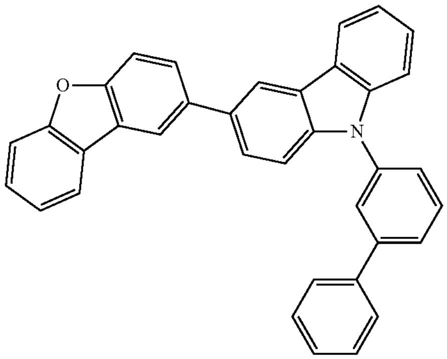
210B
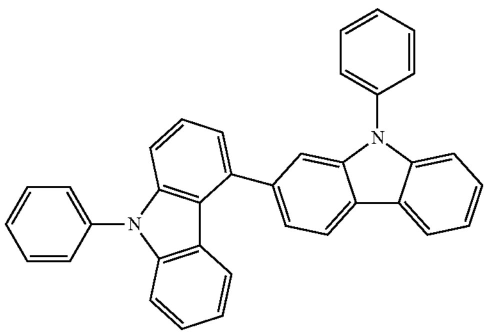
211B
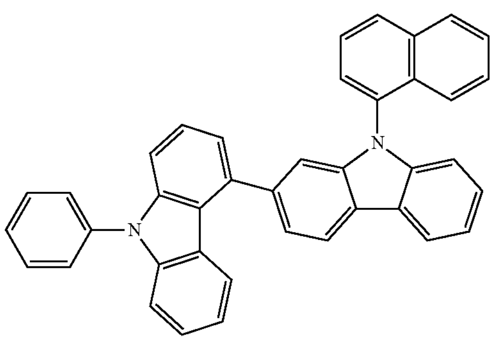
212B
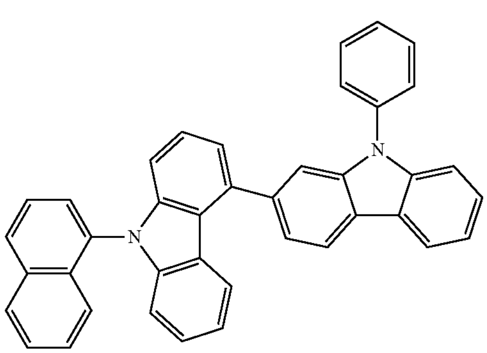
-continued
213B
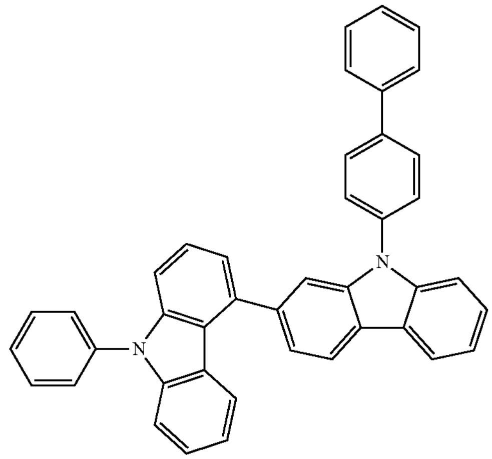
214B
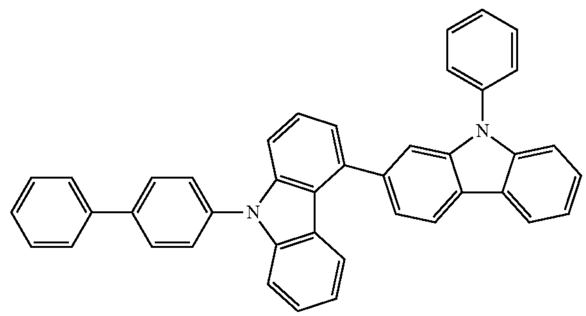
215B
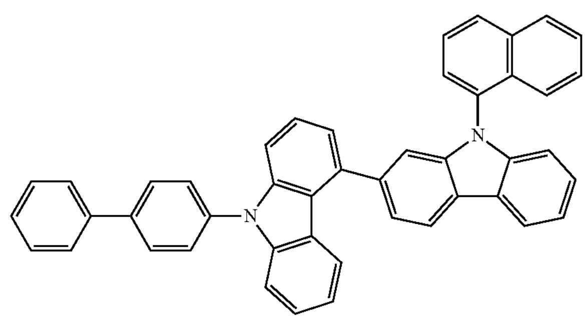
216B
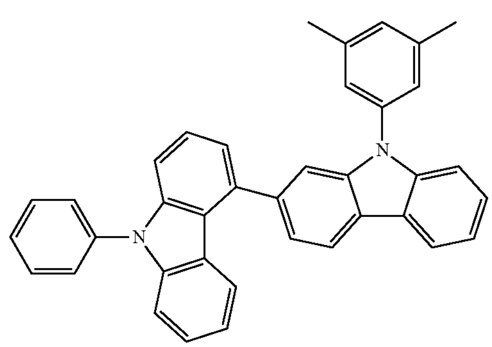

-continued
217B
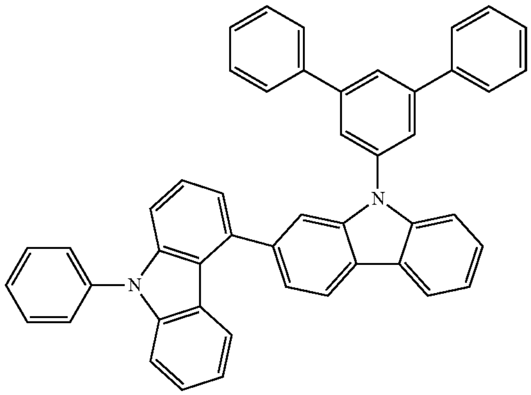
218B
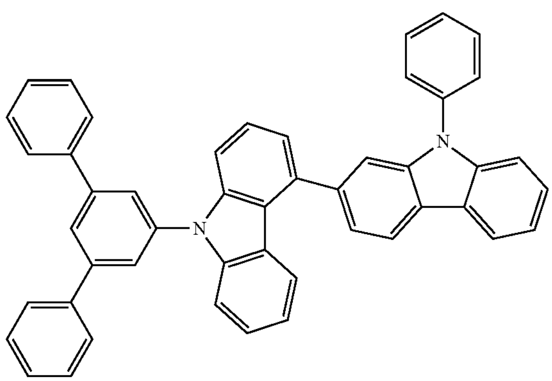
219B
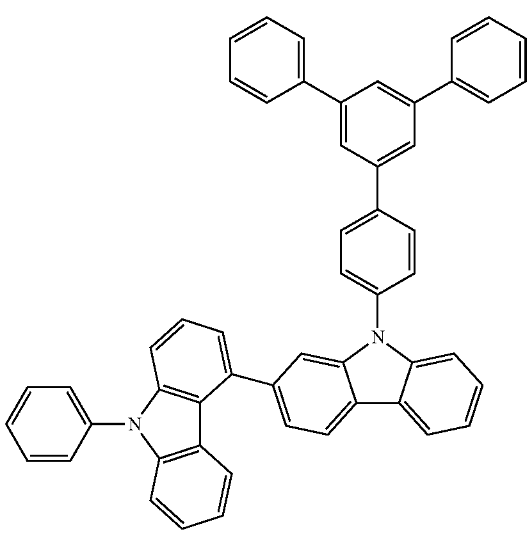
-continued
220B
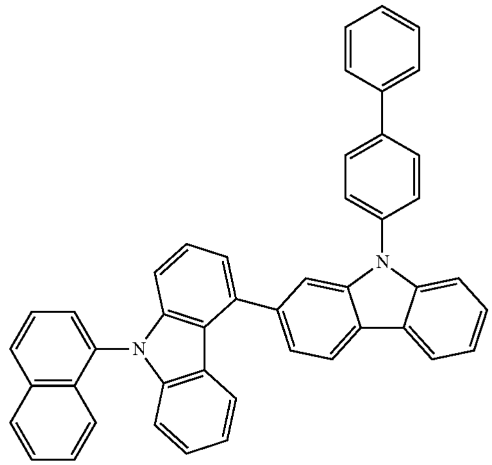
221B
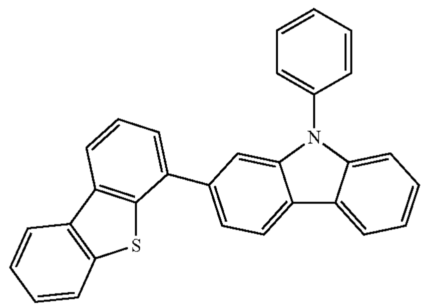
222B
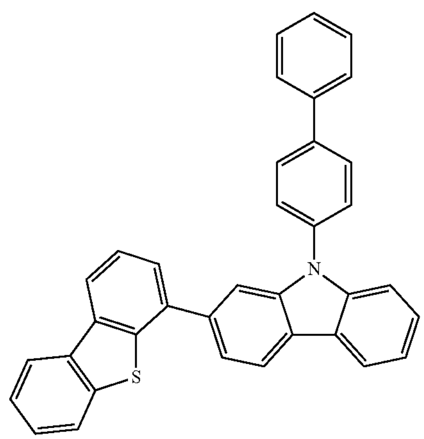
223B
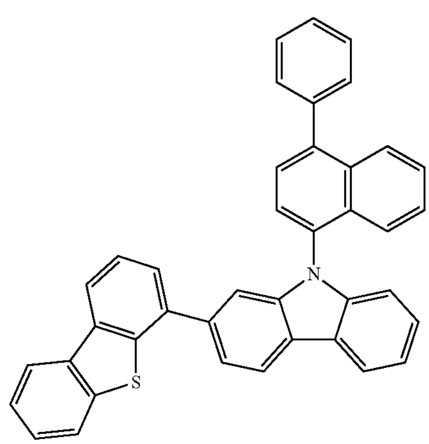

-continued
224B
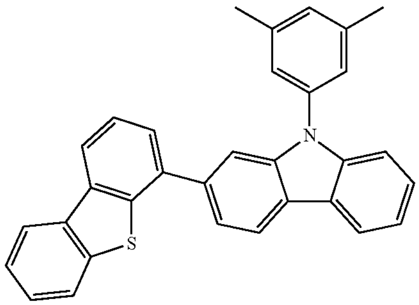
225B
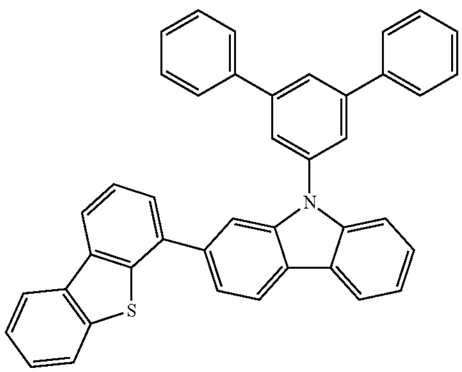
226B
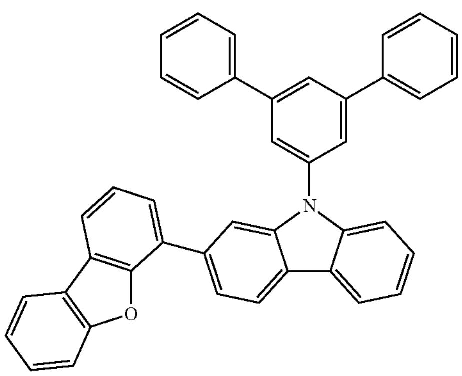
227B
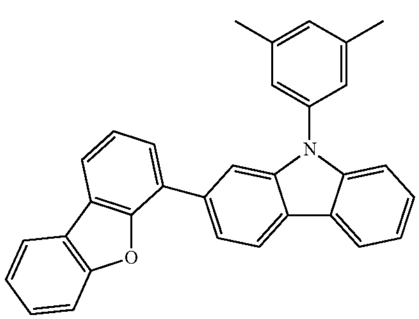
-continued
228B
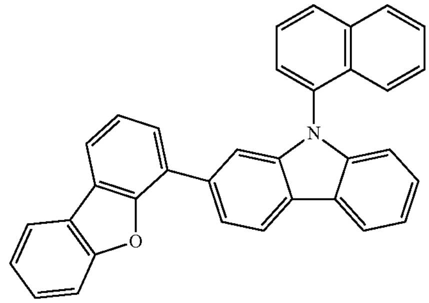
229B
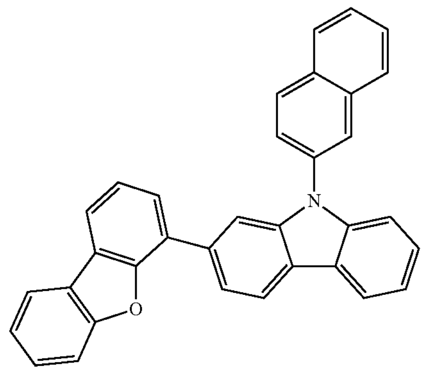
230B
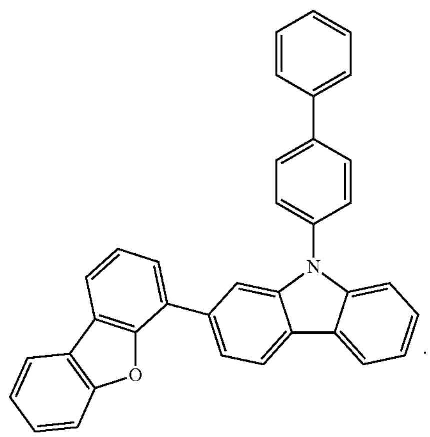
In some embodiments, the second compound may be selected from Compounds 301B to 434B below, but is not limited thereto:
301B
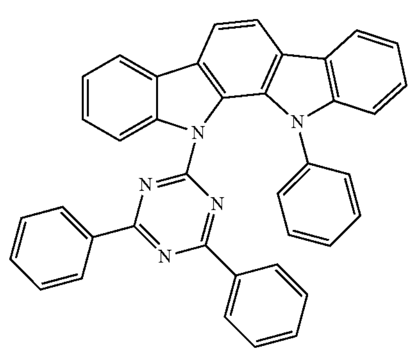

-continued
302B
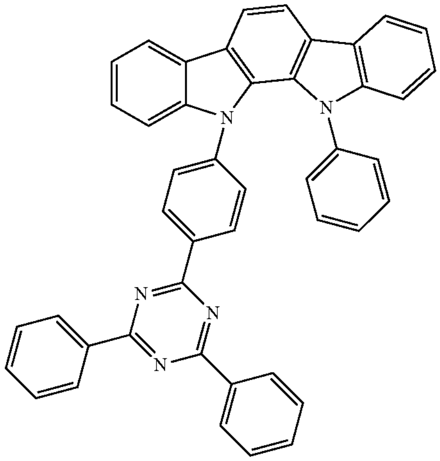
303B
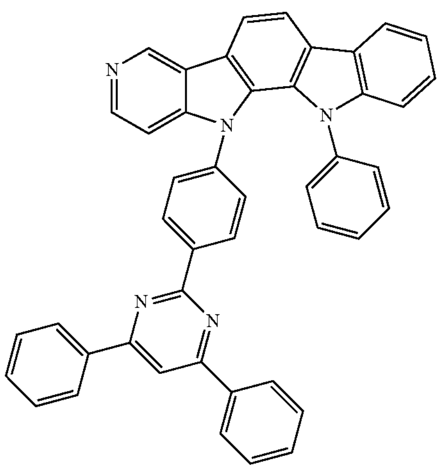
304B
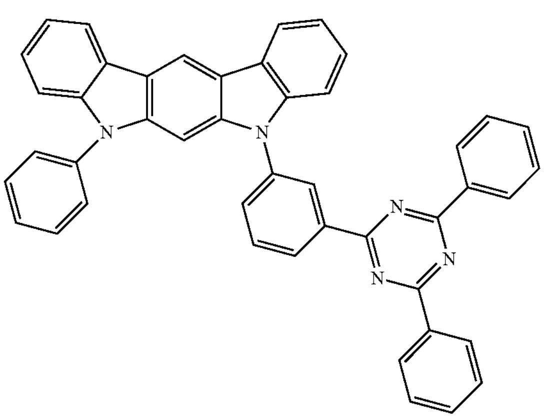
-continued
305B
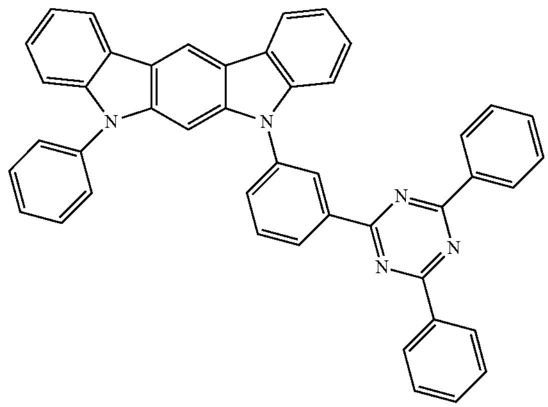
306B
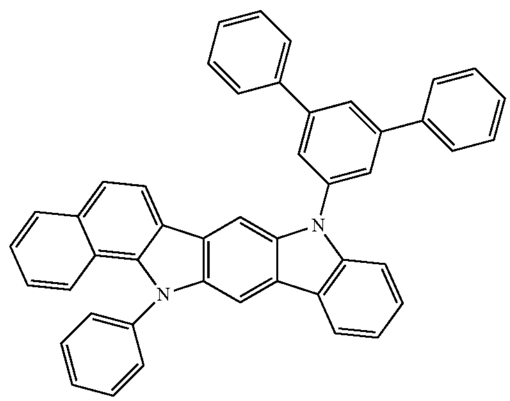
307B
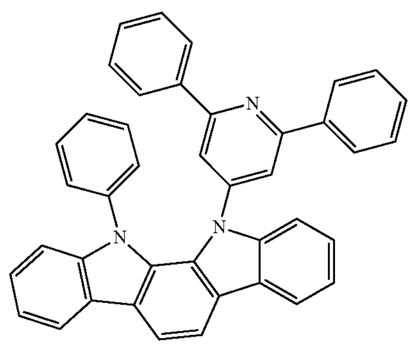
308B
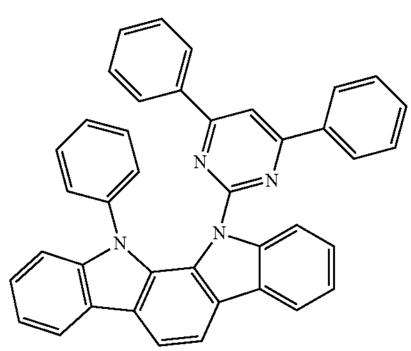

-continued
309B
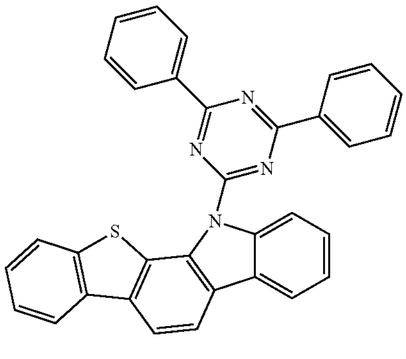
310B
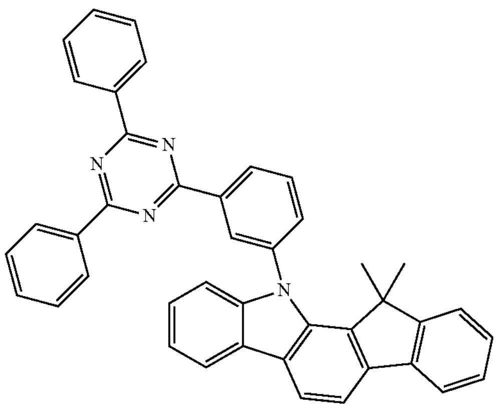
311B
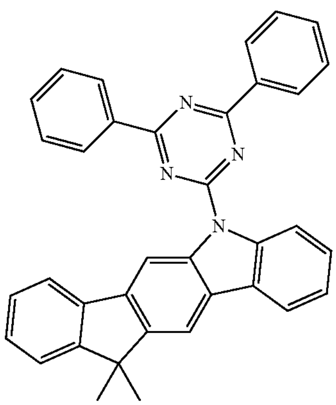
312B
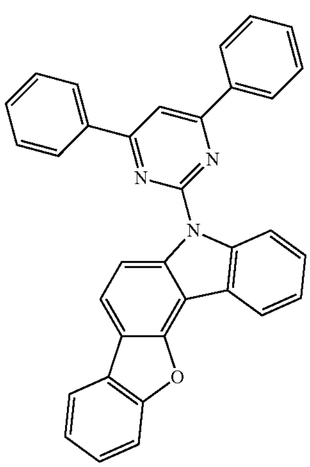
-continued
313B
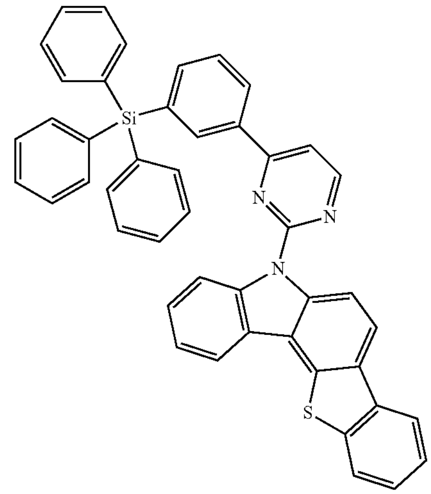
314B
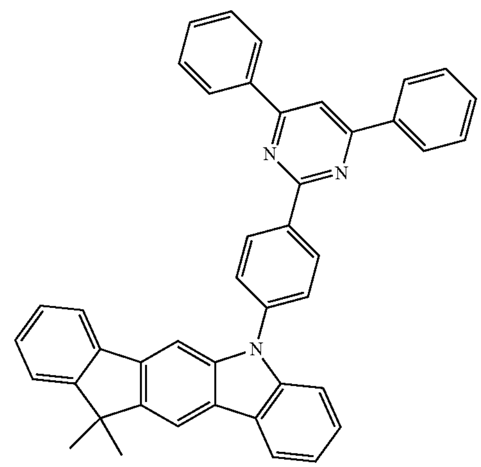
315B
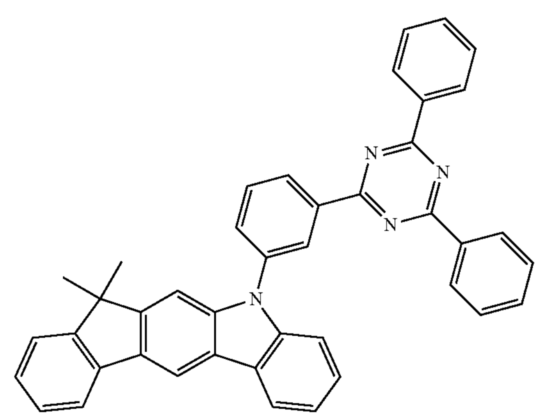

-continued
316B
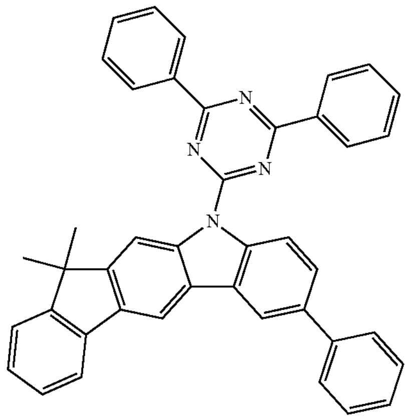
317B
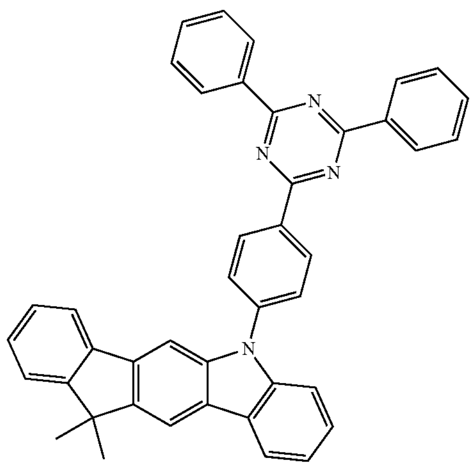
318B
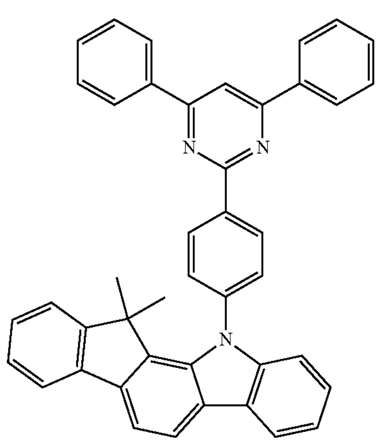
-continued
319B
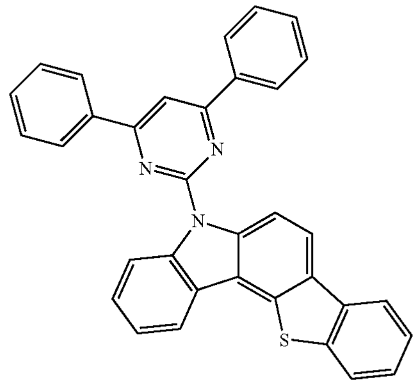
320B
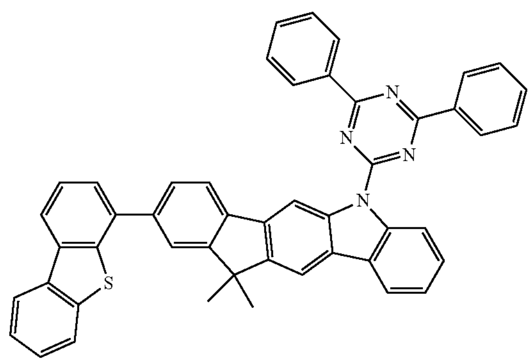
321B
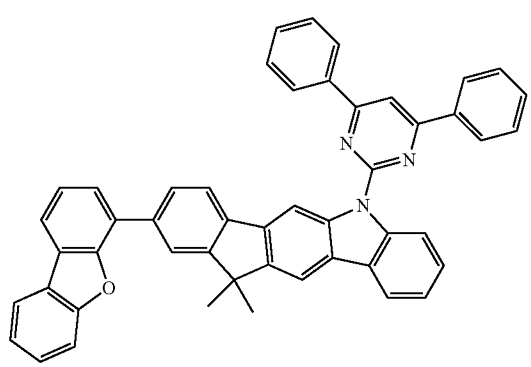
322B
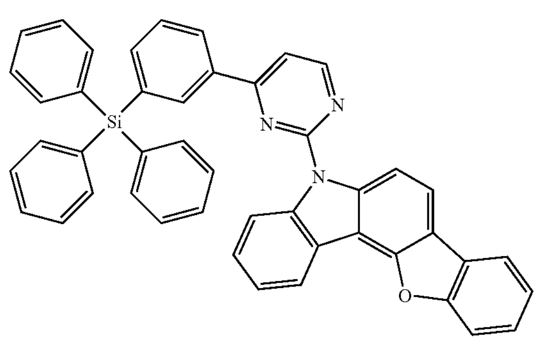

323B
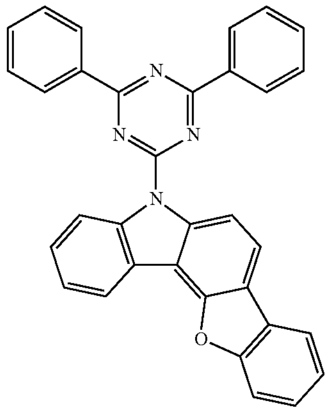
324B
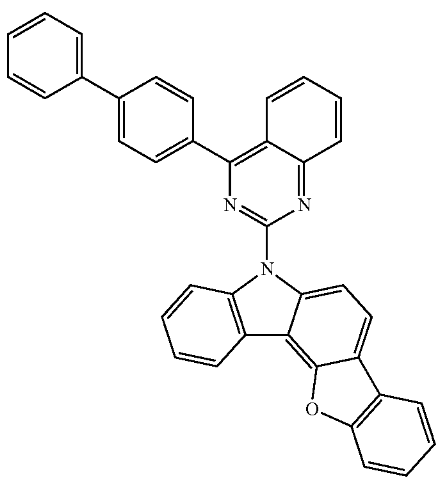
325B
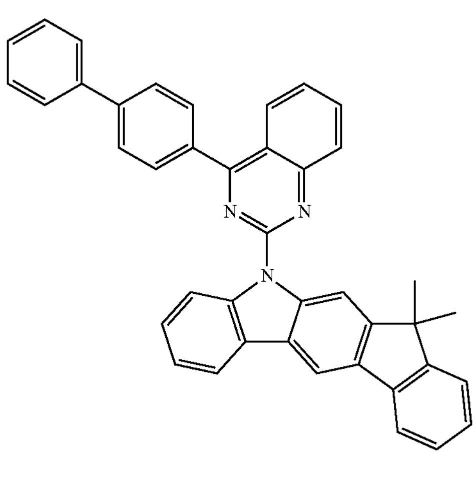
326B
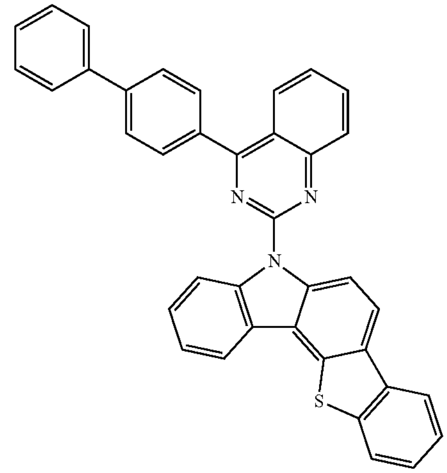
327B
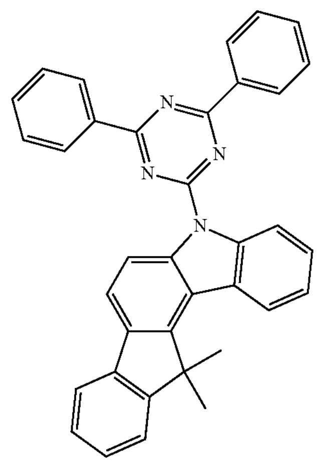
328B
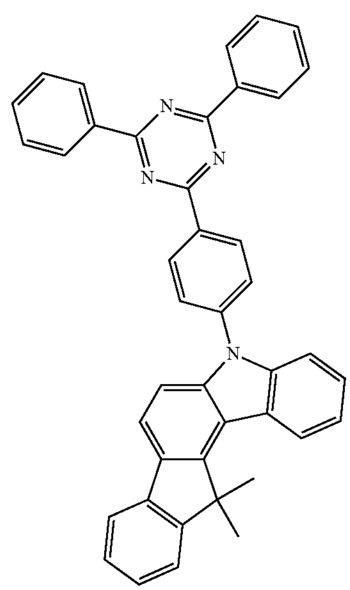

-continued
329B
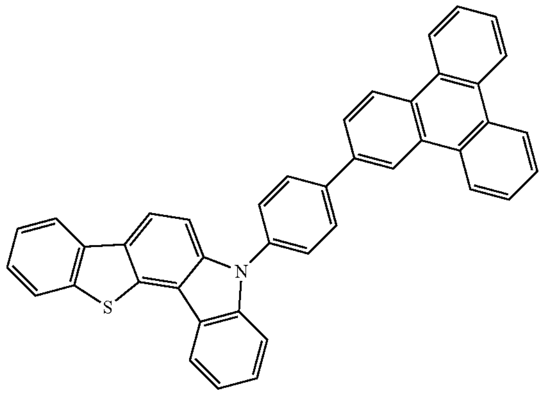
330B
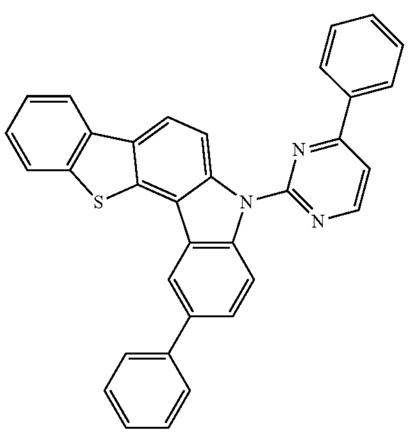
331B
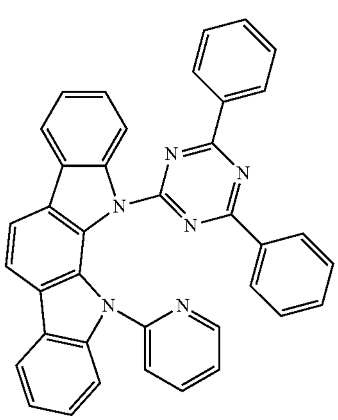
-continued
332B
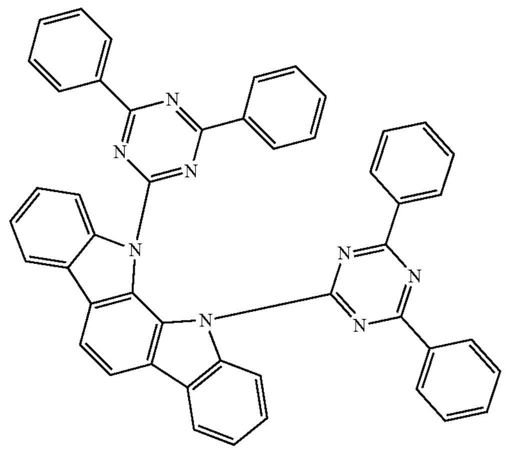
333B
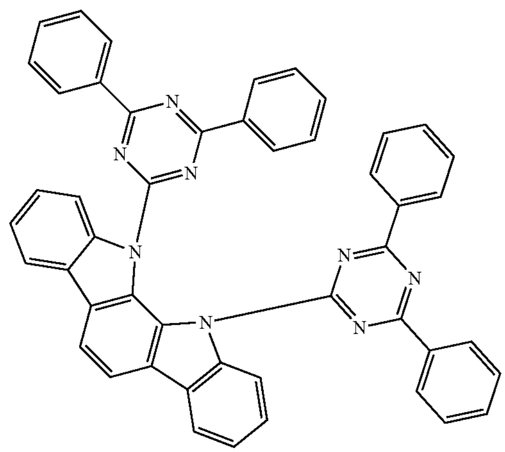
334B
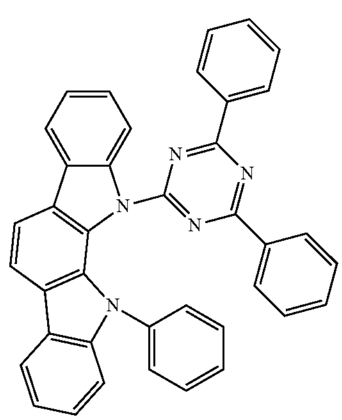

-continued
335B
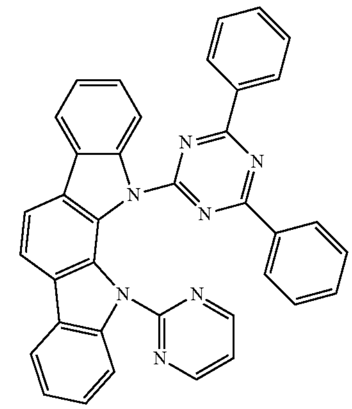
336B
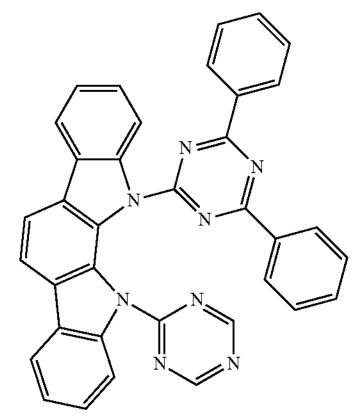
337B
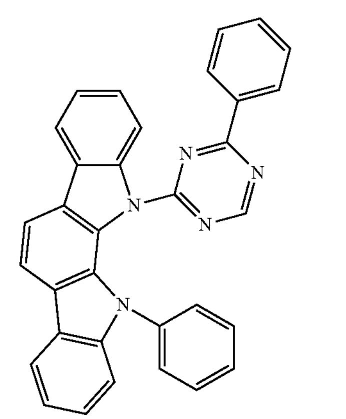
-continued
338B
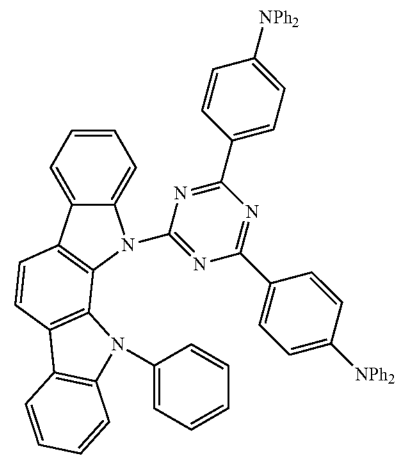
339B
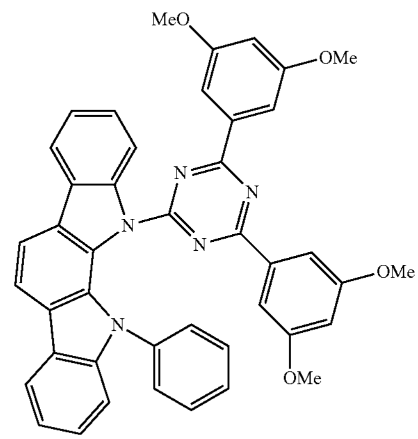
340B
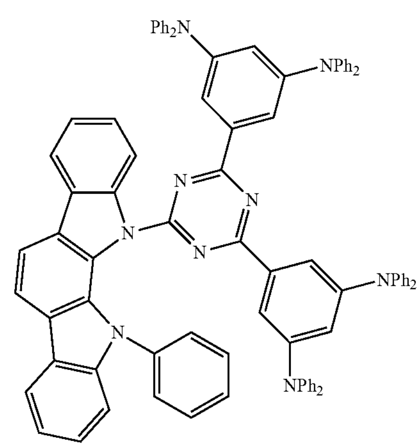

-continued
341B
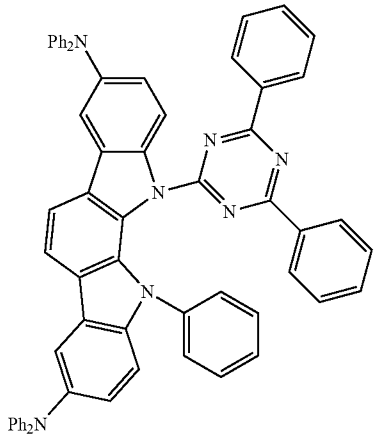
342B
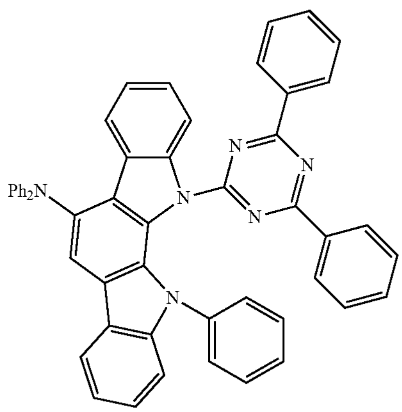
343B
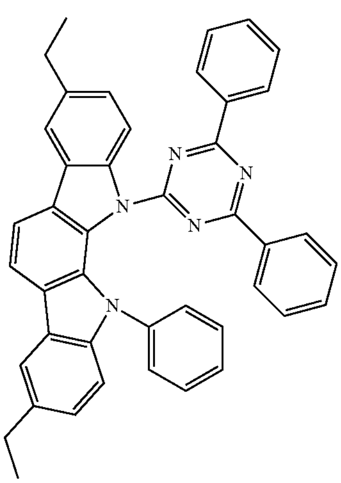
-continued
344B
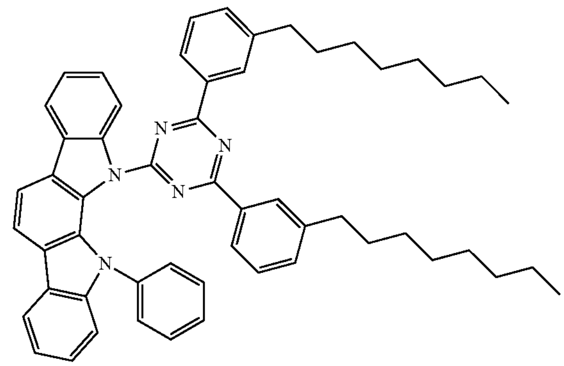
345B
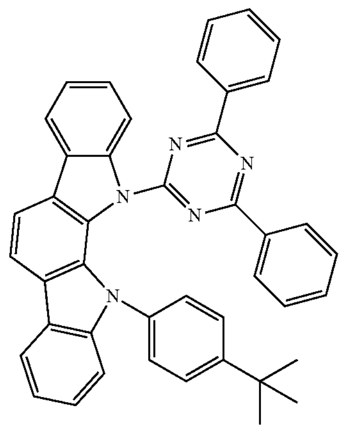
346B
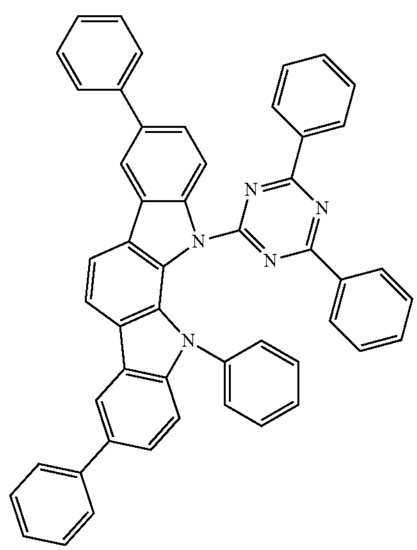

-continued
347B
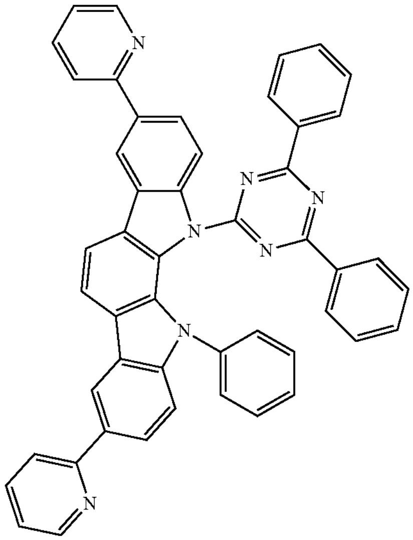
348B
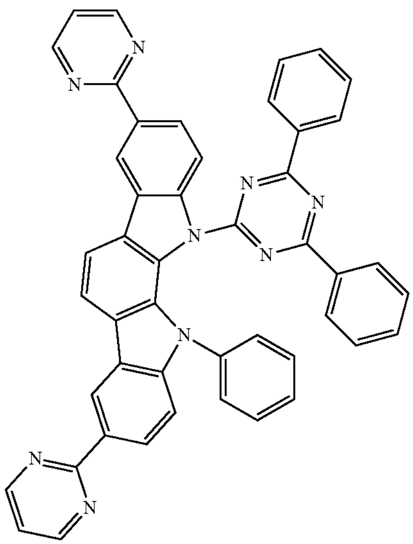
349B
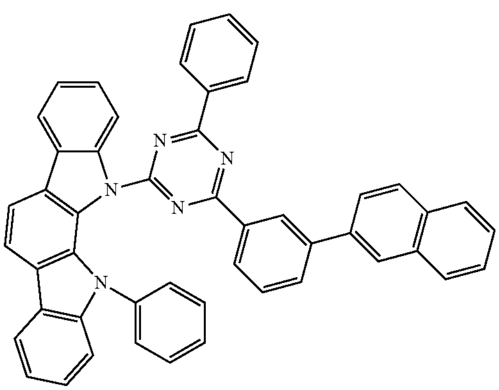
-continued
350B
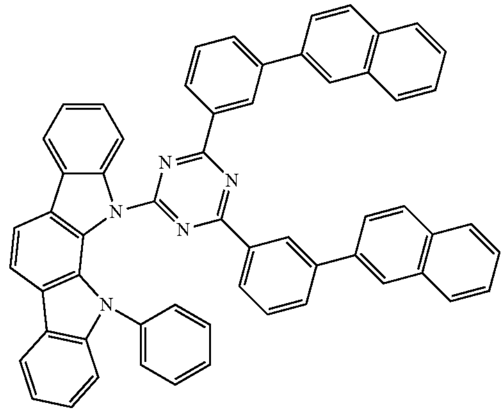
351B
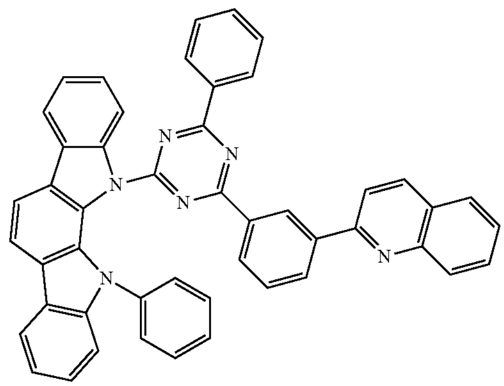
352B
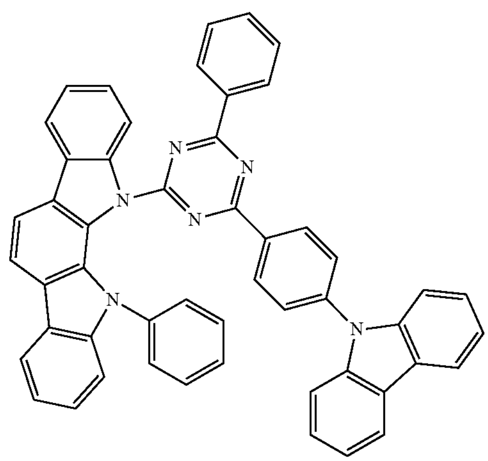

-continued
353B
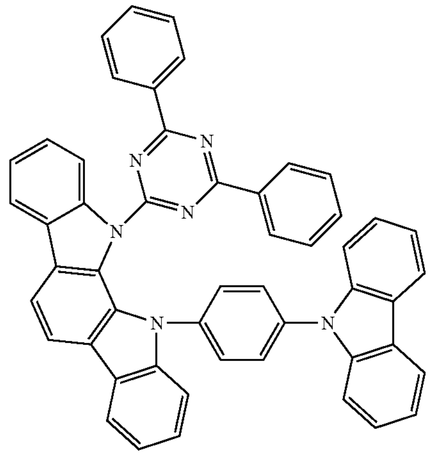
354B
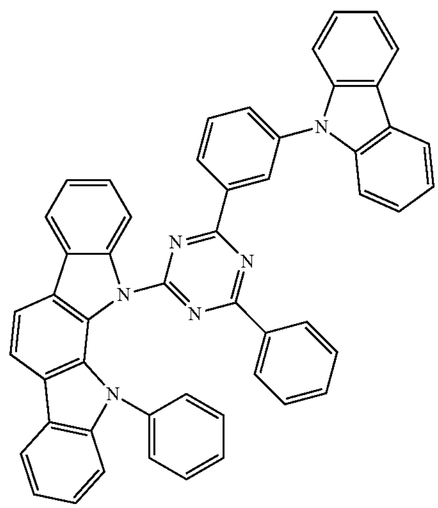
355B
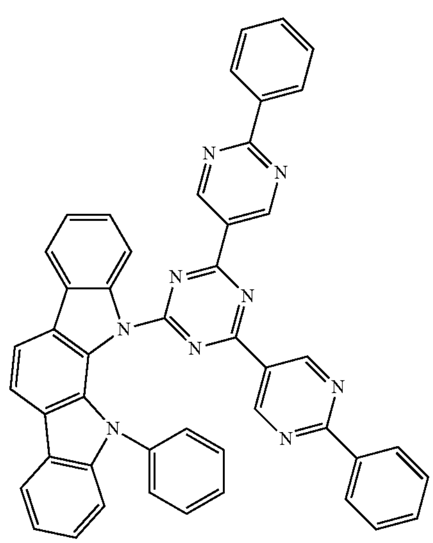
-continued
356B
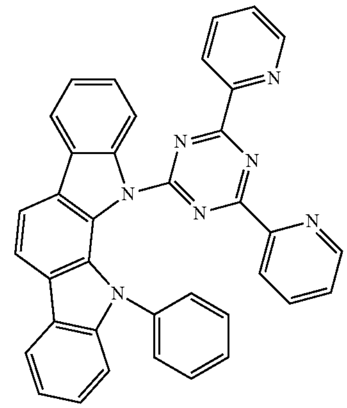
357B
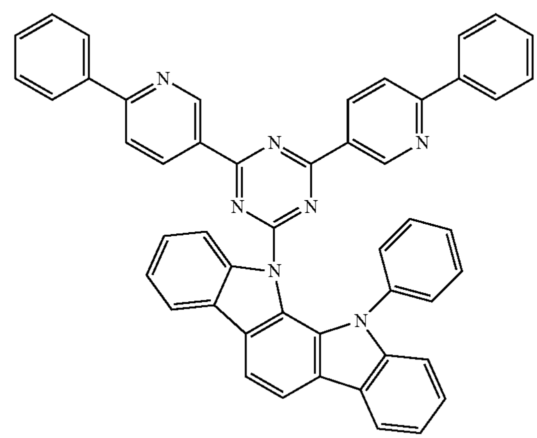
358B
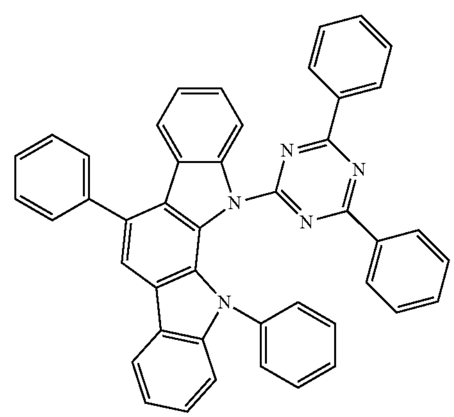

-continued
359B
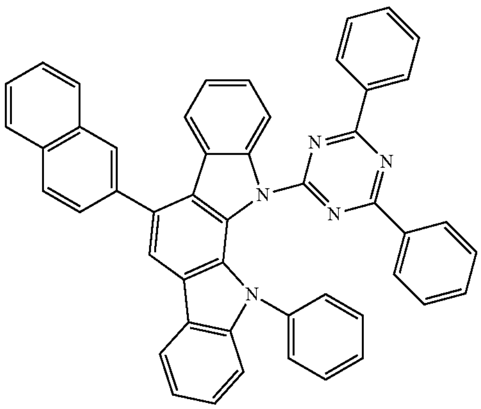
360B
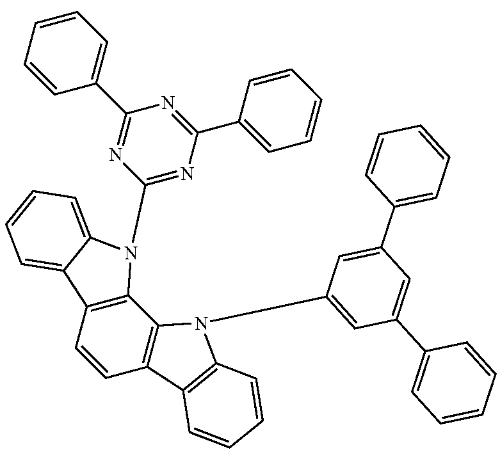
361B
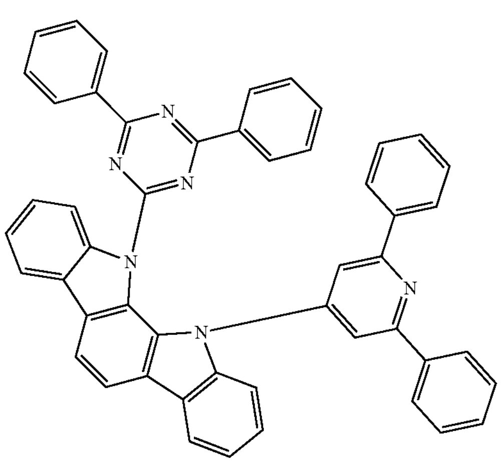
-continued
362B
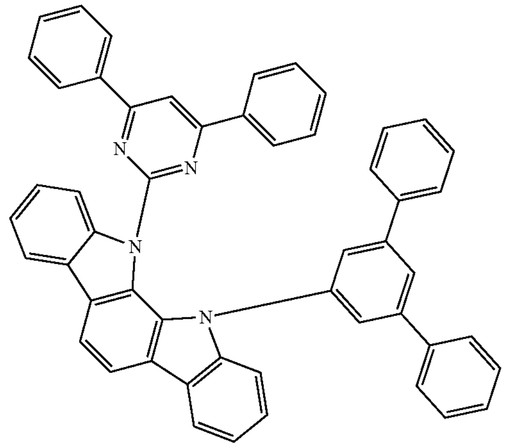
363B
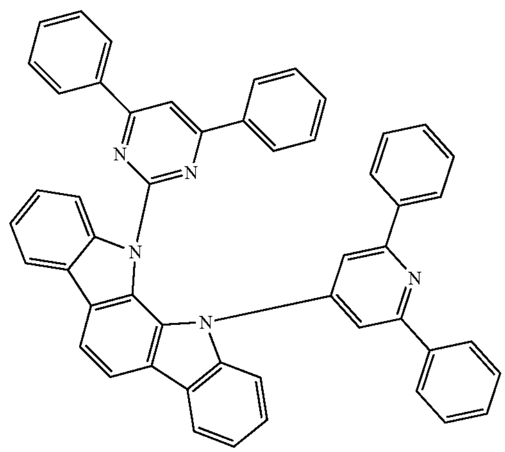
364B
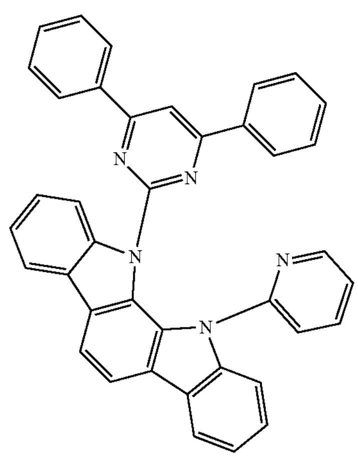

365B
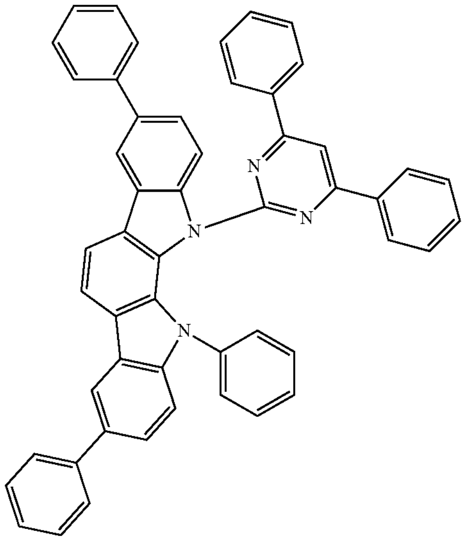
366B
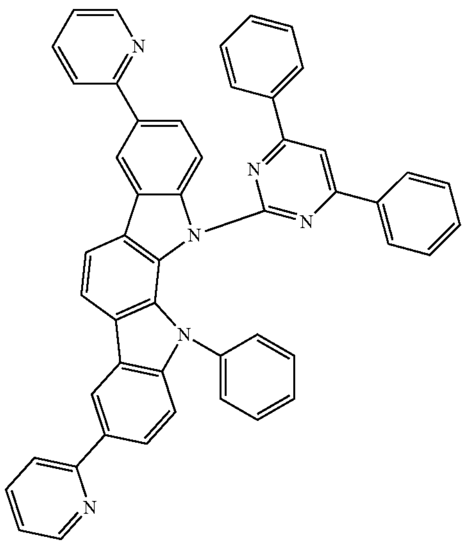
367B
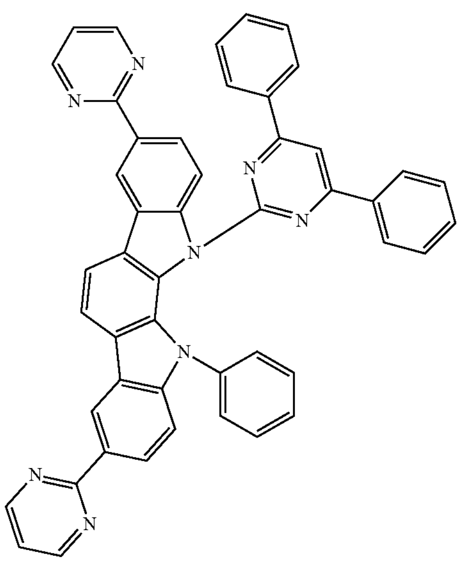
368B
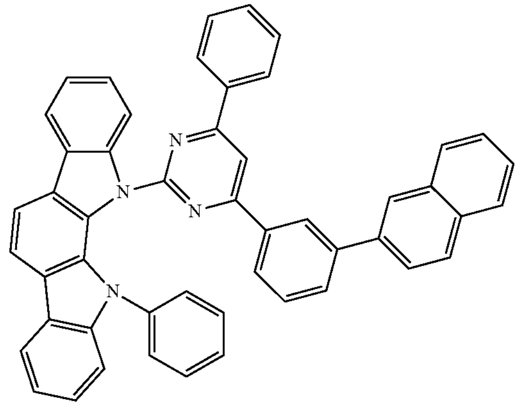
369B
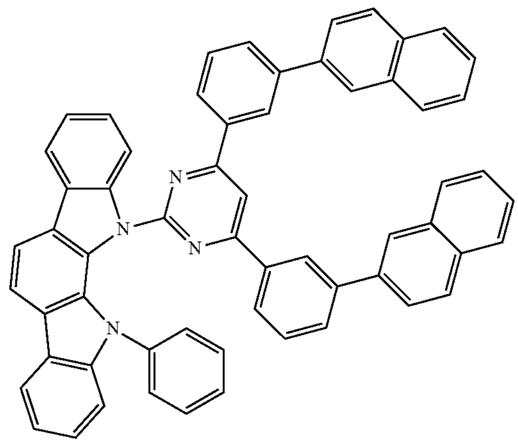
370B
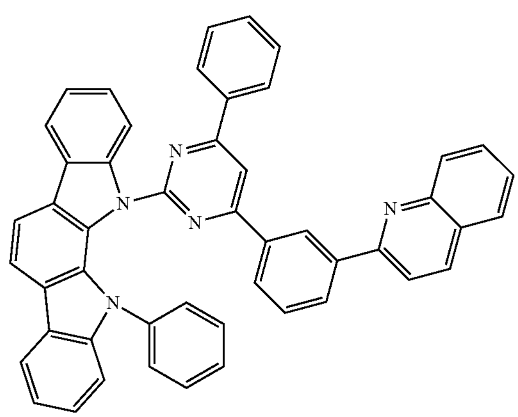

-continued
371B
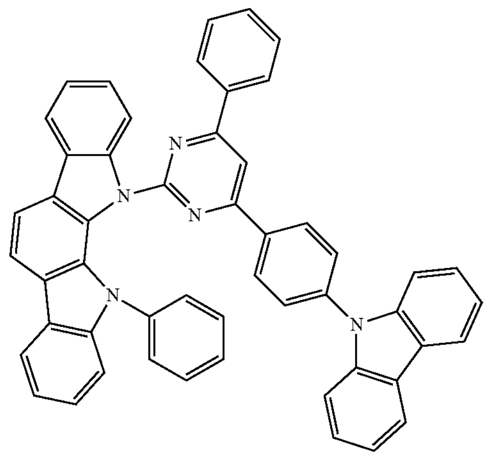
372B
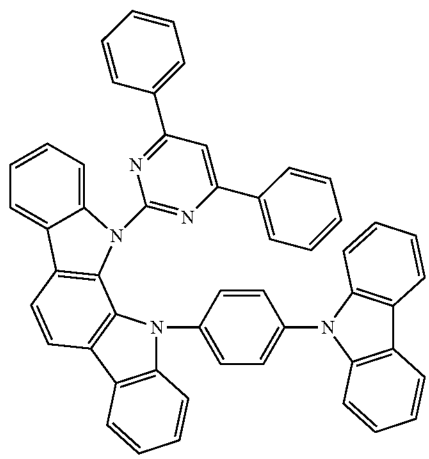
373B
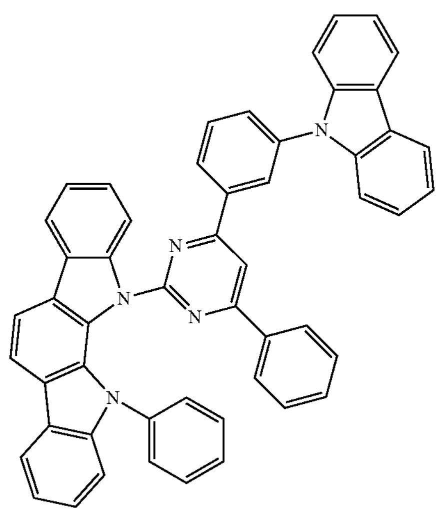
-continued
374B
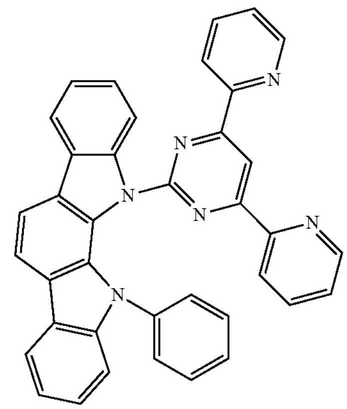
375B
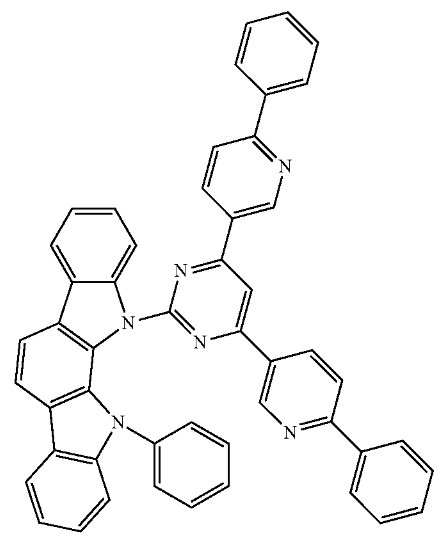
376B
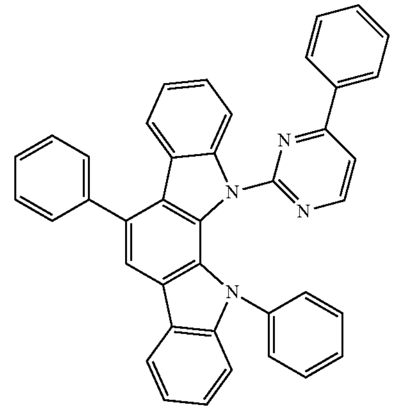

-continued
377B
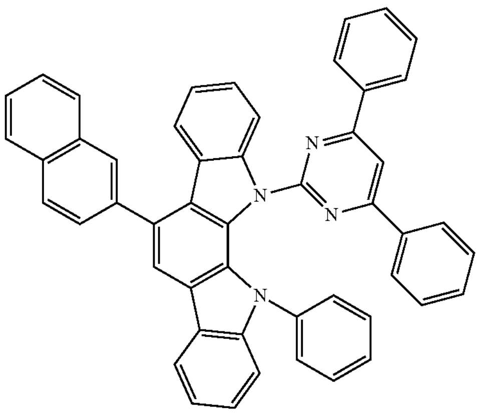
378B
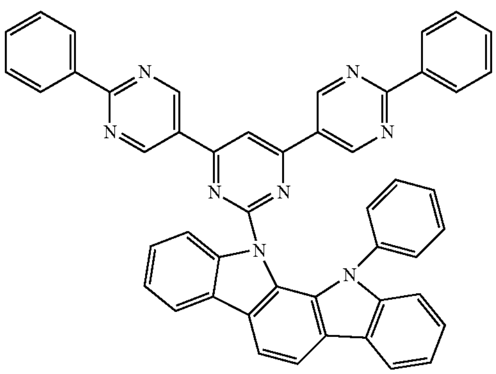
379B
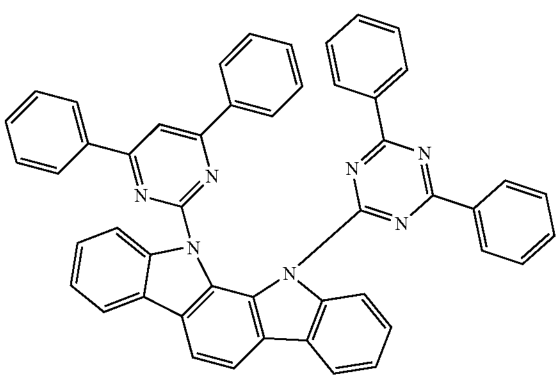
380B
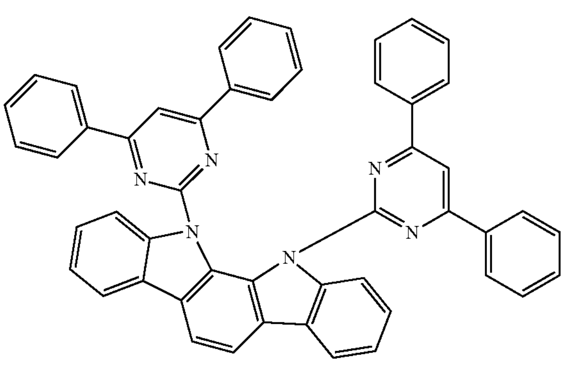
-continued
381B
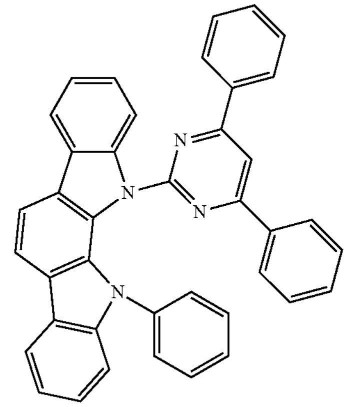
382B
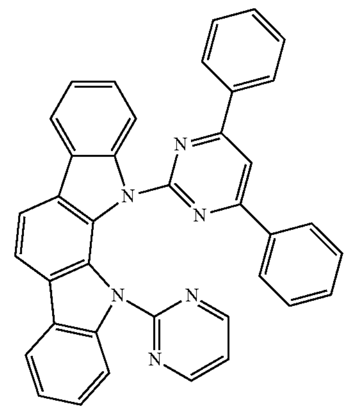
383B
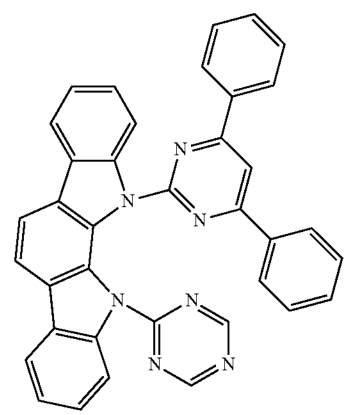
384B
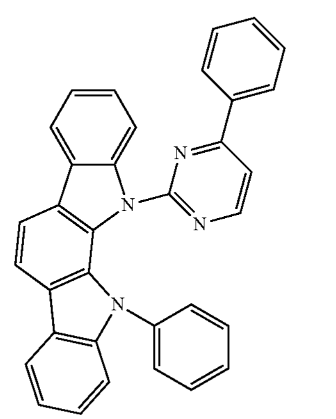

-continued
385B
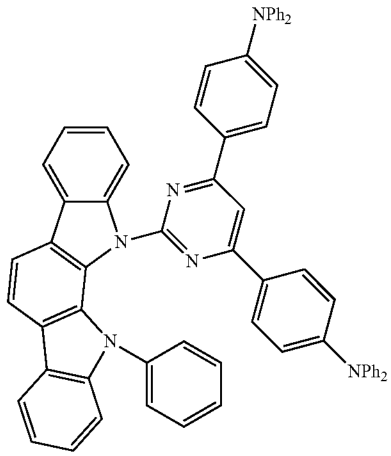
386B
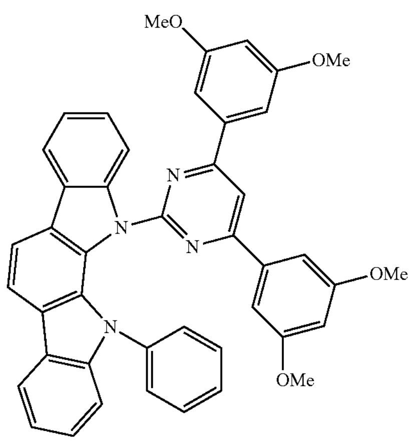
387B
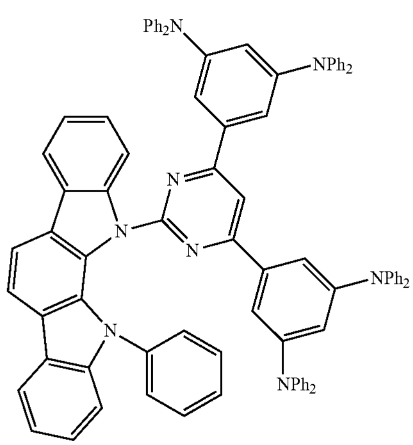
-continued
388B
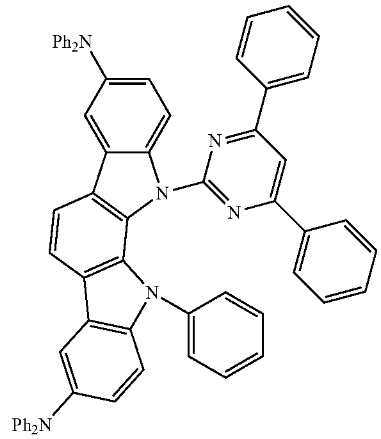
389B
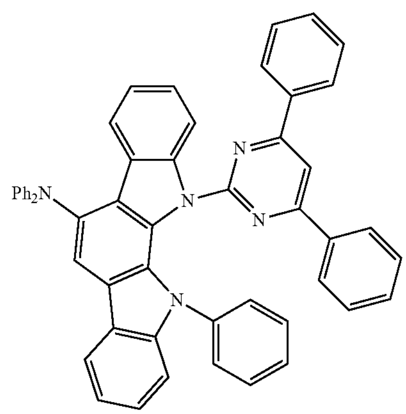
390B
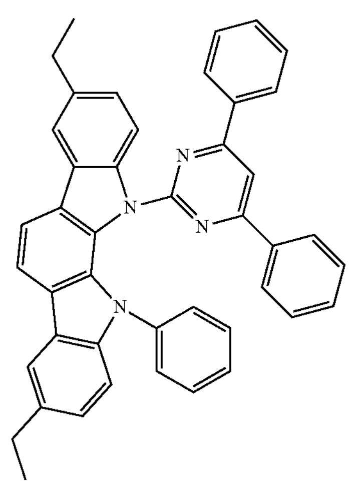

-continued
391B
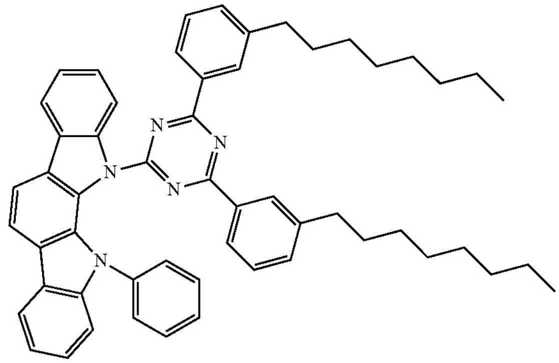
392B
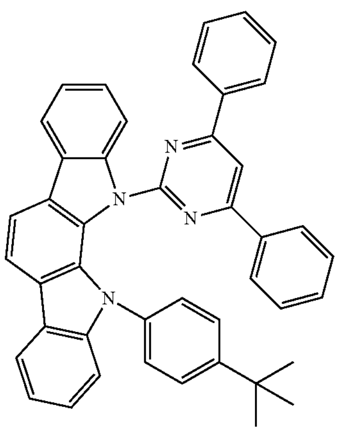
393B
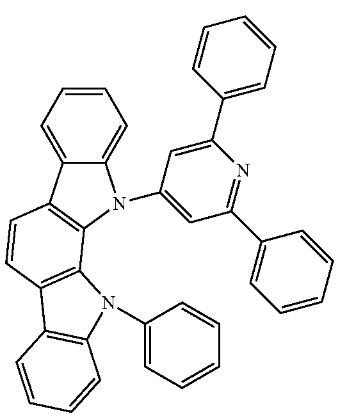
-continued
394B
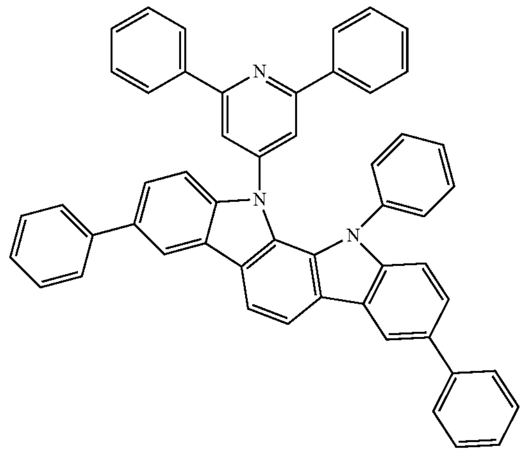
395B
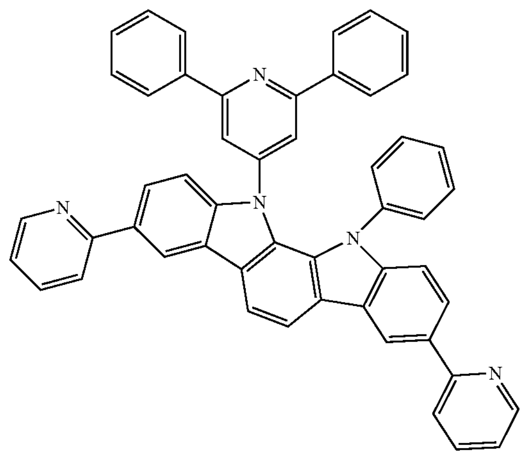
396B
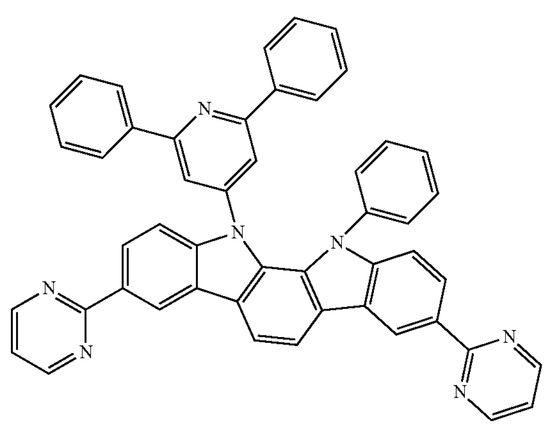

-continued
397B
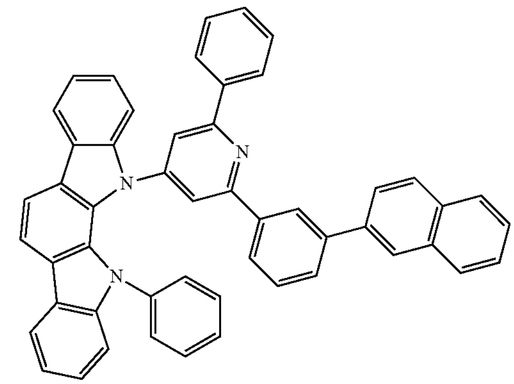
398B
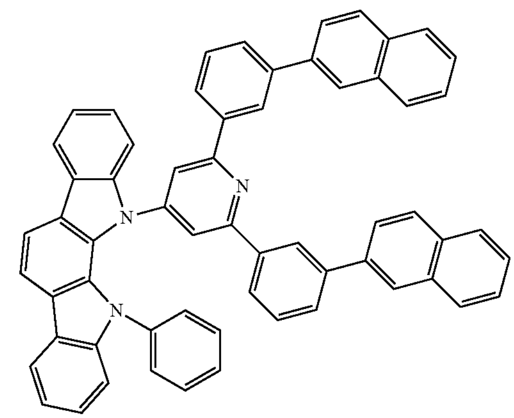
399B
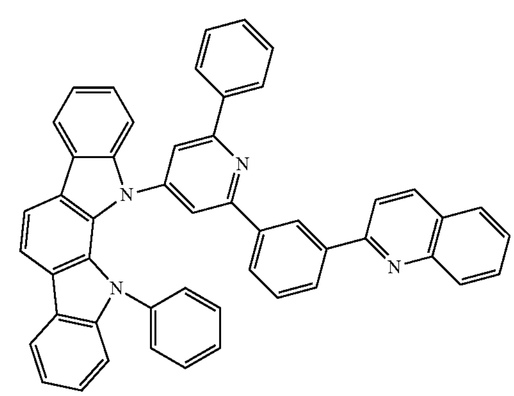
-continued
400B
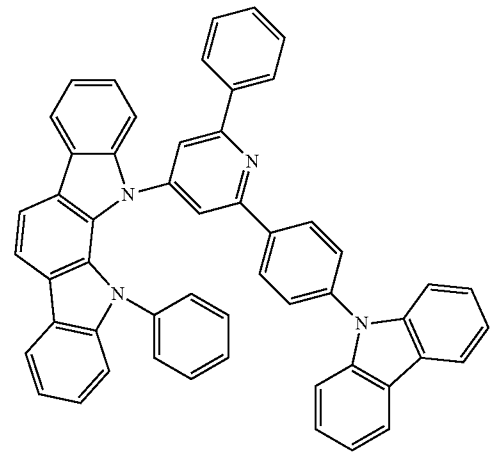
401B
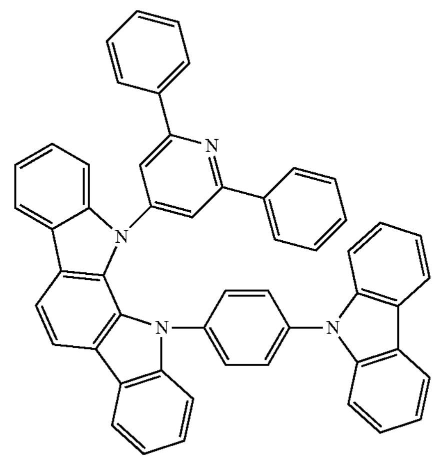
402B
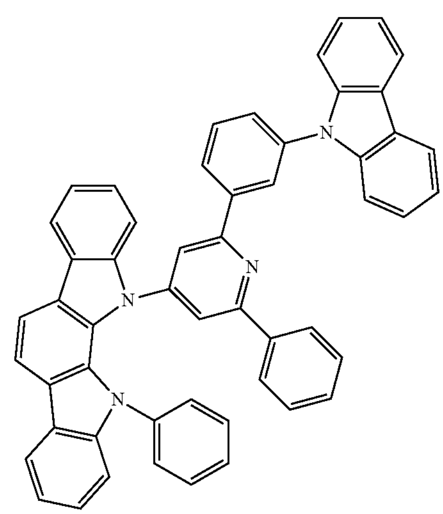

-continued
403B
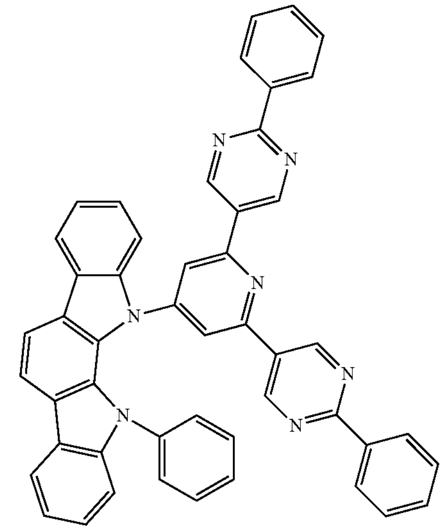
404B
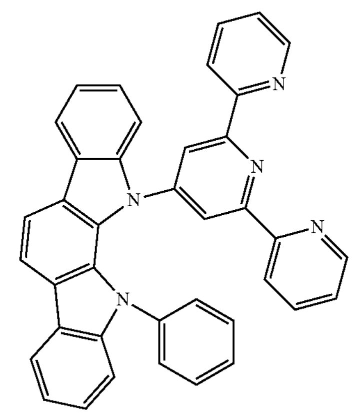
405B
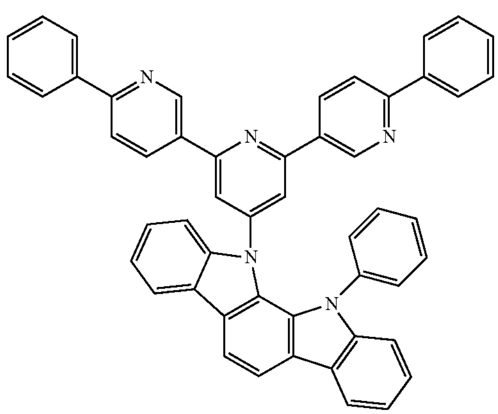
-continued
406B
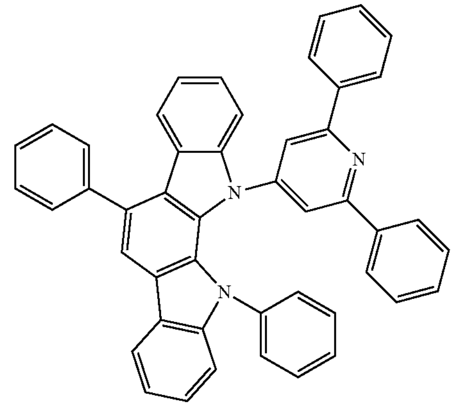
407B
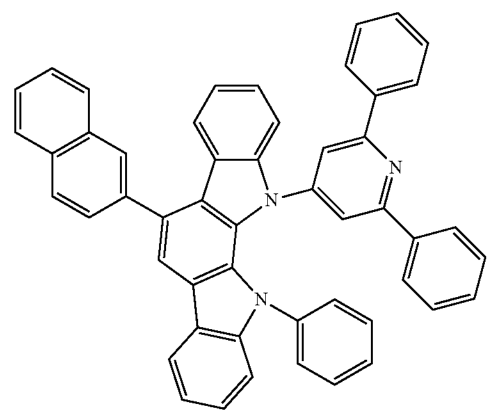
408B
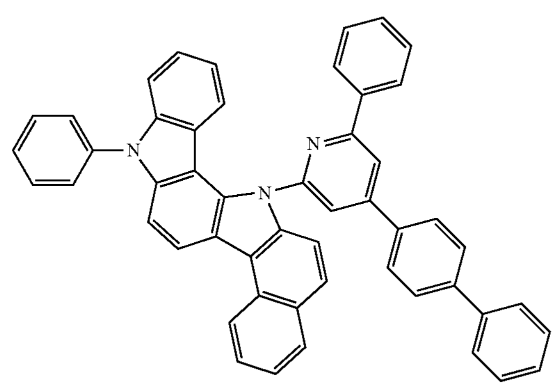

-continued
409B
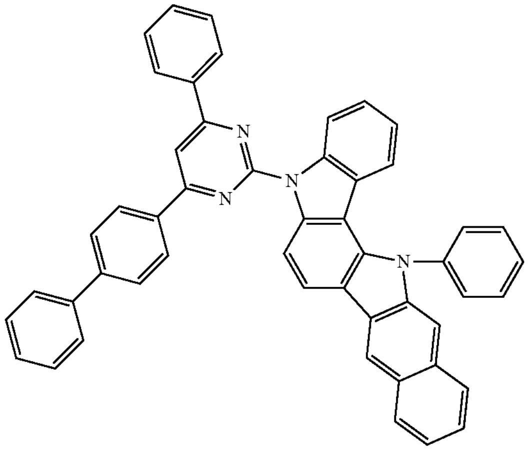
410B
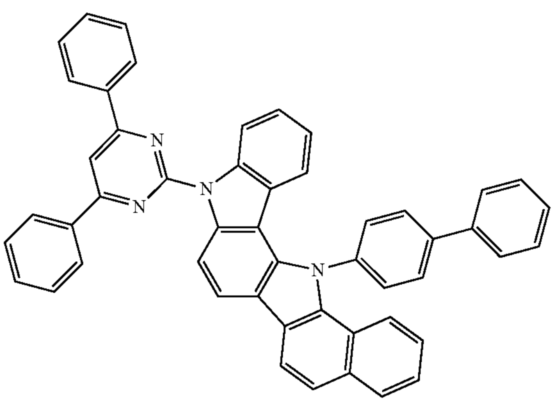
411B
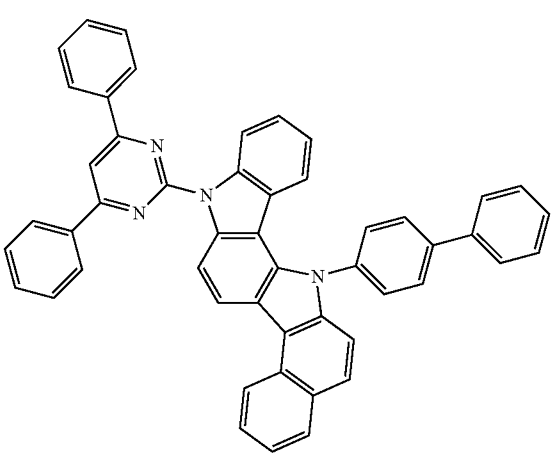
-continued
412B
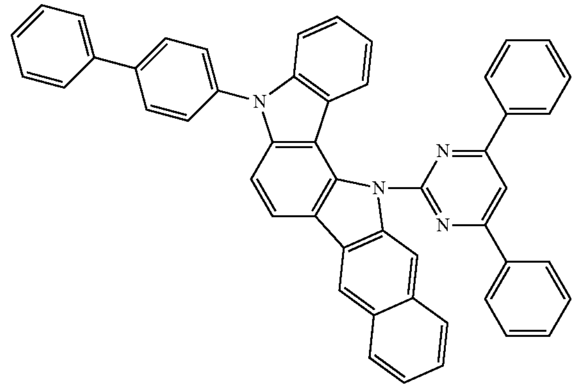
413B
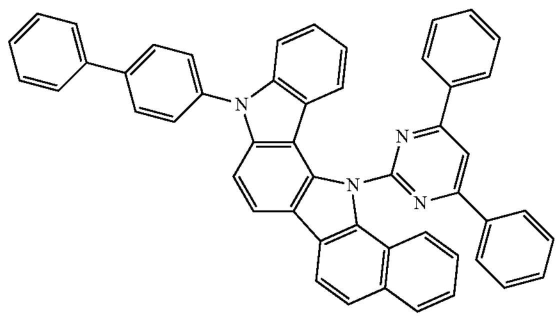
414B
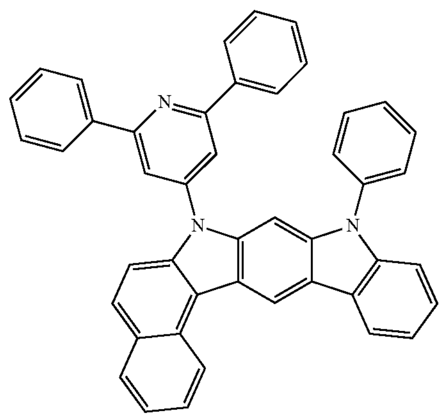
415B
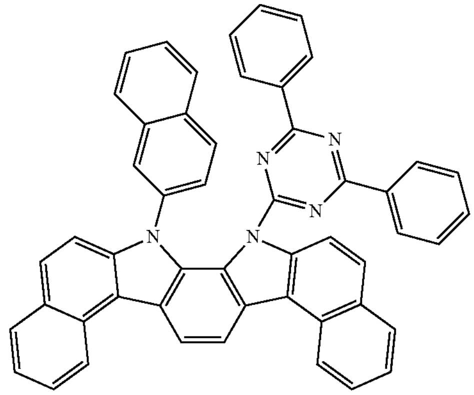

-continued
416B
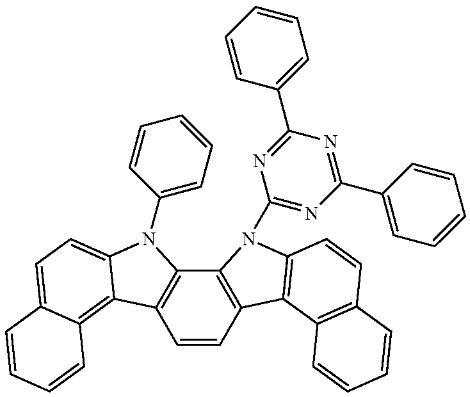
417B
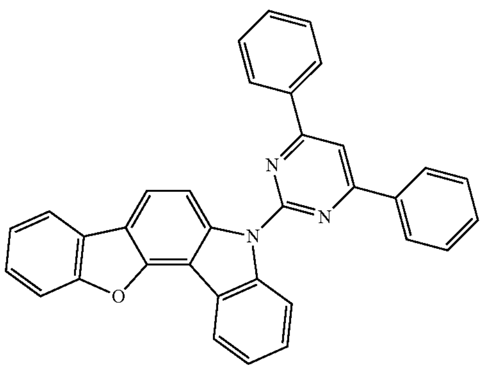
418B
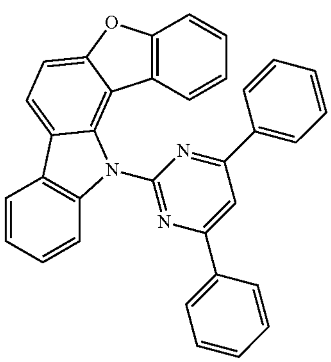
419B
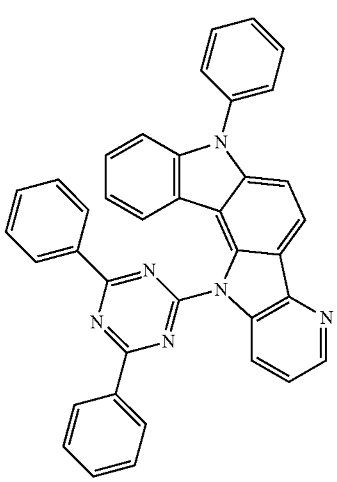
-continued
420B
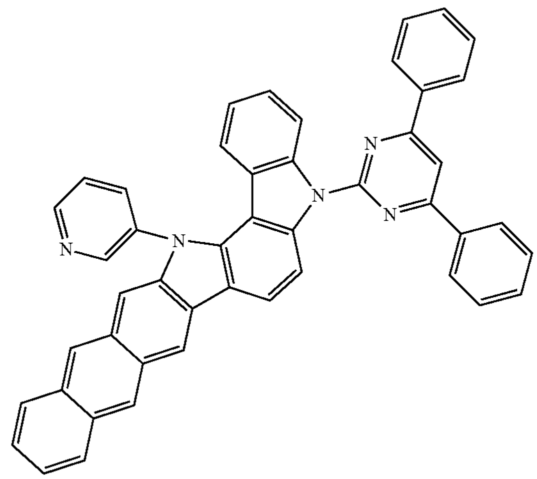
421B
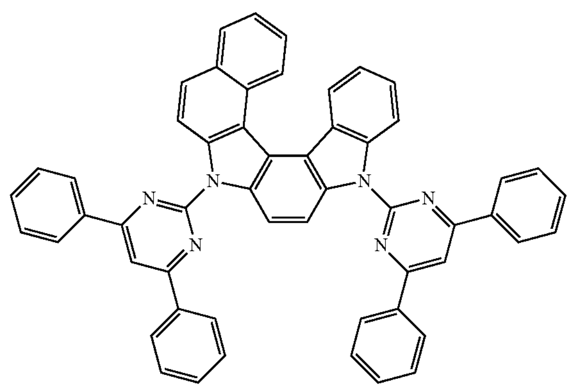
422B
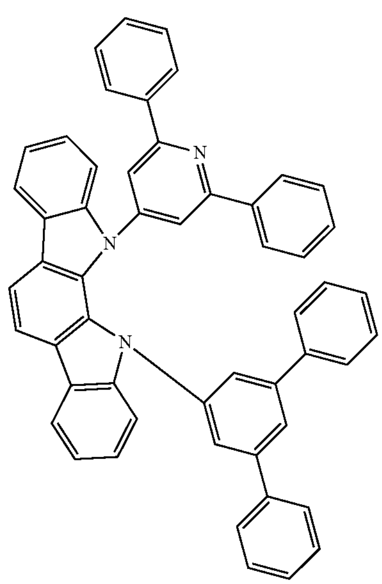

423B
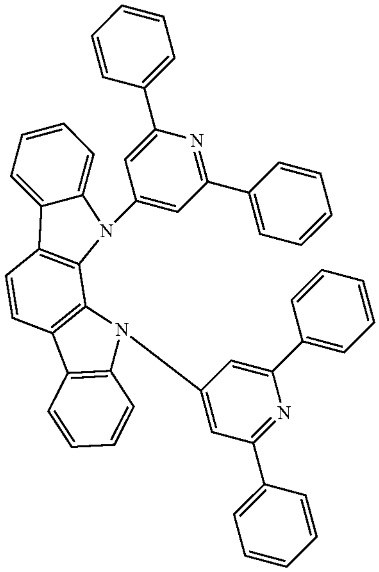
424B
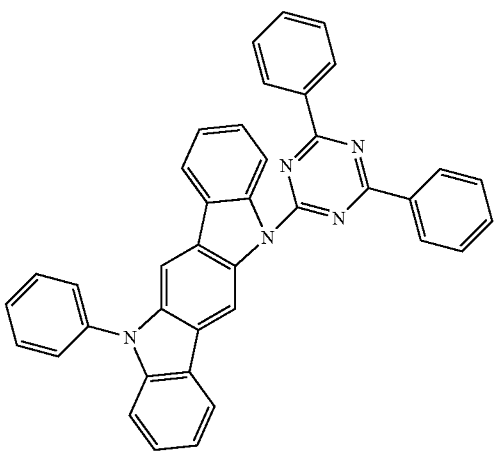
425B
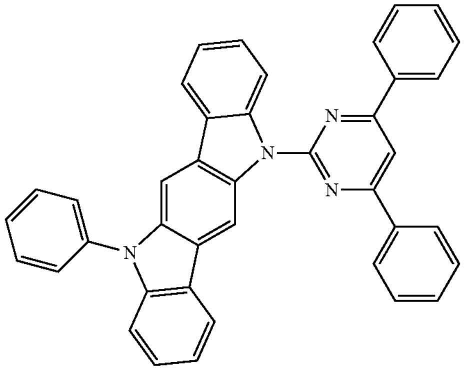
426B
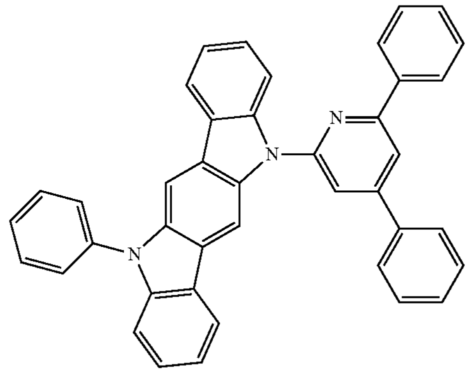
427B
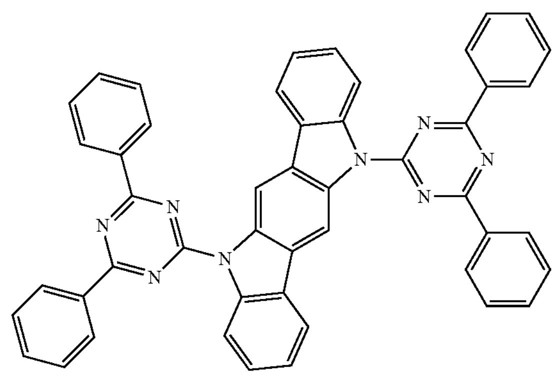
428B
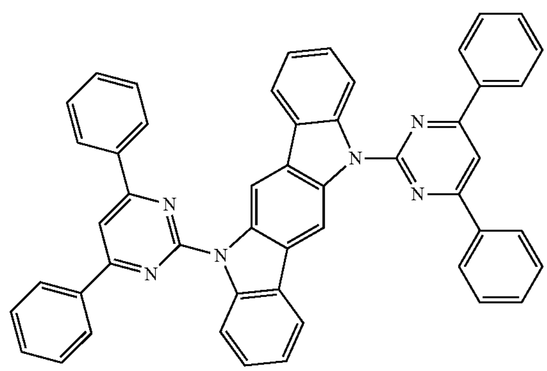
429B
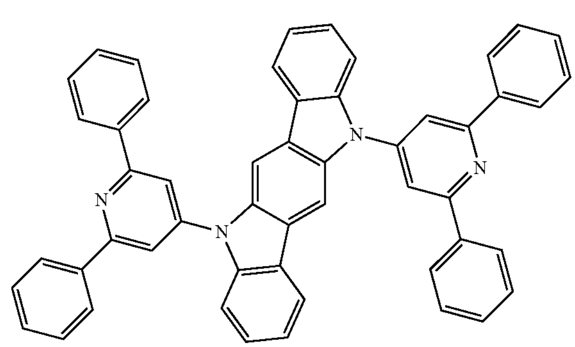

430B

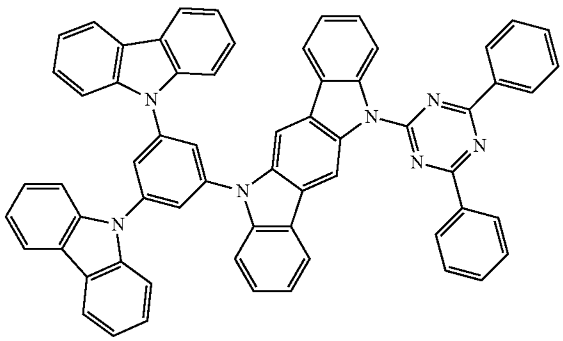

431B

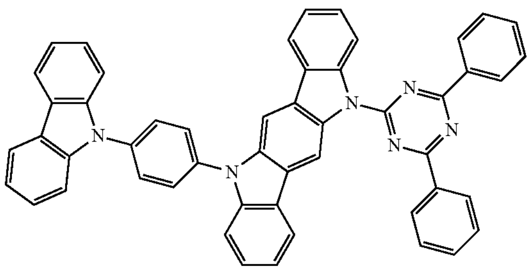

432B

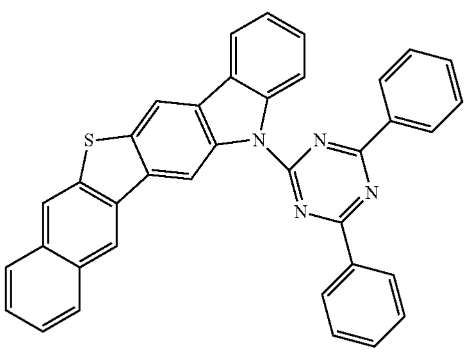

433B

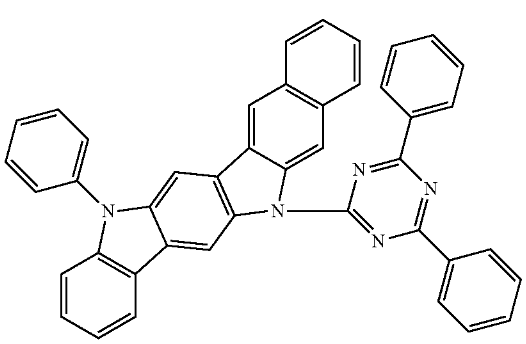

434B

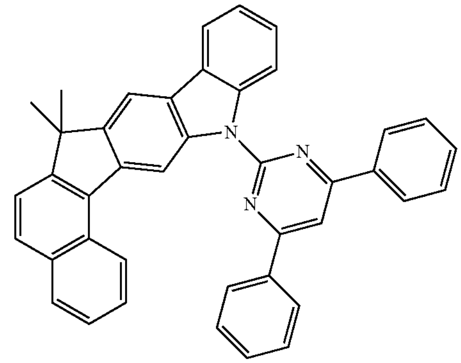

For example, neither the first compound nor the second compound may include a cyano group.

When the first compound and the second compound include a cyano group, due to very strong electron affinity of the cyano group, lowest unoccupied molecular orbital (LUMO) levels of the compounds may be decreased to below 3.0 eV, which may not be appropriate for a LUMO level of a phosphorescent dopant. Accordingly, an organic light-emitting device including a compound having a cyano group as a host may have low efficiency.

Also, when the first compound and the second compound include a cyano group, due to the very strong electron affinity of the cyano group, the polarity of the compounds may be too high, and thus electric stability may be decreased. Accordingly, an organic light-emitting device including a compound having a cyano group as a host may have a decreased lifespan.

On the other hand, when neither the first compound nor the second compound includes a cyano group, their LUMO levels may be in a range of about 2.6 eV to about 3.0 eV, which may be appropriate for a LUMO level for a phosphorescent dopant.

When neither the first compound nor the second compound includes a cyano group, their electric stability may be increased.

Accordingly, when neither the first compound nor the second compound includes a cyano group, an organic light-emitting device including the first compound and the second compound may have high efficiency and a longer lifespan.

In some embodiments, efficiency and lifespan of an organic light-emitting device are affected by the following factors: i) whether electrons and holes are balanced in an emission layer; and ii) whether an emission region is widely or substantially evenly distributed in the emission layer, and is not disproportionately distributed so as to be positioned closer to a hole transport layer or to an electron transport layer.

The above factors may not be satisfied when only one kind of material is included in the emission layer. However, according to embodiments of the present invention, these factors are satisfied by a) including at least two different materials as a host in the emission layer, and b) differentiating characteristics of substituents of the at least two different materials.

Accordingly, when an emission layer includes (a) a first compound and a second compound, wherein (b) (i) the first compound includes an electron transport group and the second compound includes a hole transport group, or (ii) the first compound includes hole transport group and the second compound includes an electron transport group, the efficiency and lifespan of an organic light-emitting device may be improved.

For example, the second compound having the hole transport group may have a relatively wide energy gap, and the first compound having the electron transport group may have a relatively narrow energy gap. In this case, the second compound may effectively control electron transport characteristics of the first compound and may prevent or substantially reduce the possibility of an emission region of an emission layer from being positioned close to the interface between an hole transport layer and the emission layer, thus leading to higher efficiency and improved lifespan characteristics of the resulting organic light-emitting device.

In embodiments where the first compound includes a relatively strong electron transport group (for example, a triazine group) and the second compound includes the hole transport group, improved efficiency and lifespan characteristics of the organic light-emitting device may be obtained, and when the second compound including the hole transport group is included in a relatively large amount, optimal efficiency and lifespan characteristics may be obtained.

In some embodiments, when the first compound includes a relatively weak electron transport group (for example, a pyridine group or a pyrimidine group) and the second compound includes the hole transport group, improved efficiency and lifespan characteristics may be obtained, and when the second compound including the hole transport group is included in a relatively small amount, optimal efficiency and lifespan characteristics may be obtained.

Accordingly, a weight ratio of the first compound to the second compound may vary depending on electric characteristics of the first compound and the second compound.

In some embodiments, a weight ratio of the first compound to the second compound may be in a range of 1:10 to 10:1. In some embodiments, a weight ratio of the first compound to the second compound may be in a range of 1:9 to 9:1. In some embodiments, a weight ratio of the first compound to the second compound may be in a range of 2:8 to 8:2, 3:7 to 7:3, 4:6 to 6:4, or 5:5, but is not limited thereto.

The dopant may be a phosphorescent dopant.

The phosphorescent dopant may include an organometallic compound including at least one selected from iridium (Ir), platinum (Pt), osmium (Os), titanium (Ti), zirconium (Zr), hafnium (Hf), europium (Eu), terbium (Tb), thulium (Tm), rhodium (Rh), and copper (Cu);

For example, the phosphorescent dopant may include an organometallic complex represented by Formula 401 below:

Formula 401

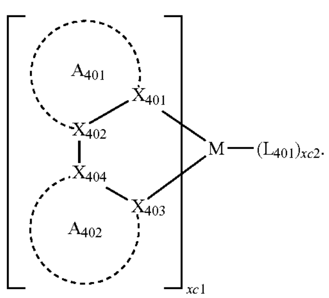

In Formula 401,

M may be selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ may be each independently a nitrogen atom or a carbon atom;

$A_{401}$ and $A_{402}$ rings may be each independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene; and at least one substituent of the substituted benzene, substituted naphthalene, substituted fluorene, substituted spiro-fluorene, substituted indene, substituted pyrrole, substituted thiophene, substituted furan, substituted imidazole, substituted pyrazole, substituted thiazole, substituted isothiazole, substituted oxazole, substituted isoxazole, substituted pyridine, substituted pyrazine, substituted pyrimidine, substituted pyridazine, substituted quinoline, substituted isoquinoline, substituted benzoquinoline, substituted quinoxaline, substituted quinazoline, substituted carbazole, substituted benzoimidazole, substituted benzofuran, substituted benzothiophene, substituted isobenzothiophene, substituted benzoxazole, substituted isobenzoxazole, substituted triazole, substituted oxadiazole, substituted triazine, substituted dibenzofuran, and substituted dibenzothiophene may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$1)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$);

$L_{401}$ may be an organic ligand;

xc1 may be selected from 1, 2, and 3; and xc2 may be selected from 0, 1, 2, and 3;

$Q_{401}$ to $Q_{407}$, $Q_{411}$ to $Q_{417}$, and $Q_{421}$ to $Q_{427}$ may be each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

$L_{401}$ may be a monovalent, divalent, or trivalent organic ligand. For example, $L_{401}$ may be selected from a halogen ligand (for example, Cl and/or F), a diketone ligand (for example, acetylacetonate, 1,3-diphenyl-1,3-propanedionate, 2,2,6,6-tetramethyl-3,5-heptanedionate, and/or hexafluoroacetonate), a carboxylic acid ligand (for example, picolinate, dimethyl-3-pyrazolecarboxylate, and/or benzoate), a carbon monooxide ligand, an isonitrile ligand, a cyano ligand, and a phosphorous ligand (for example, phosphine and/or phosphite), but is not limited thereto.

When $A_{401}$ in Formula 401 has two or more substituents, the substituents of $A_{401}$ may bind to each other to form a saturated or unsaturated ring.

When $A_{402}$ in Formula 401 has two or more substituents, the substituents of $A_{402}$ may bind to each other to form a saturated or unsaturated ring.

When xc1 in Formula 401 is two or more, a plurality of ligands

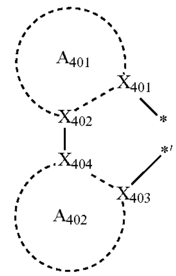

may be identical to or different from each other. When xc1 in Formula 401 is two or more, $A_{401}$ and/or $A_{402}$ of one ligand may be respectively connected to $A_{401}$ and/or $A_{402}$ of other neighboring ligands, either directly (for example, via a single bond) or via a linker or linking group (for example, a $C_1$-$C_5$ alkylene group, —N(R')— (where R' may be a $C_1$-$C_{10}$ alkyl group or a $C_6$-$C_{20}$ aryl group), and/or —C(=O)—) therebetween.

In some embodiments, M in Formula 401 may be selected from iridium (Ir), platinum (Pt), and osmium (Os), but is not limited thereto.

The phosphorescent dopant may include at least one of Compounds PD1 to PD82 below, but is not limited thereto:

PD1

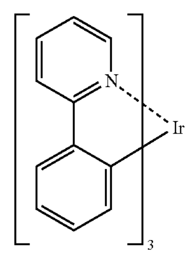

PD2

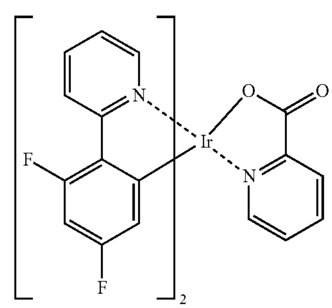

PD3

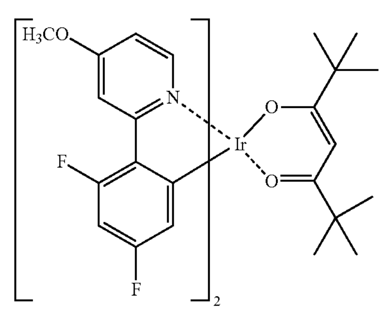

PD4
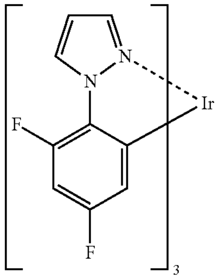
PD5
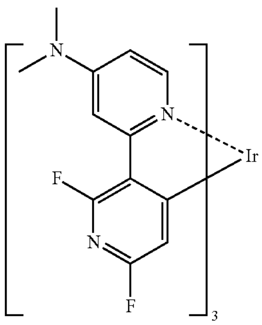
PD6
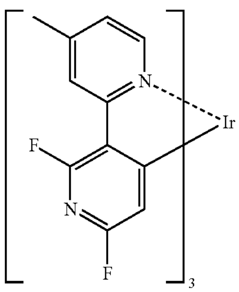
PD7
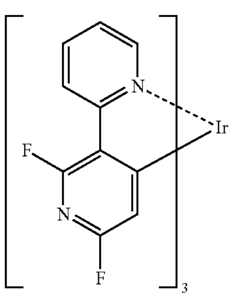
PD8
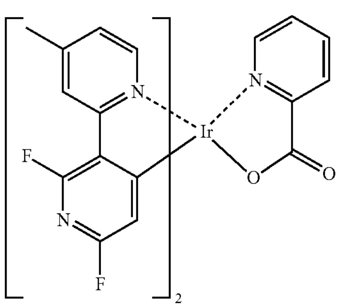
PD9
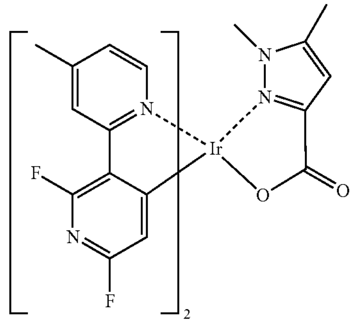
PD10
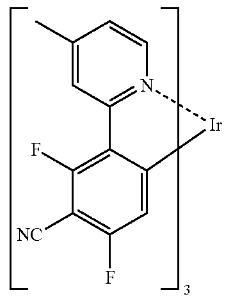
PD11
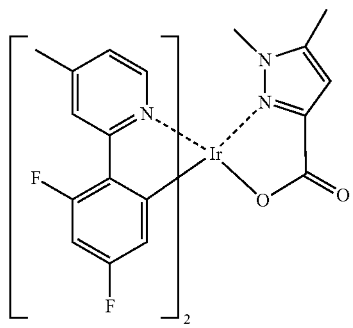
PD12
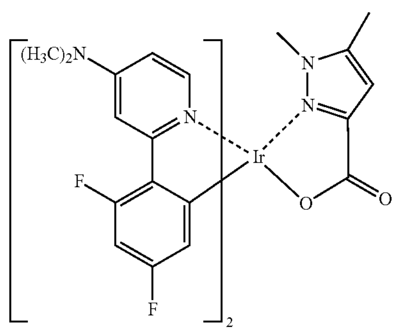
PD13
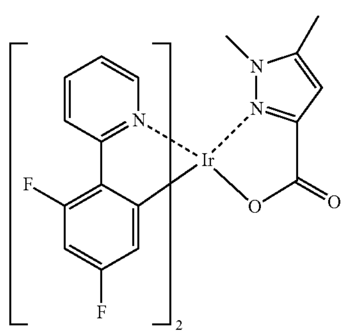

-continued
PD14
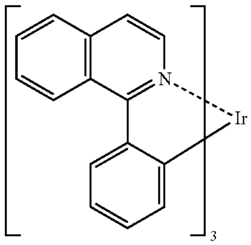
PD15
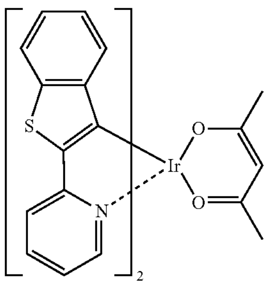
PD16
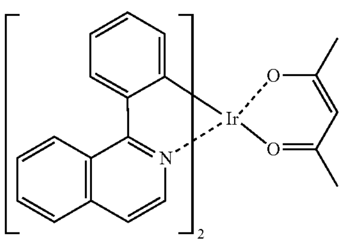
PD17
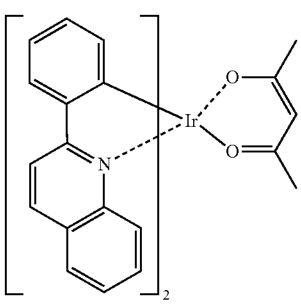
PD18
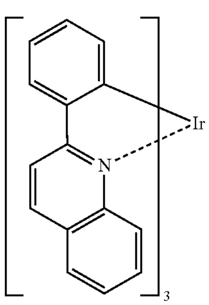
-continued
PD19
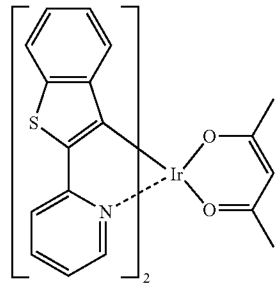
PD20
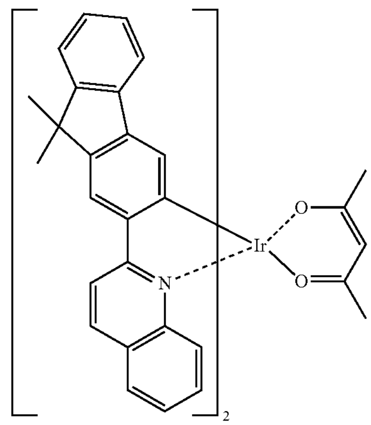
PD21
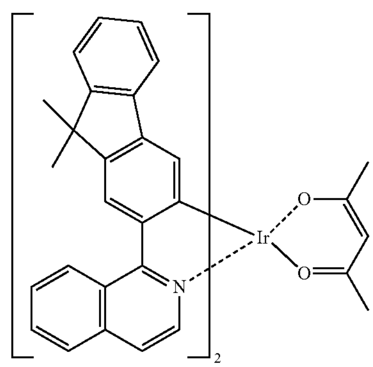
PD22
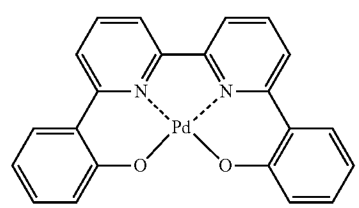
PD23
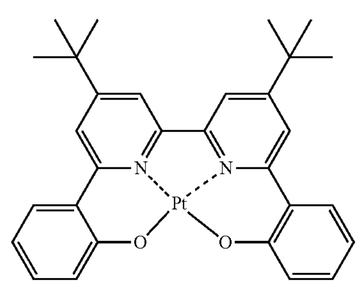

-continued
PD24
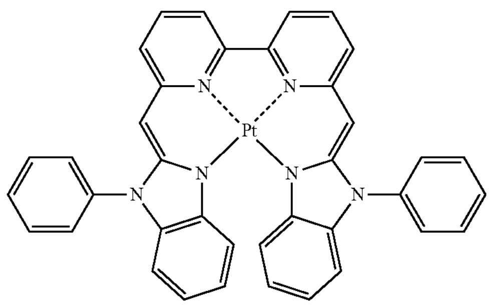
PD25
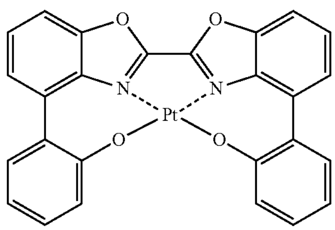
PD26
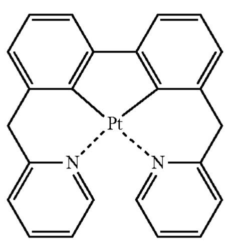
PD27
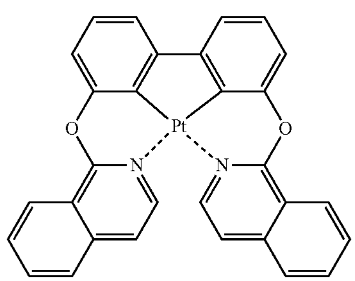
PD28
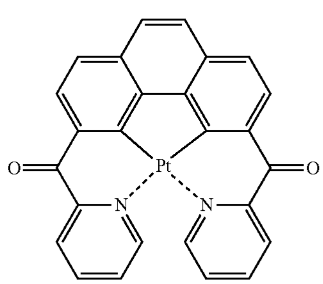
PD29
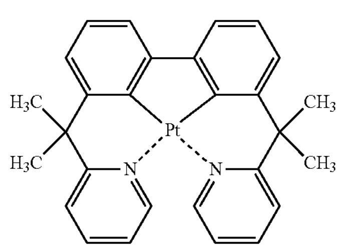
-continued
PD30
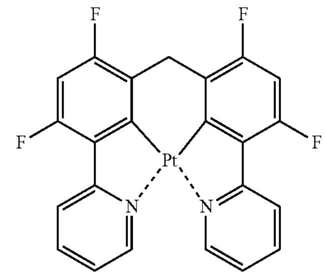
PD31
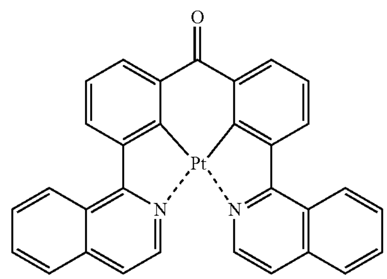
PD32
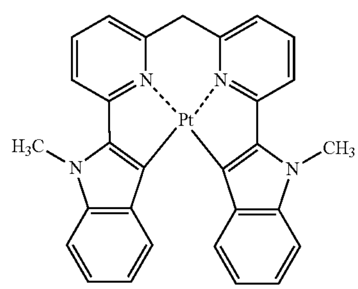
PD33
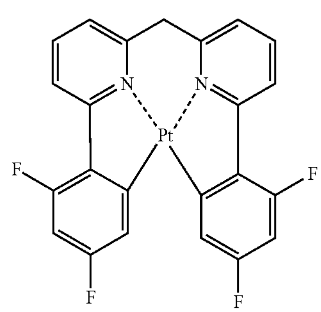
PD34
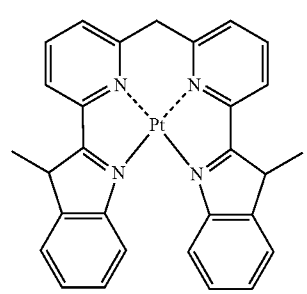

-continued
PD35
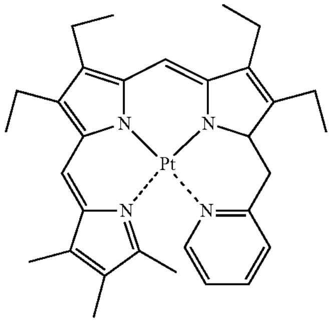
PD36
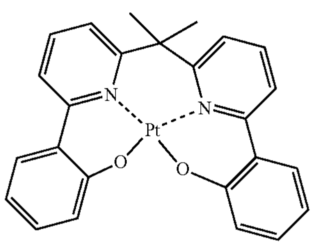
PD37
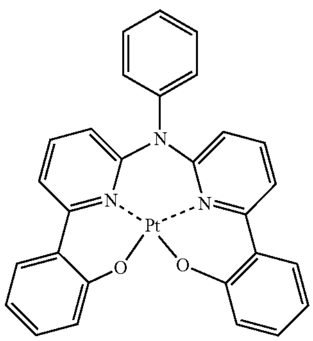
PD38
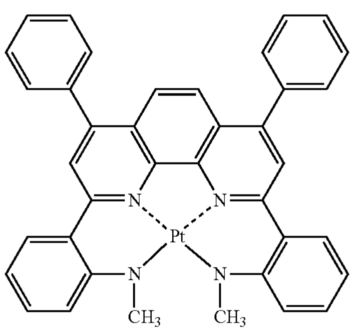
PD39
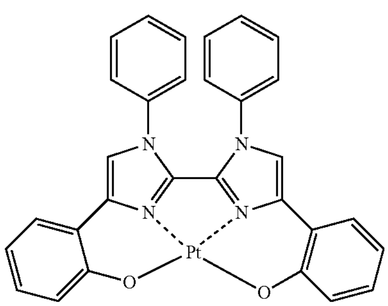
-continued
PD40
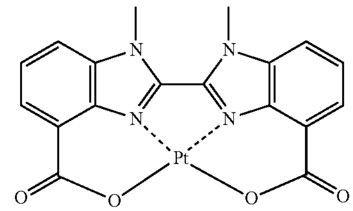
PD41
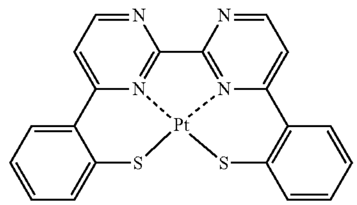
PD42
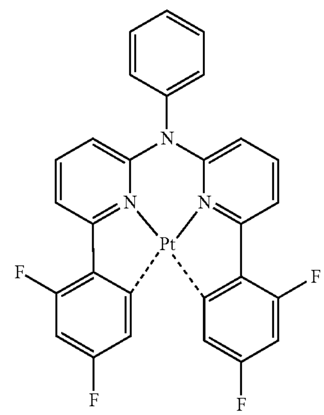
PD43
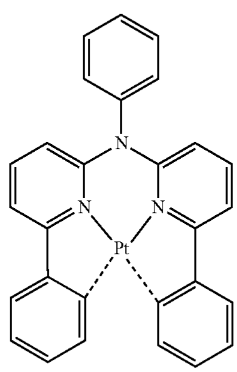
PD44
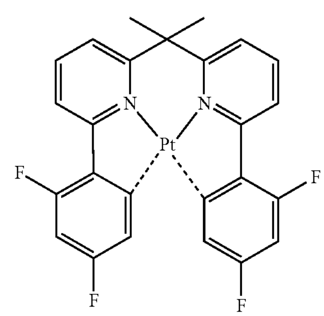

-continued
PD45
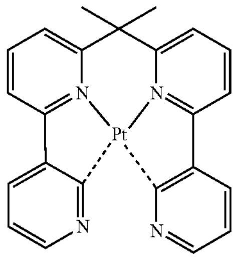
PD46
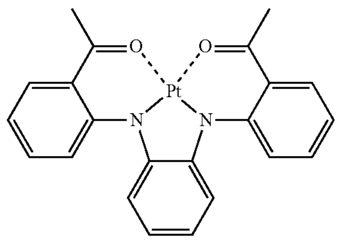
PD47
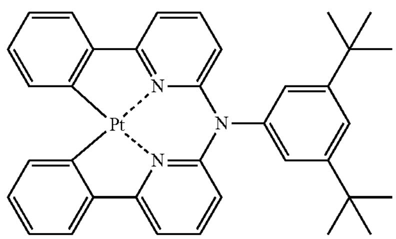
PD48
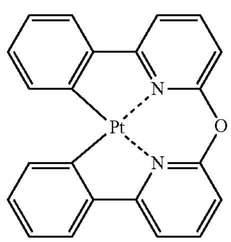
PD49
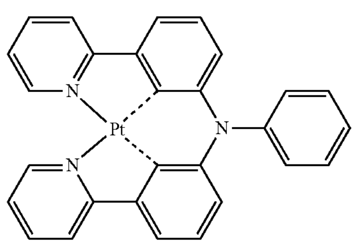
PD50
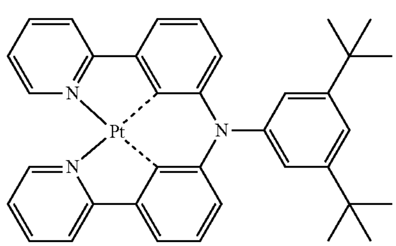
-continued
PD51
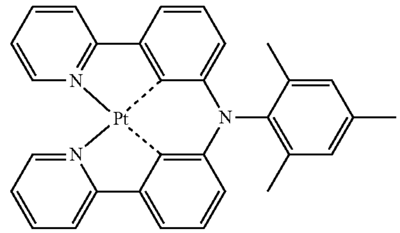
PD52
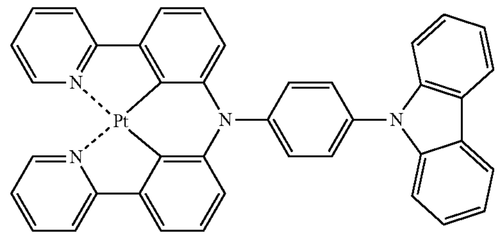
PD53
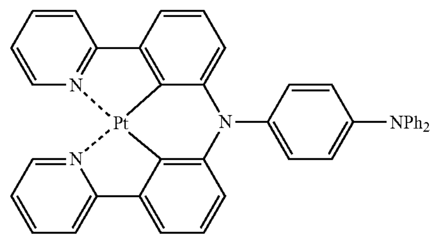
PD54
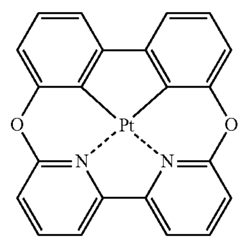
PD55
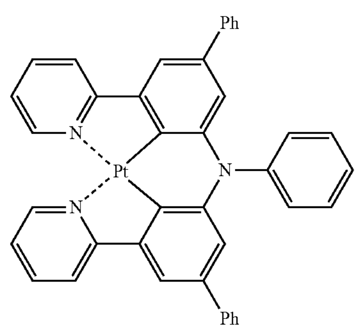
PD56
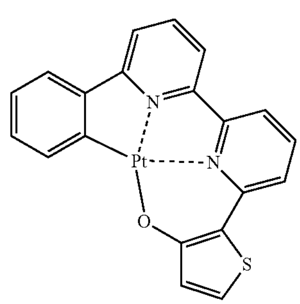

-continued
PD57
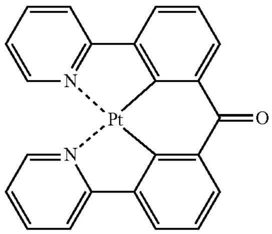
PD58
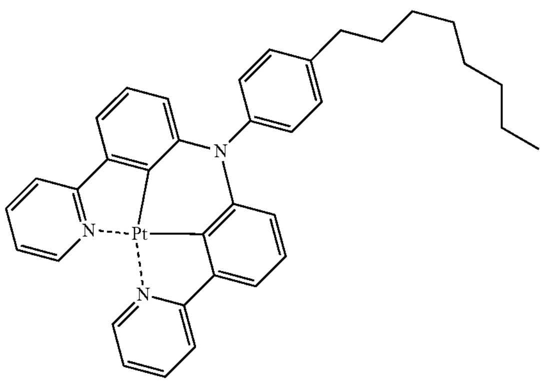
PD59
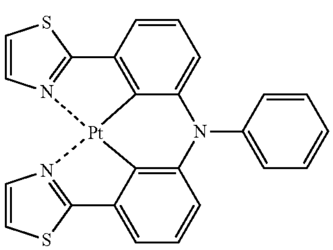
PD60
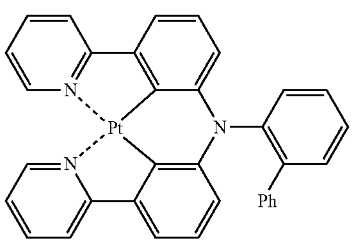
PD61
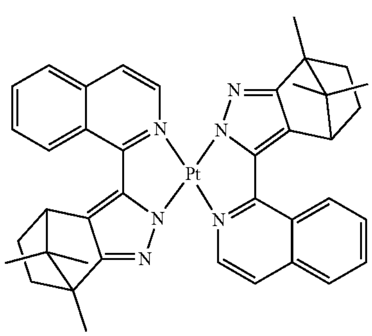
-continued
PD62
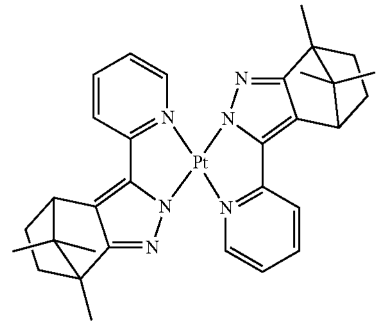
PD63
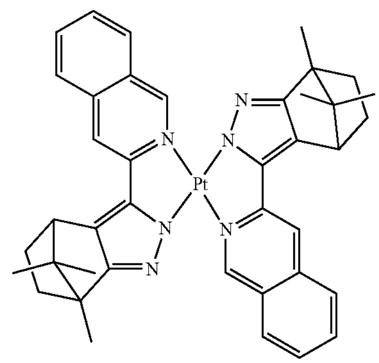
PD64
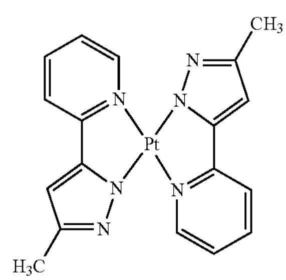
PD65
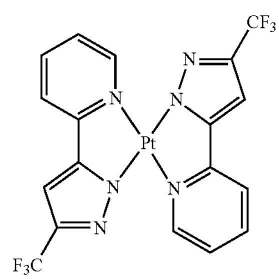
PD66
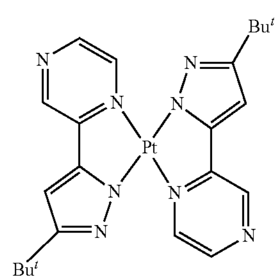

PD67
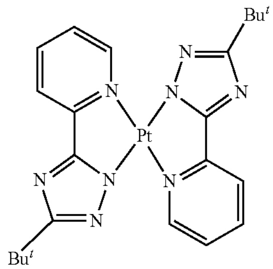
PD68
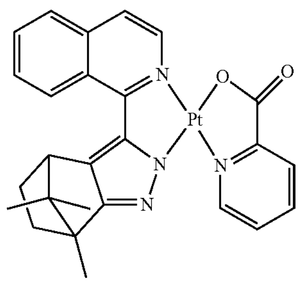
PD69
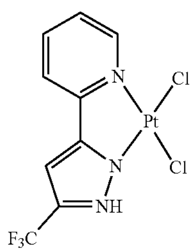
PD70
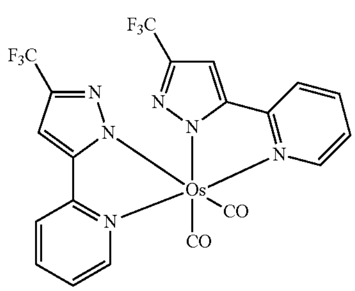
PD71
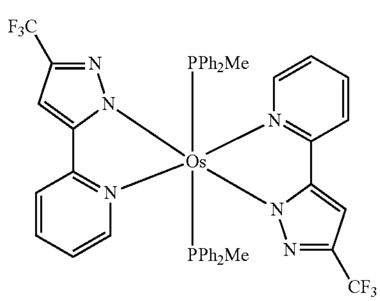
PD72
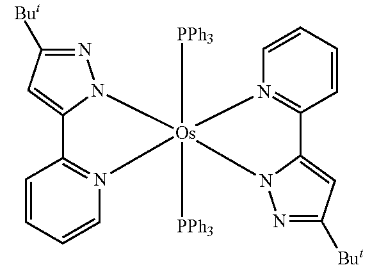
PD73
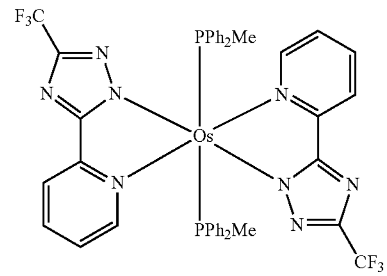
PD74
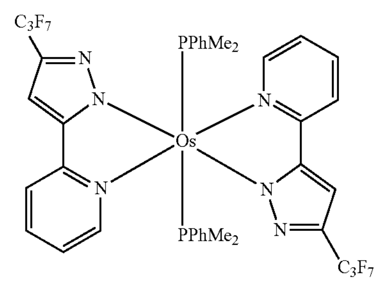
PD75
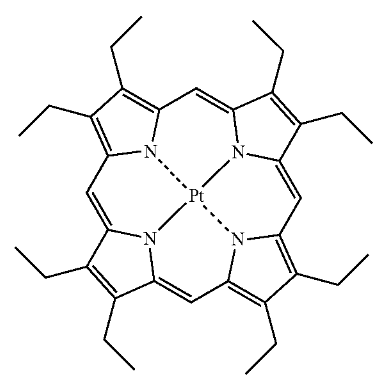
PD76
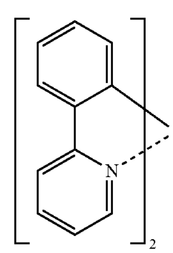

-continued

PD77

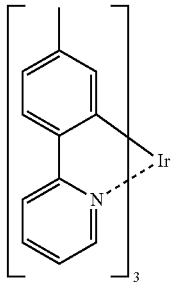

PD78

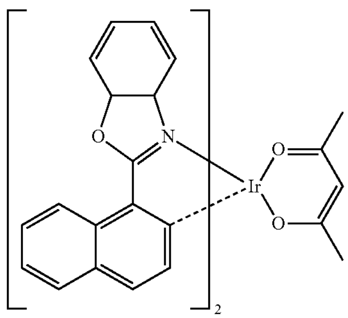

PD79

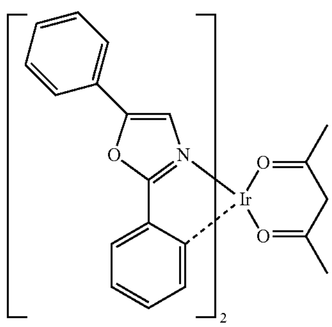

PD80

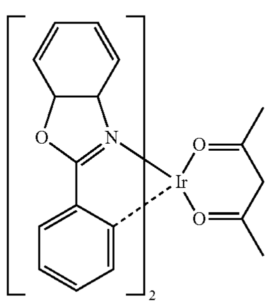

PD81

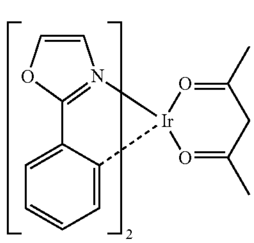

-continued

PD82

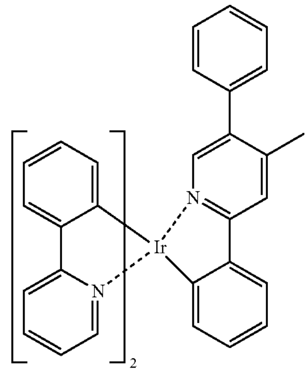

An amount of the dopant in the emission layer may be, in general, in a range of about 0.01 to about 15 parts by weight based on 100 parts by weight of the host (calculated based on the sum of the first compound and the second compound), but is not limited thereto.

A thickness of the emission layer may be in a range of about 100 Å to about 1,000 Å, for example, about 200 Å to about 600 Å. When the thickness of the emission layer is within any of these ranges, excellent light-emission characteristics may be obtained without a substantial increase in driving voltage.

The electron transport region may include at least one selected from a hole blocking layer, an electron transport layer (ETL), and an electron injection layer, but is not limited thereto.

For example, the electron transport region may have a structure of electron transport layer/electron injection layer or a structure of hole blocking layer/electron transport layer/electron injection layer, where the layers of each structure are sequentially stacked from the emission layer in the stated order, but is not limited thereto.

The electron transport region may include a hole blocking layer. When the emission layer includes a phosphorescent dopant, the hole blocking layer may be formed to prevent or substantially block the diffusion of excitons and/or holes into an electron transport layer.

When the electron transport region includes a hole blocking layer, the hole blocking layer may be formed on the emission layer by using one or more suitable methods, such as vacuum deposition, spin coating casting, a Langmuir-Blodgett (LB) method, ink-jet printing, laser-printing, and/or laser-induced thermal imaging. When the hole blocking layer is formed by vacuum deposition and/or spin coating, deposition and coating conditions for the hole blocking layer may be the same as (or similar to) the deposition and coating conditions for the hole injection layer.

The hole blocking layer may include, for example, at least one of BCP and Bphen, but is not limited thereto.

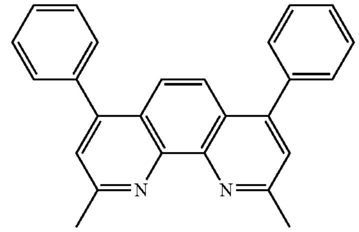

BCP

-continued

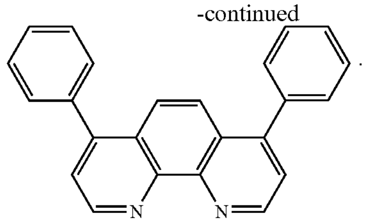

Bphen

A thickness of the hole blocking layer may be in a range of about 20 Å to about 1,000 Å, for example, about 30 Å to about 300 Å. When the thickness of the hole blocking layer is within any of these ranges, the hole blocking layer may have excellent hole blocking characteristics without a substantial increase in driving voltage.

The electron transport region may include an electron transport layer. The electron transport layer may be formed on the emission layer or the hole blocking layer by using one or more suitable methods, such as vacuum deposition, spin coating casting, a LB method, ink-jet printing, laser-printing, and/or laser-induced thermal imaging. When the electron transport layer is formed by vacuum deposition and/or spin coating, deposition and coating conditions for the electron transport layer may be the same as (or similar to) the deposition and coating conditions for the hole injection layer.

The electron transport layer may include a third compound represented by Formula 7 below:

Formula 7

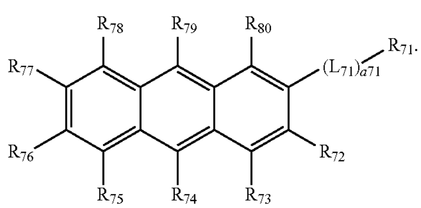

$L_{71}$ in Formula 7 may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, and the substituted divalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$);

where $Q_{11}$ to $Q_{17}$, $Q_{21}$ to $Q_{27}$, and $Q_{31}$ to $Q_{37}$ may be each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, $L_{71}$ in Formula 7 may be selected from a phenylene group, a naphthylene group, a fluorenylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group; and a phenylene group, a naphthylene group, a fluorenylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an indazolyl group, a quinolinyl group, an isoquinolinyl group, a carbazolyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, an oxadiazolyl group, a triazinyl group, a dibenzofuranyl group, a dibenzothiophenyl group, a benzocarbazolyl group and a dibenzocarbazolyl group, but they are not limited thereto.

In some embodiments, $L_{71}$ in Formula 7 may be selected from a phenylene group, a naphthylene group, a fluorenylene group, a dibenzofuranylene group, and a dibenzothiophenylene group; and a phenylene group, a naphthylene group, a fluorenylene group, a dibenzofuranylene group, and a dibenzothiophenylene group, each substituted with at least one selected from deuterium, —F, —Cl, —Br, —I, a cyano group, a nitro group, a $C_1$-$C_{20}$ alkyl group, a phenyl group, and a naphthyl group, but they are not limited thereto.

According to some embodiments, $L_{71}$ in Formula 7 may be selected from groups represented by Formulae 3-1 to 3-19 below, but is not limited thereto:

3-1

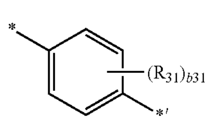

3-2

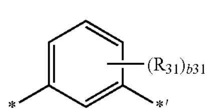

-continued 3-3

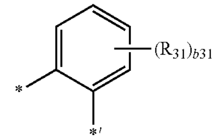

3-4

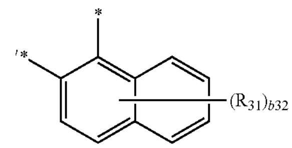

3-5

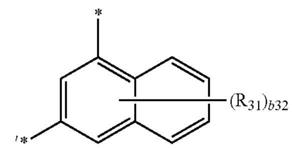

3-6

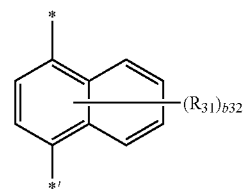

3-7

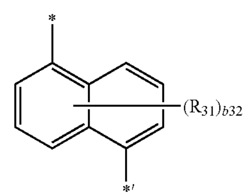

3-8

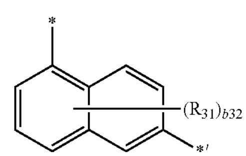

3-9

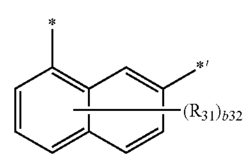

3-10

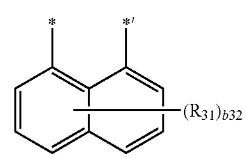

3-11

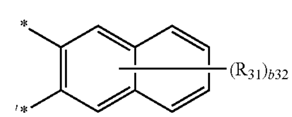

3-12

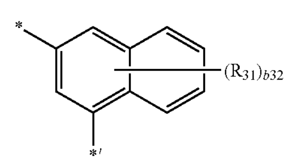

-continued

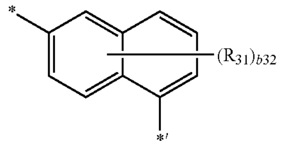
3-13

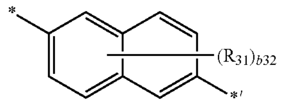
3-14

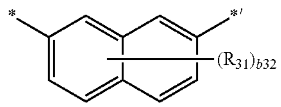
3-15

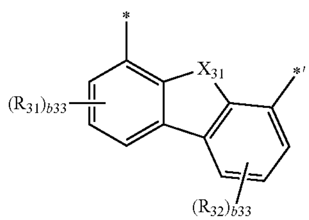
3-16

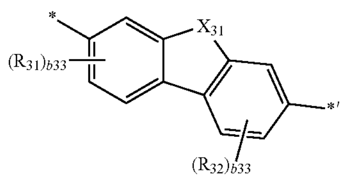
3-17

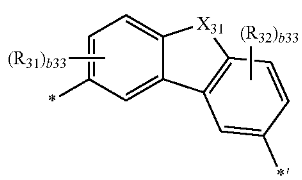
3-18

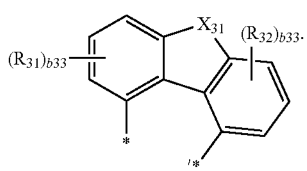
3-19

In Formulae 3-1 to 3-19, $X_{31}$ may be selected from O, S, and $C(R_{33})(R_{34})$;

$R_{31}$ to $R_{34}$ may be each independently selected from hydrogen, deuterium, —F, —Cl, —Br, —I, a cyano group, a nitro group, a methyl group, an ethyl group, an n-propyl group, an iso-propyl group, an n-butyl group, iso-butyl group, a sec-butyl group, a tert-butyl group, a phenyl group, and a naphthyl group;

b31 may be selected from 1, 2, 3, and 4;

b32 may be selected from 1, 2, 3, 4, 5, and 6;

b33 may be selected from 1, 2, and 3; and

* and *' each indicate a binding site to a neighboring atom.

According to some embodiments, $L_{71}$ in Formula 7 may be selected from groups represented by Formulae 4-1 to 4-13 below, but is not limited thereto:

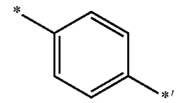
4-1

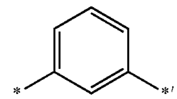
4-2

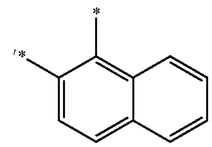
4-3

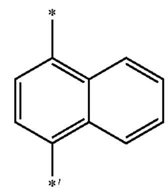
4-4

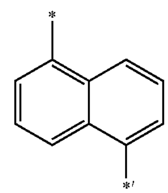
4-5

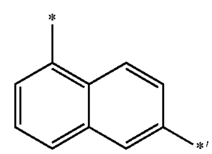
4-6

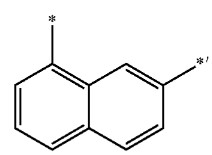
4-7

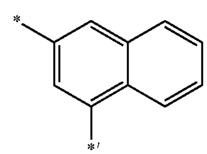
4-8

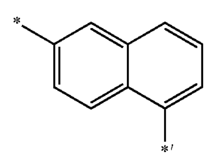
4-9

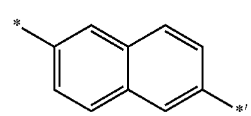
4-10

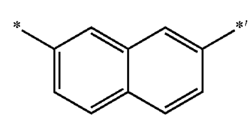
4-11

-continued

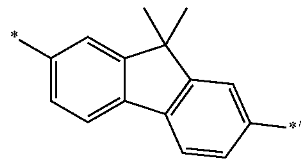

4-12

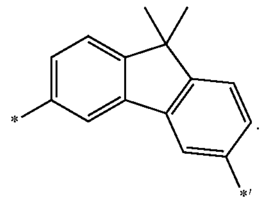

4-13

In Formulae 4-1 to 4-13,

* and *' each indicate a binding site to a neighboring atom.

a71 in Formula 7 indicates the number of $L_{71}$, and a71 may be selected from 0, 1, 2, 3, 4, and 5. When a71 is 0, $(L_{71})_{a71}$ indicates a single bond. When a71 is 2 or more, a plurality of $L_{71}$ may be identical to or different from each other. For example, a71 in Formula 7 may be selected from 0, and 1, but is not limited thereto.

In Formula 7, $R_{71}$ may be $R_{ET}$, where $R_{ET}$ is an electron transport group.

For example, $R_{ET}$ in Formula 7 may be selected from a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a benzophenanthrolinyl group, a phenazinyl group, a benzimidazolyl group, a naphthoimidazolyl group, a benzothiazolyl group, an isobenzothiazolyl group, a benzoxazolyl group, an isobenzoxazolyl group, a triazolyl group, a tetrazolyl group, an oxadiazolyl group, a triazinyl group, an imidazopyridinyl group, an imidazopyrimidinyl group, an imidazoquinolinyl group, an imidazoisoquinolinyl group, a pyridobenzofuranyl group, a pyrimidobenzofuranyl group, a pyridobenzothiophenyl group, and a pyrimidobenzothiophenyl group;

a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a benzophenanthrolinyl group, a phenazinyl group, a benzimidazolyl group, a naphthoimidazolyl group, a benzothiazolyl group, an isobenzothiazolyl group, a benzoxazolyl group, an isobenzoxazolyl group, a triazolyl group, a tetrazolyl group, an oxadiazolyl group, a triazinyl group, an imidazopyridinyl group, an imidazopyrimidinyl group, an imidazoquinolinyl group, an imidazoisoquinolinyl group, a pyridobenzofuranyl group, a pyrimidobenzofuranyl group, a pyridobenzothiophenyl group, and a pyrimidobenzothiophenyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, a pyridinyl group, a pyrimidinyl group, a triazinyl group, —N($Q_{41}$)($Q_{42}$), —Si($Q_{43}$)($Q_{44}$)($Q_{45}$), and —B($Q_{46}$)($Q_{47}$); and a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a benzophenanthrolinyl group, a phenazinyl group, a benzimidazolyl group, a naphthoimidazolyl group, a benzothiazolyl group, an isobenzothiazolyl group, a benzoxazolyl group, an isobenzoxazolyl group, a triazolyl group, a tetrazolyl group, an oxadiazolyl group, a triazinyl group, an imidazopyridinyl group, an imidazopyrimidinyl group, an imidazoquinolinyl group, an imidazoisoquinolinyl group, a pyridobenzofuranyl group, a pyrimidobenzofuranyl group, a pyridobenzothiophenyl group, and a pyrimidobenzothiophenyl group, each substituted with at least one selected from a phenyl group, a naphthyl group, a fluorenyl group, a carbazolyl group, a pyridinyl group, a pyrimidinyl group, and a triazinyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a benzofluorenyl group, a dibenzofluorenyl group, a carbazolyl group, a pyridinyl group, a pyrimidinyl group, a triazinyl group, —N($Q_{51}$)($Q_{52}$), —Si($Q_{53}$)($Q_{54}$)($Q_{55}$), and —B($Q_{56}$)($Q_{57}$);

where $Q_{41}$ to $Q_{47}$ and $Q_{51}$ to $Q_{57}$ may be each independently selected from a $C_1$-$C_{60}$ alkyl group, a $C_6$-$C_{60}$ aryl group, a monovalent non-aromatic condensed polycyclic group, and a monovalent non-aromatic condensed heteropolycyclic group, but embodiments of the present invention are not limited thereto.

In some embodiments, $R_{ET}$ in Formula 7 may be selected from a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a phenanthridinyl group, a phenanthrolinyl group, a benzophenanthrolinyl group, a benzimidazolyl group, a naphthoimidazolyl group, a triazinyl group, an imidazopyridinyl group, an imidazopyrimidinyl group, an imidazoquinolinyl group, and an imidazoisoquinolinyl group;

a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a phenanthridinyl group, a phenanthrolinyl group, a benzophenanthrolinyl group, a benzimidazolyl group, a naphthoimidazolyl group, a triazinyl group, an imidazopyridinyl group, an imidazopyrimidinyl group, an imidazoquinolinyl group, and imidazoisoquinolinyl group, each substituted with at least one selected from deuterium, a $C_1$-$C_{20}$ alkyl group, a phenyl group, a naphthyl group, a fluorenyl group, a carbazolyl group, a pyridinyl group, —$N(Q_{41})(Q_{42})$, and —$Si(Q_{43})(Q_{44})(Q_{45})$; and a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a phenanthridinyl group, a phenanthrolinyl group, a benzophenanthrolinyl group, a benzimidazolyl group, a naphthoimidazolyl group, a triazinyl group, an imidazopyridinyl group, an imidazopyrimidinyl group, an imidazoquinolinyl group, and an imidazoisoquinolinyl group, each substituted with at least one selected from a phenyl group, a naphthyl group, a fluorenyl group, a carbazolyl group and a pyridinyl group, each substituted with at least one selected from deuterium, a $C_1$-$C_{20}$ alkyl group, a phenyl group, a naphthyl group, a pyridinyl group, —$N(Q_{51})(Q_{52})$, and —$Si(Q_{53})(Q_{54})(Q_{55})$;

where $Q_{41}$ to $Q_{45}$ and $Q_{51}$ to $Q_{55}$ may be each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group, but embodiments of the present invention are not limited thereto.

According to some embodiments, $R_{ET}$ in Formula 7 may be selected from groups represented by Formulae 6-1 to 6-63 below, but is not limited thereto:

6-1

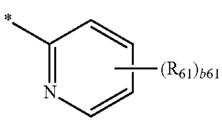

6-2

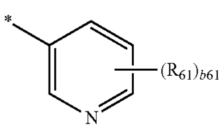

6-3

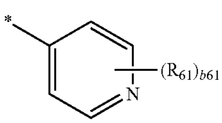

6-4

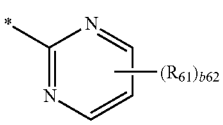

6-5

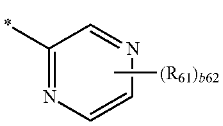

6-6

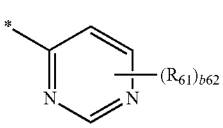

6-7

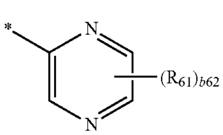

-continued 6-8

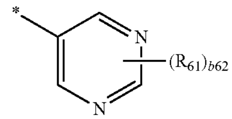

6-9

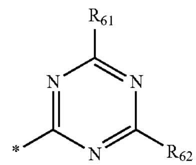

6-10

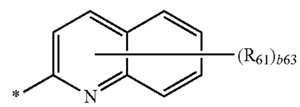

6-11

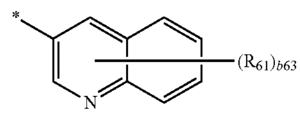

6-12

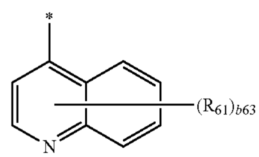

6-13

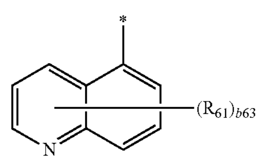

6-14

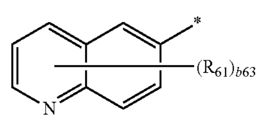

6-15

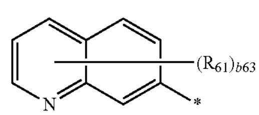

6-16

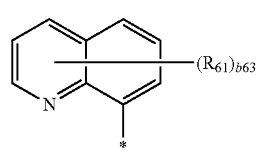

6-17

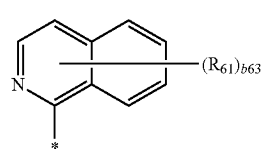

6-18

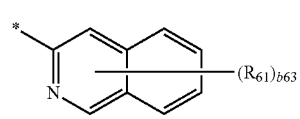

-continued
6-19
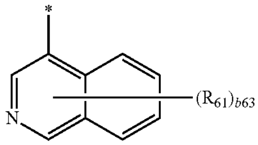
6-20
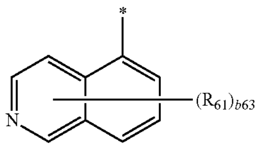
6-21
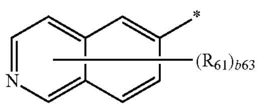
6-22
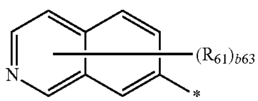
6-23
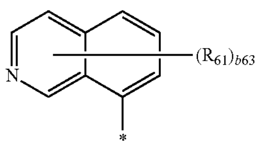
6-24
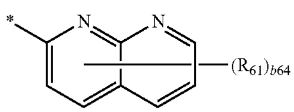
6-25
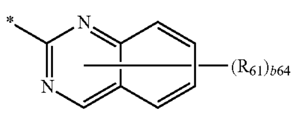
6-26
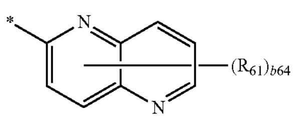
6-27
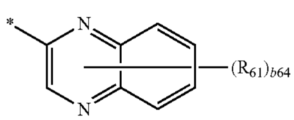
6-28
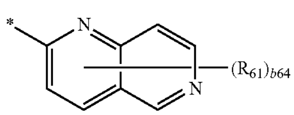
6-29
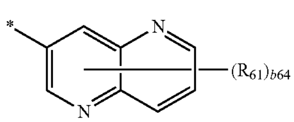
6-30
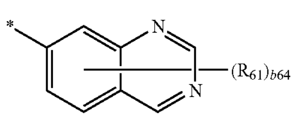
6-31
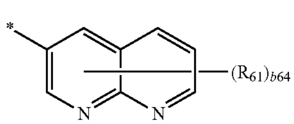
-continued
6-32
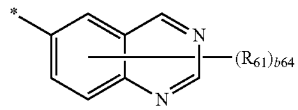
6-33
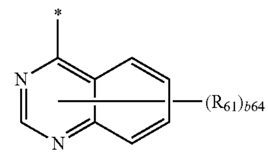
6-34
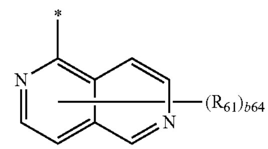
6-35
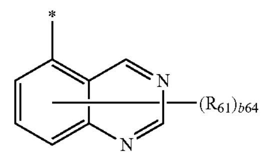
6-36
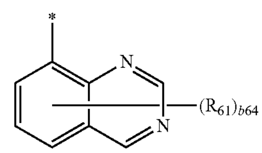
6-37
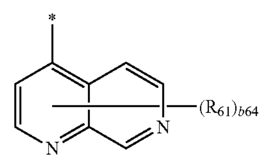
6-38
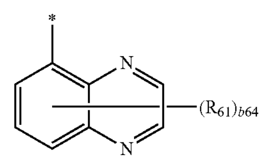
6-39
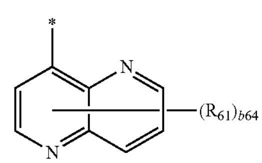
6-40
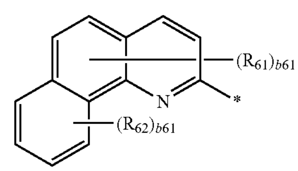
6-41
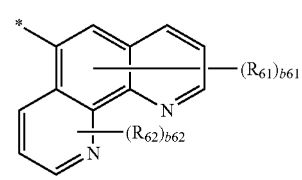

-continued
6-42
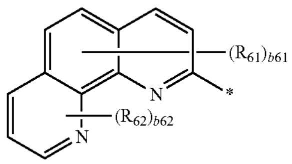
6-43
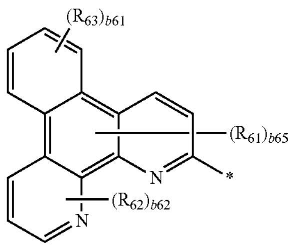
6-44
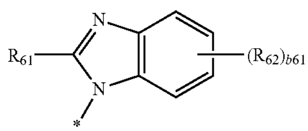
6-45
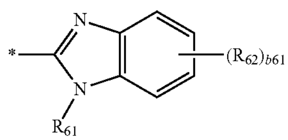
6-46
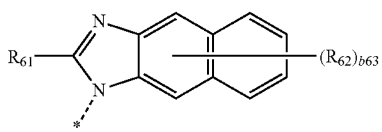
6-47
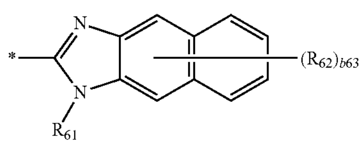
6-48
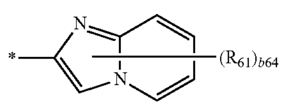
6-49
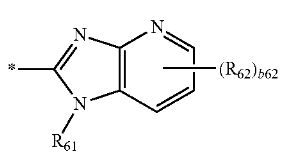
6-50
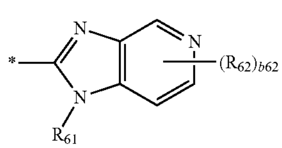
6-51
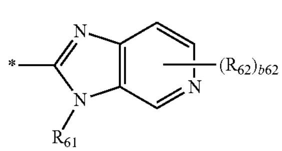
-continued
6-52
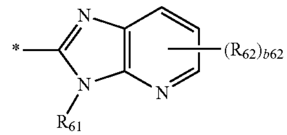
6-53
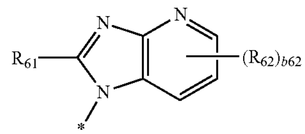
6-54
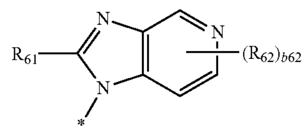
6-55
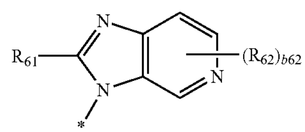
6-56
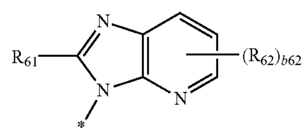
6-57
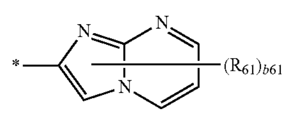
6-58
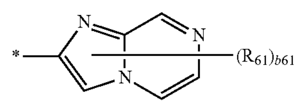
6-59
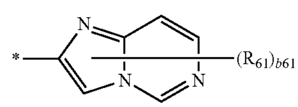
6-60
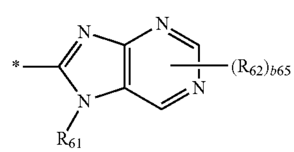
6-61
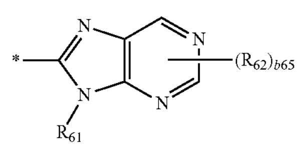
6-62
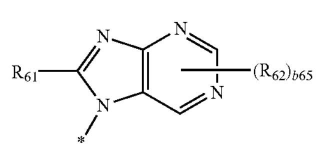

-continued 6-63

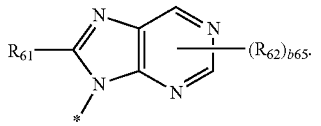

In Formulae 6-1 to 6-63, $R_{61}$ to $R_{63}$ may be each independently selected from:

deuterium, a $C_1$-$C_{20}$ alkyl group, a phenyl group, a naphthyl group, a fluorenyl group, a carbazolyl group, a pyridinyl group, —N($Q_{41}$)($Q_{42}$), and —Si($Q_{43}$)($Q_{44}$)($Q_{45}$); and a phenyl group, a naphthyl group, a fluorenyl group, a carbazolyl group, a pyridinyl group, each substituted with at least one selected from deuterium, a $C_1$-$C_{20}$ alkyl group, a phenyl group, a naphthyl group, a pyridinyl group, —N($Q_{51}$)($Q_{52}$), and —Si($Q_{53}$)($Q_{54}$)($Q_{55}$);

where $Q_{41}$ to $Q_{45}$ and $Q_{51}$ to $Q_{55}$ may be each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group;

b61 may be selected from 1, 2, 3, and 4; and b62 may be selected from 1, 2, and 3;

b63 may be selected from 1, 2, 3, 4, 5, and 6;

b64 may be selected from 1, 2, 3, 4, and 5;

b65 may be selected from 1 and 2; and

* indicates a binding site to a neighboring atom.

$R_{72}$ to $R_{80}$ in Formula 7 may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), and —B($Q_6$)($Q_7$);

at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted a monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$);

where $Q_1$ to $Q_7$, $Q_{11}$ to $Q_{17}$, $Q_{21}$ to $Q_{27}$ and $Q_{31}$ to $Q_{37}$ may be each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, $R_{72}$ to $R_{80}$ in Formula 7 may be each independently selected from:

hydrogen, a methyl group, an ethyl group, an n-propyl group, an n-butyl group, a phenyl group, a naphthyl group, an anthryl group, a pyrenyl group, a phenanthrenyl group, a fluorenyl group, a carbazolyl group, —N($Q_1$)($Q_2$), and —Si($Q_3$)($Q_4$)($Q_5$); and a phenyl group, a naphthyl group, an anthryl group, a pyrenyl group, a phenanthrenyl group, a fluorenyl group, and a carbazolyl group, each substituted with at least one selected from deuterium, —F, —Cl, —Br, —I, a cyano group, a nitro group, a methyl group, a phenyl group, and a naphthyl group, where $Q_1$ to $Q_5$ may be each independently selected from a $C_1$-$C_{60}$ alkyl group, a $C_6$-$C_{60}$ aryl group, a monovalent non-aromatic condensed polycyclic group, and a monovalent non-aromatic condensed heteropolycyclic group, but they are not limited thereto.

In some embodiments, $R_{72}$ to $R_{80}$ in Formula 7 may be each independently selected from hydrogen, a methyl group, a phenyl group, a naphthyl group, a carbazolyl group, —$N(Q_1)(Q_2)$, and —$Si(Q_3)(Q_4)(Q_5)$;

where $Q_1$ to $Q_5$ may be each independently selected from a methyl group, an ethyl group, a phenyl group, and a naphthyl group, but they are not limited thereto.

In some embodiments, $R_{72}$ to $R_{80}$ in Formula 7 may be each independently selected from a phenyl group and a naphthyl group, but are not limited thereto.

For example, the third compound may be represented by Formula 7-1 below, but is not limited thereto:

Formula 7-1

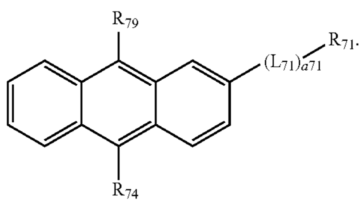

In Formula 7-1, descriptions of $L_{71}$, a71, $R_{71}$, $R_{74}$, and $R_{79}$ are the same as described above.

In some embodiments, the third compound may be selected from Compounds 701 to 745 below, but is not limited thereto:

701

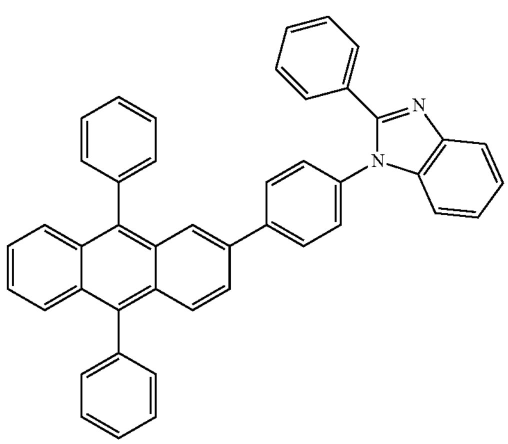

-continued

702

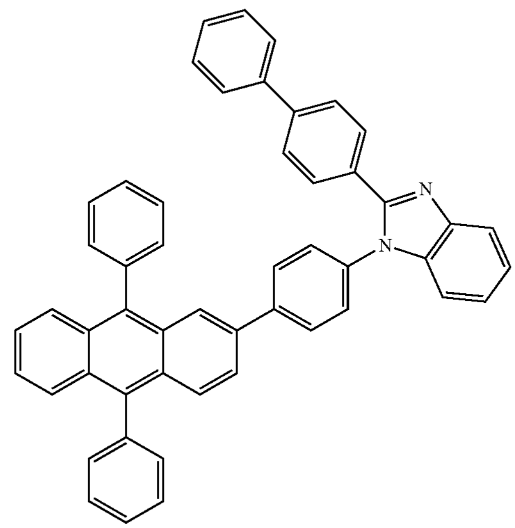

703

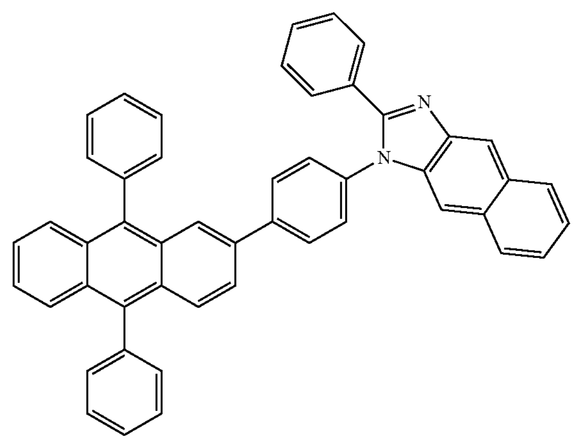

704

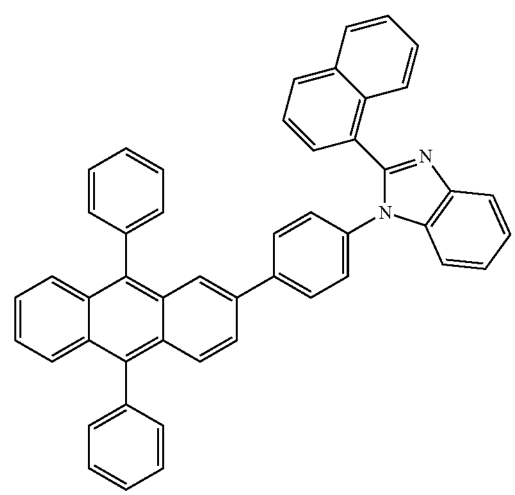

-continued
705
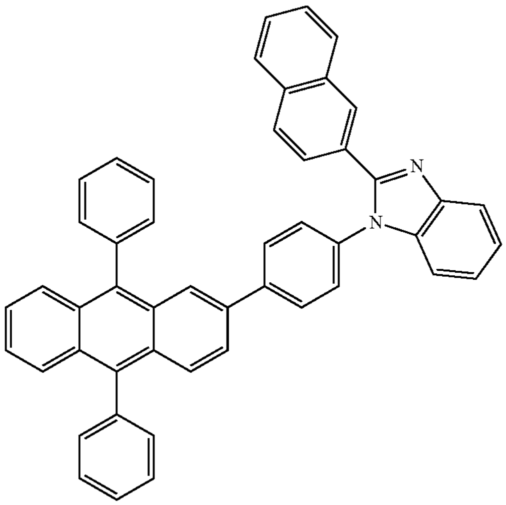
706
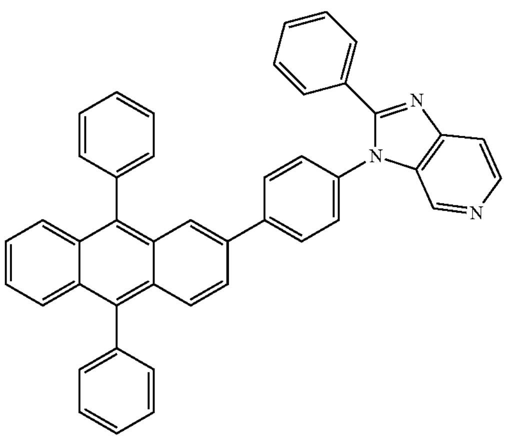
707
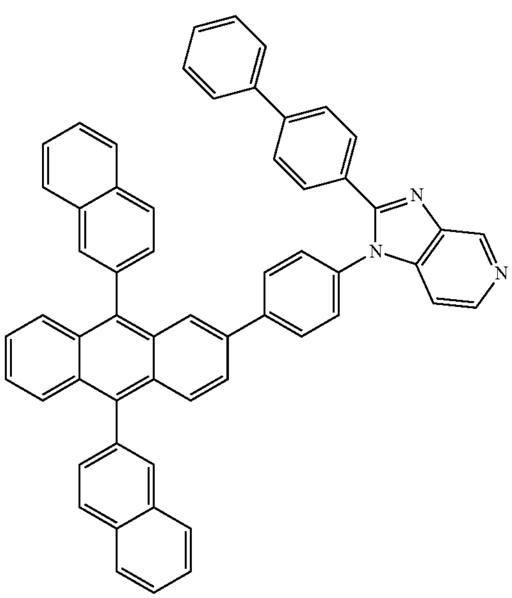
-continued
708
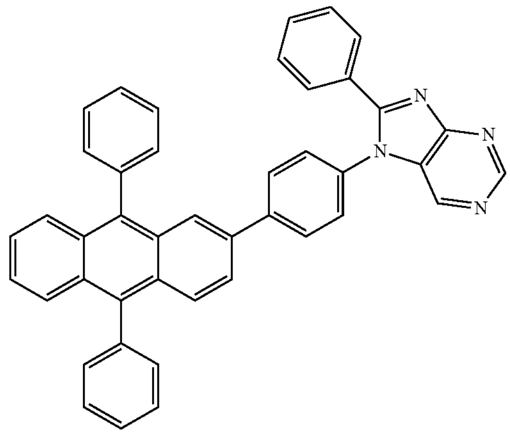
709
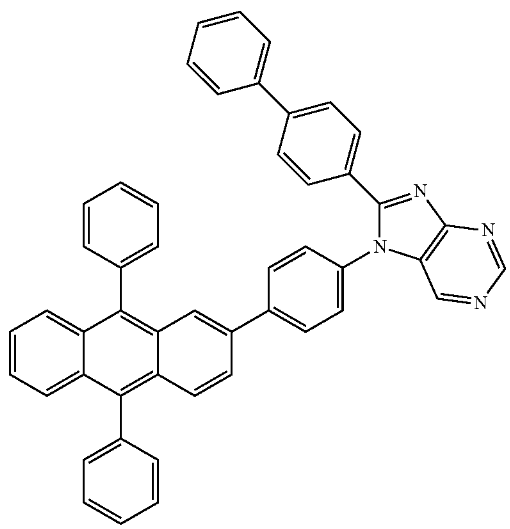
710
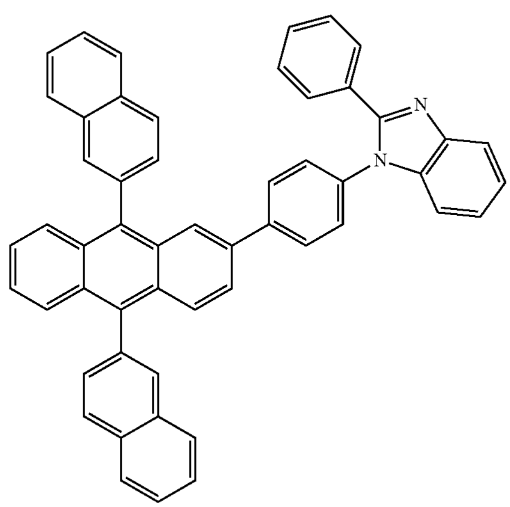

-continued
711
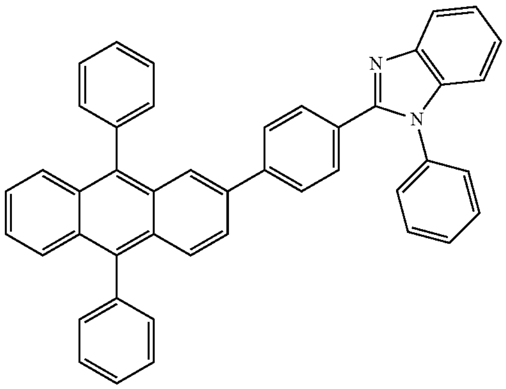
712
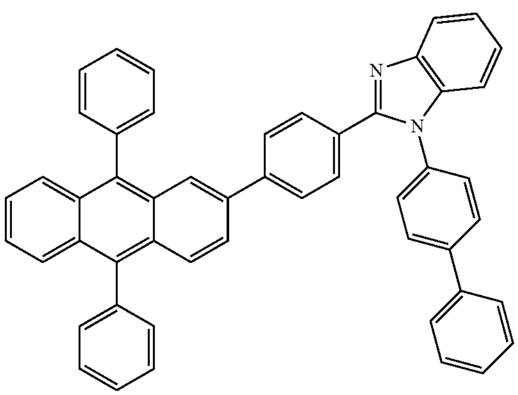
713
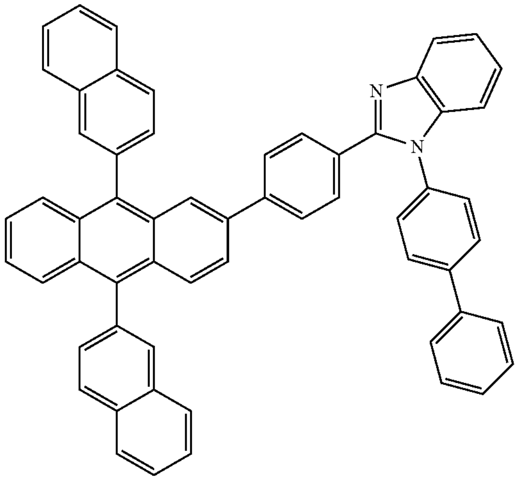
-continued
714
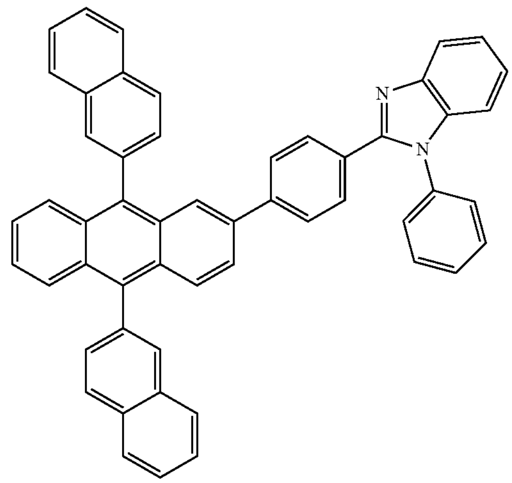
715
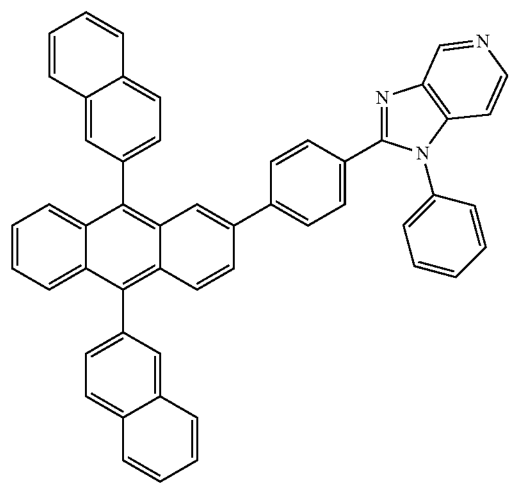
716
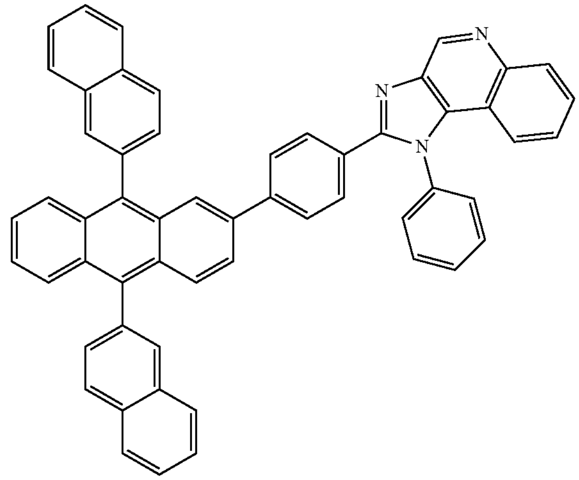

-continued
717
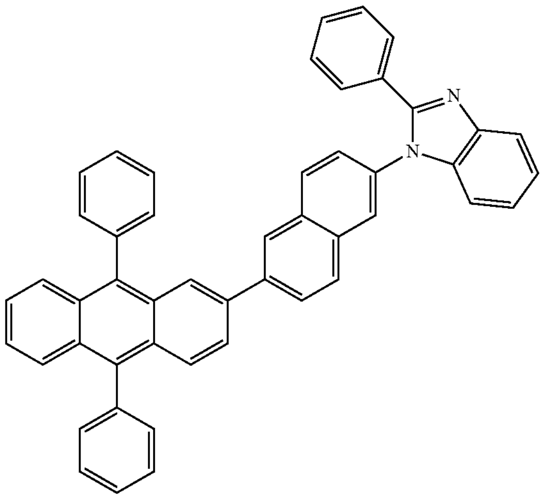
718
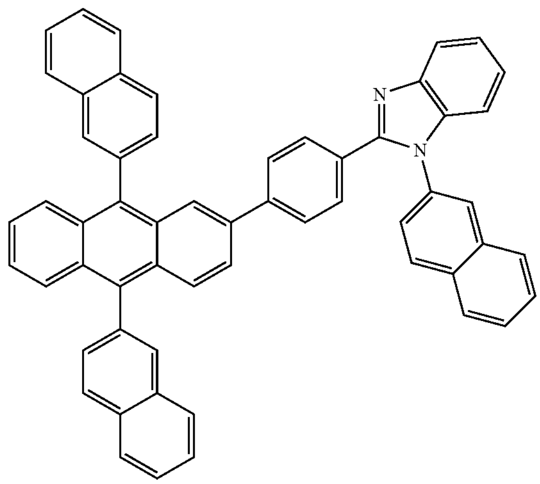
719
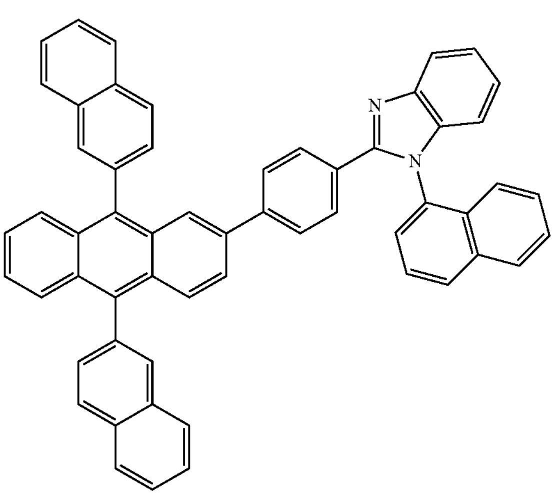
-continued
720
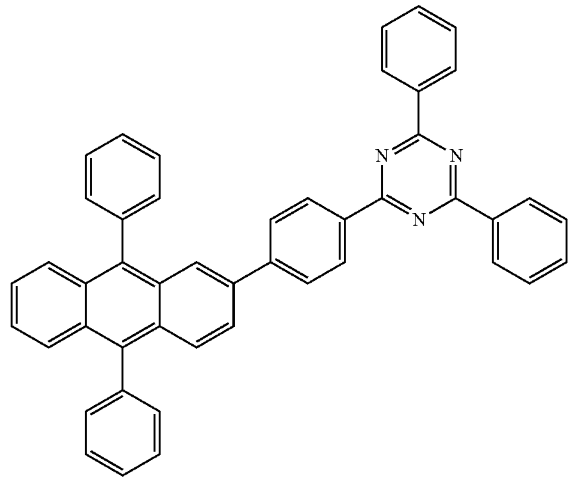
721
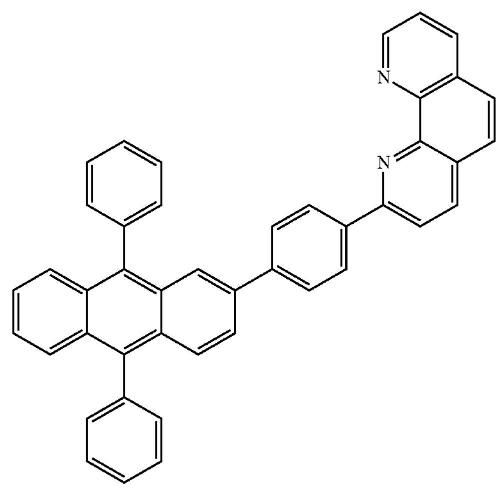
722
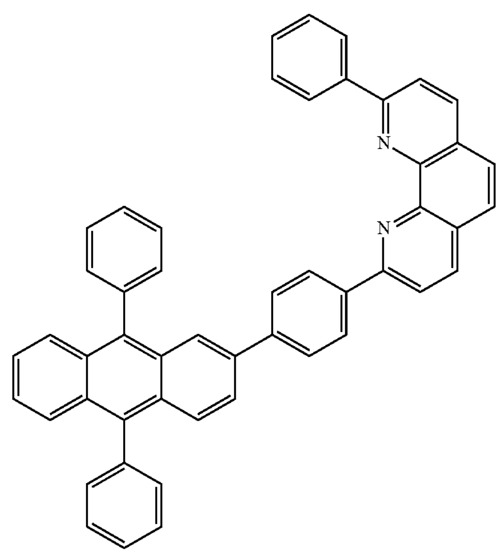

-continued
723
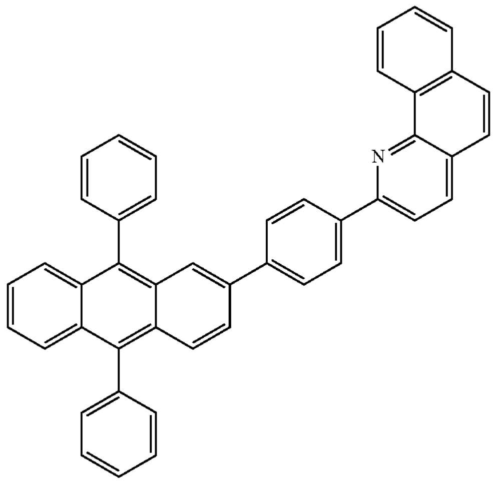
724
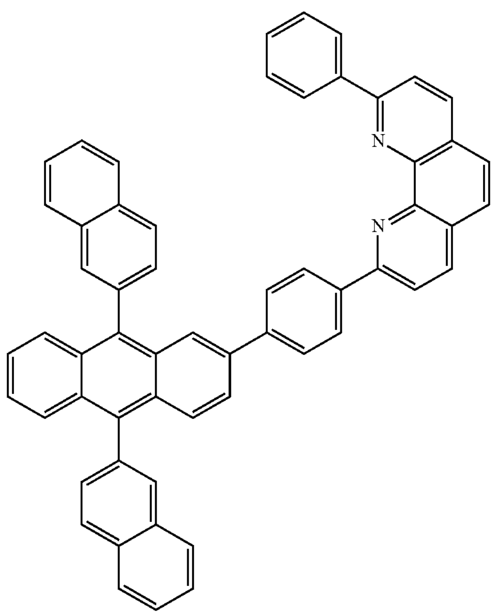
725
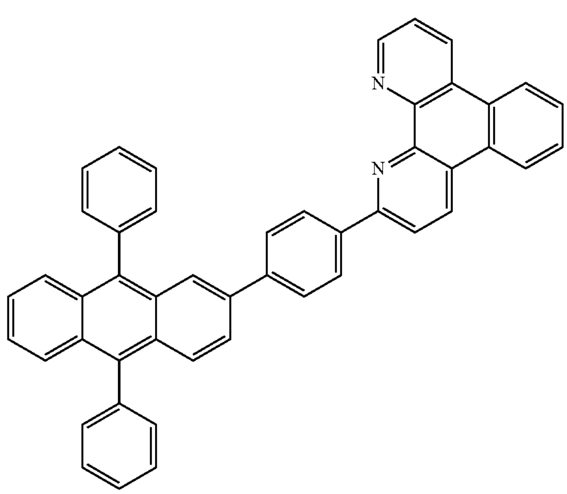
-continued
726
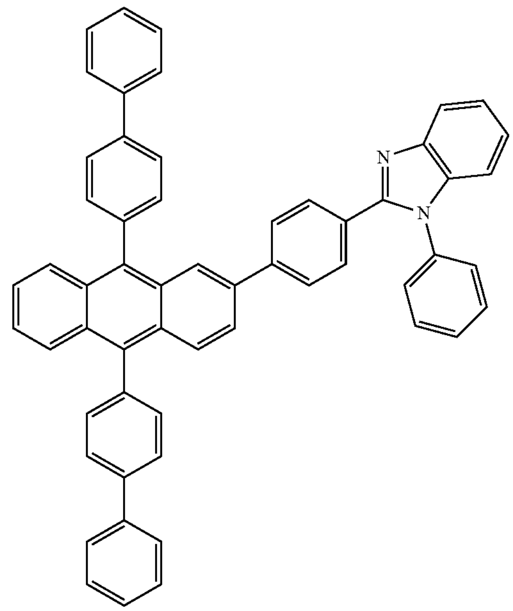
727
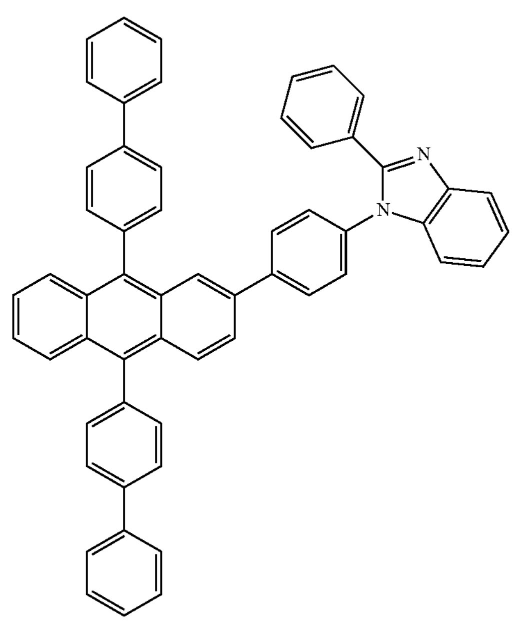

-continued
728
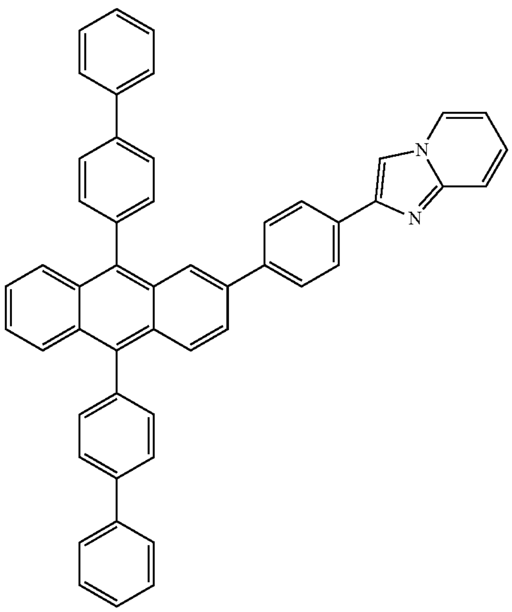
729
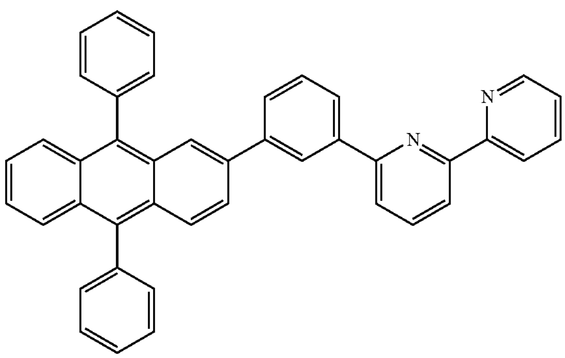
730
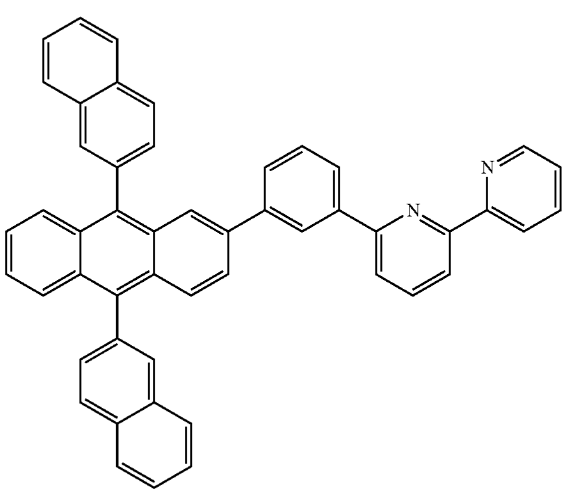
-continued
731
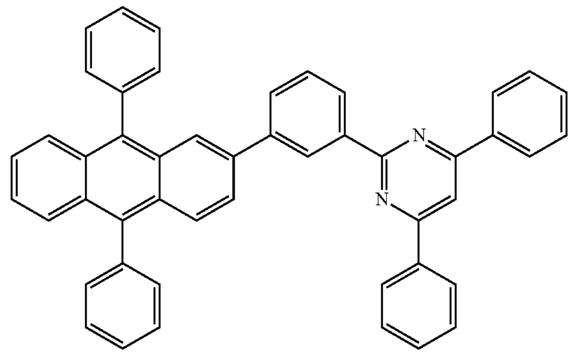
732
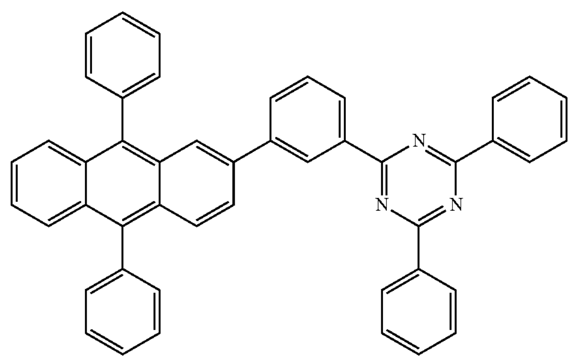
733
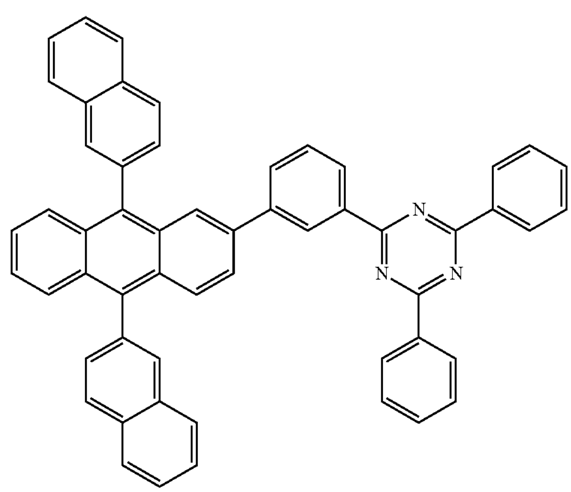

-continued
734
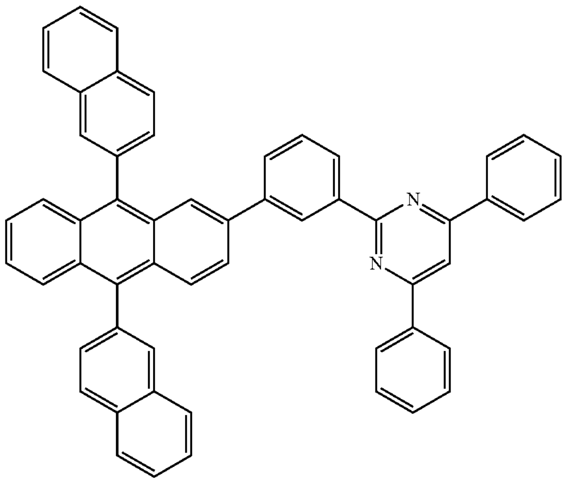
735
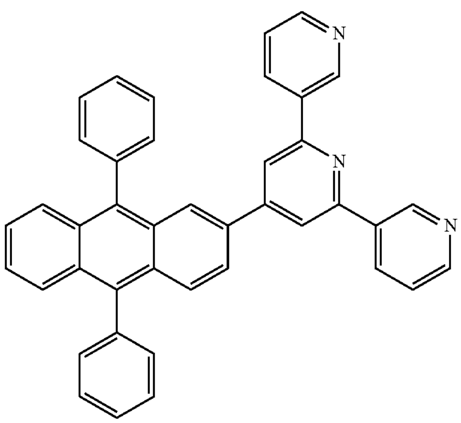
736
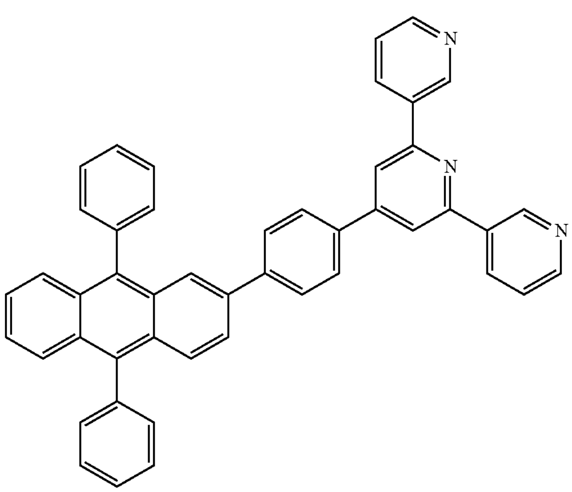
-continued
737
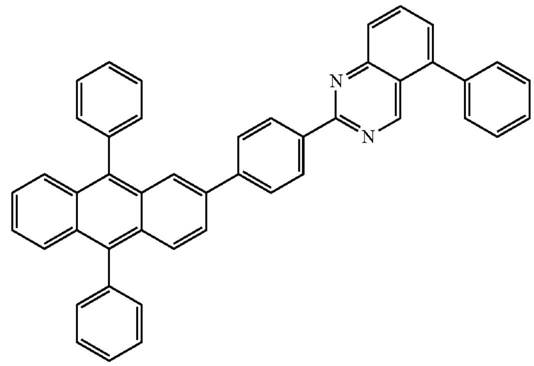
738
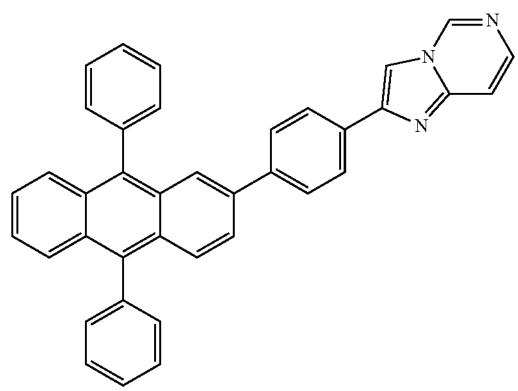
739
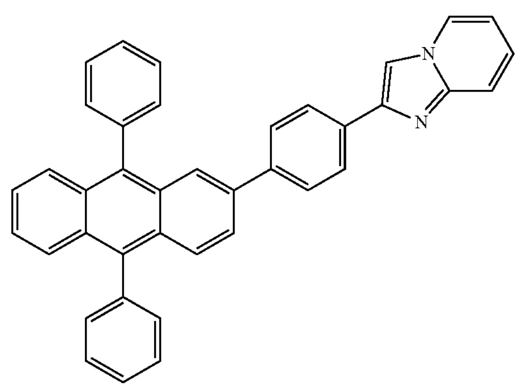

-continued
740
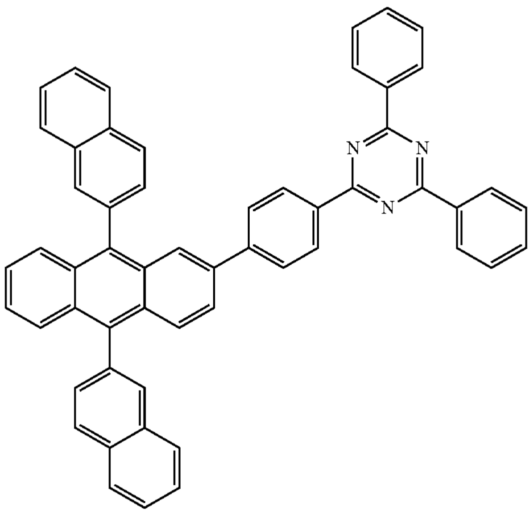
741
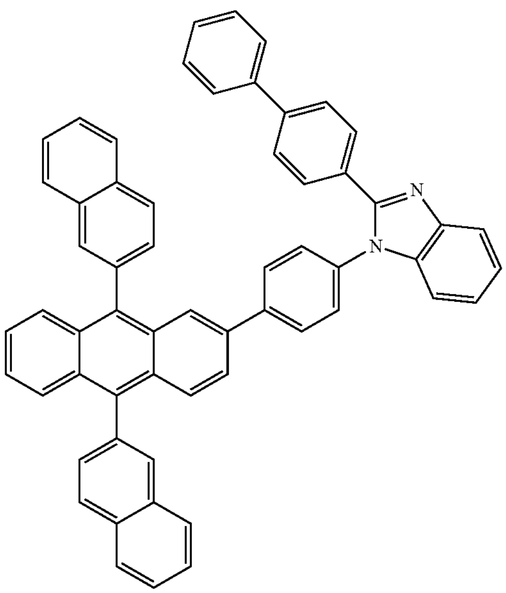
742
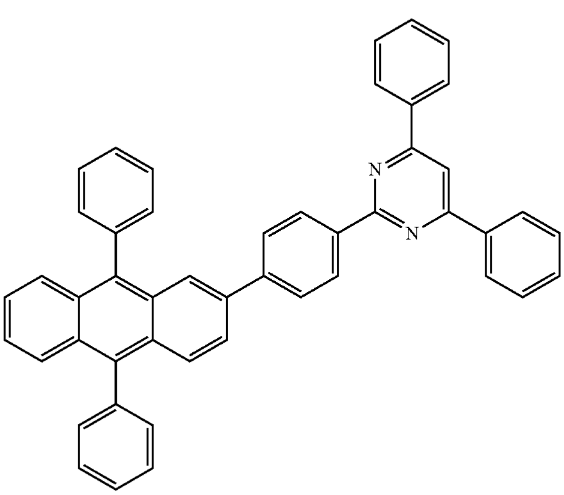
-continued
743
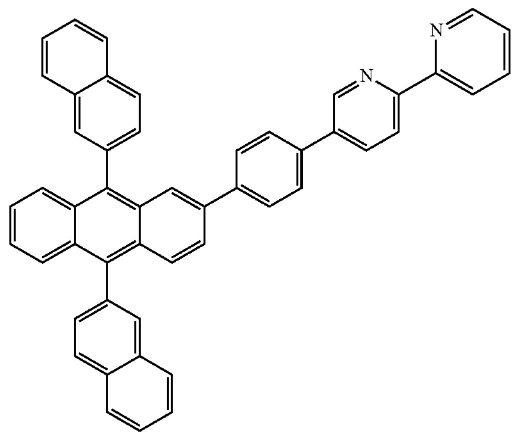
744
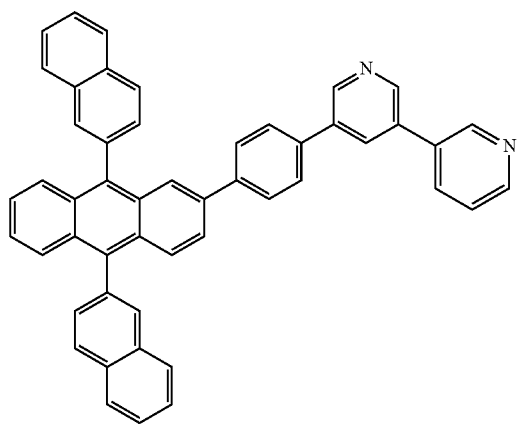
745
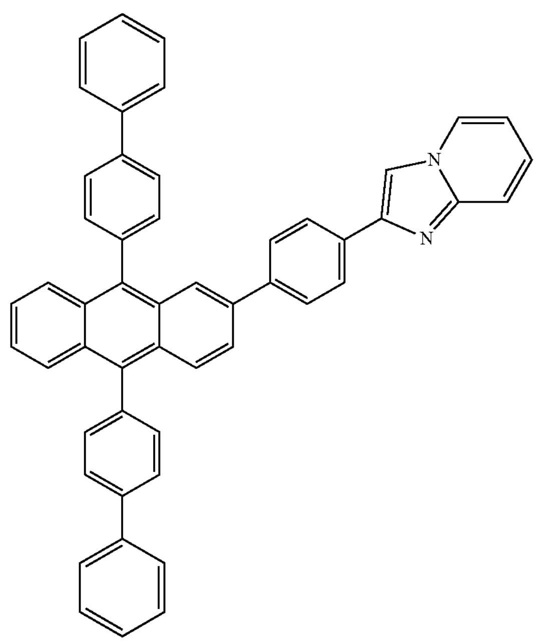
The third compound may have a HOMO energy level of about 5.8 eV to about 6.3 eV, and a LUMO energy level of about 2.7 eV to about 3.2 eV.

The third compound may effectively provide and transport electrons into an emission layer, and substantially block holes from leaking from the emission layer. That is, the third compound may have excellent electron transport characteristics and hole blocking characteristics.

Accordingly, an organic light-emitting device including the third compound may have a low driving voltage and high efficiency.

In the third compound, an electron transport group may be substituted to a second position on the anthracene moiety. Compared to a compound in which an electron transport group is substituted to a ninth position of the anthracene moiety, a compound in which an electron transport group is substituted to the second position of the anthracene moiety may have excellent electron transport characteristics and hole blocking characteristics. This is further illustrated in Examples and Comparative Examples described below.

A thickness of the electron transport layer may be in a range of about 100 Å to about 1,000 Å, for example, about 150 Å to about 500 Å. When the thickness of the electron transport layer is within any of the ranges described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) and/or ET-D2.

ET-D1

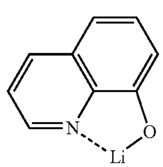

ET-D2

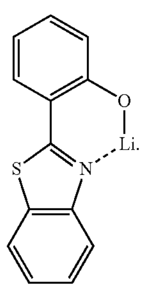

The electron transport region may include an electron injection layer that allows electrons to be easily provided from the second electrode 190.

The electron injection layer may be formed on the electron transport layer by using one or more suitable methods, such as vacuum deposition, spin coating casting, a LB method, ink-jet printing, laser-printing, and/or laser-induced thermal imaging. When the electron injection layer is formed by vacuum deposition and/or spin coating, deposition and coating conditions for the electron injection layer may be the same as (or similar to) those for the hole injection layer.

The electron injection layer may include at least one selected from LiF, NaCl, CsF, $Li_2O$, BaO, and LiQ.

A thickness of the electron injection layer may be in a range of about 1 Å to about 100 Å, for example, about 3 Å to about 90 Å. When the thickness of the electron injection layer is within any of the ranges described above, the electron injection layer may have satisfactory electron injection characteristics without a substantial increase in driving voltage.

The second electrode 190 may be positioned on the electron transport region described above. The second electrode 190 may be a cathode that is an electron injection electrode, and in this regard, a material for forming the second electrode may be a material having a low work function, for example, a metal, an alloy, an electrically conductive compound, or a mixture thereof. Non-limiting examples of the material for forming the second electrode 190 include lithium (Li), magnesium (Mg), aluminum (Al), aluminum-lithium (Al—Li), calcium (Ca), magnesium-indium (Mg—In), and magnesium-silver (Mg—Ag). In some embodiments, the material for forming the second electrode 190 may be ITO or IZO. The second electrode 190 may be a reflective electrode or a transmissive electrode.

The organic light-emitting device according to embodiments of the present invention may be included in a flat panel display device including a thin film transistor. The thin film transistor may include a gate electrode, source and drain electrodes, a gate insulating film, and an active layer, and one of the source and drain electrodes may electrically contact the first electrode 110 of the organic light-emitting device 10. The active layer may include crystalline silicon, amorphous silicon, organic semiconductor, oxide semiconductor, and/or the like, but embodiments of the present invention are not limited thereto.

A $C_1$-$C_{60}$ alkyl group used herein refers to a linear or branched aliphatic hydrocarbon monovalent group having 1 to 60 carbon atoms in the main chain, and non-limiting examples thereof include a methyl group, an ethyl group, a propyl group, an isobutyl group, a sec-butyl group, a ter-butyl group, a pentyl group, an iso-amyl group, and a hexyl group. A $C_1$-$C_{60}$ alkylene group used herein refers to a divalent group having the same structure as the $C_1$-$C_{60}$ alkyl group.

A $C_1$-$C_{60}$ alkoxy group used herein refers to a monovalent group represented by —$OA_{101}$ (where $A_{101}$ is the $C_1$-$C_{60}$ alkyl group), and non-limiting examples thereof include a methoxy group, an ethoxy group, and an isopropyloxy group.

A $C_2$-$C_{60}$ alkenyl group used herein refers to a hydrocarbon group having at least one carbon-carbon double bond at one or more positions along a carbon chain of the $C_2$-$C_{60}$ alkyl group (for example, in the middle or at either terminal end of the $C_2$-$C_{60}$ alkyl group), and non-limiting examples thereof include an ethenyl group, a propenyl group, and a butenyl group. A $C_2$-$C_{60}$ alkenylene group used herein refers to a divalent group having the same structure as the $C_2$-$C_{60}$ alkenyl group.

A $C_2$-$C_{60}$ alkynyl group used herein refers to a hydrocarbon group having at least one carbon-carbon triple bond at one or more positions along a carbon chain of the $C_2$-$C_{60}$ alkyl group (for example, in the middle or at either terminal end of the $C_2$-$C_{60}$ alkyl group), and non-limiting examples thereof include an ethynyl group and a propynyl group. A $C_2$-$C_{60}$ alkynylene group used herein refers to a divalent group having the same structure as the $C_2$-$C_{60}$ alkynyl group.

A $C_3$-$C_{10}$ cycloalkyl group used herein refers to a monovalent hydrocarbon monocyclic group having 3 to 10 carbon atoms as ring-forming atoms, and non-limiting examples thereof include a cyclopropyl group, a cyclobutyl group, a cyclopentyl group, a cyclohexyl group, and a cycloheptyl group. A $C_3$-$C_{10}$ cycloalkylene group used herein refers to a divalent group having the same structure as the $C_3$-$C_{10}$ cycloalkyl group.

A $C_1$-$C_{10}$ heterocycloalkyl group used herein refers to a monovalent monocyclic group having at least one hetero atom selected from N, O, P, and S as a ring-forming atom and 1 to 10 carbon atoms as the remaining ring-forming atoms, and non-limiting examples thereof include a tetrahydrofuranyl group and a tetrahydrothiophenyl group. A $C_1$-$C_{10}$ heterocycloalkylene group used herein refers to a divalent group having the same structure as the $C_1$-$C_{10}$ heterocycloalkyl group.

A $C_3$-$C_{10}$ cycloalkenyl group used herein refers to a monovalent monocyclic group that has 3 to 10 carbon atoms as ring-forming atoms and at least one double bond in the ring thereof and does not have aromaticity, and non-limiting examples thereof include a cyclopentenyl group, a cyclohexenyl group, and a cycloheptenyl group. A $C_3$-$C_{10}$ cycloalkenylene group used herein refers to a divalent group having the same structure as the $C_3$-$C_{10}$ cycloalkenyl group.

A $C_1$-$C_{10}$ heterocycloalkenyl group used herein refers to a monovalent monocyclic group that has at least one hetero atom selected from N, O, P, and S as a ring-forming atom, 1 to 10 carbon atoms as the remaining ring-forming atoms, and at least one double bond in its ring. Non-limiting examples of the $C_1$-$C_{10}$ heterocycloalkenyl group include a 2,3-hydrofuranyl group and a 2,3-hydrothiophenyl group. A $C_1$-$C_{10}$ heterocycloalkenylene group used herein refers to a divalent group having the same structure as the $C_1$-$C_{10}$ heterocycloalkenyl group.

A $C_6$-$C_{60}$ aryl group used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and/or the $C_6$-$C_{60}$ arylene group include two or more rings, the rings may be fused to each other.

A $C_1$-$C_{60}$ heteroaryl group used herein refers to a monovalent group having a carbocyclic aromatic system that includes at least one hetero atom selected from N, O, P, and S as a ring-forming atom, and 1 to 60 carbon atoms as the remaining ring-forming atoms. A $C_1$-$C_{60}$ heteroarylene group used herein refers to a divalent group having a carbocyclic aromatic system that includes at least one hetero atom selected from N, O, P, and S as a ring-forming atom, and 1 to 60 carbon atoms as the remaining ring-forming atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and/or the $C_1$-$C_{60}$ heteroarylene group include two or more rings, the rings may be fused to each other.

A $C_6$-$C_{60}$ aryloxy group used herein refers to a group represented by —$OA_{102}$ (where $A_{102}$ is the $C_6$-$C_{60}$ aryl group), and a $C_6$-$C_{60}$ arylthio group refers to a group represented by —$SA_{103}$ (where $A_{103}$ is the $C_6$-$C_{60}$ aryl group).

A monovalent non-aromatic condensed polycyclic group used herein refers to a monovalent group that has two or more rings condensed to each other, only carbon atoms as ring-forming atoms (for example, 8 to 60 carbon atoms), and does not have overall aromaticity. A non-limiting example of the monovalent non-aromatic condensed polycyclic group is a fluorenyl group. A divalent non-aromatic condensed polycyclic group used herein refers to a divalent group having the same structure as the monovalent non-aromatic condensed polycyclic group.

A monovalent non-aromatic condensed heteropolycyclic group used herein refers to a monovalent group that has two or more rings condensed to each other, has at least one heteroatom selected from N, O P, and S as a ring-forming atom, and carbon atoms as the remaining ring-forming atoms (for example, 2 to 60 carbon atoms), and does not have overall aromaticity. A non-limiting example of the monovalent non-aromatic condensed heteropolycyclic group is a carbazolyl group. A divalent non-aromatic condensed heteropolycyclic group used herein refers to a divalent group having the same structure as the monovalent non-aromatic condensed heteropolycyclic group.

The term "Ph" used herein refers to phenyl group, the term "Me" used herein refers to methyl group, the term "Et" used herein refers to ethyl group, and the term "ter-Bu" or "But" used herein refers to tert-butyl.

Hereinafter, an organic light-emitting device according to one or more embodiments of the present invention is described in more detail with reference to Examples. However, these Examples are provided for illustrative purposes only, and should not in any sense be interpreted as limiting the scope of the present disclosure.

EXAMPLES

Example 1

An anode was prepared by cutting a glass substrate with ITO/Ag/ITO having a thickness of 70 Å/1000 Å/70 Å deposited thereon to a size of 50 mm×50 mm×0.4 mm, ultrasonically cleaning the resulting glass substrate by using isopropyl alcohol and pure water, each for 10 minutes, and then irradiating UV light for 10 minutes thereto and exposing to ozone to clean. Then, the obtained anode was loaded into a vacuum deposition apparatus.

HT13 was deposited on the anode to form a hole injection layer having a thickness of 700 Å, and then, HT3 was deposited on the hole injection layer to form a hole transport layer having a thickness of 800 Å, and Compound 167B (first compound), 424B (second compound), and Compound PD82 (dopant) were co-deposited on the hole transport layer at a weight ratio of 50:50:10 to form an emission layer having a thickness of 400 Å.

Thereafter, Compound 710 and LiQ were co-deposited on the emission layer at a weight ratio of 5:5 to form an electron transport layer having a thickness of 300 Å, and then, LiQ was deposited on the electron transport layer to form an electron injection layer having a thickness of 10 Å, and Mg and Ag were co-deposited on the electron injection layer at a weight ratio of 90:10 to form a cathode having a thickness of 120 Å, thereby completing manufacture of an organic light-emitting device.

Examples 2 to 8 and Comparative Examples 1 and 6

Organic light-emitting devices were manufactured in the same (or substantially the same) manner as in Example 1, except that in forming an emission layer, compounds listed in Table 1 were respectively used.

TABLE 1

| | First compound | Second compound | Third compound | Dopant | Weight ratio (first compound:second compound:dopant) |
|---|---|---|---|---|---|
| Example 1 | 167B | 424B | 710 | PD82 | 50:50:10 |
| Example 2 | 167B | 424B | 739 | PD82 | 50:50:10 |
| Example 3 | 167B | 424B | 721 | PD82 | 50:50:10 |
| Example 4 | 167B | 424B | 740 | PD82 | 50:50:10 |
| Example 5 | 161A | 375A | 710 | PD82 | 50:50:10 |
| Example 6 | 161A | 375A | 739 | PD82 | 50:50:10 |
| Example 7 | 161A | 375A | 721 | PD82 | 50:50:10 |
| Example 8 | 161A | 375A | 740 | PD82 | 50:50:10 |
| Comparative Example 1 | 167B | 424B | Alq3 | PD82 | 50:50:10 |
| Comparative Example 2 | 161A | 375A | Alq3 | PD82 | 50:50:10 |
| Comparative Example 3 | A | D | H | PD82 | 50:50:10 |
| Comparative Example 4 | B | E | H | PD82 | 50:50:10 |
| Comparative Example 5 | C | F | I | PD82 | 50:50:10 |
| Comparative Example 6 | C | G | I | PD82 | 50:50:10 |

A

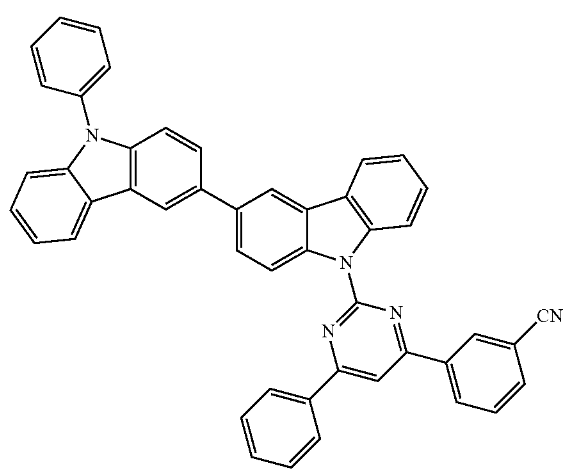

B

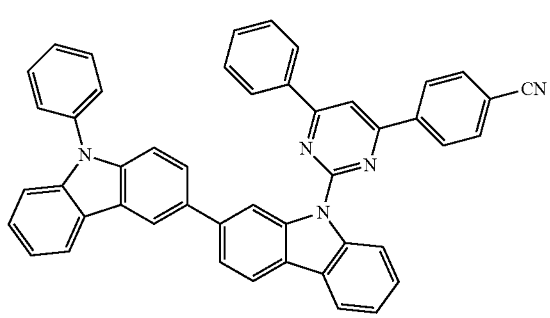

-continued

C

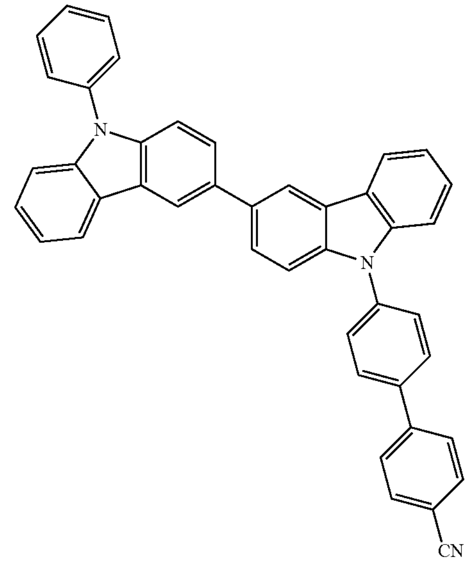

D

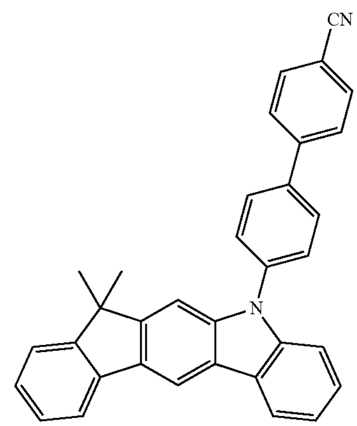

E

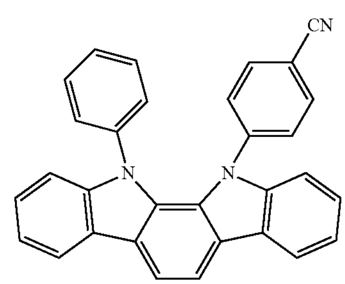

F

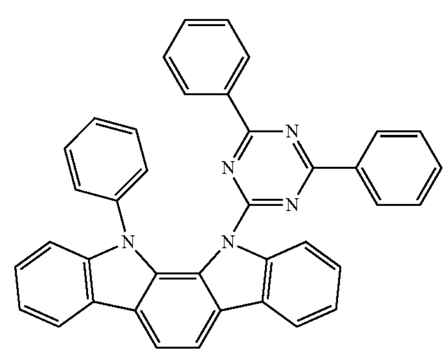

-continued

G

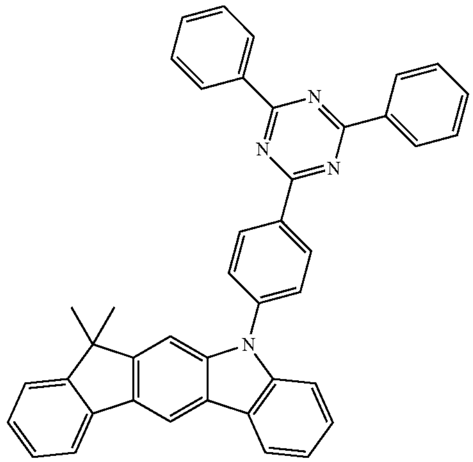

H

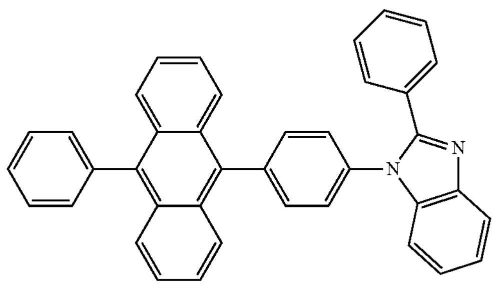

-continued

I

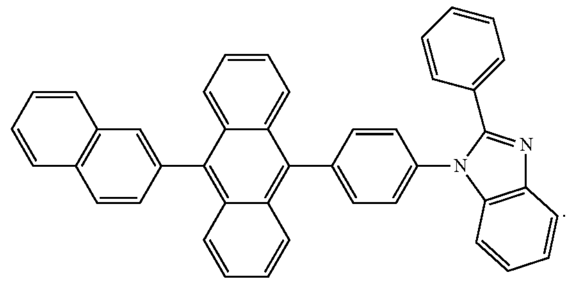

Evaluation Example 1

Driving voltage, current density, luminance, efficiency, color purity, efficiency, and lifespan of the organic light-emitting devices of Examples 1 to 8 and Comparative Examples 1 to 6 were evaluated by using Keithley 2400 (Keithley Instruments Inc.), Minolta Cs-1000A (Konica Minolta, inc.) and PR650 Spectroscan Source Measurement Unit (a product of Photo Research, Inc.). $T_{97}$ lifespan indicates an amount of time that elapsed when 100% of the initial luminance of 9000 cd/m$^2$ was reduced to 97%. Results are shown in Table 2.

TABLE 2

| | First compound | Second compound | Third compound | Dopant | Driving voltage (V) | Current density (mA/cm$^2$) | Efficiency (cd/A) | $T_{97}$ (time) |
|---|---|---|---|---|---|---|---|---|
| Example 1 | 167B | 424B | 710 | PD82 | 4.3 | 10.0 | 88.1 | 165 |
| Example 2 | 167B | 424B | 739 | PD82 | 4.3 | 10.0 | 89.3 | 147 |
| Example 3 | 167B | 424B | 721 | PD82 | 4.4 | 10.0 | 86.1 | 145 |
| Example 4 | 167B | 424B | 740 | PD82 | 4.2 | 10.0 | 91.7 | 153 |
| Example 5 | 161A | 375A | 710 | PD82 | 4.3 | 10.0 | 86.8 | 156 |
| Example 6 | 161A | 375A | 739 | PD82 | 4.3 | 10.0 | 87.8 | 167 |
| Example 7 | 161A | 375A | 721 | PD82 | 4.4 | 10.0 | 85.6 | 137 |
| Example 8 | 161A | 375A | 740 | PD82 | 4.2 | 10.0 | 88.4 | 143 |
| Comparative Example 1 | 167B | 424B | Alq3 | PD82 | 5.2 | 10.0 | 81.3 | 85 |
| Comparative Example 2 | 161A | 375A | Alq3 | PD82 | 5.0 | 10.0 | 79.6 | 78 |
| Comparative Example 3 | A | D | H | PD82 | 5.6 | 10.0 | 65.4 | 20 |
| Comparative Example 4 | B | E | H | PD82 | 5.8 | 10.0 | 61.2 | 15 |
| Comparative Example 5 | C | F | I | PD82 | 5.2 | 10.0 | 58.5 | 27 |
| Comparative Example 6 | C | G | I | PD82 | 5.4 | 10.0 | 60.5 | 22 |

As illustrated in Table 2, the organic light-emitting devices of Examples 1 to 8 had significantly better characteristics than the organic light-emitting devices of Comparative Examples 1 to 6.

Organic light-emitting devices according to embodiments of the present invention may have low driving voltage, high efficiency, and long lifespan characteristics.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the drawing, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:

a first electrode; a second electrode; an organic layer between the first electrode and the second electrode, the organic layer comprising an emission layer, and an electron transport region between the emission layer and the second electrode, wherein the emission layer comprises a first compound represented by Formula 1 and a second compound represented by any one of Formulae 2-1 to 2-5; and wherein the electron transport region comprises a third compound represented by Formula 7:

Formula 1

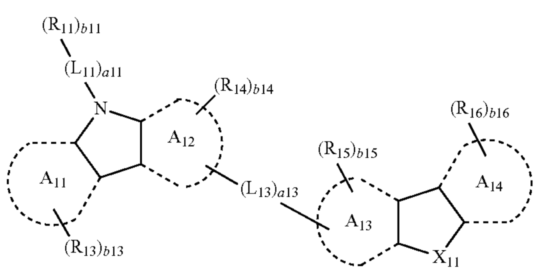

Formula 2-1

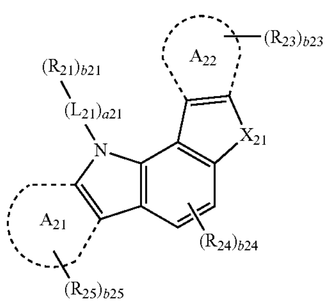

Formula 2-2

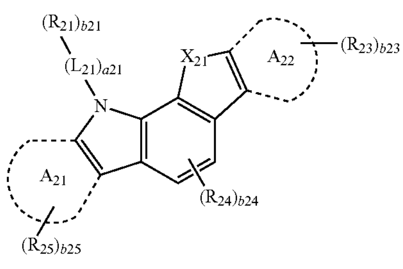

-continued

Formula 2-3

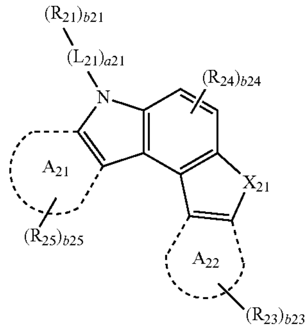

Formula 2-4

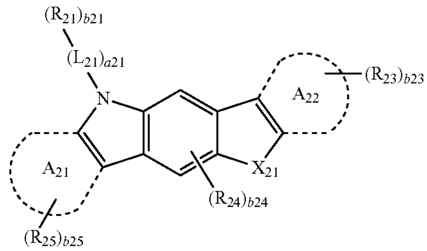

Formula 2-5

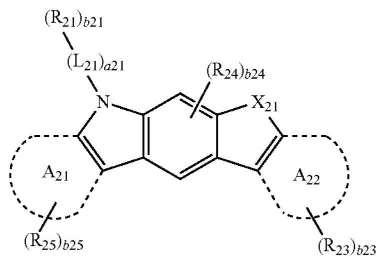

Formula 7

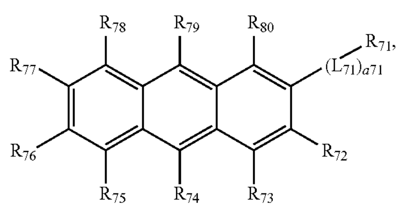

wherein in Formulae 1, 2-1 to 2-5, and 7, $A_{11}$, $A_{12}$, $A_{13}$, $A_{14}$, $A_{21}$, and $A_{22}$ are each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, and a cinnoline;

at least one of $A_{21}$ and $A_{22}$ is each independently selected from a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, and a cinnoline;

$X_{11}$ is $N[(L_{12})_{a12}\text{-}(R_{12})_{b12}]$;

$X_{21}$ is selected from $N[(L_{22})_{a22}\text{-}(R_{22})_{b22}]$ and $C[(L_{22})_{a22}\text{-}(R_{22})_{b22}][R_{26}]$;

$L_{11}$ to $L_{13}$, and $L_{71}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

$L_{21}$ and $L_{22}$ are each independently selected from groups represented by Formulae 3-1 to 3-19:

3-1

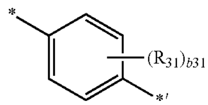

3-2

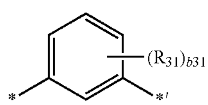

3-3

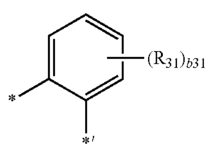

3-4

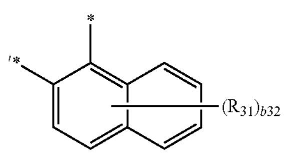

3-5

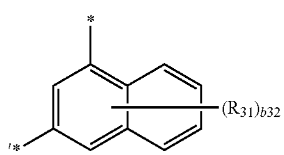

3-6

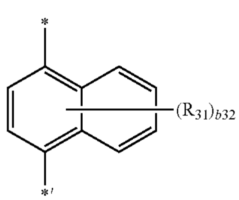

3-7

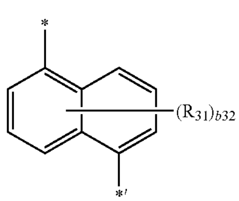

3-8

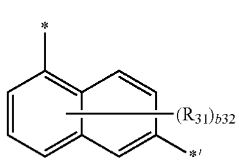

-continued 3-9

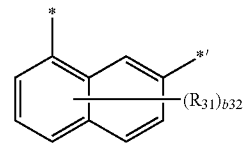

3-10

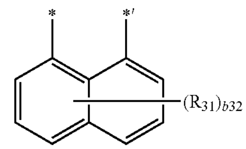

3-11

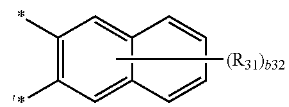

3-12

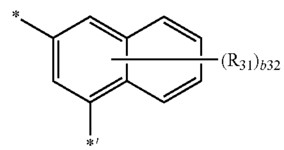

3-13

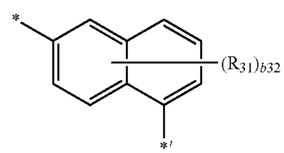

3-14

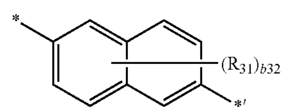

3-15

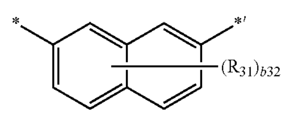

3-16

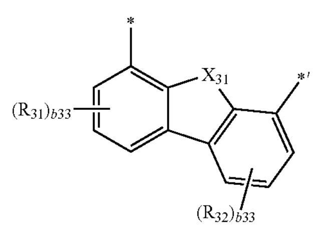

3-17

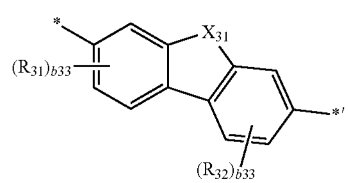

3-18

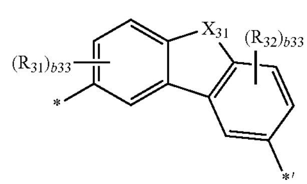

-continued 3-19

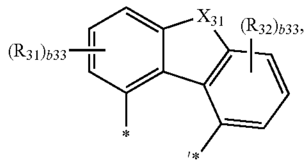

wherein in Formulae 3-1 to 3-19, $X_{31}$ is selected from O, S, and $C(R_{33})(R_{34})$;

$R_{31}$ to $R_{34}$ are each independently selected from hydrogen, deuterium, —F, —Cl, —Br, —I, a cyano group, a nitro group, a methyl group, an ethyl group, an n-propyl group, an iso-propyl group, an n-butyl group, iso-butyl group, a sec-butyl group, a tert-butyl group, a phenyl group, and a naphthyl group;

b31 is selected from 1, 2, 3, and 4;

b32 is selected from 1, 2, 3, 4, 5, and 6;

b33 is selected from 1, 2, and 3; and

* and *' each indicate a binding site to a neighboring atom;

a11 to a13, a21, a22, and a71 are each independently selected from 0, 1, 2, 3, 4, and 5;

$R_{11}$ and $R_{12}$ are each independently selected from $R_{HT}$ and $R_{ET}$, and at least one selected from $R_{11}$ and $R_{12}$ is $R_{ET}$;

$R_{21}$ and $R_{22}$ are each independently $R_{HT}$, provided that when $X_{21}$ is $N[(L_{22})_{a22}$-$(R_{22})_{b22}]$, $R_{21}$ and $R_{22}$ are each independently not a substituted or unsubstituted furanyl group, carbazolyl group, benzofuranyl group, benzothiophenyl group, dibenzofuranyl group, dibenzothiophenyl group, benzocarbazolyl group, dibenzocarbazolyl group, thianthrenyl group, phenoxathinyl group, or dibenzodioxinyl group, and when $X_{21}$ is $C[(L_{22})_{a22}$-$(R_{22})_{b22}][R_{26}]$, $R_{21}$ is not a substituted or unsubstituted phenyl group or a substituted or unsubstituted fluorenyl group;

$R_{71}$ is selected from groups represented by Formulae 6-1 to 6-44 and 6-46 to 6-63 below:

6-1

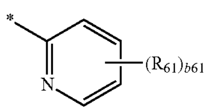

6-2

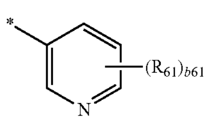

6-3

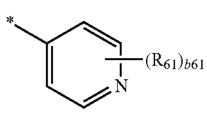

6-4

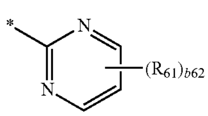

6-5

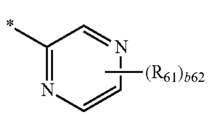

-continued 6-6

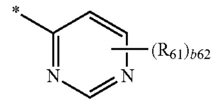

6-7

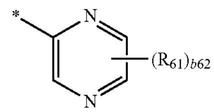

6-8

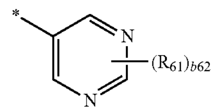

6-9

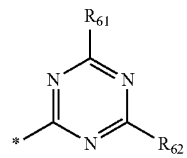

6-10

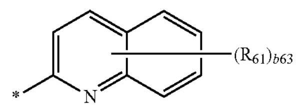

6-11

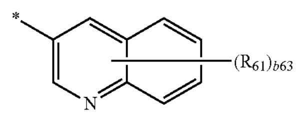

6-12

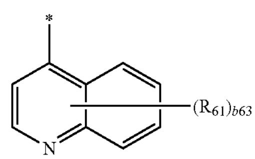

6-13

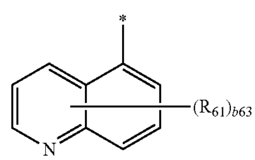

6-14

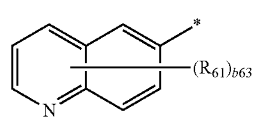

6-15

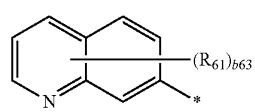

6-16

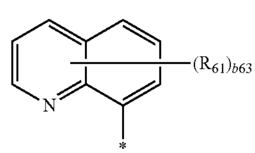

6-17

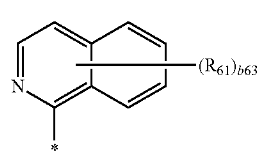

-continued
6-18
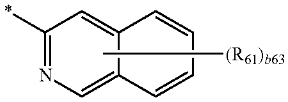
6-19
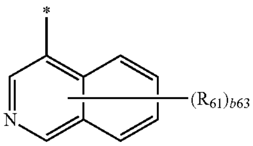
6-20
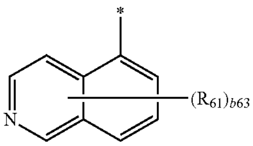
6-21
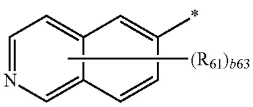
6-22
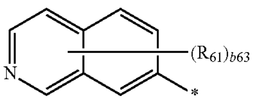
6-23
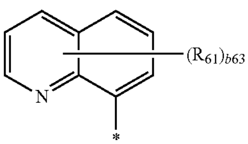
6-24
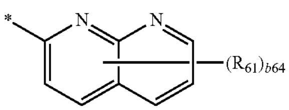
6-25
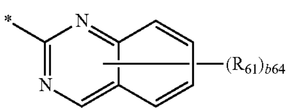
6-26
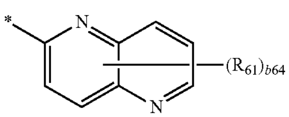
6-27
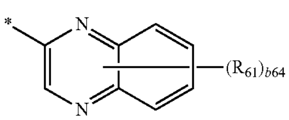
6-28
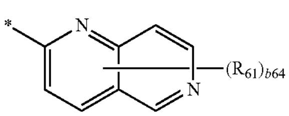
6-29
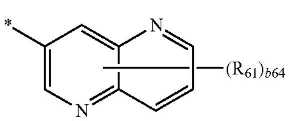
6-30
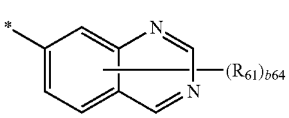
-continued
6-31
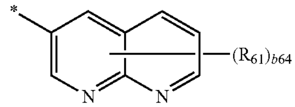
6-32
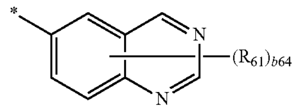
6-33
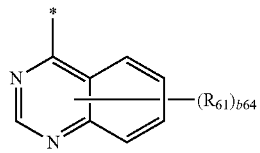
6-34
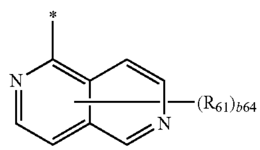
6-35
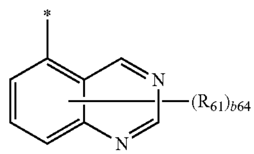
6-36
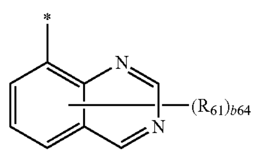
6-37
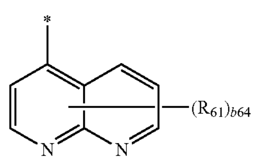
6-38
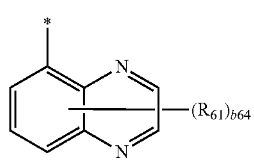
6-39
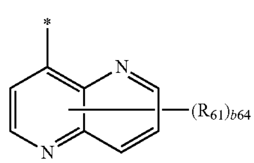
6-40
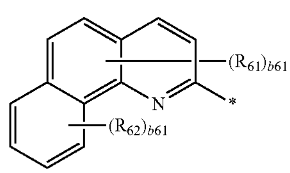

-continued
6-41
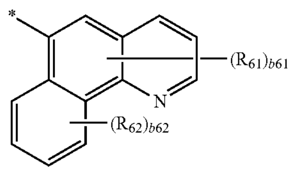
6-42
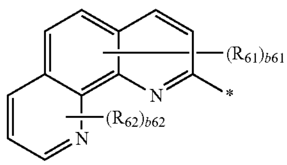
6-43
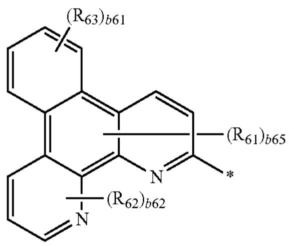
6-44
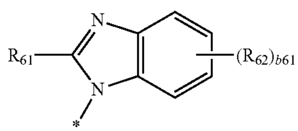
6-45
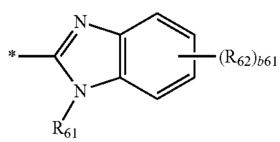
6-46
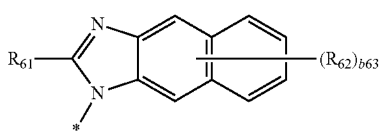
6-47
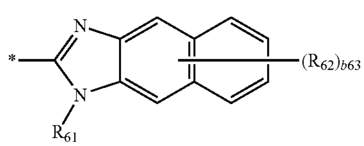
6-48
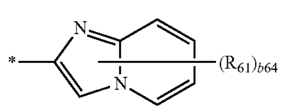
6-49
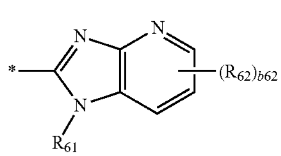
6-50
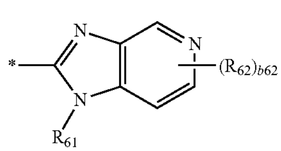
-continued
6-51
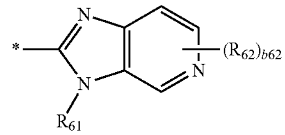
6-52
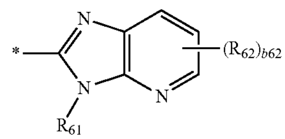
6-53
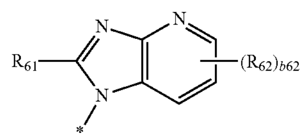
6-54
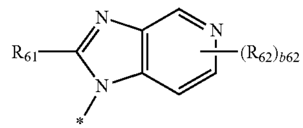
6-55
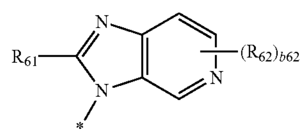
6-56
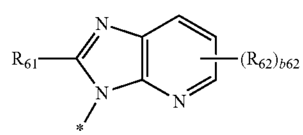
6-57
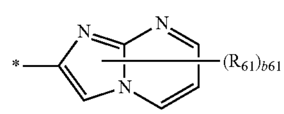
6-58
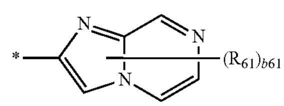
6-59
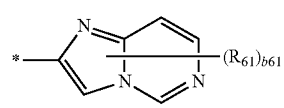
6-60
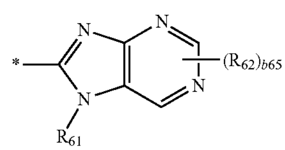
6-61
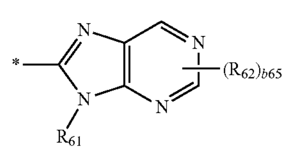
6-62
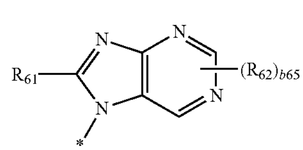

-continued 6-63

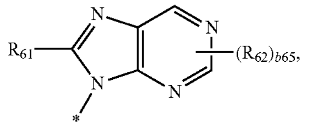

wherein in Formulae 6-1 to 6-44 and 6-46 to 6-63, $R_{61}$ and $R_{62}$ are each independently selected from:

deuterium, a $C_1$-$C_{20}$ alkyl group, a phenyl group, a naphthyl group, a fluorenyl group, a carbazolyl group, a pyridinyl group, —N($Q_{41}$)($Q_{42}$), and —Si($Q_{43}$)($Q_{44}$)($Q_{45}$); and a phenyl group, a naphthyl group, a fluorenyl group, a carbazolyl group, a pyridinyl group, each substituted with at least one selected from deuterium, a $C_1$-$C_{20}$ alkyl group, a phenyl group, a naphthyl group, a pyridinyl group, —N($Q_{51}$)($Q_{52}$), and —Si($Q_{53}$)($Q_{54}$)($Q_{55}$);

b61 is selected from 1, 2, 3, and 4; and b62 is selected from 1, 2, and 3;

b63 is selected from 1, 2, 3, 4, 5, and 6;

b64 is selected from 1, 2, 3, 4, and 5;

b65 is selected from 1 and 2; and

* indicates a binding site to a neighboring atom, wherein $Q_{41}$ to $Q_{45}$ and $Q_{51}$ to $Q_{55}$ are each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group;

b11, b12, b21, and b22 are each independently selected from 1, 2, 3, and 4;

$R_{13}$ to $R_{16}$, $R_{26}$, and $R_{72}$ to $R_{80}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), and —B($Q_6$)($Q_7$);

$R_{23}$ to $R_{25}$ are each independently selected from hydrogen and a phenyl group;

b13 to b16 and b23 to b25 are each independently selected from 1, 2, 3 and 4;

$R_{HT}$ is a hole transport group selected from:

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a thianthrenyl group, a phenoxathinyl group, and a dibenzodioxinyl group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a thianthrenyl group, a phenoxathinyl group, and a dibenzodioxinyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, —N($Q_{41}$)($Q_{42}$), —Si($Q_{43}$)($Q_{44}$)($Q_{45}$), and —B($Q_{46}$)($Q_{47}$); and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a thianthrenyl group, a phenoxathinyl group, and a dibenzodioxinyl group, each substituted with at least one selected from a phenyl group, a naphthyl group, a fluorenyl group, and a carbazolyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a benzofluorenyl group, a dibenzofluorenyl group, a carbazolyl group, —N($Q_{51}$)($Q_{52}$), —Si($Q_{53}$)($Q_{54}$)($Q_{55}$), and —B($Q_{56}$)($Q_{57}$);

$R_{ET}$ is an electron transport group selected from:

a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a benzophenanthrolinyl group, a phenazinyl group, a benzimidazolyl group, a naphthoimidazolyl group, a benzothiazolyl group, an isobenzothiazolyl group, a benzoxazolyl group, an isobenzoxazolyl group, a triazolyl group, a tetrazolyl group, an oxadiazolyl group, a triazinyl group, an imidazopyridinyl group, an imidazopyrimidinyl group, an imidazoquinolinyl group, an imidazoisoquinolinyl group, a pyridobenzofuranyl group, a pyrimidobenzofuranyl group, a pyridobenzothiophenyl group, and a pyrimidobenzothiophenyl group;

a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a benzophenanthrolinyl group, a phenazinyl group, a benzimidazolyl group, a naphthoimidazolyl group, a benzothiazolyl group, an isobenzothiazolyl group, a benzoxazolyl group, an isobenzoxazolyl group, a triazolyl group, a tetrazolyl group, an oxadiazolyl group, a triazinyl group, an imidazopyridinyl group, an imidazopyrimidinyl group, an imidazoquinolinyl group, an imidazoisoquinolinyl group, a pyridobenzofuranyl group, a pyrimidobenzofuranyl group, a pyridobenzothiophenyl group, and a pyrimidobenzothiophenyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, a pyridinyl group, a pyrimidinyl group, a triazinyl group, —N($Q_{41}$)($Q_{42}$), —Si($Q_{43}$)($Q_{44}$)($Q_{45}$), and —B($Q_{46}$)($Q_{47}$); and a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a benzophenanthrolinyl group, a phenazinyl group, a benzimidazolyl group, a naphthoimidazolyl group, a benzothiazolyl group, an isobenzothiazolyl group, a benzoxazolyl group, an isobenzoxazolyl group, a triazolyl group, a tetrazolyl group, an oxadiazolyl group, a triazinyl group, an imidazopyridinyl group, an imidazopyrimidinyl group, an imidazoquinolinyl group, an imidazoisoquinolinyl group, a pyridobenzofuranyl group, a pyrimidobenzofuranyl group, a pyridobenzothiophenyl group, and a pyrimidobenzothiophenyl group, each substituted with at least one selected from a phenyl group, a naphthyl group, a fluorenyl group, a carbazolyl group, a pyridinyl group, a pyrimidinyl group, and a triazinyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a benzofluorenyl group, a dibenzofluorenyl group, a carbazolyl group, a pyridinyl group, a pyrimidinyl group, a triazinyl group, —N($Q_{51}$)($Q_{52}$), —Si($Q_{53}$)($Q_{54}$)($Q_{55}$), and —B($Q_{56}$)($Q_{57}$); and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($C_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$);

wherein $Q_1$ to $Q_7$, $Q_{11}$ to $Q_{17}$, $Q_{21}$ to $Q_{27}$ and $Q_{31}$ to $Q_{37}$ are each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and wherein $Q_{41}$ to $Q_{47}$ and $Q_{51}$ to $Q_{57}$ are each independently selected from a $C_1$-$C_{60}$ alkyl group, a $C_6$-$C_{60}$ aryl group, a monovalent non-aromatic condensed polycyclic group, and a monovalent non-aromatic condensed heteropolycyclic group.

2. The organic light-emitting device of claim 1, wherein neither the first compound nor the second compound comprises a cyano group.

3. The organic light-emitting device of claim 1, wherein $L_{11}$ to $L_{13}$, and $L_{71}$ are each independently selected from groups represented by Formulae 3-1 to 3-19:

3-1

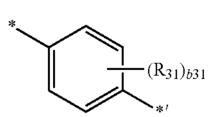

3-2

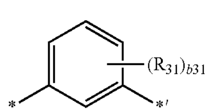

3-3

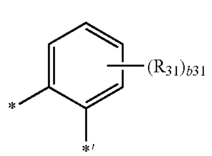

-continued 3-4

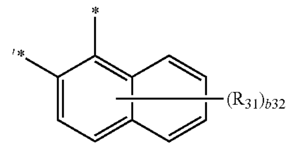

3-5

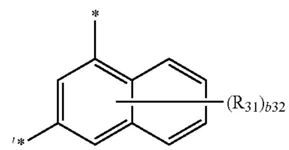

3-6

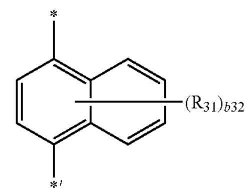

3-7

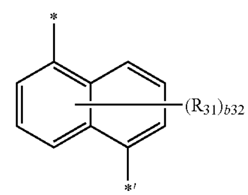

3-8

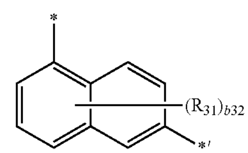

3-9

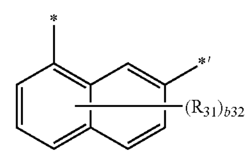

3-10

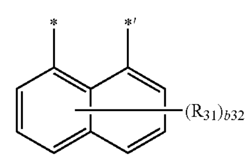

3-11

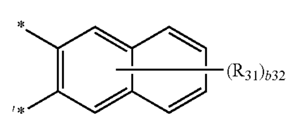

3-12

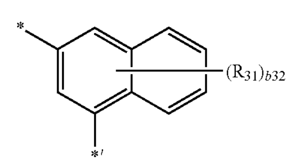

3-13

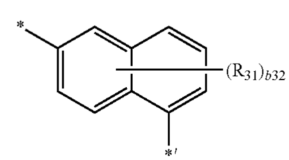

-continued 3-14

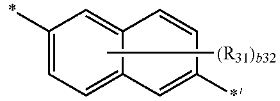

3-15

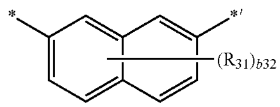

3-16

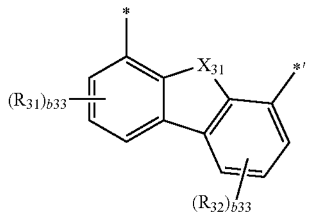

3-17

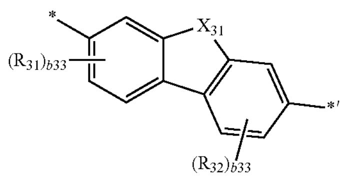

3-18

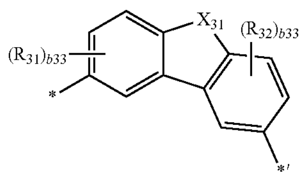

3-19

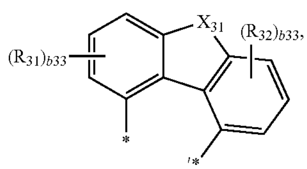

wherein in Formulae 3-1 to 3-19, $X_{31}$ is selected from O, S, and $C(R_{33})(R_{34})$;

$R_{31}$ to $R_{34}$ are each independently selected from hydrogen, deuterium, —F, —Cl, —Br, —I, a cyano group, a nitro group, a methyl group, an ethyl group, an n-propyl group, an iso-propyl group, an n-butyl group, iso-butyl group, a sec-butyl group, a tert-butyl group, a phenyl group, and a naphthyl group;

b31 is selected from 1, 2, 3, and 4;

b32 is selected from 1, 2, 3, 4, 5, and 6;

b33 is selected from 1, 2, and 3; and

* and *' each indicate a binding site to a neighboring atom.

4. The organic light-emitting device of claim 1, wherein $R_{HT}$ is selected from groups represented by Formulae 5-1 to 5-10 below:

5-1

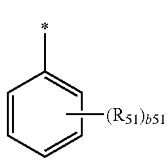

-continued 5-2

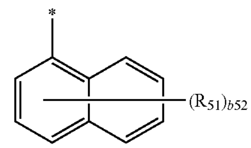

5-3

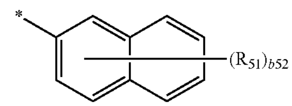

5-4

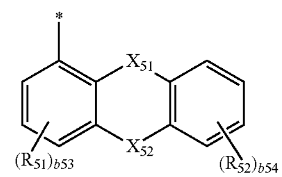

5-5

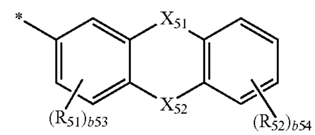

5-6

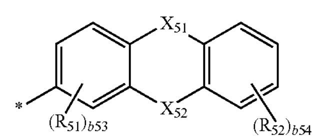

5-7

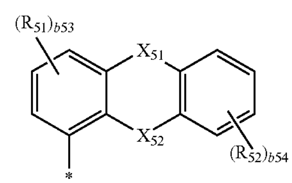

5-8

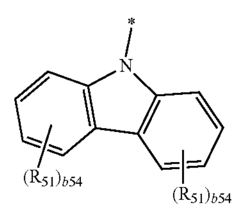

5-9

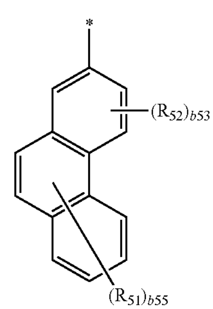

-continued 5-10

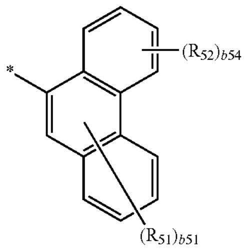

wherein in Formulae 5-1 to 5-10, $X_{51}$ is selected from a single bond, $N(R_{54})$, $C(R_{54})(R_{55})$, O, and S;

$X_{52}$ is selected from $N(R_{56})$, $C(R_{56})(R_{57})$, O, and S;

$R_{51}$, $R_{52}$ and $R_{54}$ to $R_{57}$ are each independently selected from:

deuterium, a $C_1$-$C_{20}$ alkyl group, a phenyl group, a naphthyl group, a fluorenyl group, a carbazolyl group, —$N(Q_{41})(Q_{42})$, and —$Si(Q_{43})(Q_{44})(Q_{45})$; and a phenyl group, a naphthyl group, a fluorenyl group, and a carbazolyl group, each substituted with at least one selected from deuterium, a $C_1$-$C_{20}$ alkyl group, a phenyl group, a naphthyl group, —$N(Q_{51})(Q_{52})$, and —$Si(Q_{53})(Q_{54})(Q_{55})$;

wherein $Q_{41}$ to $Q_{45}$ and $Q_{51}$ to $Q_{55}$ are each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group;

b51 is selected from 1, 2, 3, 4, and 5;

b52 is selected from 1, 2, 3, 4, 5, 6, and 7;

b53 is selected from 1, 2, and 3;

b54 is selected from 1, 2, 3, and 4;

b55 is selected from 1, 2, 3, 4, 5, and 6; and

* indicates a binding site to a neighboring atom.

5. The organic light-emitting device of claim 1, wherein $R_{ET}$ is selected from groups represented by Formulae 6-1 to 6-63 below:

6-1

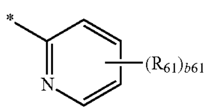

6-2

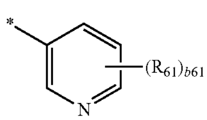

6-3

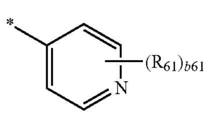

6-4

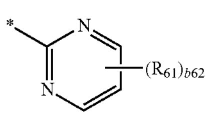

6-5

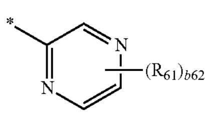

-continued 6-6

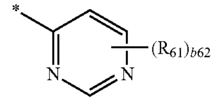

6-7

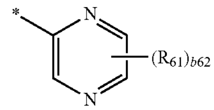

6-8

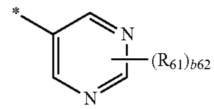

6-9

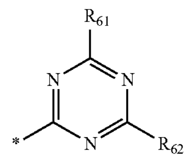

6-10

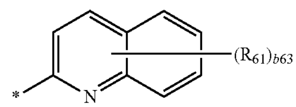

6-11

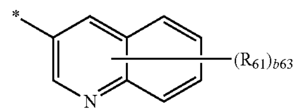

6-12

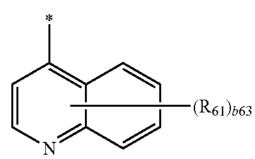

6-13

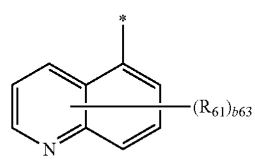

6-14

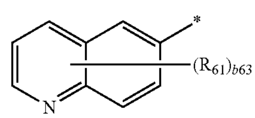

6-15

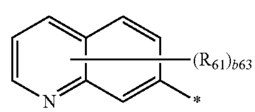

6-16

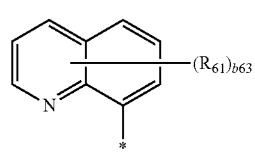

6-17

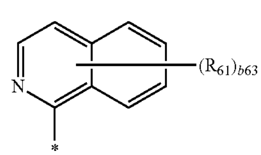

-continued
6-18
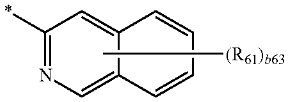
6-19
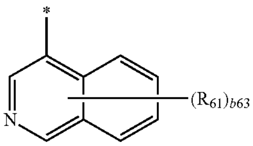
6-20
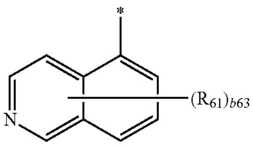
6-21
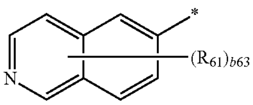
6-22
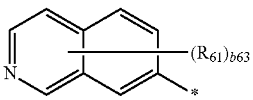
6-23
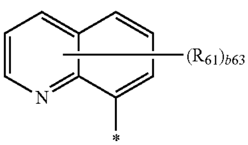
6-24
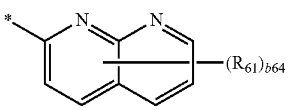
6-25
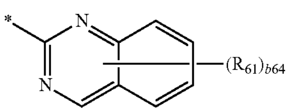
6-26
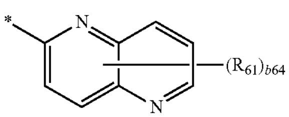
6-27
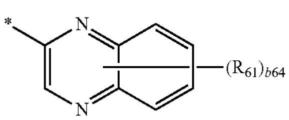
6-28
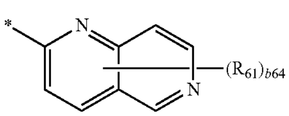
6-29
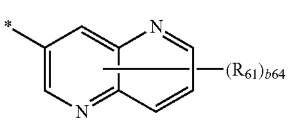
6-30
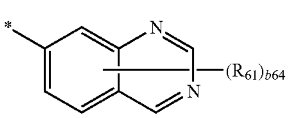
-continued
6-31
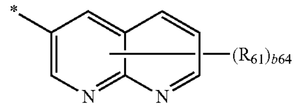
6-32
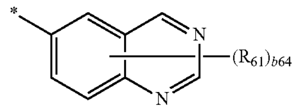
6-33
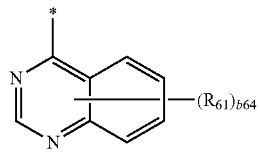
6-34
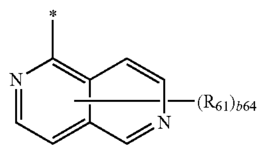
6-35
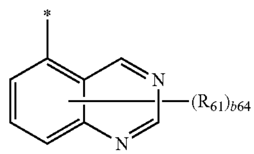
6-36
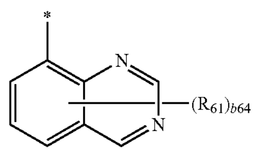
6-37
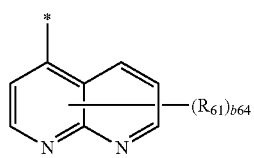
6-38
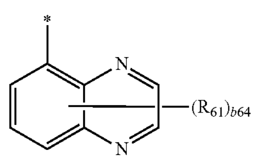
6-39
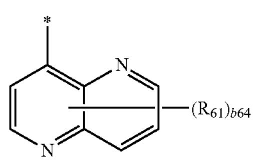
6-40
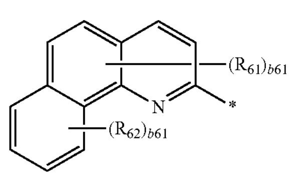

-continued
6-41
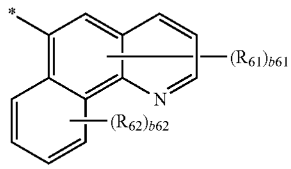
6-42
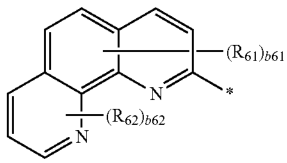
6-43
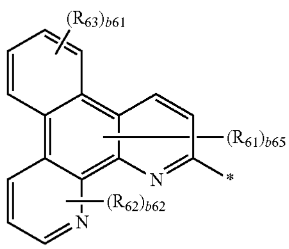
6-44
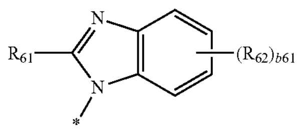
6-45
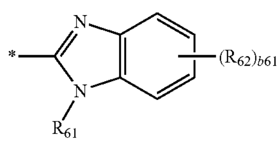
6-46
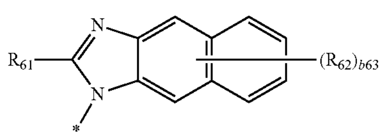
6-47
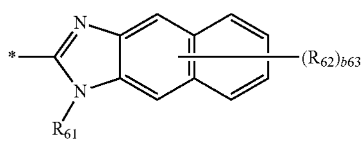
6-48
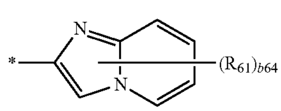
6-49
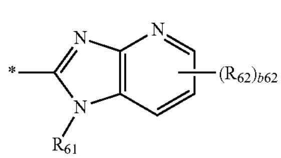
6-50
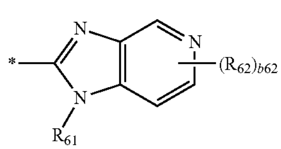
-continued
6-51
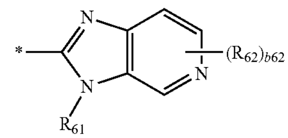
6-52
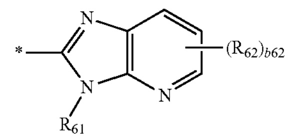
6-53
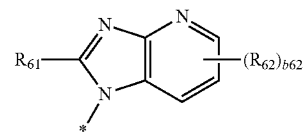
6-54
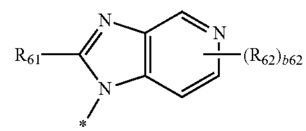
6-55
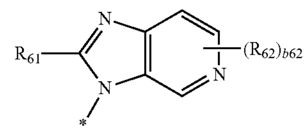
6-56
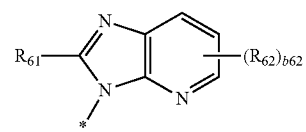
6-57
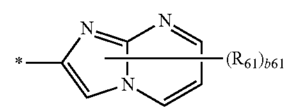
6-58
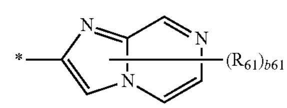
6-59
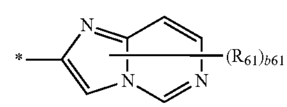
6-60
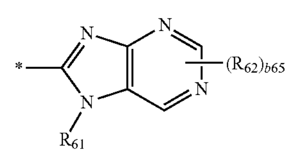
6-61
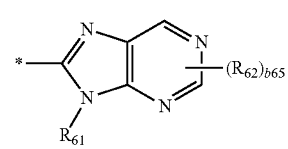

-continued 6-62

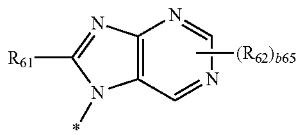

6-63

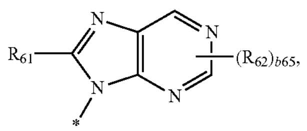

wherein in Formulae 6-1 to 6-63, $R_{61}$ to $R_{63}$ are each independently selected from:

deuterium, a $C_1$-$C_{20}$ alkyl group, a phenyl group, a naphthyl group, a fluorenyl group, a carbazolyl group, a pyridinyl group, —$N(Q_{41})(Q_{42})$, and —$Si(Q_{43})(Q_{44})(Q_{45})$; and a phenyl group, a naphthyl group, a fluorenyl group, a carbazolyl group, a pyridinyl group, each substituted with at least one selected from deuterium, a $C_1$-$C_{20}$ alkyl group, a phenyl group, a naphthyl group, a pyridinyl group, —$N(Q_{51})(Q_{52})$, and —$Si(Q_{53})(Q_{54})(Q_{55})$;

b61 is selected from 1, 2, 3, and 4; and b62 is selected from 1, 2, and 3;

b63 is selected from 1, 2, 3, 4, 5, and 6;

b64 is selected from 1, 2, 3, 4, and 5;

b65 is selected from 1 and 2; and

* indicates a binding site to a neighboring atom, wherein $Q_{41}$ to $Q_{45}$ and $Q_{51}$ to $Q_{55}$ are each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group.

6. The organic light-emitting device of claim 1, wherein the first compound is represented by Formula 1-1 below:

Formula 1-1

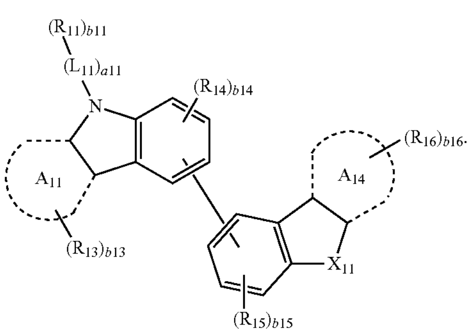

7. The organic light-emitting device of claim 1, wherein the second compound is represented by any one of Formulae 2-11 to 2-15 below:

Formula 2-11

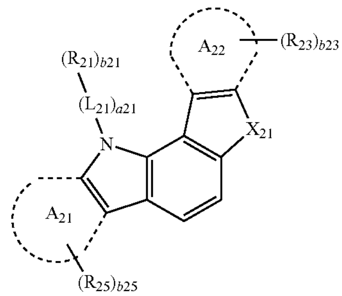

Formula 2-12

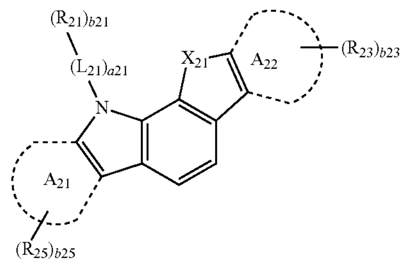

Formula 2-13

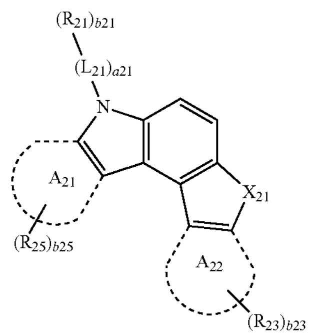

Formula 2-14

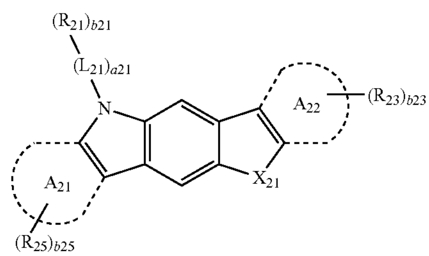

Formula 2-15

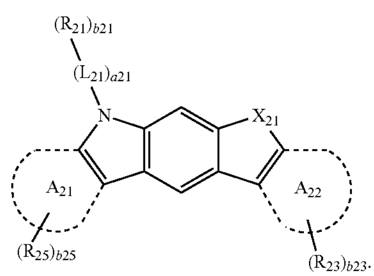

8. The organic light-emitting device of claim 1, wherein the third compound is represented by Formula 7-1 below:

Formula 7-1

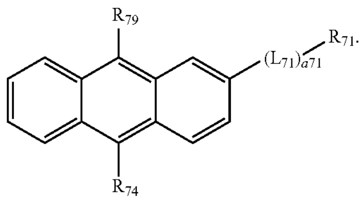

9. An organic light-emitting device comprising:

a first electrode; a second electrode; an organic layer between the first electrode and the second electrode, the organic layer comprising an emission layer, and an electron transport region between the emission layer and the second electrode, wherein the emission layer comprises a first compound represented by Formula 1 and a second compound represented by one of Formulae 2-1 to 2-5; and wherein the electron transport region comprises a third compound represented by Formula 7:

Formula 1

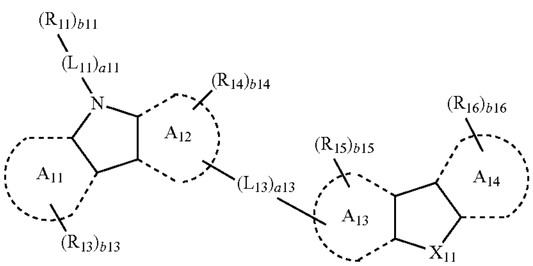

Formula 2-1

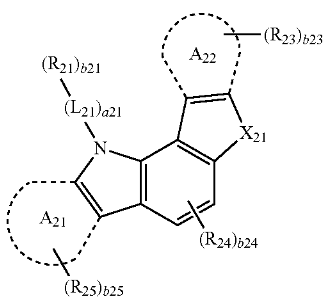

Formula 2-2

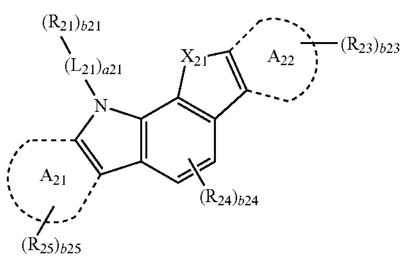

-continued

Formula 2-3

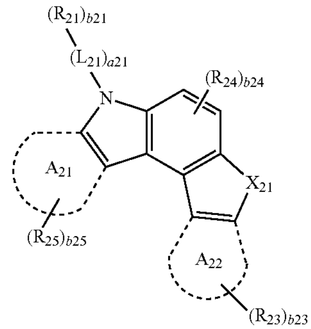

Formula 2-4

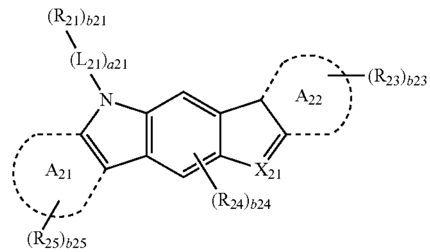

Formula 2-5

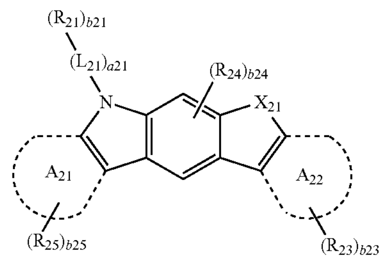

Formula 7

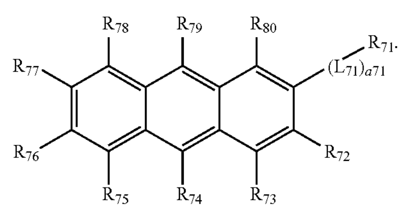

wherein in Formulae 1, 2-1 to 2-5, and 7, $A_{11}$, $A_{12}$, $A_{13}$, $A_{14}$, $A_{21}$, and $A_{22}$ are each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, and a cinnoline;

at least one of $A_{21}$ and $A_{22}$ is each independently selected from a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, and a cinnoline;

$X_{11}$ is $N[(L_{12})_{a12}-(R_{12})_{b12}]$;

$X_{21}$ is selected from O, S, $N[(L_{22})_{a22}-(R_{22})_{b22}]$, and $C[(L_{22})_{a22}-(R_{22})_{b22}][R_{26}]$;

$L_{11}$ and $L_{12}$ are each independently selected from groups represented by Formulae 3-1 to 3-19:

-continued
3-1
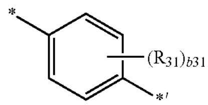
3-2
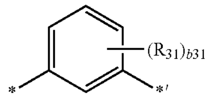
3-3
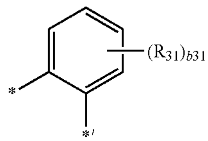
3-4
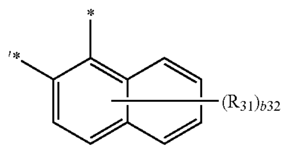
3-5
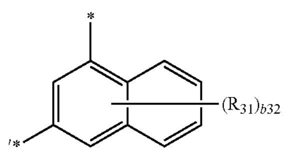
3-6
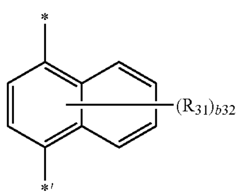
3-7
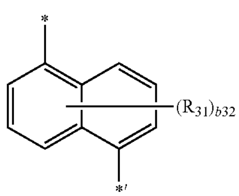
3-8
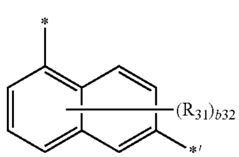
3-9
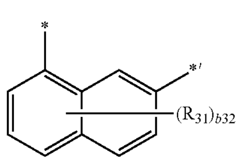
3-10
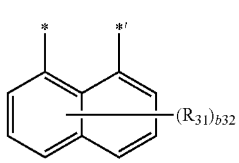
3-11
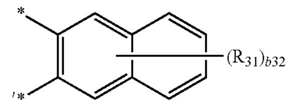
3-12
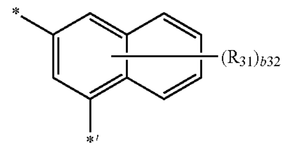
3-13
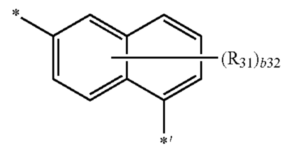
3-14
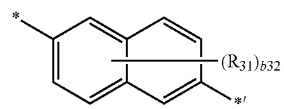
3-15
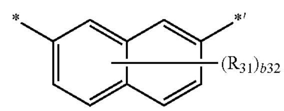
3-16
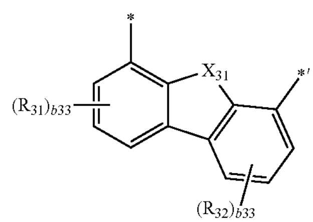
3-17
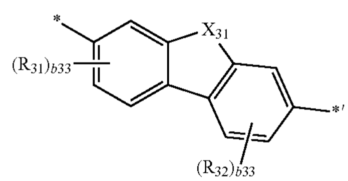
3-18
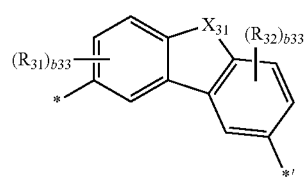
3-19
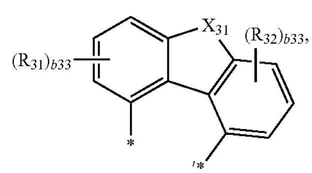
wherein in Formulae 3-1 to 3-19,
$X_{31}$ is selected from O, S, and $C(R_{33})(R_{34})$;
$R_{31}$ to $R_{34}$ are each independently selected from hydrogen, deuterium, —F, —Cl, —Br, —I, a cyano group, a nitro group, a methyl group, an ethyl group, an n-propyl group, an iso-propyl group, an n-butyl group, iso-butyl group, a sec-butyl group, a tert-butyl group, a phenyl group, and a naphthyl group;

b31 is selected from 1, 2, 3, and 4;

b32 is selected from 1, 2, 3, 4, 5, and 6;

b33 is selected from 1, 2, and 3; and

* and *' each indicate a binding site to a neighboring atom;

$L_{13}$, $L_{21}$, $L_{22}$, and $L_{71}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a13, a21, a22, and a71 are each independently selected from 0, 1, 2, 3, 4, and 5;

$R_{11}$ and $R_{12}$ are each independently $R_{HT}$;

$R_{21}$ and $R_{22}$ are each independently selected from $R_{HT}$ and $R_{ET}$, and at least one selected from $R_{21}$ and $R_{22}$ is $R_{ET}$;

$R_{71}$ is selected from groups represented by Formulae 6-4 to 6-39 below:

6-4

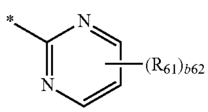

6-5

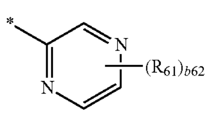

6-6

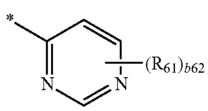

6-7

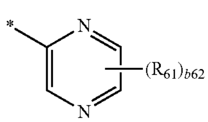

6-8

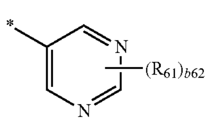

6-9

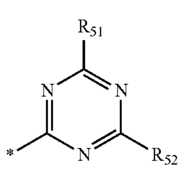

6-10

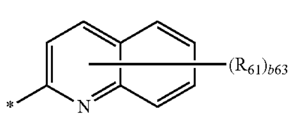

6-11

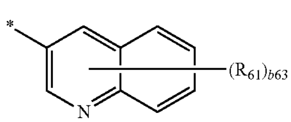

-continued 6-12

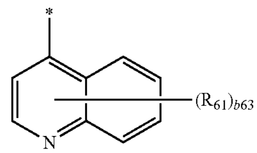

6-13

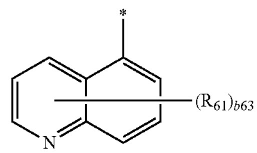

6-14

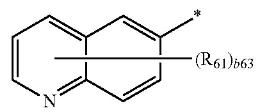

6-15

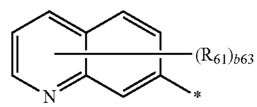

6-16

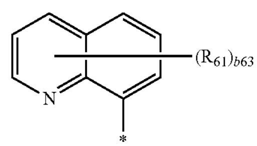

6-17

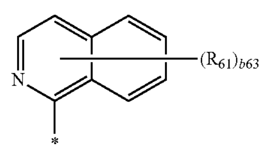

6-18

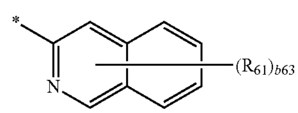

6-19

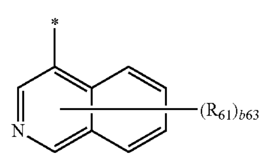

6-20

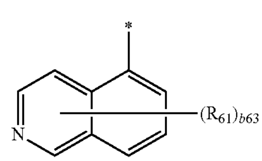

6-21

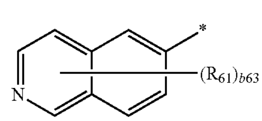

6-22

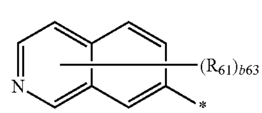

-continued 6-23

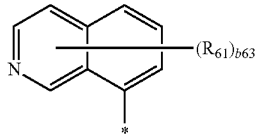

6-24

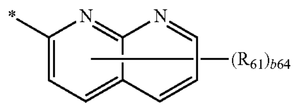

6-25

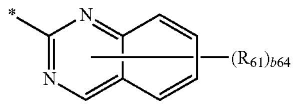

6-26

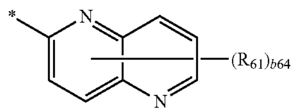

6-27

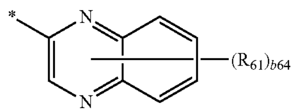

6-28

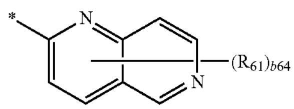

6-29

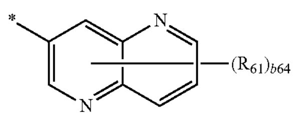

6-30

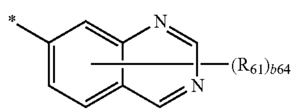

6-31

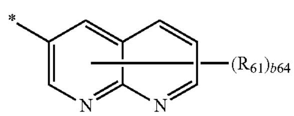

6-32

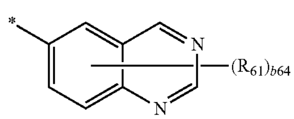

6-33

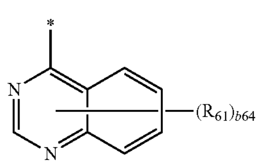

6-34

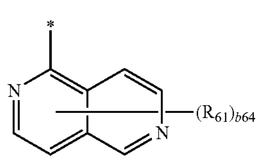

-continued 6-35

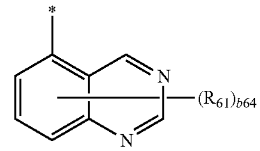

6-36

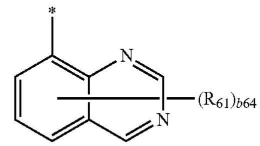

6-37

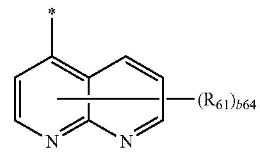

6-38

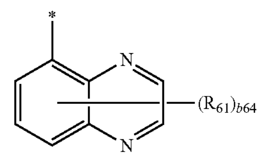

6-39

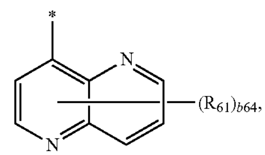

wherein in Formulae 6-4 to 6-39, $R_{61}$ and $R_{62}$ are each independently selected from:

deuterium, a $C_1$-$C_{20}$ alkyl group, a phenyl group, a naphthyl group, a fluorenyl group, a carbazolyl group, a pyridinyl group, —N($Q_{41}$)($Q_{42}$), and —Si($Q_{43}$)($Q_{44}$)($Q_{45}$); and a phenyl group, a naphthyl group, a fluorenyl group, a carbazolyl group, a pyridinyl group, each substituted with at least one selected from deuterium, a $C_1$-$C_{20}$ alkyl group, a phenyl group, a naphthyl group, a pyridinyl group, —N($Q_{51}$)($Q_{52}$), and —Si($Q_{53}$)($Q_{54}$)($Q_{55}$), b62 is selected from 1, 2, and 3;

b63 is selected from 1, 2, 3, 4, 5, and 6;

b64 is selected from 1, 2, 3, 4, and 5; and

* indicates a binding site to a neighboring atom, wherein $Q_{41}$ to $Q_{45}$ and $Q_{51}$ to $Q_{55}$ are each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group;

b11, b12, b21, and b22 are each independently selected from 1, 2, 3, and 4;

$R_{13}$ to $R_{16}$, $R_{23}$ to $R_{25}$, and $R_{72}$ to $R_{80}$ are each independently hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted a monovalent non-aromatic condensed polycyclic group, and a substituted or unsubstituted monovalent non-aromatic condensed heteropolycyclic group;

b13 to b16 and b23 to b25 are each independently selected from 1, 2, 3 and 4;

$R_{HT}$ is a hole transport group selected from:

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a thianthrenyl group, a phenoxathinyl group, and a dibenzodioxinyl group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a thianthrenyl group, a phenoxathinyl group, and a dibenzodioxinyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, —N($Q_{41}$)($Q_{42}$), —Si($Q_{43}$)($Q_{44}$)($Q_{45}$), and —B($Q_{46}$)($Q_{47}$); and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a thianthrenyl group, a phenoxathinyl group, and a dibenzodioxinyl group, each substituted with at least one selected from a phenyl group, a naphthyl group, a fluorenyl group, and a carbazolyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a benzofluorenyl group, a dibenzofluorenyl group, a carbazolyl group, —N($Q_{51}$)($Q_{52}$), —Si($Q_{53}$)($Q_{54}$)($Q_{55}$), and —B($Q_{56}$)($Q_{57}$);

$R_{ET}$ is an electron transport group selected from:

a pyrrolyl group, an imidazolyl group, a pyrazolyl group, a thiazolyl group, an isothiazolyl group, an oxazolyl group, an isoxazolyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a benzophenanthrolinyl group, a phenazinyl group, a benzimidazolyl group, a naphthoimidazolyl group, a benzothiazolyl group, an isobenzathiazolyl group, a benzoxazolyl group, an isobenzoxazolyl group, a triazolyl group, a tetrazolyl group, an oxadiazolyl group, an imidazopyridinyl group, an imidazopyrimidinyl group, an imidazoquinolinyl group, an imidazoisoquinolinyl group, a pyridobenzofuranyl group, a pyrimidobenzofuranyl group, a pyridobenzothiophenyl group, and a pyrimidobenzothiophenyl group;

a pyrrolyl group, an imidazolyl group, a pyrazolyl group, a thiazolyl group, an isothiazolyl group, an oxazolyl group, an isoxazolyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a benzophenanthrolinyl group, a phenazinyl group, a benzimidazolyl group, a naphthoimidazolyl group, a benzothiazolyl group, an isobenzothiazolyl group, a benzoxazolyl group, an isobenzoxazolyl group, a triazolyl group, a tetrazolyl group, an oxadiazolyl group, an imidazopyridinyl group, an imidazopyrimidinyl group, an imidazoquinolinyl group, an imidazoisoquinolinyl group, a pyridobenzofuranyl group, a pyrimidobenzofuranyl group, a pyridobenzothiophenyl group, and a pyrimidobenzothiophenyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, —N($Q_{41}$)($Q_{42}$), —Si($Q_{43}$)($Q_{44}$)($Q_{45}$), and —B($Q_{46}$)($Q_{47}$); and a pyrrolyl group, an imidazolyl group, a pyrazolyl group, a thiazolyl group, an isothiazolyl group, an oxazolyl group, an isoxazolyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a benzophenanthrolinyl group, a phenazinyl group, a benzimidazolyl group, a naphthoimidazolyl group, a benzothiazolyl group, an isobenzothiazolyl group, a benzoxazolyl group, an isobenzoxazolyl group, a triazolyl group, a tetrazolyl group, an oxadiazolyl group, an imidazopyridinyl group, an imidazopyrimidinyl group, an imidazoquinolinyl group, an imidazoisoquinolinyl group, a pyridobenzofuranyl group, a pyrimidobenzofuranyl group, a pyridobenzothiophenyl group, and a pyrimidobenzothiophenyl group, each substituted with at least one selected from a phenyl group, a naphthyl group, a fluorenyl group, and a carbazolyl group, each substituted with at least one selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a benzofluorenyl group, a dibenzofluorenyl group, a carbazolyl group, —N($Q_{51}$)($Q_{52}$), —Si($Q_{53}$)($Q_{54}$)($Q_{55}$), and —B($Q_{56}$)($Q_{57}$); and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$);

wherein $Q_{11}$ to $Q_{17}$, $Q_{21}$ to $Q_{27}$, and $Q_{31}$ to $Q_{37}$ are each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and wherein $Q_{41}$ to $Q_{47}$ and $Q_{51}$ to $Q_{57}$ are each independently selected from a $C_1$-$C_{60}$ alkyl group, a $C_6$-$C_{60}$ aryl group, a monovalent non-aromatic condensed polycyclic group, and a monovalent non-aromatic condensed heteropolycyclic group.

10. The organic light-emitting device of claim 9, wherein neither the first compound nor the second compound comprises a cyano group.

11. The organic light-emitting device of claim 9, wherein $L_{13}$, $L_{21}$, $L_{22}$, and $L_{71}$ are each independently selected from groups represented by Formulae 3-1 to 3-19:

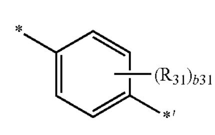

3-1

-continued 3-2

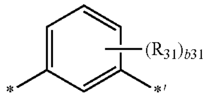

3-3

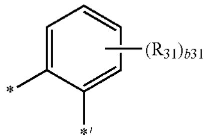

3-4

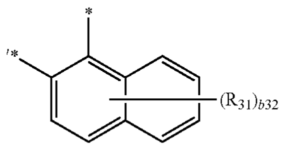

3-5

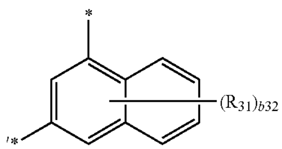

3-6

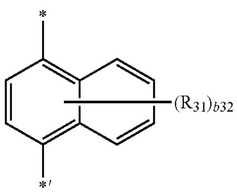

3-7

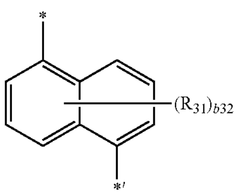

3-8

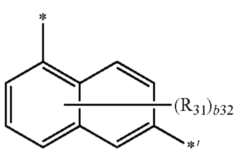

3-9

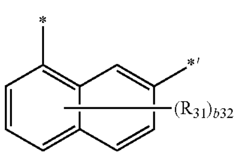

3-10

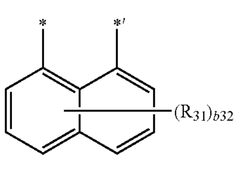

3-11

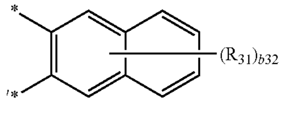

-continued 3-12

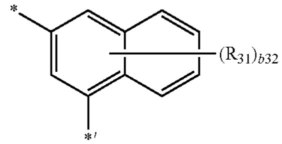

3-13

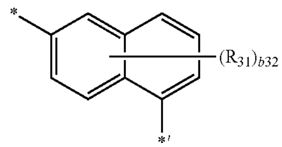

3-14

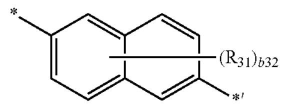

3-15

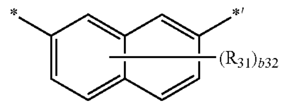

3-16

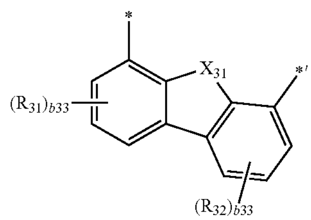

3-17

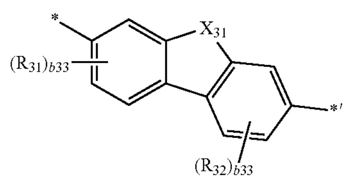

3-18

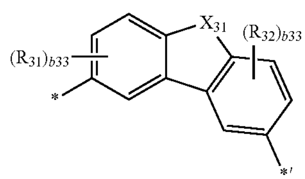

3-19

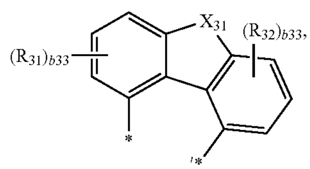

wherein in Formulae 3-1 to 3-19, $X_{31}$ is selected from O, S, and $C(R_{33})(R_{34})$;

$R_{31}$ to $R_{34}$ are each independently selected from hydrogen, deuterium, —F, —Cl, —Br, —I, a cyano group, a nitro group, a methyl group, an ethyl group, an n-propyl group, an iso-propyl group, an n-butyl group, iso-butyl group, a sec-butyl group, a tert-butyl group, a phenyl group, and a naphthyl group;

b31 is selected from 1, 2, 3, and 4;

b32 is selected from 1, 2, 3, 4, 5, and 6;

b33 is selected from 1, 2, and 3; and

* and *' each indicate a binding site to a neighboring atom.

12. The organic light-emitting device of claim 9, wherein $R_{HT}$ is selected from groups represented by Formulae 5-1 to 5-12 below:

5-1

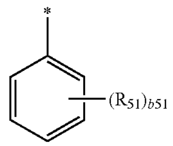

5-2

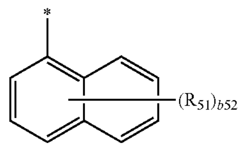

5-3

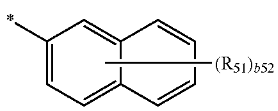

5-4

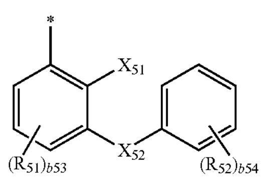

5-5

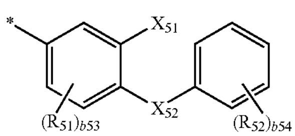

5-6

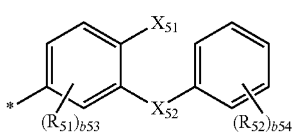

5-7

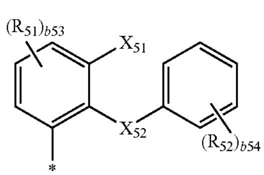

5-8

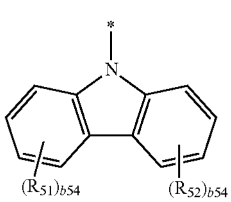

-continued 5-9

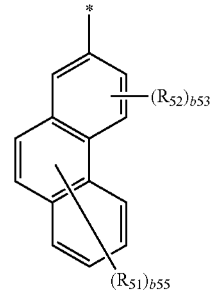

5-10

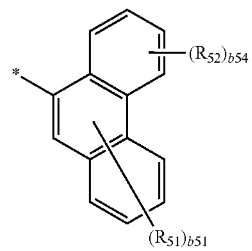

5-11

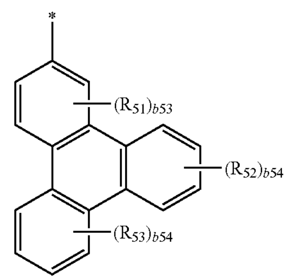

5-12

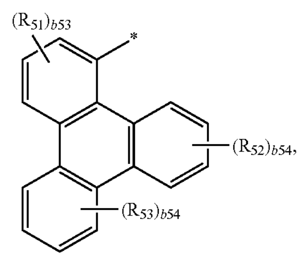

wherein in Formulae 5-1 to 5-12, $X_{51}$ is selected from a single bond, $N(R_{54})$, $C(R_{54})(R_{55})$, O, and S;

$X_{52}$ is selected from $N(R_{56})$, $C(R_{56})(R_{57})$, O, and S;

$R_{51}$ to $R_{57}$ are each independently selected from:

deuterium, a $C_1$-$C_{20}$ alkyl group, a phenyl group, a naphthyl group, a fluorenyl group, a carbazolyl group, —$N(Q_{41})(Q_{42})$, and —$Si(Q_{43})(Q_{44})(Q_{45})$; and a phenyl group, a naphthyl group, a fluorenyl group, and a carbazolyl group, each substituted with at least one selected from deuterium, a $C_1$-$C_{20}$ alkyl group, a phenyl group, a naphthyl group, —$N(Q_{51})(Q_{52})$, and —$Si(Q_{53})(Q_{54})(Q_{55})$;

wherein $Q_{41}$ to $Q_{45}$ and $Q_{51}$ to $Q_{55}$ are each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group;

b51 is selected from 1, 2, 3, 4, and 5;

b52 is selected from 1, 2, 3, 4, 5, 6, and 7;

b53 is selected from 1, 2, and 3;
b54 is selected from 1, 2, 3, and 4;
b55 is selected from 1, 2, 3, 4, 5, and 6; and
* indicates a binding site to a neighboring atom.
13. The organic light-emitting device of claim 9, wherein $R_{ET}$ is selected from groups represented by Formulae 6-10 to 6-63 below:
6-10
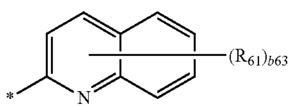
6-11
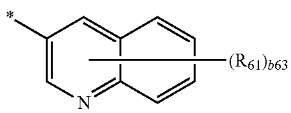
6-12
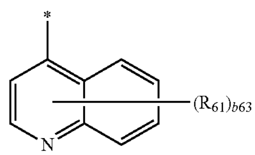
6-13
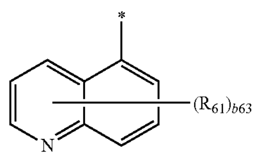
6-14
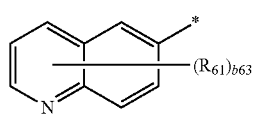
6-15
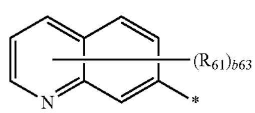
6-16
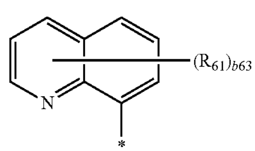
6-17
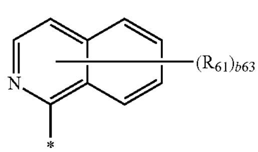
6-18
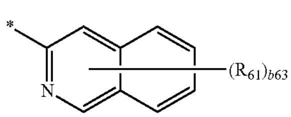
6-19
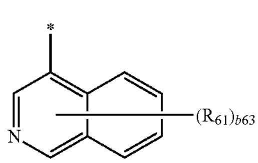
-continued
6-20
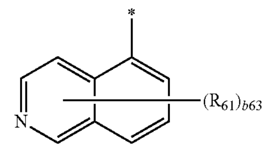
6-21
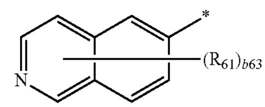
6-22
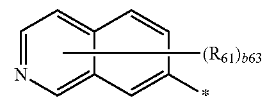
6-23
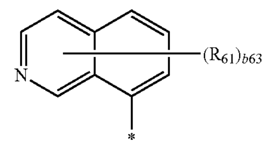
6-24
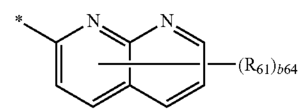
6-25
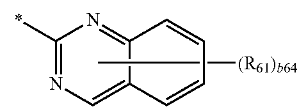
6-26
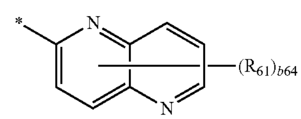
6-27
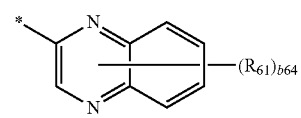
6-28
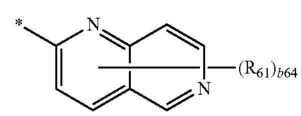
6-29
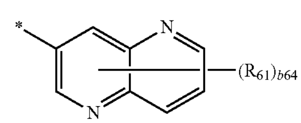
6-30
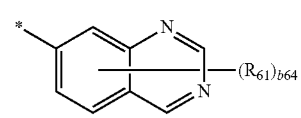
6-31
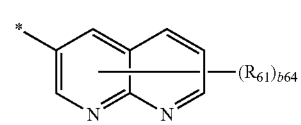
6-32
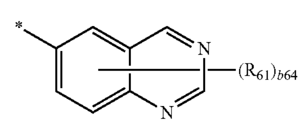

-continued
6-33
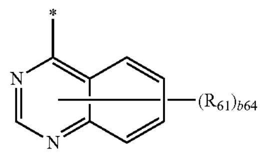
6-34
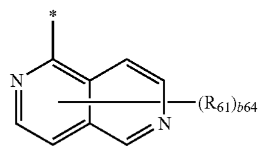
6-35
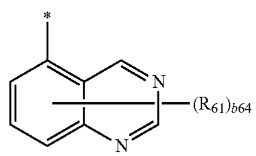
6-36
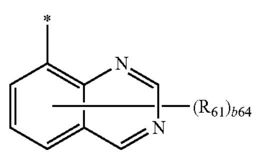
6-37
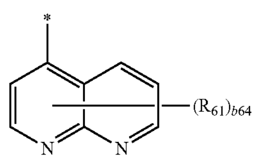
6-38
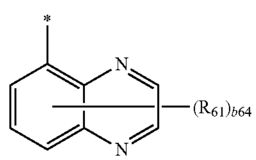
6-39
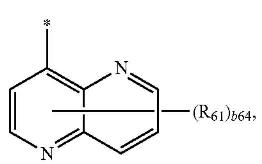
6-40
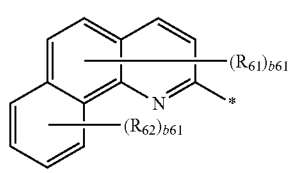
6-41
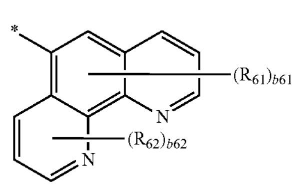
-continued
6-42
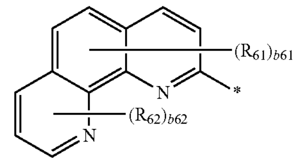
6-43
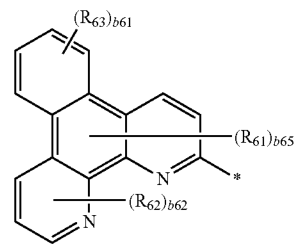
6-44
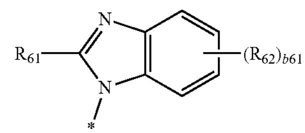
6-45
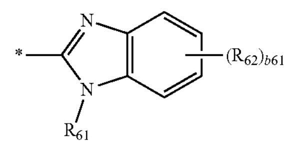
6-46
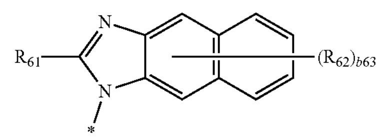
6-47
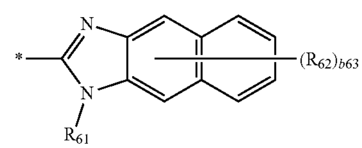
6-48
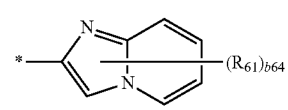
6-49
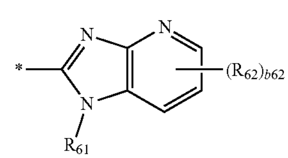
6-50
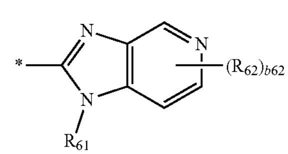
6-51
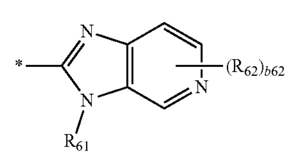

-continued 6-52

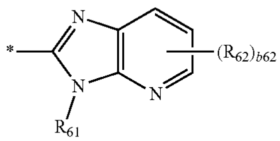

6-53

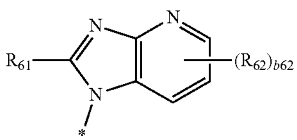

6-54

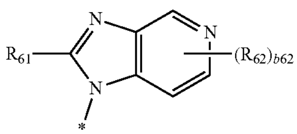

6-55

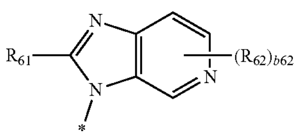

6-56

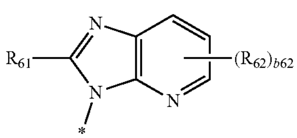

6-57

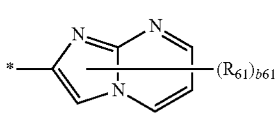

6-58

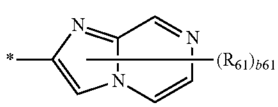

6-59

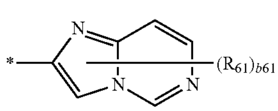

6-60

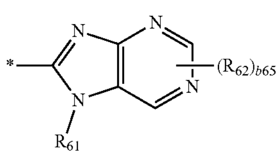

-continued 6-61

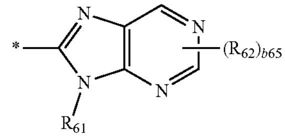

6-62

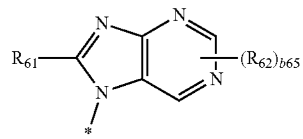

6-63

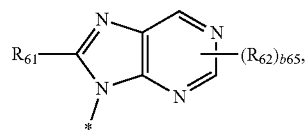

wherein in Formulae 6-10 to 6-63, $R_{61}$ to $R_{63}$ are each independently selected from:

deuterium, a $C_1$-$C_{20}$ alkyl group, a phenyl group, a naphthyl group, a fluorenyl group, a carbazolyl group, a pyridinyl group, —N($Q_{41}$)($Q_{42}$), and —Si($Q_{43}$)($Q_{44}$)($Q_{45}$); and a phenyl group, a naphthyl group, a fluorenyl group, a carbazolyl group, a pyridinyl group, each substituted with at least one selected from deuterium, a $C_1$-$C_{20}$ alkyl group, a phenyl group, a naphthyl group, a pyridinyl group, —N($Q_{51}$)($Q_{52}$), and —Si($Q_{53}$)($Q_{54}$)($Q_{55}$), b61 is selected from 1, 2, 3, and 4; and b62 is selected from 1, 2, and 3;

b63 is selected from 1, 2, 3, 4, 5, and 6;

b64 is selected from 1, 2, 3, 4, and 5;

b65 is selected from 1 and 2; and

* indicates a binding site to a neighboring atom, wherein $Q_{41}$ to $Q_{45}$ and $Q_{51}$ to $Q_{55}$ are each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group.

14. The organic light-emitting device of claim 9, wherein the first compound is represented by Formula 1-1 below:

Formula 1-1

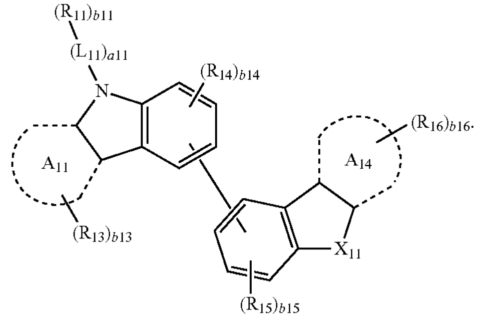

15. The organic light-emitting device of claim 9, wherein the second compound is represented by any one of Formulae 2-11 to 2-15 below:

Formula 2-11

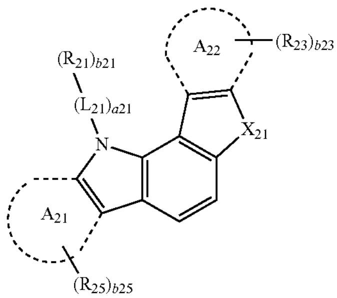

Formula 2-12

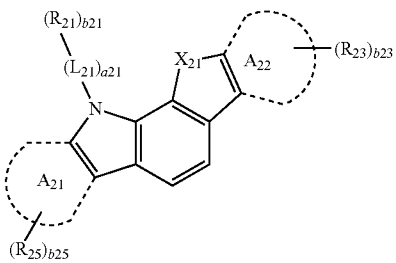

Formula 2-13

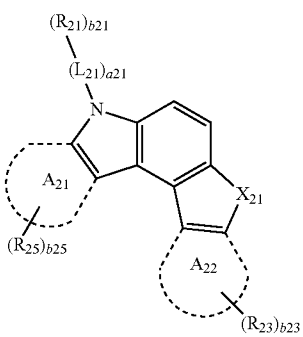

Formula 2-14

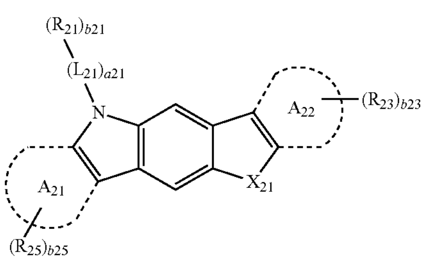

Formula 2-15

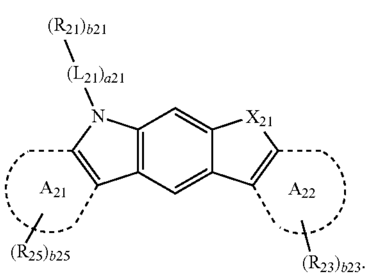

16. The organic light-emitting device of claim 9, wherein the third compound is represented by Formula 7-1 below:

Formula 7-1

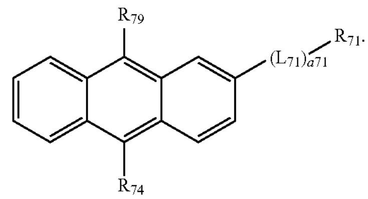

17. An organic light-emitting device comprising:

a first electrode; a second electrode; an organic layer between the first electrode and the second electrode, the organic layer comprising an emission layer, and an electron transport region between the emission layer and the second electrode, wherein the emission layer comprises a first compound represented by Formula 1 and a second compound represented by any one of Formulae 2-1 to 2-5; and wherein the electron transport region comprises a third compound represented by Formula 7:

Formula 1

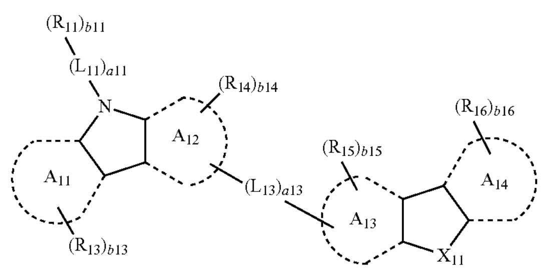

Formula 2-1

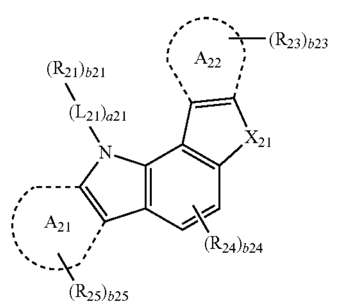

Formula 2-2

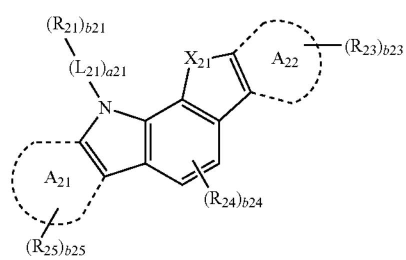

-continued

Formula 2-3

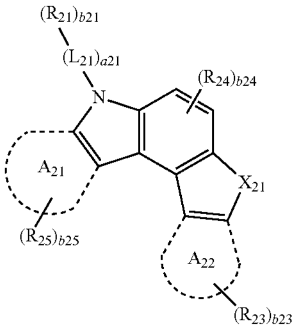

Formula 2-4>

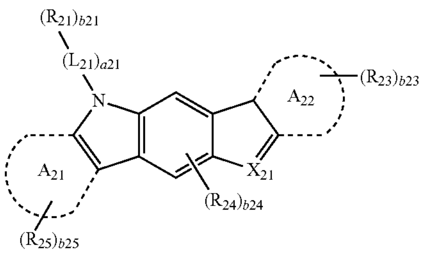

Formula 2-5

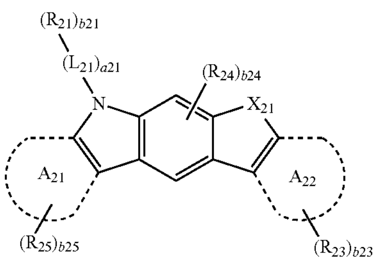

Formula 7

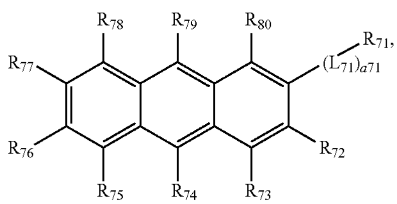

wherein in Formulae 1, 2-1 to 2-5, and 7, $A_{11}$, $A_{12}$, $A_{13}$, $A_{14}$, $A_{21}$, and $A_{22}$ are each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, and a cinnoline;

$X_{11}$ is selected from O, S, $N[(L_{12})_{a12}\text{-}(R_{12})_{b12}]$, $C[(L_{12})_{a12}\text{-}(R_{12})_{b12}][R_{17}]$, $Si[(L_{12})_{a12}\text{-}(R_{12})_{b12}][R_{17}]$, $P[(L_{12})_{a12}\text{-}(R_{12})_{b12}]$, $B[(L_{12})_{a12}\text{-}(R_{12})_{b12}]$, and $P({=}O)[(L_{12})_{a12}\text{-}(R_{12})_{b12}]$;

$X_{21}$ is selected from $Si[(L_{22})_{a22}\text{-}(R_{22})_{b22}][R_{26}]$, $P[(L_{22})_{a22}\text{-}(R_{22})_{b22}]$, $B[(L_{22})_{a22}\text{-}(R_{22})_{b22}]$, and $P({=}O)[(L_{22})_{a22}\text{-}(R_{22})_{b22}]$;

$L_{11}$ to $L_{13}$, $L_{21}$, $L_{22}$, and $L_{71}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a13, a21, a22, and a71 are each independently selected from 0, 1, 2, 3, 4, and 5;

$R_{11}$ and $R_{12}$ are each independently selected from $R_{HT}$ and $R_{ET}$, and at least one selected from $R_{11}$ and $R_{12}$ is $R_{ET}$;

$R_{21}$ and $R_{22}$ are each independently $R_{HT}$;

$R_{71}$ is $R_{ET}$;

b11, b12, b21, and b22 are each independently selected from 1, 2, 3, and 4;

$R_{13}$ to $R_{17}$, $R_{23}$ to $R_{26}$, and $R_{72}$ to $R_{80}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, and $—B(Q_6)(Q_7)$;

b13 to b16 and b23 to b25 are each independently selected from 1, 2, 3 and 4;

$R_{HT}$ is a hole transport group;

$R_{ET}$ is an electron transport group; and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$;

wherein $Q_1$ to $Q_7$, $Q_{11}$ to $Q_{17}$, $Q_{21}$ to $Q_{27}$ and $Q_{31}$ to $Q_{37}$ are each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

18. An organic light-emitting device comprising:

a first electrode; a second electrode; an organic layer between the first electrode and the second electrode, the organic layer comprising an emission layer, and an electron transport region between the emission layer and the second electrode, wherein the emission layer comprises a first compound represented by Formula 1 and a second compound represented by one of Formulae 2-1 to 2-5; and wherein the electron transport region comprises a third compound represented by Formula 7:

Formula 1

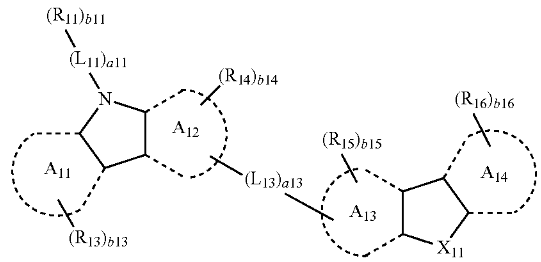

Formula 2-1

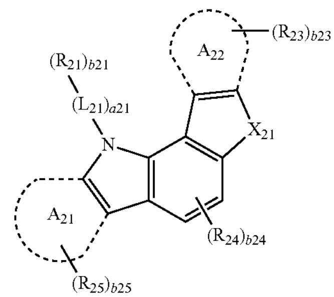

Formula 2-2

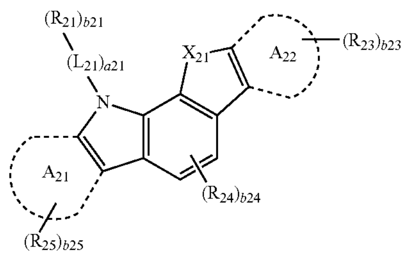

Formula 2-3

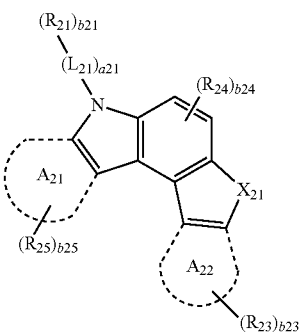

Formula 2-4

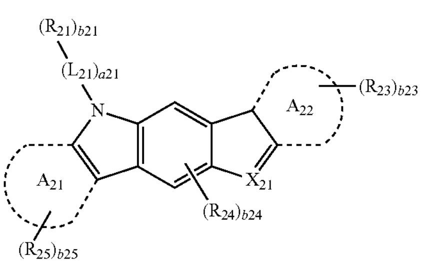

-continued

Formula 2-5

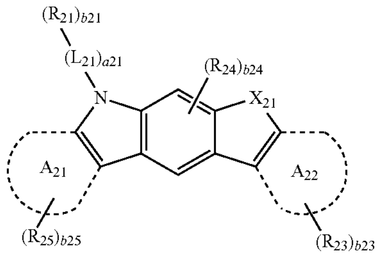

Formula 7

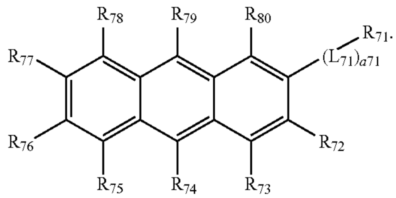

wherein in Formulae 1, 2-1 to 2-5, and 7, $A_{11}$, $A_{12}$, $A_{13}$, $A_{14}$, $A_{21}$, and $A_{22}$ are each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, and a cinnoline;

$X_{11}$ is selected from O, S, $N[(L_{12})_{a12}\text{-}(R_{12})_{b12}]$, $C[(L_{12})_{a12}\text{-}(R_{12})_{b12}][R_{17}]$, $Si[(L_{12})_{a12}\text{-}(R_{12})_{b12}][R_{17}]$, $P[(L_{12})_{a12}\text{-}(R_{12})_{b12}]$, $B[(L_{12})_{a12}\text{-}(R_{12})_{b12}]$, and $P(=O)[(L_{12})_{a12}\text{-}(R_{12})_{b12}]$, $X_{21}$ is selected from $Si[(L_{22})_{a22}\text{-}(R_{22})_{b22}][R_{26}]$, $P[(L_{22})_{a22}\text{-}(R_{22})_{b22}]$, $B[(L_{22})_{a22}\text{-}(R_{22})_{b22}]$, and $P(=O)[(L_{22})_{a22}\text{-}(R_{22})_{b22}]$, $L_{11}$ to $L_{13}$, $L_{21}$, $L_{22}$, and $L_{71}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a13, a21, a22, and a71 are each independently selected from 0, 1, 2, 3, 4, and 5;

$R_{11}$ and $R_{12}$ are each independently $R_{HT}$;

$R_{21}$ and $R_{22}$ are each independently selected from $R_{HT}$ and $R_{ET}$, and at least one selected from $R_{21}$ and $R_{22}$ is $R_{ET}$;

$R_{71}$ is $R_{ET}$;

b11, b12, b21, and b22 are each independently selected from 1, 2, 3, and 4;

$R_{13}$ to $R_{17}$, $R_{23}$ to $R_{26}$, and $R_{72}$ to $R_{80}$ are each independently hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted a monovalent non-aromatic condensed polycyclic group, and a substituted or unsubstituted monovalent non-aromatic condensed heteropolycyclic group;

b13 to b16 and b23 to b25 are each independently selected from 1, 2, 3 and 4;

$R_{HT}$ is a hole transport group;

$R_{ET}$ is an electron transport group; and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, and $—B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$;

wherein $Q_{11}$ to $Q_{17}$, $Q_{21}$ to $Q_{27}$, and $Q_{31}$ to $Q_{37}$ are each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

* * * * *